US010840454B2

(12) United States Patent
Cho et al.

(10) Patent No.: US 10,840,454 B2
(45) **Date of Patent: *Nov. 17, 2020**

(54) ORGANIC LIGHT-EMITTING DEVICES

(71) Applicant: SAMSUNG DISPLAY CO., LTD., Yongin (KR)

(72) Inventors: Hwan-Hee Cho, Yongin (KR); Mi-Kyung Kim, Yongin (KR); Se-Hun Kim, Yongin (KR); Dong-Hyun Kim, Yongin (KR); Chang-Woong Chu, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 362 days.

This patent is subject to a terminal disclaimer.

(21) Appl. No.: 14/691,521

(22) Filed: Apr. 20, 2015

(65) Prior Publication Data

US 2015/0228915 A1 Aug. 13, 2015

Related U.S. Application Data

(63) Continuation-in-part of application No. 14/061,667, filed on Oct. 23, 2013, now Pat. No. 9,012,903.

(30) Foreign Application Priority Data

Jun. 14, 2013 (KR) ........................ 10-2013-0068640

(51) Int. Cl.
*H01L 51/00* (2006.01)
*H01L 51/50* (2006.01)

(52) U.S. Cl.
CPC ........ *H01L 51/0052* (2013.01); *H01L 51/006* (2013.01); *H01L 51/0061* (2013.01);
(Continued)

(58) Field of Classification Search
CPC ............. H01L 27/3211; H01L 51/0073; H01L 51/0052
See application file for complete search history.

(56) References Cited

U.S. PATENT DOCUMENTS 8,188,315 B2 5/2012 Hwang et al.
9,012,903 B2 * 4/2015 Cho .................... H01L 51/0067 257/40

(Continued)

FOREIGN PATENT DOCUMENTS

KR 10-2005-0097670 10/2005
KR 10-2007-0114562 A 12/2007
(Continued)

OTHER PUBLICATIONS

U.S. Office Action dated Feb. 20, 2018, issued in U.S. Appl. No. 15/263,055 (19 pages).

*Primary Examiner* — Irina Krylova
(74) *Attorney, Agent, or Firm* — Lewis Roca Rothgerber Christie LLP

(57) ABSTRACT

An organic light-emitting device includes: a first electrode; a second electrode; and an organic layer between the first electrode and the second electrode. The organic layer includes an emission layer, and the emission layer includes at least one light-emitting material represented by one of Formulas 1 and 2. The organic layer further includes at least one hole-transporting material represented by one of Formulas 2(1) and 2(2).

Formula 1

Formula 2

Formula 2(1)

(Continued)

-continued

Formula 2(2)

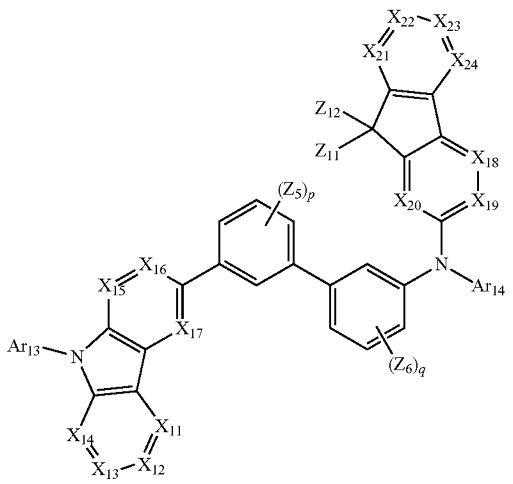

6 Claims, 3 Drawing Sheets

Figure 1:
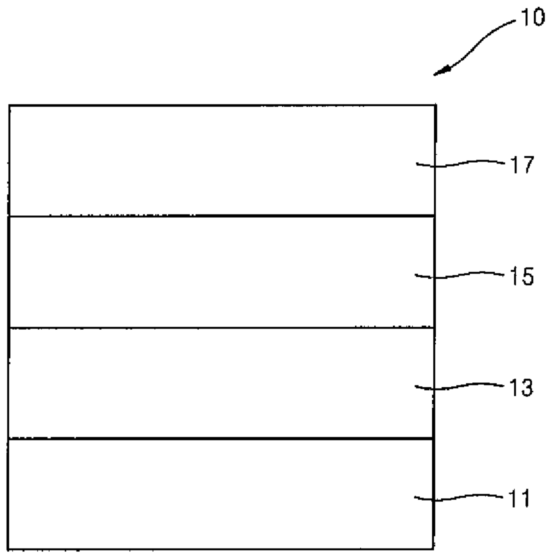

(52) U.S. Cl.
CPC ...... *H01L 51/0067* (2013.01); *H01L 51/0071* (2013.01); *H01L 51/0072* (2013.01); *H01L 51/0073* (2013.01); *H01L 51/0058* (2013.01); *H01L 51/0059* (2013.01); *H01L 51/5016* (2013.01); *H01L 51/5056* (2013.01)

(56) References Cited

U.S. PATENT DOCUMENTS

| | | | | |
|---|---|---|---|---|
| 9,590,184 | B2 * | 3/2017 | Lee | H01L 51/006 |
| 2002/0034656 | A1 | 3/2002 | Thompson et al. | |
| 2003/0042848 | A1 * | 3/2003 | Park | H01L 27/3211 313/503 |
| 2005/0221124 | A1 | 10/2005 | Hwang et al. | |
| 2007/0114919 | A1 * | 5/2007 | Sotoyama | C09K 11/06 313/504 |
| 2007/0215867 | A1 | 9/2007 | Kawakami et al. | |
| 2008/0111480 | A1 * | 5/2008 | Lee | H01L 51/5048 313/504 |
| 2008/0242871 | A1 | 10/2008 | Kawakami et al. | |
| 2011/0084254 | A1 | 4/2011 | Kim et al. | |
| 2011/0193074 | A1 | 8/2011 | Lee et al. | |
| 2011/0278551 | A1 | 11/2011 | Yabunouchi et al. | |
| 2012/0138911 | A1 * | 6/2012 | Inoue | C07D 209/82 257/40 |
| 2012/0146014 | A1 * | 6/2012 | Kato | C07D 209/86 257/40 |
| 2012/0168741 | A1 | 7/2012 | Egawa et al. | |
| 2012/0235123 | A1 * | 9/2012 | Lee | H01L 51/0072 257/40 |
| 2013/0105771 | A1 | 5/2013 | Ryu et al. | |
| 2013/0168645 | A1 | 7/2013 | Park | |
| 2014/0027721 | A1 | 1/2014 | Kim et al. | |
| 2014/0054558 | A1 | 2/2014 | Kim et al. | |
| 2014/0117322 | A1 | 5/2014 | Seo et al. | |
| 2014/0124747 | A1 | 5/2014 | Hwang et al. | |
| 2014/0124748 | A1 | 5/2014 | Kim et al. | |
| 2014/0138633 | A1 | 5/2014 | Jung et al. | |
| 2014/0183495 | A1 * | 7/2014 | Lee | H01L 51/0052 257/40 |
| 2014/0209869 | A1 | 7/2014 | Jung et al. | |
| 2014/0367649 | A1 | 12/2014 | Cho et al. | |

FOREIGN PATENT DOCUMENTS

| | | | |
|---|---|---|---|
| KR | 10-2010-0039815 | | 4/2010 |
| KR | 10-2010-0106014 | A | 10/2010 |
| KR | 10-2011-0015836 | | 2/2011 |
| KR | 10-2011-0097784 | A | 8/2011 |
| KR | 10-2011-0117548 | A | 10/2011 |
| KR | 10-2012-0042633 | A | 5/2012 |
| KR | 10-2012-0052993 | | 5/2012 |
| KR | 10-2012-0127746 | | 11/2012 |
| KR | 10-2013-0020398 | A | 2/2013 |
| KR | 10-2013-0113263 | A | 10/2013 |
| KR | 10-2014-0141951 | A | 12/2014 |
| KR | 10-2014-0145887 | A | 12/2014 |
| KR | 10-2015-0031892 | A | 3/2015 |
| WO | WO 2010/110553 | A2 | 9/2010 |
| WO | WO2013032304 | * | 3/2013 |
| WO | 2013/060418 | A1 | 5/2013 |

* cited by examiner

ORGANIC LIGHT-EMITTING DEVICES

CROSS-REFERENCE TO RELATED APPLICATION(S)

This application is a continuation-in-part of U.S. application Ser. No. 14/061,667 filed Oct. 23, 2013, which claims priority to and the benefit of Korean Patent Application No. 10-2013-0068640, filed on Jun. 14, 2013 in the Korean Intellectual Property Office, the entire contents of all of which are incorporated herein by reference.

BACKGROUND

1. Technical Field

The present invention relates to an organic light-emitting device.

2. Description of the Related Art

Organic light-emitting devices (OLEDs) are self-emitting devices that have advantages such as wide viewing angles, good contrast, quick response times, and good luminance, driving voltage, and response speed characteristics. Also, OLEDs can provide multicolored images.

A typical OLED has a structure including a substrate, and an anode, a hole transport layer, an emission layer, an electron transport layer, and a cathode sequentially stacked on the substrate. In this regard, the hole transport layer, the emission layer, and the electron transport layer are organic thin films formed of organic compounds.

An operating principle of an OLED having the above-described structure may be as follows. When a voltage is applied between the anode and the cathode, holes injected from the anode move to the emission layer via the hole transport layer, and electrons injected from the cathode move to the emission layer via the electron transport layer. The holes and electrons recombine in the emission layer to generate excitons. When the excitons drop from an excited state to a ground state, light is emitted.

SUMMARY

Aspects of embodiments of the present invention are directed toward an organic light-emitting device (OLED) having high efficiency and a long lifespan.

According to an aspect of an embodiment of the present invention, an organic light-emitting device includes: a first electrode; a second electrode; and an organic layer between the first electrode and the second electrode. In some embodiments, the organic layer includes an emission layer, and the emission layer includes a light-emitting material represented by one of Formulas 1 and 2, and a hole-transporting material represented by one of Formulas 2(1) and 2(2).

Formula 1

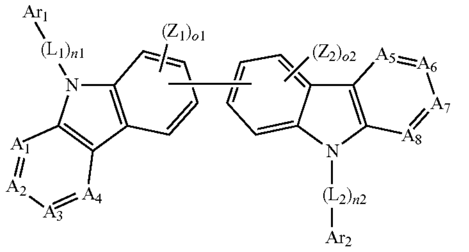

-continued

Formula 2

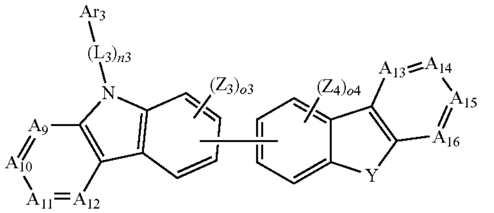

In Formulas 1 and 2, $A_1$ is $CR_1$ or N; $A_2$ is $CR_2$ or N; $A_3$ is $CR_3$ or N; $A_4$ is $CR_4$ or N; $A_5$ is $CR_5$ or N; $A_6$ is $CR_6$ or N; $A_7$ is $CR_7$ or N; $A_8$ is $CR_8$ or N; $A_9$ is $CR_9$ or N; $A_{10}$ is $CR_{10}$ or N; $A_1$ is $CR_{11}$ or N; $A_{12}$ is $CR_{12}$ or N; $A_{13}$ is $CR_{13}$ or N; $A_{14}$ is $CR_{14}$ or N; $A_{15}$ is $CR_{15}$ or N; and $A_{16}$ is $CR_{16}$ or N. $R_1$ to $R_{16}$ are each independently a hydrogen atom, a deuterium atom, a halogen atom, a $C_1$-$C_{60}$ alkyl group, a $C_6$-$C_{60}$ aryl group, a $C_1$-$C_{60}$ heteroaryl group, or —$N(Q_1)(Q_2)(Q_3)$ (where $Q_1$ to $Q_3$ are each independently a $C_1$-$C_{60}$ alkyl group, a $C_6$-$C_{60}$ aryl group, or a $C_1$-$C_{60}$ heteroaryl group). Two or more of $R_1$ to $R_{16}$ may optionally combine to form a $C_6$-$C_{20}$ saturated ring or a $C_6$-$C_{20}$ unsaturated ring. Y is O, S, or $C(R_{31})(R_{32})$.

In Formulas 1 and 2, n1 to n3 are each independently an integer of 0 to 3. $L_1$ to $L_3$ are each independently a substituted or unsubstituted $C_3$-$C_{10}$ cycloalkylene group, a substituted or unsubstituted $C_3$-$C_{10}$ cycloalkenylene group, a substituted or unsubstituted $C_6$-$C_{60}$ arylene group, a substituted or unsubstituted $C_2$-$C_{10}$ heterocycloalkylene group, a substituted or unsubstituted $C_2$-$C_{10}$ heterocycloalkenylene group, or a substituted or unsubstituted $C_1$-$C_{60}$ heteroarylene group.

In Formulas 1 and 2, $Ar_1$ to $Ar_3$ are each independently: i) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_1$-$C_{60}$ heteroaryl group, or —$Si(Q_1)(Q_2)(Q_3)$ (where $Q_1$ to $Q_3$ are each independently a substituted or unsubstituted $C_1$-$C_{10}$ alkyl group or a substituted or unsubstituted $C_6$-$C_{30}$ aryl group); or ii) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_1$-$C_{60}$ heteroaryl group substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, or —$Si(Q_1)(Q_2)(Q_3)$ (where $Q_1$ to $Q_3$ are each independently a substituted or unsubstituted $C_1$-$C_{10}$ alkyl group or a substituted or unsubstituted $C_6$-$C_{30}$ aryl group).

In Formulas 1 and 2, $Z_1$ to $Z_4$, $R_{31}$, and $R_{32}$ are each independently: i) a hydrogen atom, a deuterium atom, a $C_1$-$C_{60}$ alkyl group, a $C_2$-$C_{60}$ alkenyl group, a $C_2$-$C_{60}$ alkynyl group, or a $C_1$-$C_{60}$ alkoxy group; or ii) a $C_1$-$C_{60}$ alkyl group, a $C_2$-$C_{60}$ alkenyl group, a $C_2$-$C_{60}$ alkynyl group, and a $C_1$-$C_{60}$ alkoxy group substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, or a $C_1$-$C_{60}$ heteroaryl group; or iii) a $C_3$-$C_{10}$ cycloalkyl group, $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, or a $C_1$-$C_{60}$ heteroaryl group; or iv) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, or a $C_1$-$C_{60}$ heteroaryl group substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, or a $C_1$-$C_{60}$ heteroaryl group.

In Formulas 1 and 2, o1 to o4 are each independently an integer of 0 to 3.

Formula 2(1)

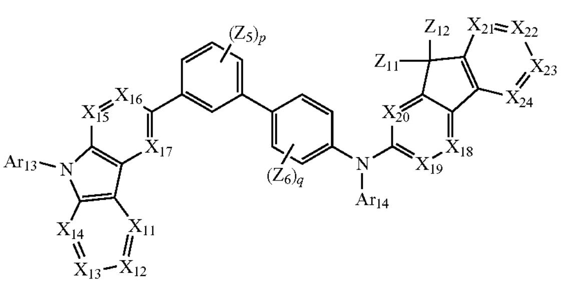

Formula 2(2)

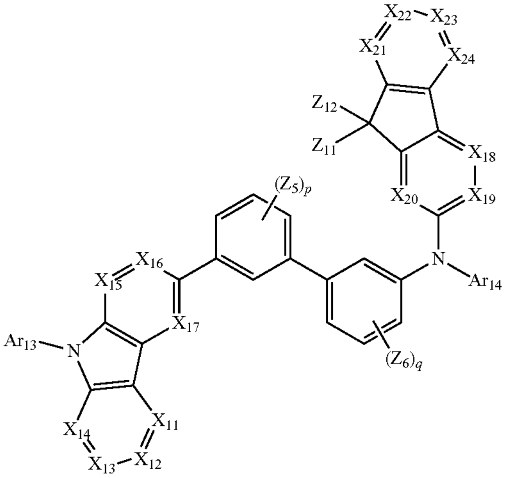

In Formulas 2(1) and 2(2), $X_{11}$ is $CR_{11}$ or N; $X_{12}$ is $CR_{12}$ or N; $X_{13}$ is $CR_{13}$ or N; $X_{14}$ is $CR_{14}$ or N; $X_{15}$ is $CR_{15}$ or N; $X_{16}$ is $CR_{16}$ or N; $X_{17}$ is $CR_{17}$ or N; $X_{18}$ is $CR_{18}$ or N; $X_{19}$ is $CR_{19}$ or N; $X_{20}$ is $CR_{20}$ or N; $X_{21}$ is $CR_{21}$ or N; $X_{22}$ is $CR_{22}$ or N; $X_{23}$ is $CR_{23}$ or N; and $X_{24}$ is $CR_{24}$ or N.

In Formulas 2(1) and 2(2), $Z_5$, $Z_6$, and $R_{11}$ to $R_{24}$ are each independently: i) a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group; or ii) a $C_1$-$C_{60}$ alkyl group, a $C_2$-$C_{60}$ alkenyl group, a $C_2$-$C_{60}$ alkynyl group, or a $C_1$-$C_{60}$ alkoxy group substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, or a $C_1$-$C_{60}$ heteroaryl group; or iii) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, or a $C_1$-$C_{60}$ heteroaryl group; iv) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, or a $C_1$-$C_{60}$ heteroaryl group substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, or a $C_1$-$C_{60}$ heteroaryl group; or v) —$N(Q_{11})(Q_{12})$, —$Si(Q_{13})(Q_{14})(Q_{15})$, or —$B(Q_{16})(Q_{17})$ (where $Q_{11}$ to $Q_{17}$ are each independently a $C_1$-$C_{60}$ alkyl group, a $C_1$-$C_{60}$ alkoxy group, a $C_6$-$C_{60}$ aryl group, or a $C_1$-$C_{60}$ heteroaryl group).

In Formulas 2(1) and 2(2), $Ar_{13}$ and $Ar_{14}$ are each independently: i) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, or a $C_1$-$C_{60}$ heteroaryl group; or ii) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, or a $C_1$-$C_{60}$ heteroaryl group substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, or a $C_1$-$C_{60}$ heteroaryl group.

In Formulas 2(1) and 2(2), p and q are each independently an integer from 1 to 4; and $Z_{11}$ and $Z_{12}$ are each independently: i) a $C_1$-$C_{60}$ alkyl group, a $C_2$-$C_{60}$ alkenyl group, a $C_2$-$C_{60}$ alkynyl group, or a $C_1$-$C_{60}$ alkoxy group; or ii) a $C_1$-$C_{60}$ alkyl group, a $C_2$-$C_{60}$ alkenyl group, a $C_2$-$C_{60}$ alkynyl group, or a $C_1$-$C_{60}$ alkoxy group substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, or a $C_1$-$C_{60}$ heteroaryl group; or iii) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, or a $C_1$-$C_{60}$ heteroaryl group; or iv) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, or a $C_1$-$C_{60}$ heteroaryl group substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, or a $C_1$-$C_{60}$ heteroaryl group.

DETAILED DESCRIPTION OF THE DRAWINGS

Figure 2:
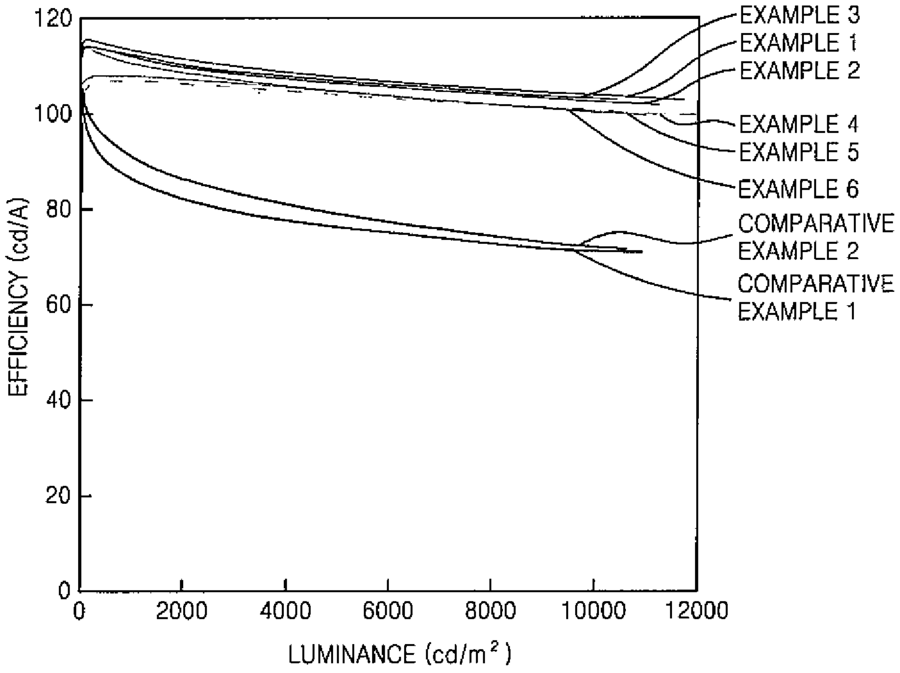
Figure 3:
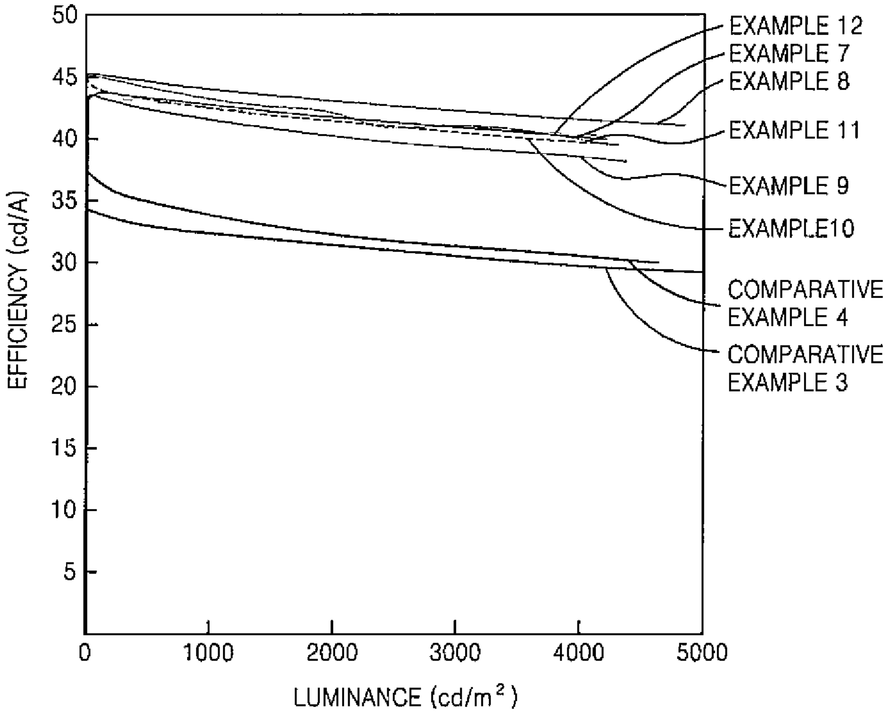

The above and other features and advantages of the present invention will become more apparent by reference to the following detailed description when considered together with the attached drawings in which:

FIG. 1 is a schematic view of a structure of an organic light-emitting device (OLED) according to an embodiment of the present invention;

FIG. 2 is a graph comparing the luminance and efficiency of the OLEDs prepared according to Examples 1-6 to the luminance and efficiency of the OLEDs prepared according to Comparative Examples 1 and 2; and FIG. 3 is a graph comparing the luminance and efficiency of the OLEDs prepared according to Examples 7-12 to the luminance and efficiency of the OLEDs prepared according to Comparative Examples 3 and 4.

DETAILED DESCRIPTION

Reference will now be made to certain embodiments of the present invention, examples of which are illustrated in the accompanying drawings, where like reference numerals refer to like elements throughout. As those skilled in the art would recognize, the described embodiments may be modified in many ways, and therefore should not be construed as limiting. Accordingly, the embodiments are described below, by referring to the figures, merely to explain aspects of the present disclosure.

As used herein, the term "and/or" includes any and all combinations of one or more of the associated listed items. Expressions such as "at least one of," when preceding a list of elements, modify the entire list of elements and do not modify the individual elements of the list. Also, in the context of the present application, when a first element is referred to as being "on" a second element, it can be directly on the second element or be indirectly on the second element with one or more intervening elements therebetween.

FIG. 1 is a cross-sectional view schematically illustrating a structure of an organic light-emitting device (OLED) 10 according to an embodiment of the present invention. The OLED 10 includes a substrate 11, a first electrode 13, an organic layer 15, and a second electrode 17. Hereinafter, structures and methods of manufacturing OLEDs according to embodiments of the present invention will be described with reference to FIG. 1.

A substrate 11 may be any suitable substrate commonly used in OLEDs. In some embodiments, the substrate 11 may be a glass substrate or a transparent plastic substrate with mechanical strength, thermal stability, transparency, surface smoothness, ease of handling, and water resistance.

A first electrode 13 may be formed on the substrate 11 by depositing or sputtering a first electrode-forming material. When the first electrode 13 is an anode, a material having a high work function may be used as the first electrode-forming material to facilitate hole injection. The first electrode 13 may be a reflective electrode or a transmission electrode (e.g., a transparent electrode). Non-limiting examples of the first electrode-forming material include transparent and conductive materials, such as indium tin oxide (ITO), indium zinc oxide (IZO), stannic oxide ($SnO_2$), and zinc oxide (ZnO). Alternatively, the first electrode 13 may be formed as a reflective electrode using magnesium (Mg), aluminum (Al), aluminum-lithium (Al—Li), calcium (Ca), magnesium-indium (Mg—In), or magnesium-silver (Mg—Ag).

The first electrode 13 may have a single-layer structure or a multi-layer structure including at least two layers. For example, the first electrode 13 may have a three-layer structure of ITO/Ag/ITO, but is not limited thereto.

An organic layer 15 may be disposed on the first electrode 13. The organic layer 15 may include a plurality of layers between the first electrode 13 and the second electrode 17 in the OLED 10. The organic layer 15 may include an emission layer (EML) and at least one additional layer, such as a hole injection layer (HIL), a hole transport layer (HTL), a functional layer having both hole injection and hole transport capabilities (hereinafter, referred to as a "H-functional layer"), a buffer layer, an electron blocking layer (EBL), a hole blocking layer (HBL), an electron transport layer (ETL), an electron injection layer (EIL), and/or a functional layer having both electron injection and transport capabilities (hereinafter, referred to as an "E-functional layer"). In some embodiments, the organic layer 15 may include, in sequential order, an HIL, an HTL, a buffer layer, an EML, an ETL, and an EIL.

In some embodiments, for example, the organic layer 15 includes an emission layer (EML), and a hole-transporting region is disposed between the first electrode and the emission layer. The hole-transporting region may include a hole transport layer and a buffer layer, and the buffer layer may be disposed between the hole transport layer and the emission layer.

The HIL may be formed on the first electrode 13 by various methods, such as vacuum deposition, spin coating, casting, and Langmuir-Blodgett (LB) deposition. When the HIL is formed by vacuum deposition, the vacuum deposition conditions may vary depending on the compound used to form the HIL, and the desired structural and thermal properties of the HIL to be formed. For example, the vacuum deposition may be performed at a temperature of about 100° C. to about 500° C., a pressure of about $10^{-8}$ torr to about $10^{-3}$ torr, and a deposition rate of about 0.01 Å/sec to about 100 Å/sec. However, the deposition conditions are not limited thereto.

When the HIL is formed by spin coating, spin coating conditions may vary depending on a compound used to form the HIL, and desired structural and thermal properties of the HIL to be formed. For example, the spin coating may be performed at a coating rate of about 2,000 rpm to about 5,000 rpm, and the temperature at which heat treatment is performed to remove solvent after coating may be about 80° C. to about 200° C. However, the spin coating conditions are not limited thereto.

The HIL may be formed of any suitable hole-injecting material commonly used to form an HIL. Non-limiting examples of the hole-injecting material include N,N'-diphenyl-N,N'-bis-[4-(phenyl-m-tolyl-amino)-phenyl]-biphenyl-4,4'-diamine (DNTPD), a phthalocyanine compound such as copper phthalocyanine, 4,4',4"-tris(3-methylphenylphenylamino)triphenylamine (m-MTDATA), N,N'-di(1-naphthyl group-N,N'-diphenylbenzidine) (NPB), TDATA, 2-TNATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), and polyaniline/poly(4-styrenesulfonate) (Pani/PSS.

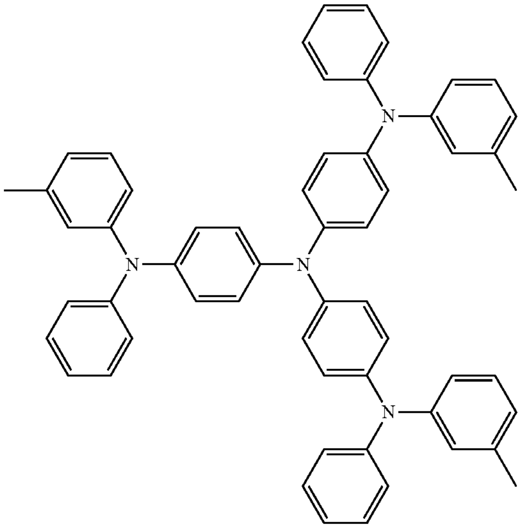

m-MTDATA

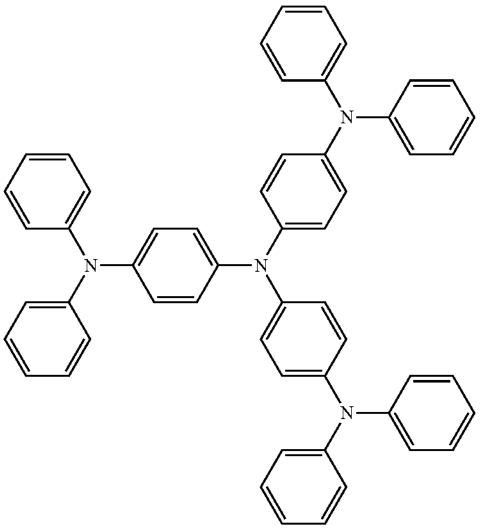

TDATA

-continued

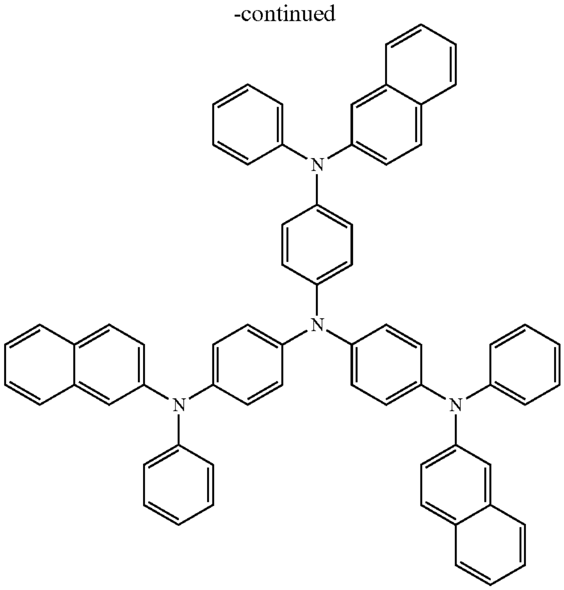

2-TNATA

The thickness of the HIL may be about 100 Å to about 10,000 Å, for example, about 100 Å to about 1,000 Å. When the thickness of the HIL is within either of the foregoing ranges, the HIL may have satisfactory hole injection ability without a substantial increase in driving voltage.

Then, an HTL may be formed on the HIL by various methods, such as vacuum deposition, spin coating, casting, and LB deposition. When the HTL is formed by vacuum deposition or spin coating, the vacuum deposition conditions or spin coating conditions may be similar to those described above for the formation of the HIL, though the conditions may vary depending on the compound used to form the HTL. The HTL may include at least one hole-transporting material represented by one of Formulas 2(1) and 2(2). Additionally, in embodiments including a hole-transport region comprising a hole transport layer and a buffer layer disposed between the first electrode and the emission layer, the buffer layer and/or the hole transport layer may include at least one hole-transporting material represented by one of Formulas 2(1) and 2(2).

Formula 2(1)

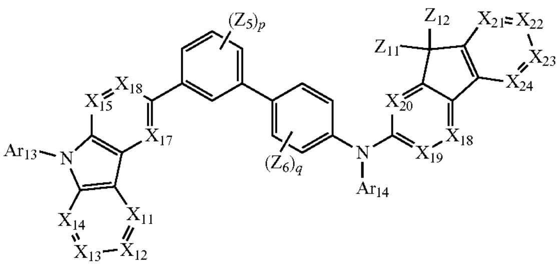

-continued

Formula 2(2)

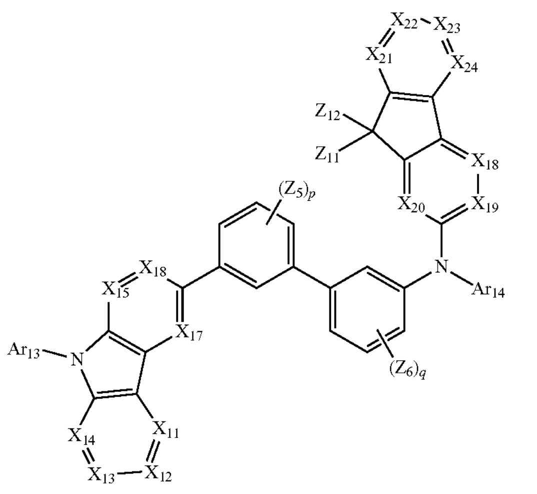

In Formula 2(1) and Formula 2(2), $X_{11}$ may be $CR_{11}$ or N; $X_{12}$ may be $CR_{12}$ or N; $X_{13}$ may be $CR_{13}$ or N; $X_{14}$ may be $CR_{14}$ or N; $X_{15}$ may be $CR_{15}$ or N; $X_{16}$ may be $CR_{16}$ or N; $X_{17}$ may be $CR_{17}$ or N; $X_{18}$ may be $CR_{18}$ or N; $X_{19}$ may be $CR_{19}$ or N; $X_{20}$ may be $CR_{20}$ or N; $X_{21}$ may be $CR_{21}$ or N; $X_{22}$ may be CR22 or N; $X_{23}$ may be $CR_{23}$ or N; and $X_{24}$ may be $CR_{24}$ or N.

For example, in Formula 2(1) or Formula 2(2), $X_{11}$ may be $C(R_{11})$, $X_{12}$ may be $C(R_{12})$, X13 may be $C(R_{13})$, X14 may be $C(R_{14})$, $X_{15}$ may be $C(R_{15})$, $X_{16}$ may be $C(R_{16})$, $X_{17}$ may be $C(R_{17})$, $X_{18}$ may be $C(R_{18})$, $X_{19}$ may be $C(R_{19})$, $X_{20}$ may be $C(R_{20})$, $X_{21}$ may be $C(R_{21})$, $X_{22}$ may be $C(R_{22})$, $X_{23}$ may be $C(R_{23})$, and $X_{24}$ may be $C(R_{24})$, but Formulas 2(1) and 2(2) are not limited thereto.

In some embodiments, in Formula 2(1) or Formula 2(2), $Ar_{13}$ and $Ar_{14}$ may each independently be: i) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, or a $C_2$-$C_{60}$ heteroaryl group; or ii) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, or a $C_1$-$C_{60}$ heteroaryl group substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, or a $C_1$-$C_{60}$ heteroaryl group.

In some embodiments, in Formula 2(1) or Formula 2(2), $Ar_{13}$ and $Ar_{14}$ may each independently be: i) a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthryl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoxazolyl group, a benzimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a benzoxazolyl group, a dibenzofuranyl group, a dibenzothiophenyl group, or a benzocarbazolyl group; or ii) a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthryl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quiniolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoxazolyl group, a benzimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolylene group, a tetrazolyl group, an oxadiazolyl group, a triazinyl group, a benzoxazolyl group, a dibenzofuranyl group, a dibenzothiophenyl group, or a benzocarbazolyl group substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_6$-$C_{20}$ aryl group, or a $C_1$-$C_{20}$ heteroaryl group. However, $Ar_{13}$ and $Ar_{14}$ are not limited thereto.

In some other embodiments, in Formula 2(1) or Formula 2(2), $Ar_{13}$ and $Ar_{14}$ may each independently be: i) a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, or a triazinyl group; or ii) a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, or a triazinyl group substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, or a triazinyl group. However, $Ar_{13}$ and $Ar_{14}$ are not limited thereto.

In some other embodiments, in Formula 2(1) or Formula 2(2), $Ar_{13}$ and $Ar_{14}$ may each independently be represented by one of Formulas 3-1 to 3-20, but $Ar_{13}$ and $Ar_{14}$ are not limited thereto. When $Ar_{13}$ and/or $Ar_{14}$ are represented by one of Formulas 3-1 to 3-20, * represents a binding site to N.

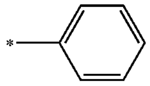

3-1

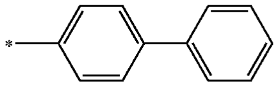

3-2

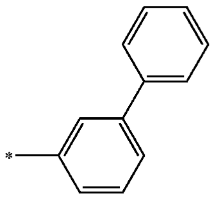

3-3

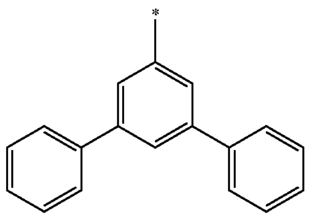

3-4

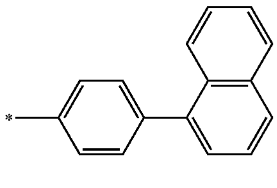

3-5

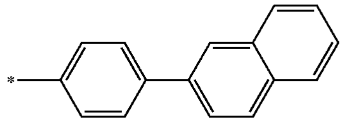

3-6

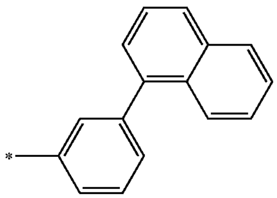

3-7

-continued

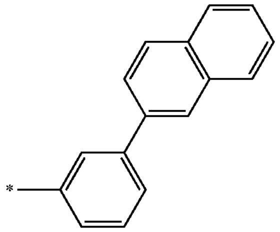

3-8

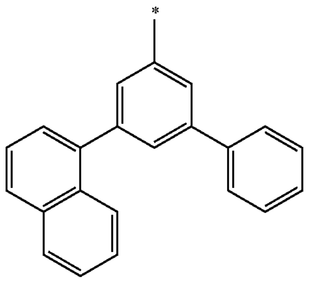

3-9

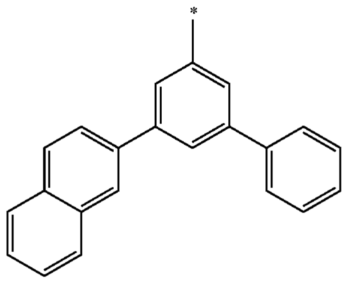

3-10

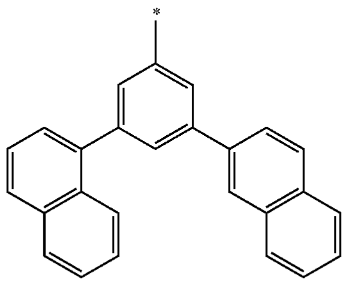

3-11

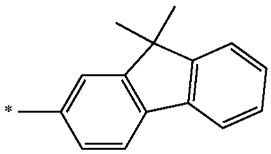

3-12

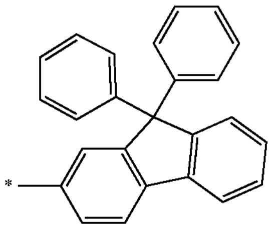

3-13

-continued 3-14

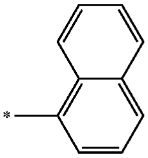

3-15

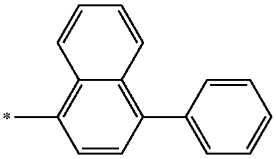

3-16

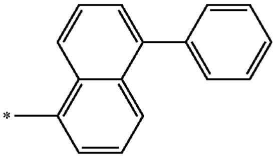

3-17

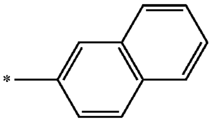

3-18

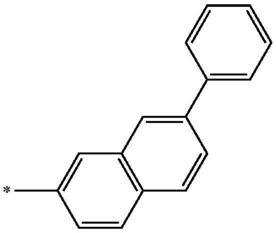

3-19

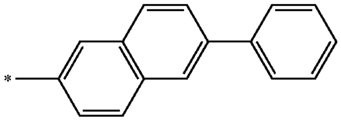

3-20

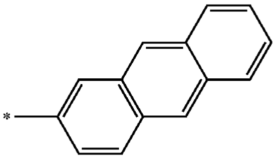

In Formula 2(1) or Formula 2(2), $Z_{11}$ and $Z_{12}$ may each independently be: i) a $C_1$-$C_{60}$ alkyl group, a $C_2$-$C_{60}$ alkenyl group, a $C_2$-$C_{60}$ alkynyl group, or a $C_1$-$C_{60}$ alkoxy group; or ii) a $C_1$-$C_{60}$ alkyl group, a $C_2$-$C_{60}$ alkenyl group, a $C_2$-$C_{60}$ alkynyl group, or a $C_1$-$C_{60}$ alkoxy group substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, or a $C_1$-$C_{60}$ heteroaryl group; or iii) a $C_3$-$C_{10}$ cycloalkyl group, a $C_3$-$C_{10}$ heterocycloalkyl group, a $C_3$-$C_{60}$ cycloalkenyl group, a $C_3$-$C_{10}$ heterocycloalkenyl group, a $C_6$-$C_{60}$ aryl group, or a $C_1$-$C_{60}$ heteroaryl group; or iv) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, or a $C_1$-$C_{60}$ heteroaryl group substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, or a $C_1$-$C_{60}$ heteroaryl group.

In some embodiments, in Formula 2(1) or Formula 2(2), $Z_{11}$ and $Z_{12}$ may each independently be: i) a $C_1$-$C_{20}$ alkyl group; or ii) a $C_1$-$C_{20}$ alkyl group that is substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, or a triazinyl group; or iii) a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, or a triazinyl group; or iv) a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, or a triazinyl group substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, or a triazinyl group. However, $Z_{11}$ and $Z_{12}$ are not limited thereto.

In some other embodiments, in Formula 2(1) or Formula 2(2), $Z_{11}$ and $Z_{12}$ may each independently be a methyl group, an ethyl group, a propyl group, a butyl group, a pentyl group, a hexyl group, a heptyl group. For example, $Z_{11}$ and $Z_{12}$ may each independently be a moiety represented by one of Formulas 3-1 to 3-20, but $Z_{11}$ and $Z_{12}$ are not limited thereto. When $Z_{11}$ and/or $Z_{12}$ are represented by Formulas 3-1 to 3-20, * represents a carbon atom of a fluorene-based ring of Formula 2(1) or Formula 2(2).
3-1
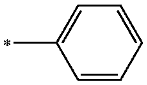
3-2
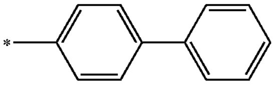
3-3
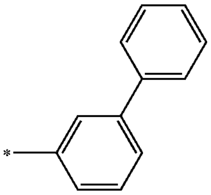
3-4
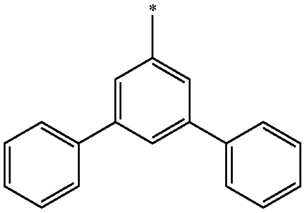
3-5
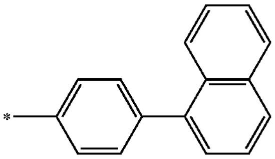
3-6
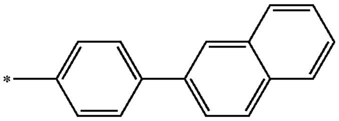
3-7
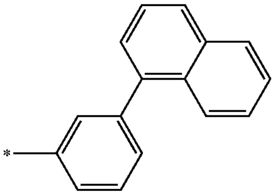
3-8
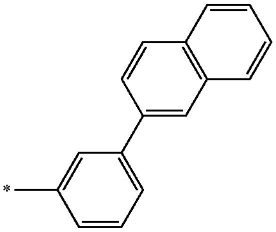
-continued
3-9
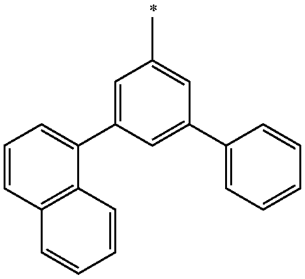
3-10
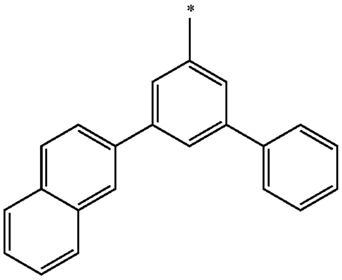
3-11
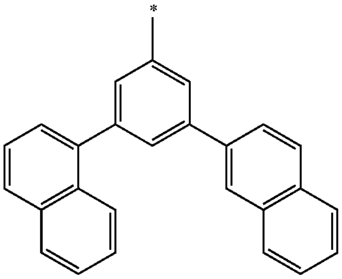
3-12
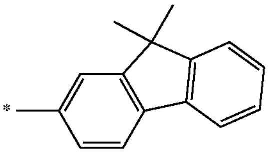
3-13
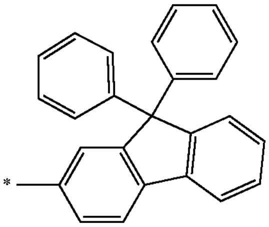
3-14
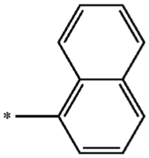
3-15
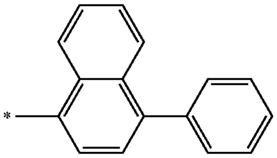

-continued 3-16

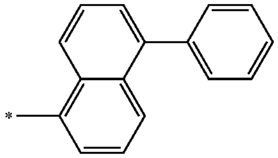

3-17

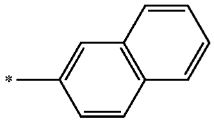

3-18

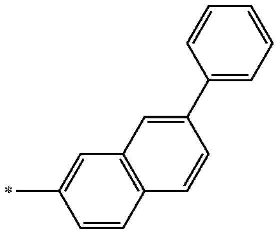

3-19

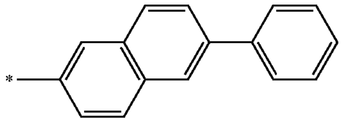

3-20

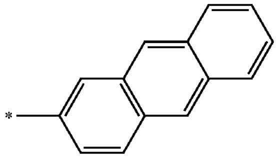

In Formula 2(1) or Formula 2(2), $Z_5$, $Z_6$, and $R_{11}$ to $R_{24}$ may each independently be: i) a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group; or ii) a $C_1$-$C_{60}$ alkyl group, a $C_2$-$C_{60}$ alkenyl group, a $C_2$-$C_{60}$ alkynyl group, or a $C_1$-$C_{60}$ alkoxy group substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, or a $C_1$-$C_{60}$ heteroaryl group; or iii) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, or a $C_1$-$C_{60}$ heteroaryl group; or iv) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, or a $C_1$-$C_{60}$ heteroaryl group substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{10}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, or a $C_1$-$C_{60}$ heteroaryl group; or v) —N($Q_{11}$)($Q_{12}$), —Si($Q_{13}$)($Q_{14}$)($Q_{15}$), or —B($Q_{16}$)($Q_{17}$) (where $Q_{11}$ to $Q_{17}$ are each independently a $C_1$-$C_{60}$ alkyl group, a $C_1$-$C_{60}$ alkoxy group, a $C_6$-$C_{60}$ aryl group, or a $C_1$-$C_{60}$ heteroaryl group). However, $Z_5$, $Z_6$, and $R_{11}$ to $R_{24}$ are not limited thereto.

In some embodiments, in Formula 2(1) or Formula 2(2), $Z_5$, $Z_6$, and $R_{11}$ to $R_{24}$ may each independently be: i) a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, or a $C_1$-$C_{20}$ alkyl group; or ii) a $C_1$-$C_{20}$ alkyl group that is substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, or a triazinyl group; or iii) a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, or a triazinyl group; or iv) a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, or a triazinyl group substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, or a triazinyl group. However, $Z_5$, $Z_6$, and $R_{11}$ to $R_{24}$ are not limited thereto.

In some other embodiments, in Formula 2(1) or Formula 2(2), $Z_5$, $Z_6$, and $R_{11}$ to $R_{24}$ may each independently be a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, or a $C_1$-$C_{20}$ alkyl group. However, $Z_5$, $Z_6$, and $R_{11}$ to $R_{24}$ are not limited thereto.

In some other embodiments, in Formula 2(1) or Formula 2(2), $Z_5$, $Z_6$, and $R_{11}$ to $R_{24}$ may each independently be a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a methyl group, an ethyl group, a propyl group, a butyl group, a pentyl group, a hexyl group, a heptyl group, or a compound represented by one of Formulas 3-1 to 3-20. However, $Z_5$, $Z_6$, and $R_{11}$ to $R_{24}$ are not limited thereto.

3-1

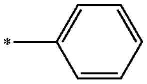

3-2

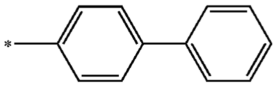

3-3

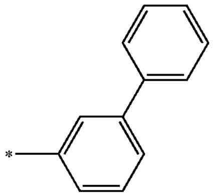

3-4

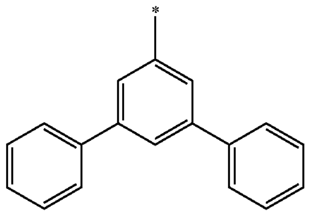

3-5

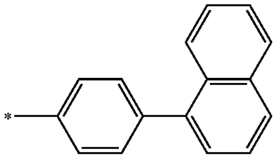

3-6

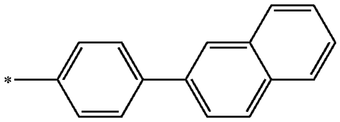

3-7

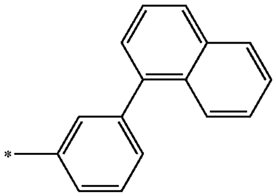

-continued 3-8

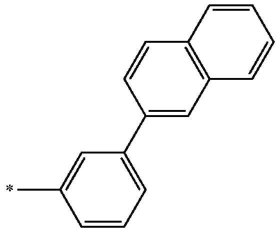

3-9

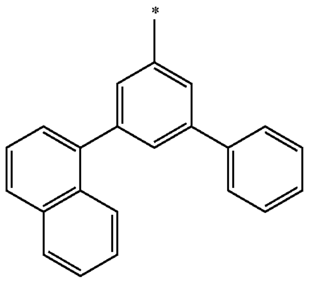

3-10

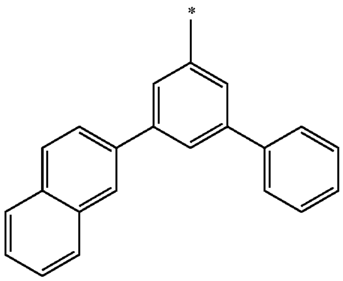

3-11

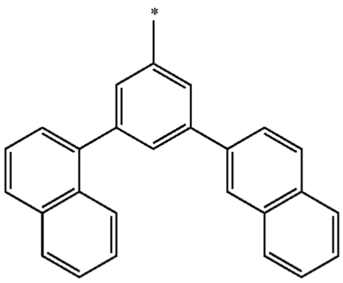

3-12

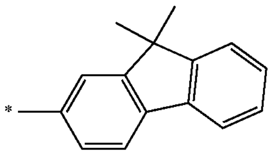

3-13

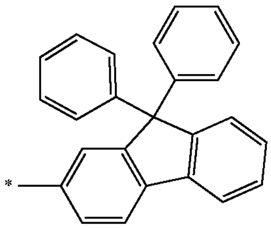

-continued 3-14

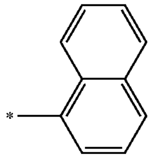

3-15

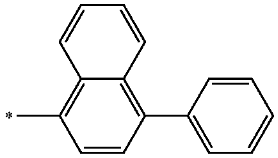

3-16

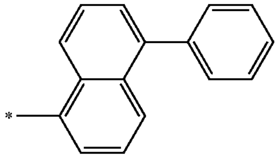

3-17

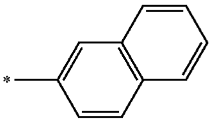

3-18

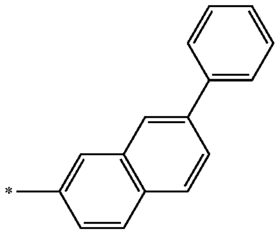

3-19

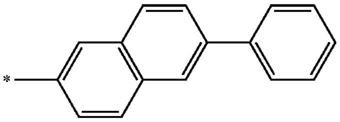

3-20

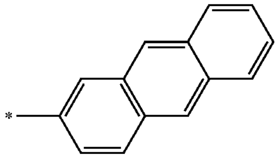

In Formula 2(1) and Formula 2(2), p indicates the number of $Z_5$s, and is an integer of 1 to 4. When p is 2 or greater, the $Z_5$s may be identical to or different from each other. In Formula 2(1) or Formula 2(2), q indicates the number of $Z_6$s, and is an integer from 1 to 4. When q is 2 or greater, the $Z_6$s may be identical to or different from each other.

According to an embodiment of the present invention, the hole-transporting material may be represented by one of Formulas 2A and 2B, but the hole-transporting material is not limited thereto.

Formula 2A

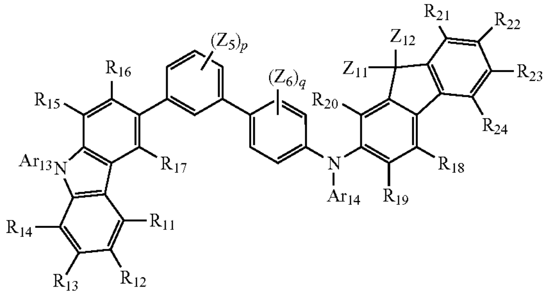

Formula 2B

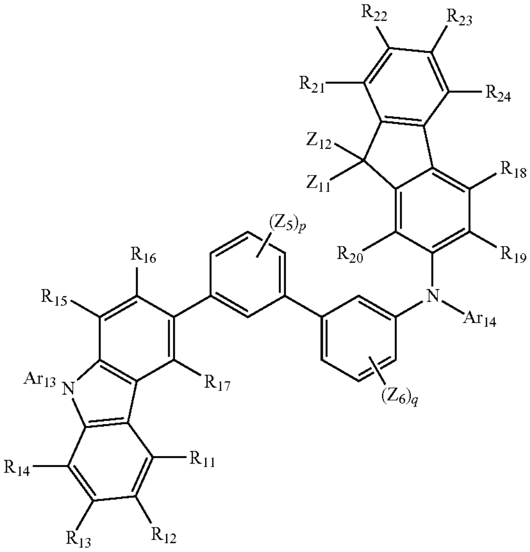

In Formula 2A and Formula 2B, p and q are each independently an integer of 1 to 4, and $Ar_{13}$ and $Ar_{14}$ may each independently be represented by one of Formulas 3-1 to 3-20; $Z_{11}$ and $Z_{12}$ may each independently be represented by a $C_1$-$C_{20}$ alkyl group or one of Formulas 3-1 to 3-20.

3-1

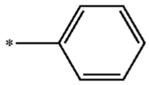

3-2

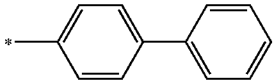

3-3

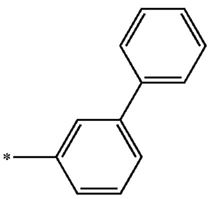

-continued
3-4
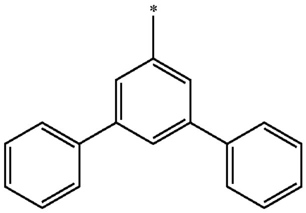
3-5
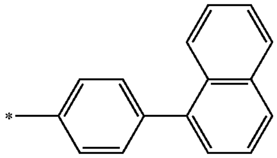
3-6
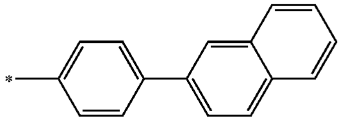
3-7
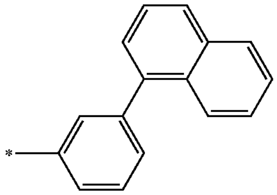
3-8
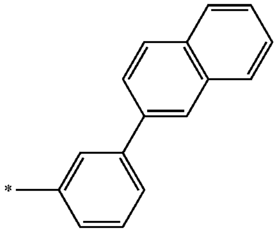
3-9
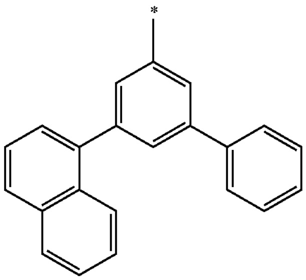
3-10
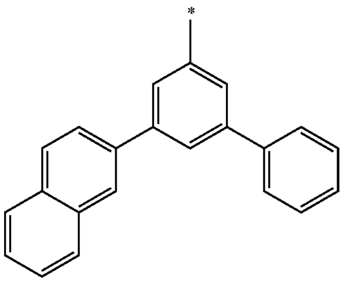
-continued
3-11
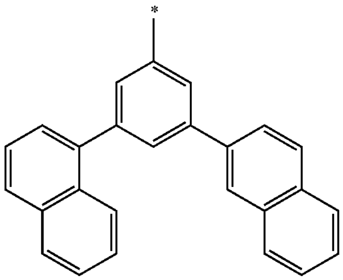
3-12
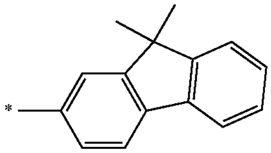
3-13
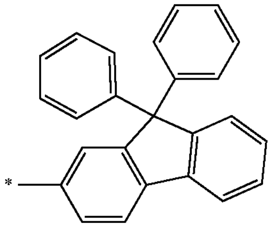
3-14
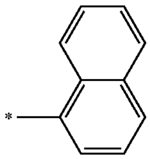
3-15
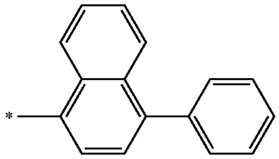
3-16
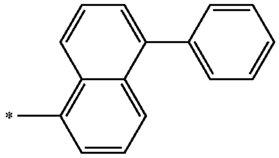
3-17
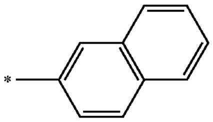
3-18
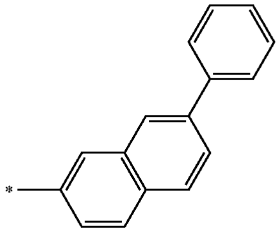

-continued 3-19

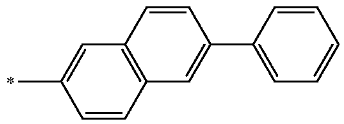

3-20

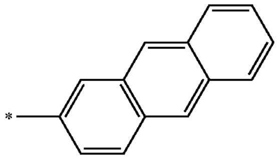

In Formula 2A and Formula 2B, $Z_5$, $Z_6$, and $R_{11}$ to $R_{24}$ may each independently be a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, or a group represented by one of Formulas 3-1 to 3-20.

3-1

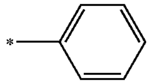

3-2

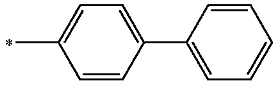

3-3

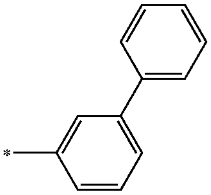

3-4

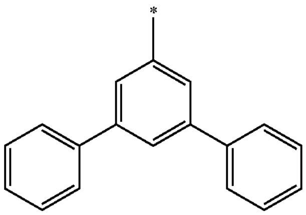

3-5

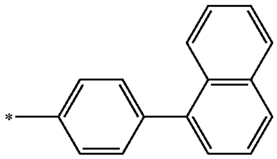

3-6

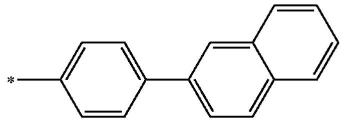

-continued 3-7

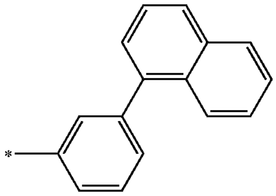

3-8

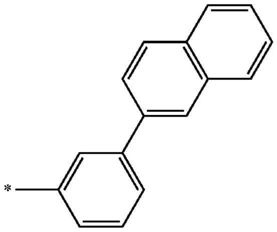

3-9

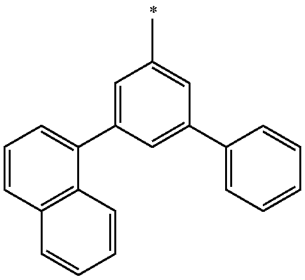

3-10

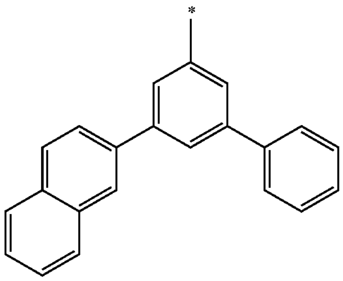

3-11

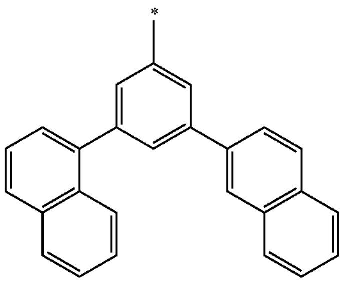

3-12

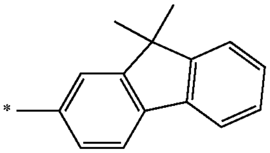

-continued
3-13
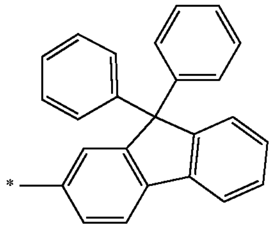
3-14
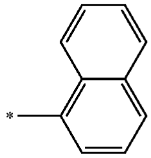
3-15
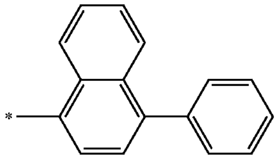
3-16
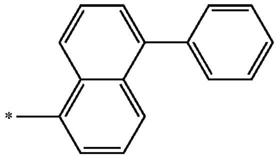
3-17
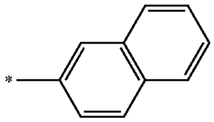
3-18
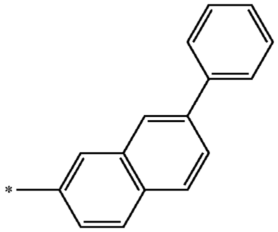
3-19
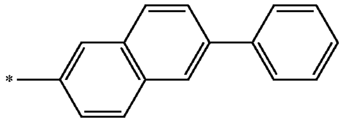
3-20
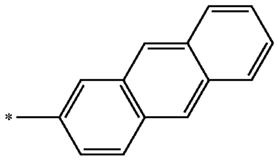
In some other embodiments, the hole-transporting material may be at least one of Compounds 6-1 to 6-144, but the hole-transporting material is not limited thereto.
6-1
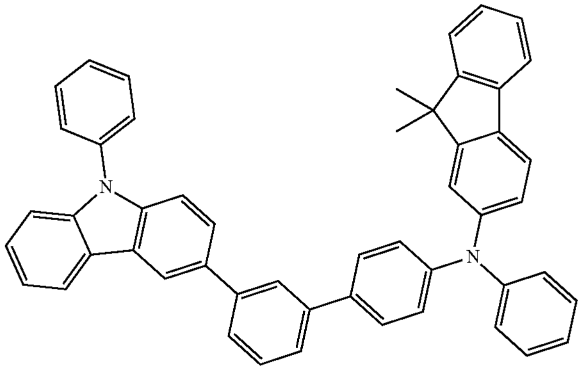
6-2
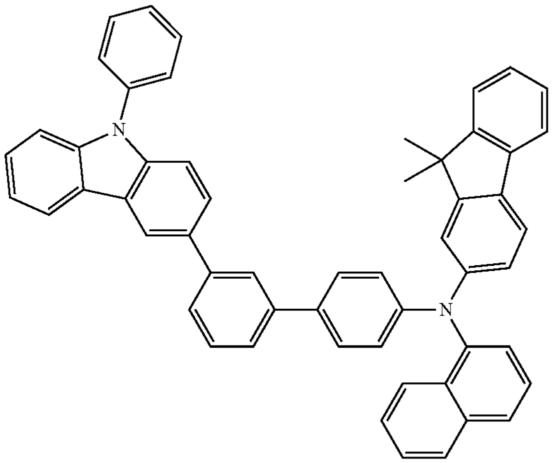
6-3
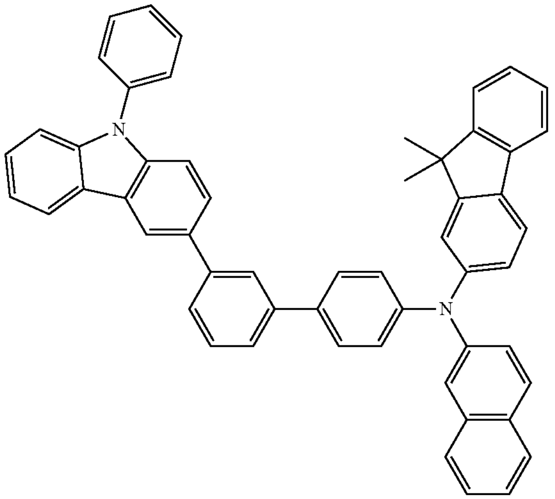

-continued
6-4
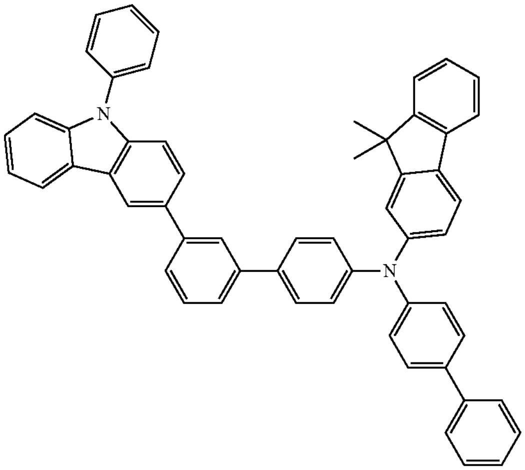
6-5
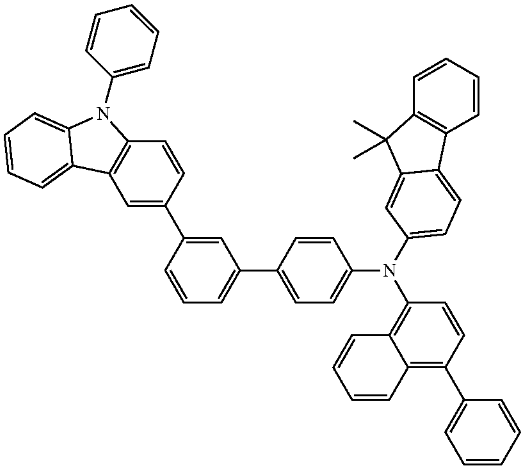
6-6
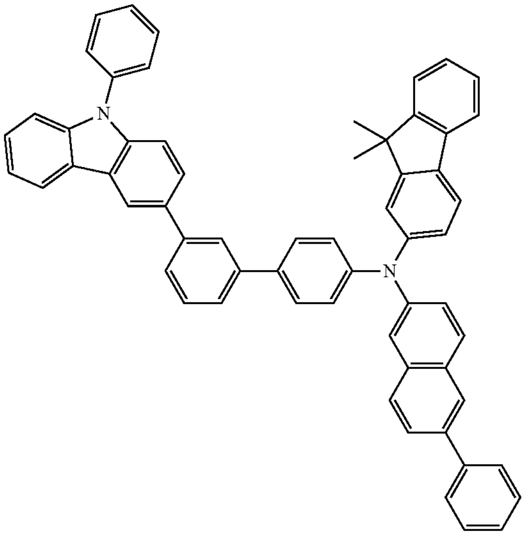
-continued
6-7
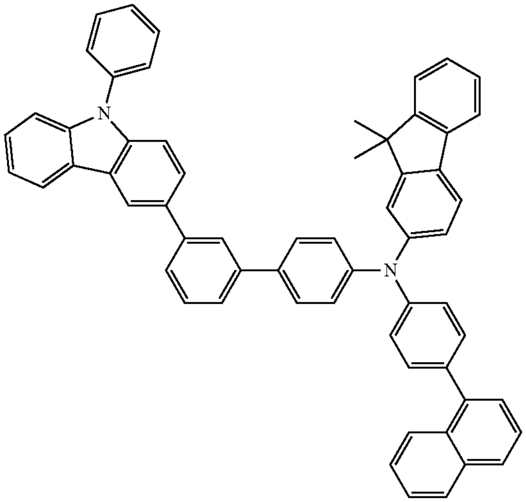
6-8
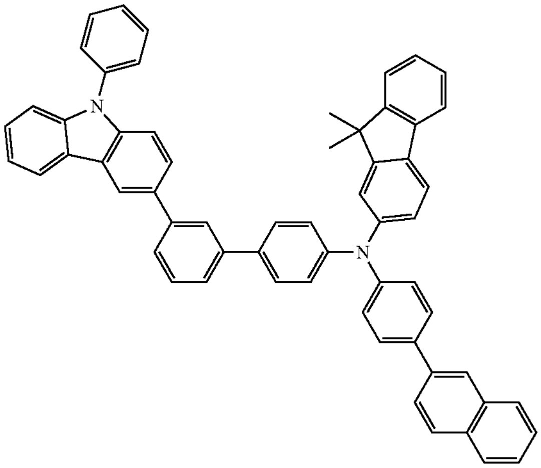
6-9
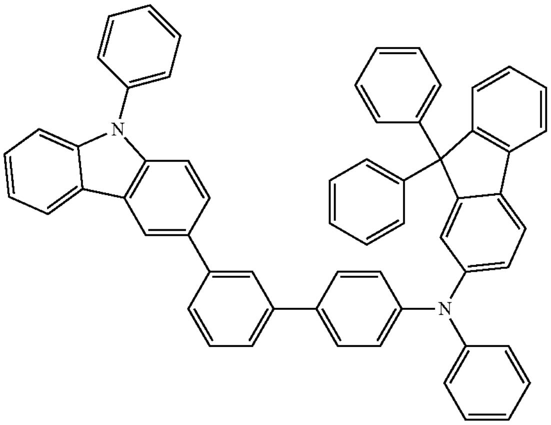

-continued
6-10
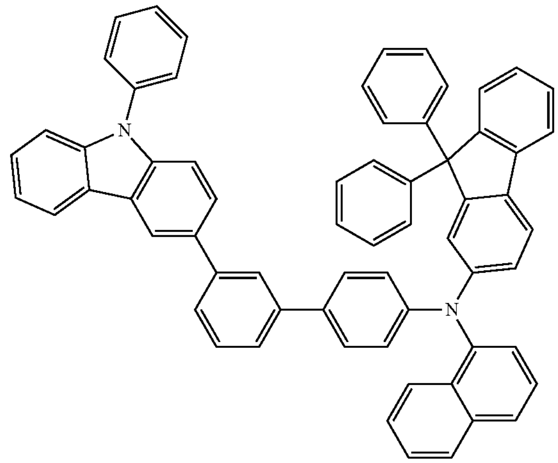
6-11
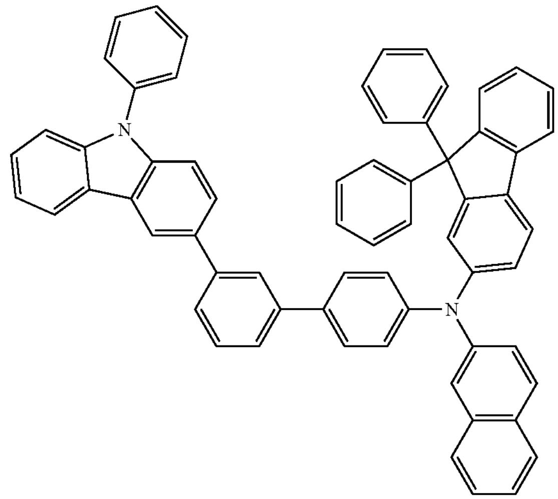
6-12
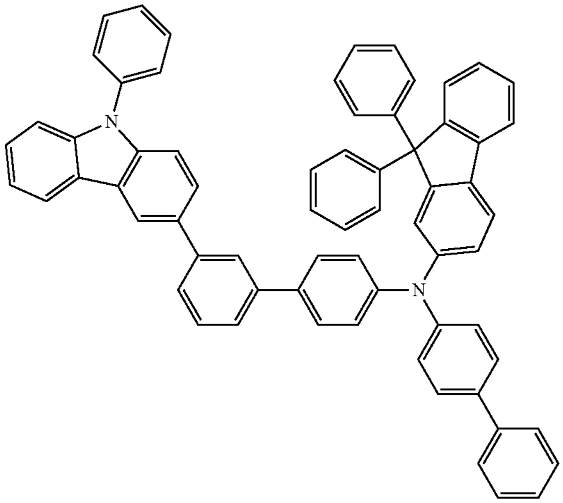
-continued
6-13
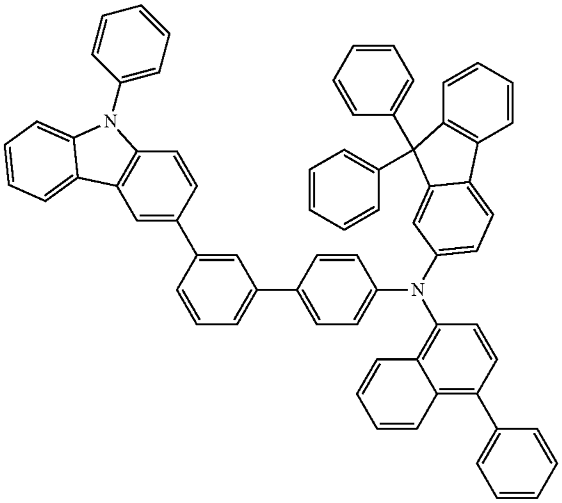
6-14
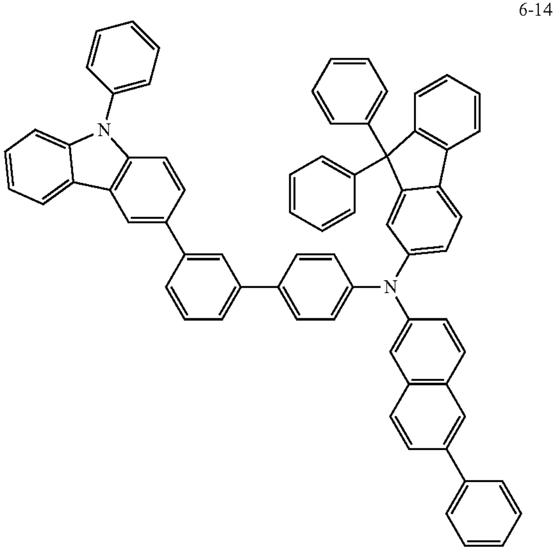
6-15
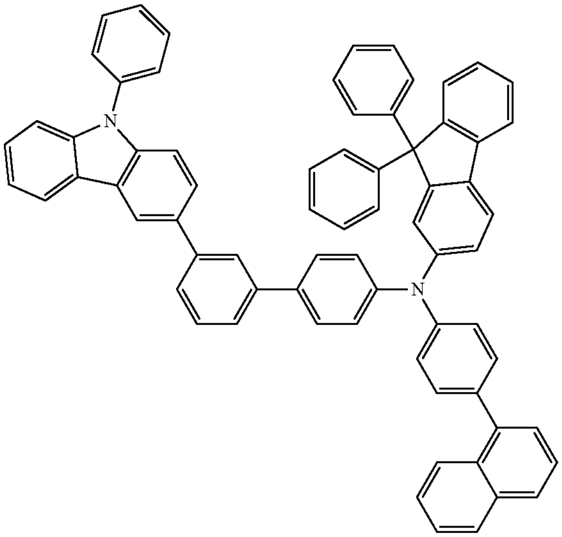

-continued
6-16
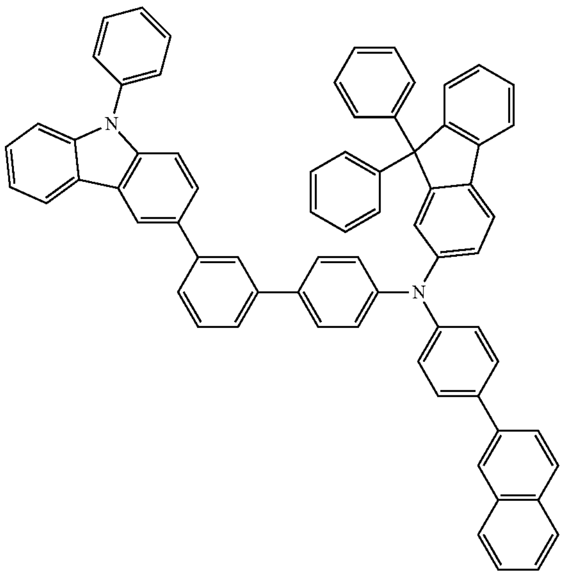
6-17
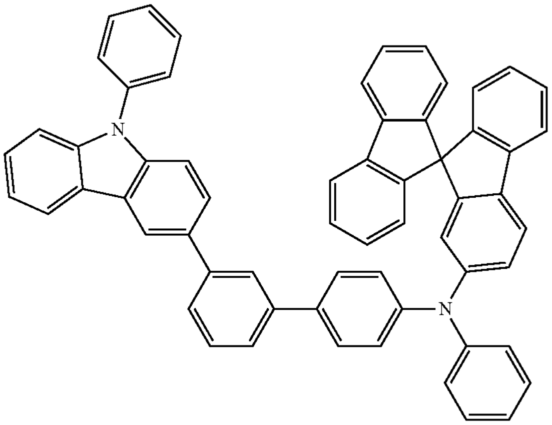
6-18
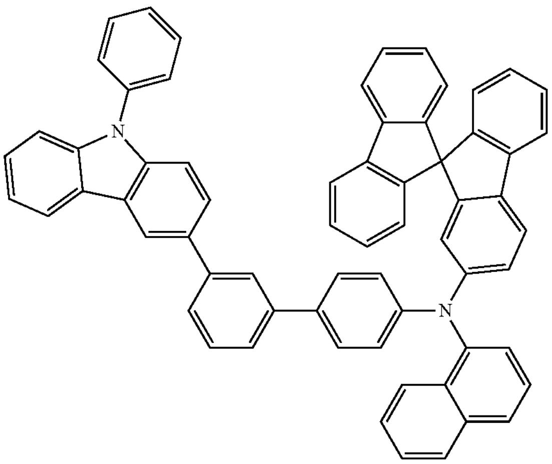
-continued
6-19
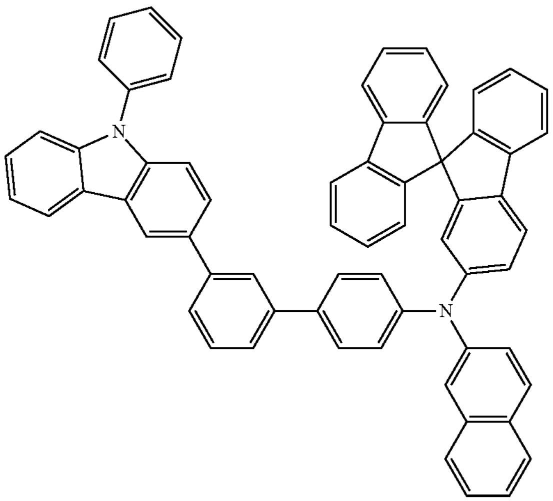
6-20
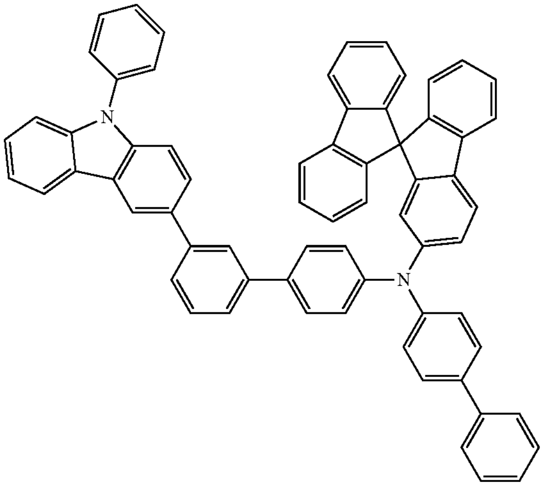
6-21
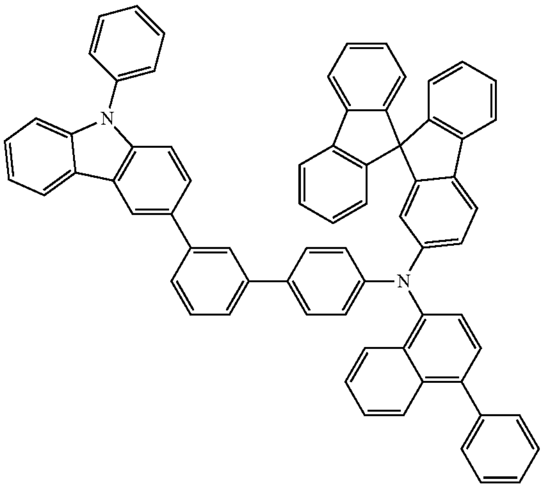

-continued
6-22
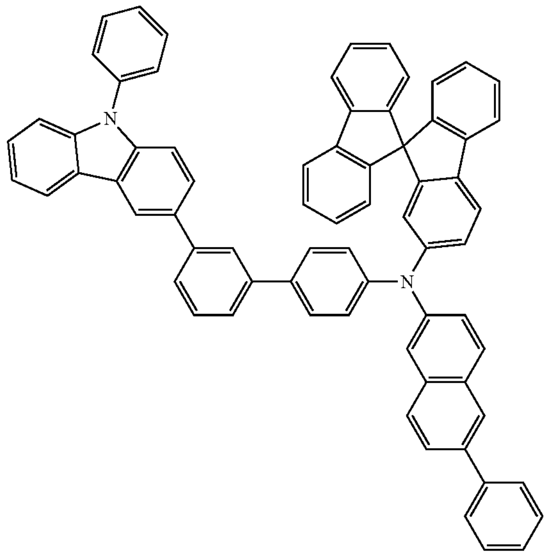
6-23
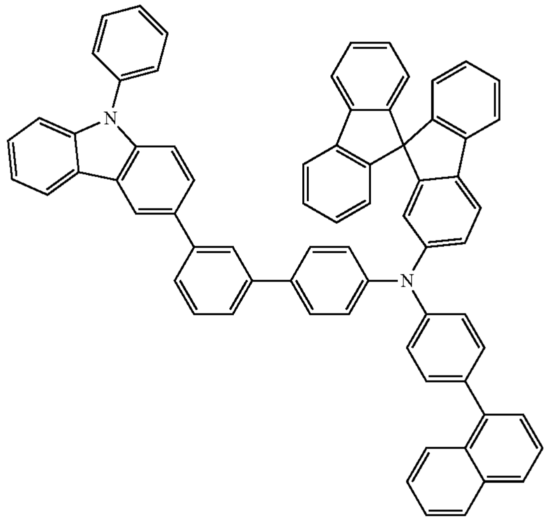
6-24
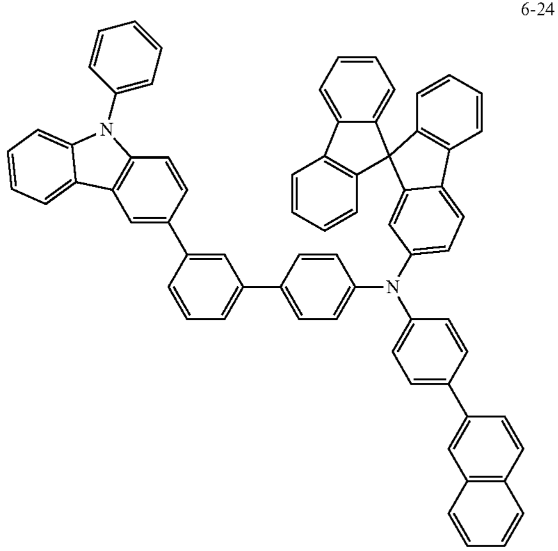
-continued
6-25
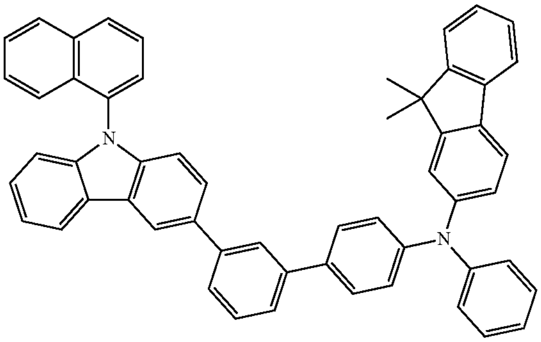
6-26
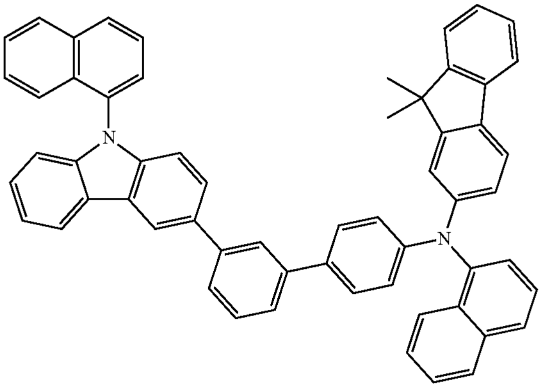
6-27
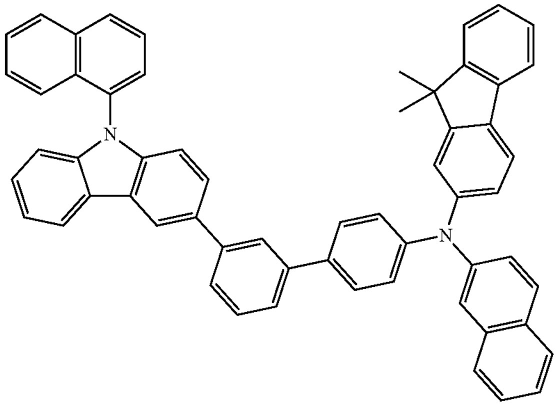
6-28
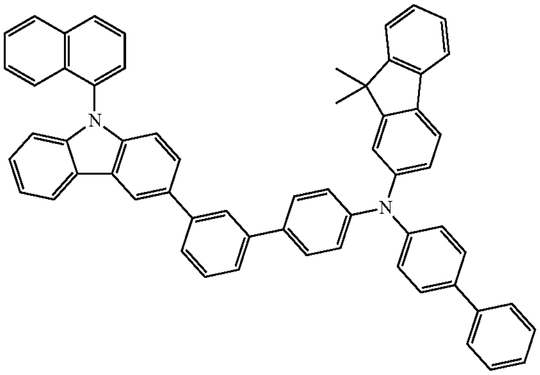

-continued
6-29
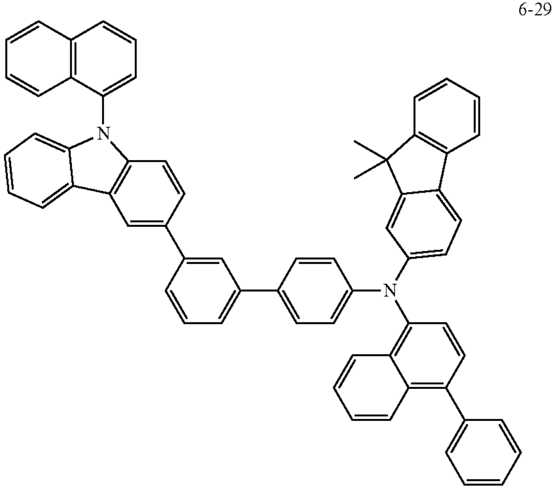
6-30
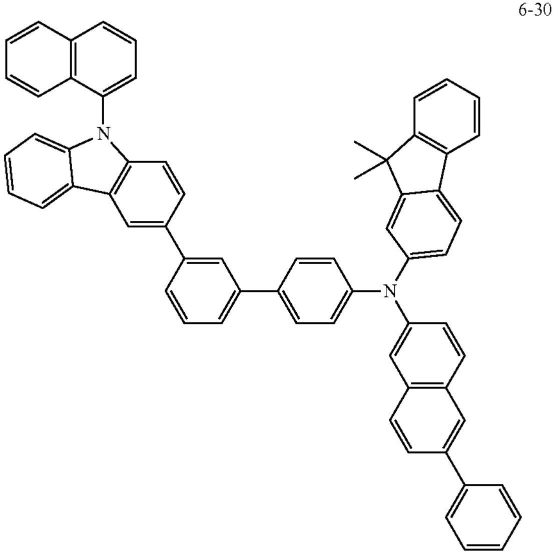
6-31
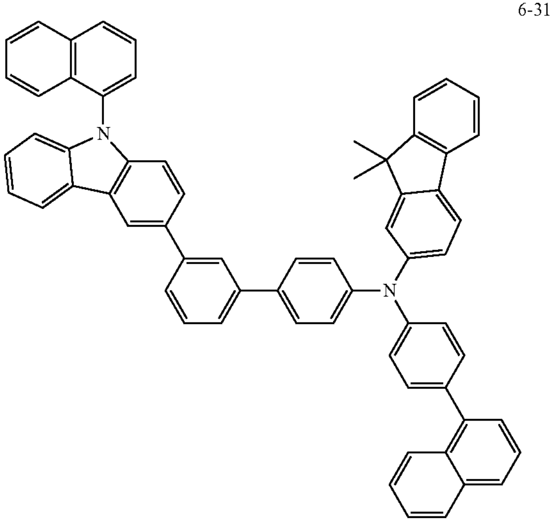
-continued
6-32
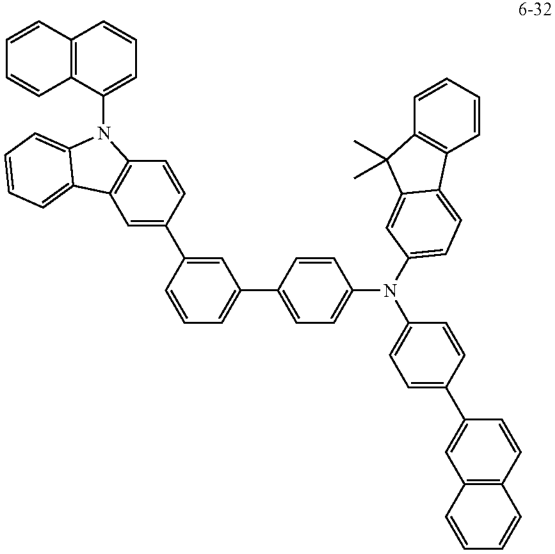
6-33
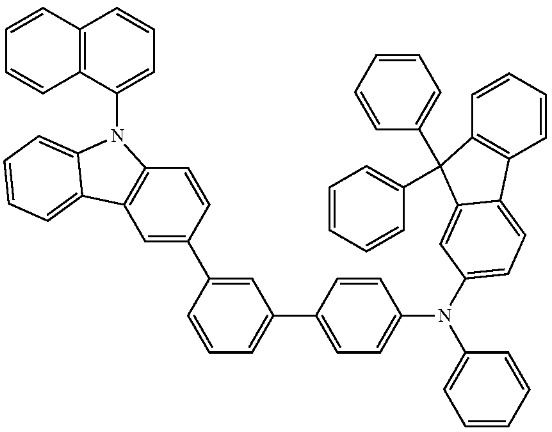
6-34
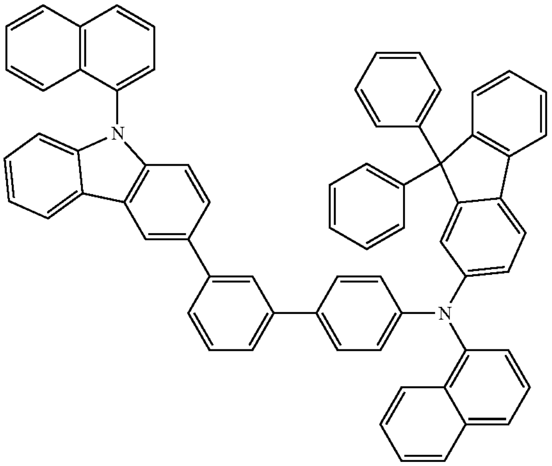

-continued
6-35
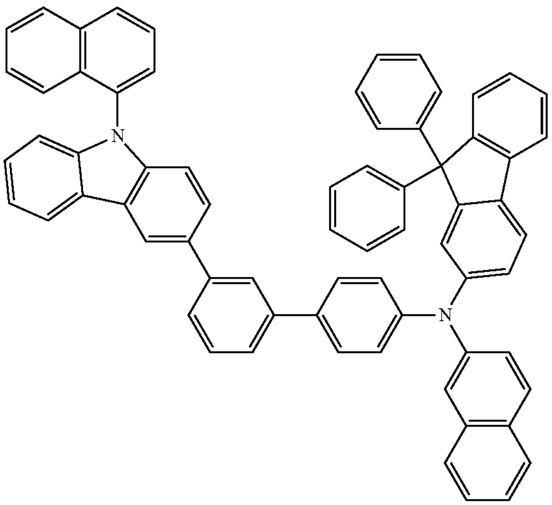
6-36
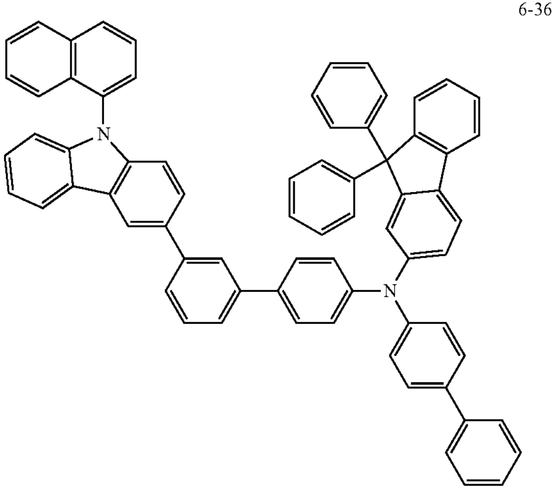
6-37
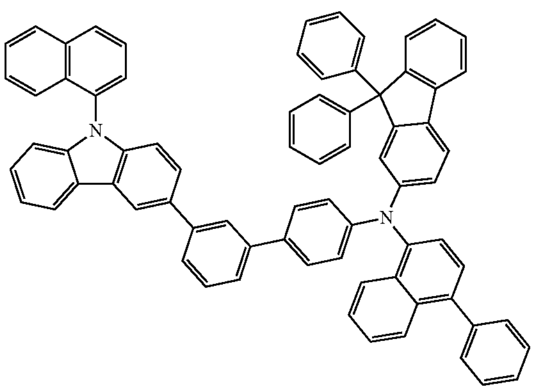
-continued
6-38
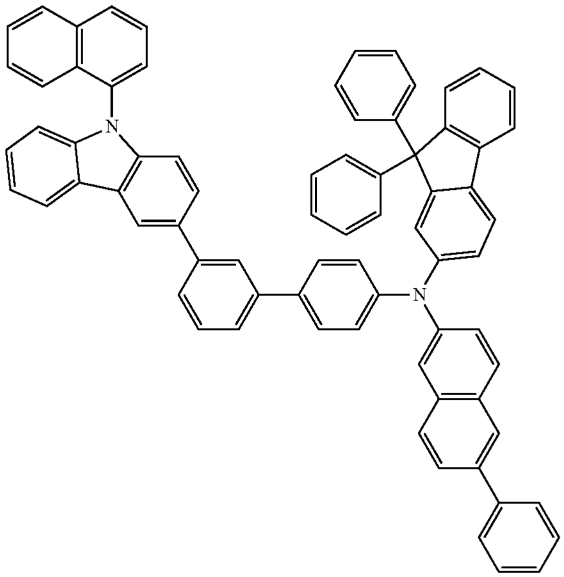
6-39
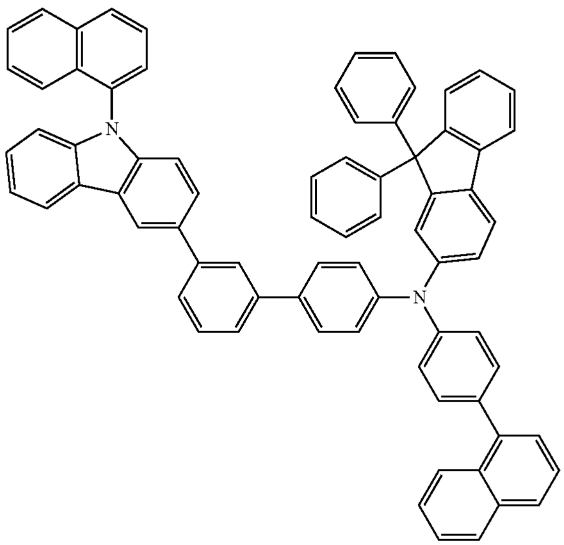

-continued
6-40
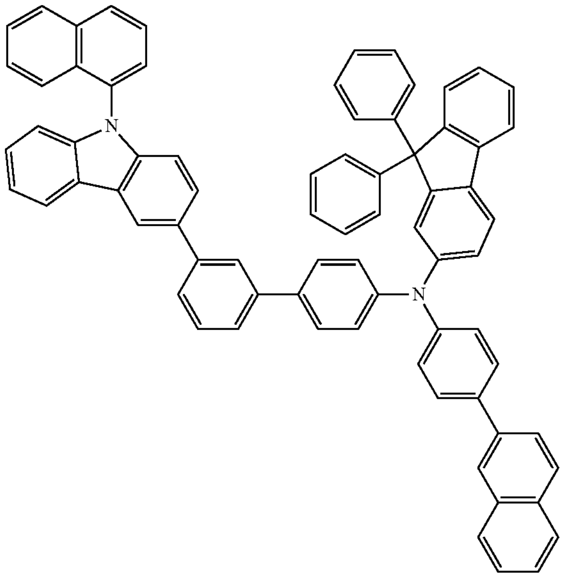
6-41
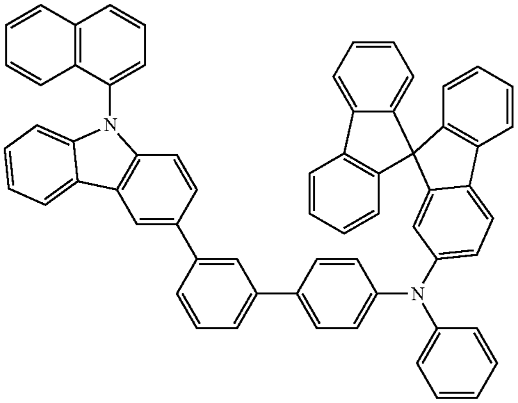
6-42
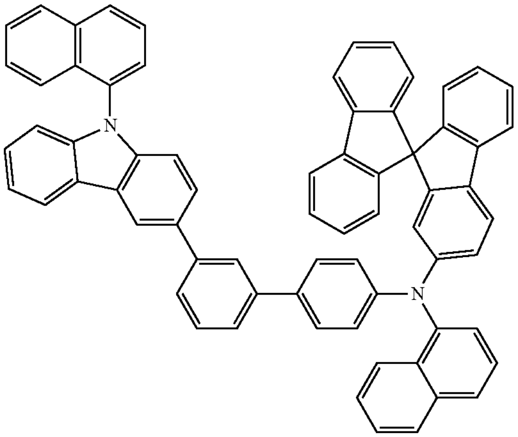
-continued
6-43
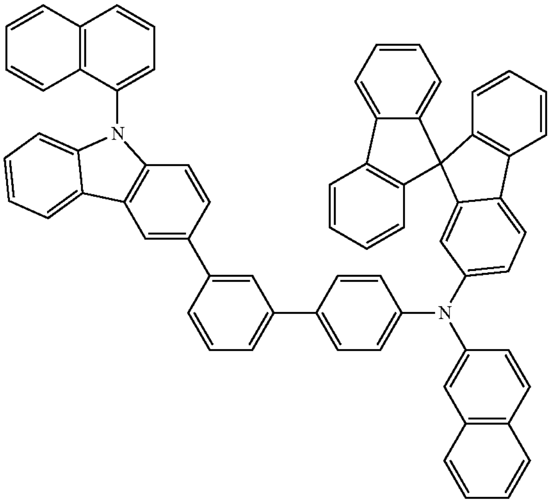
6-44
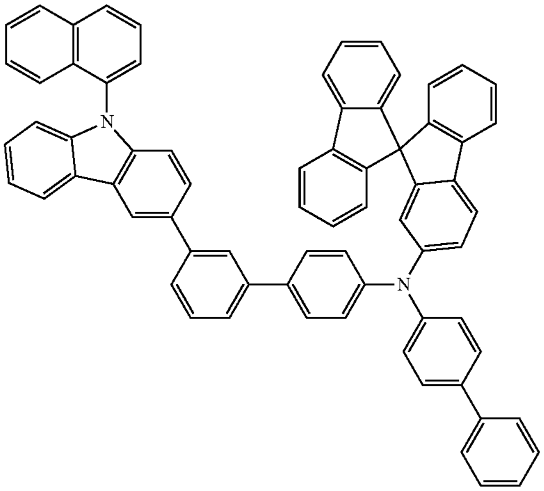
6-45
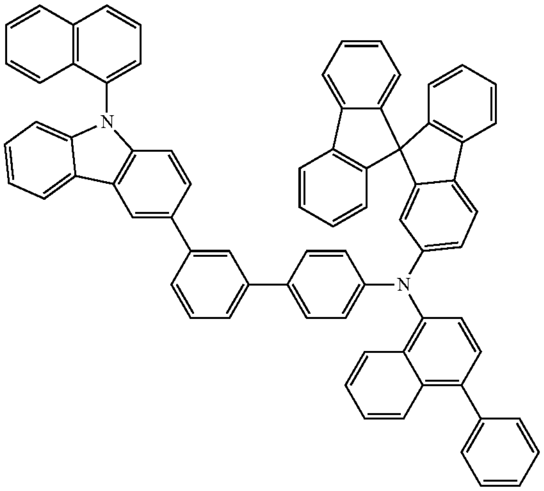

-continued
6-46
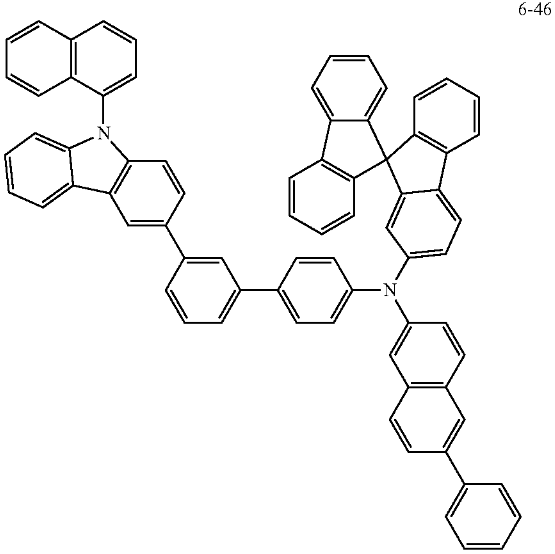
6-47
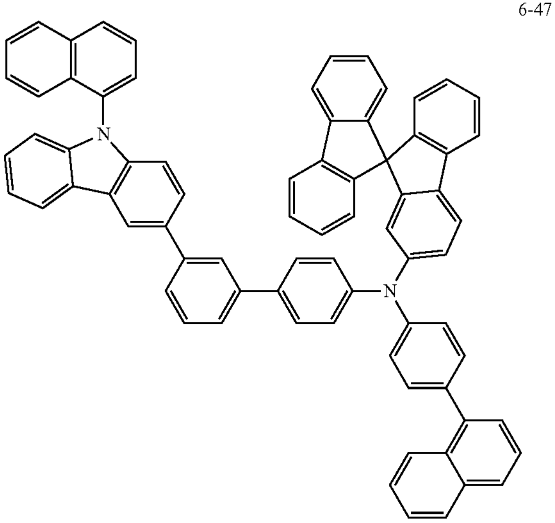
6-48
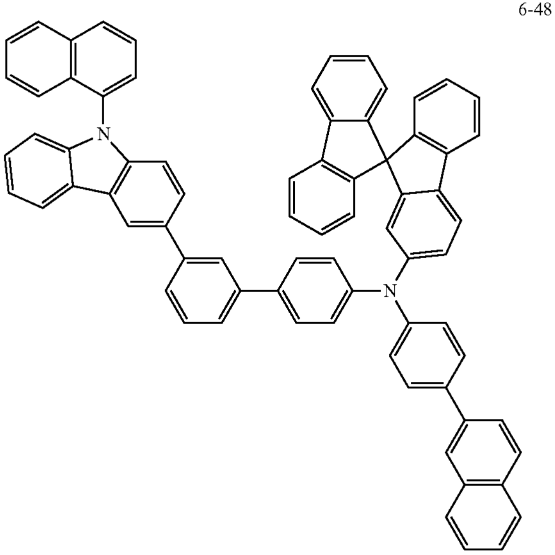
-continued
6-49
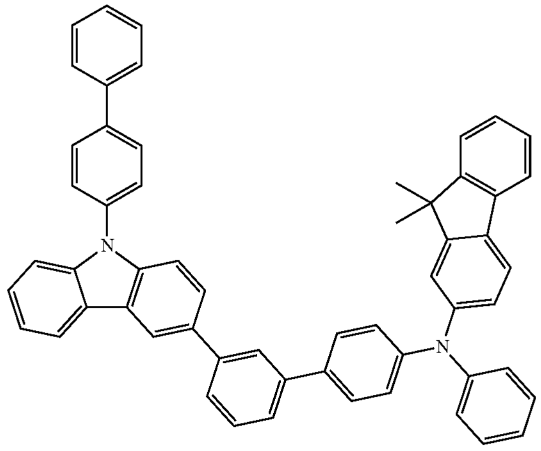
6-50
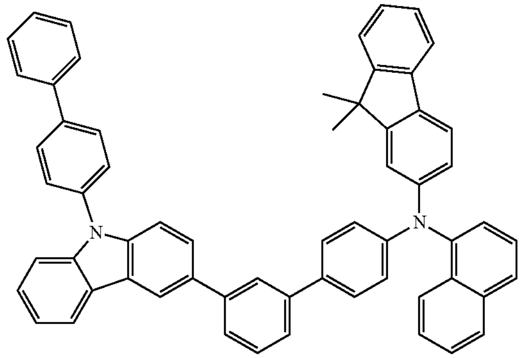
6-51
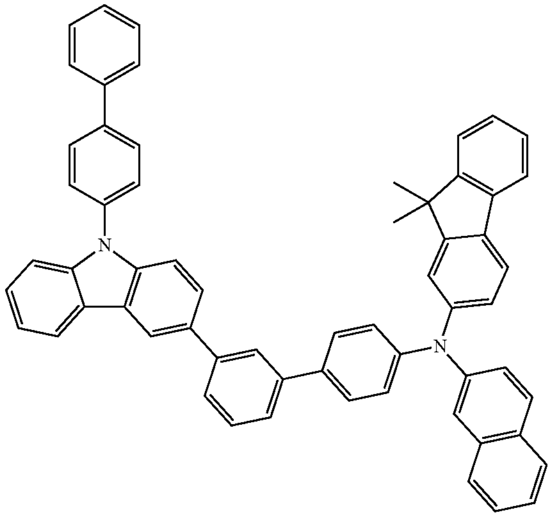

-continued
6-52
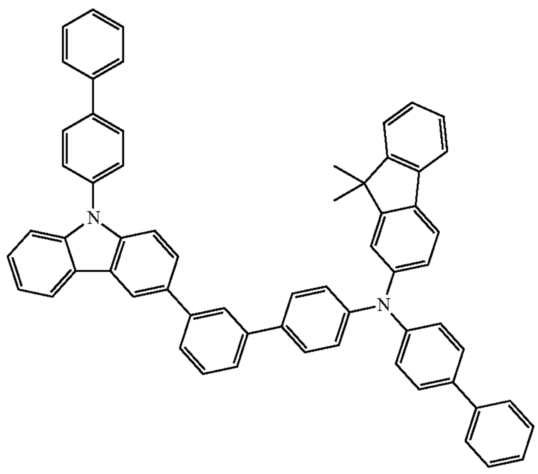
6-53
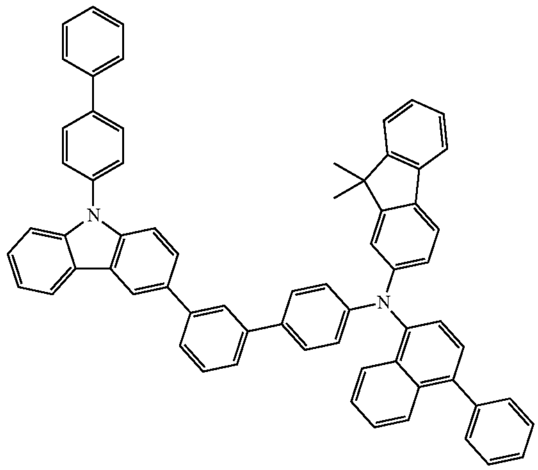
6-54
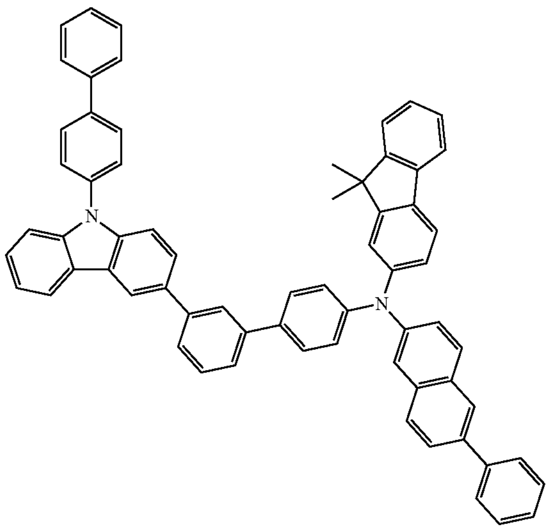
-continued
6-55
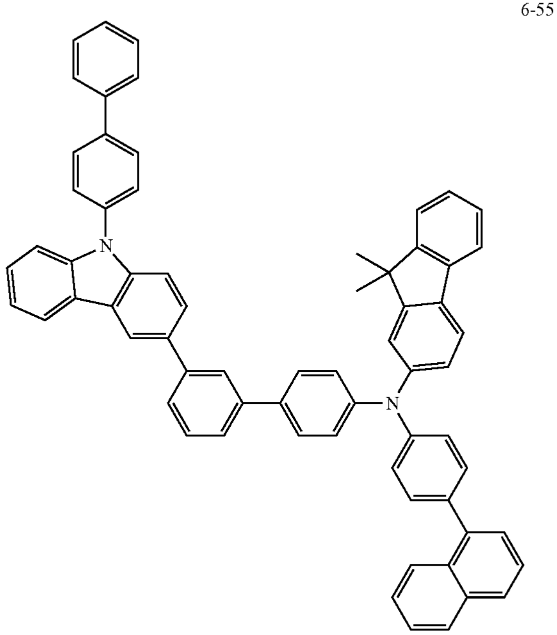
6-56
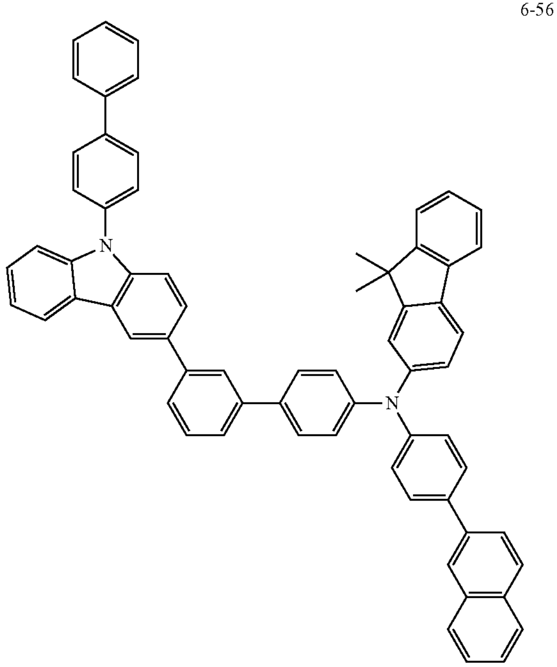

-continued
6-57
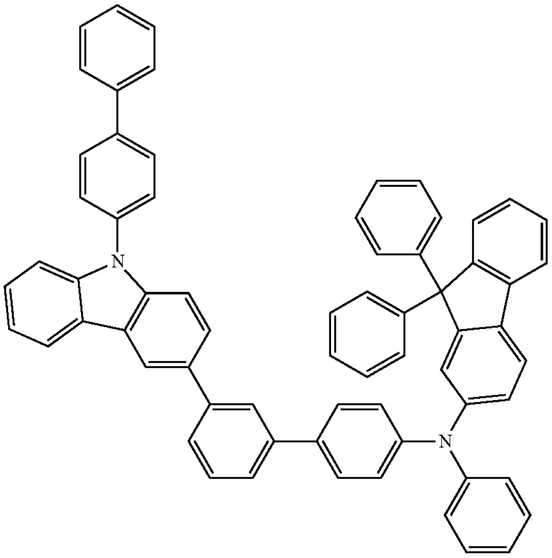
6-58
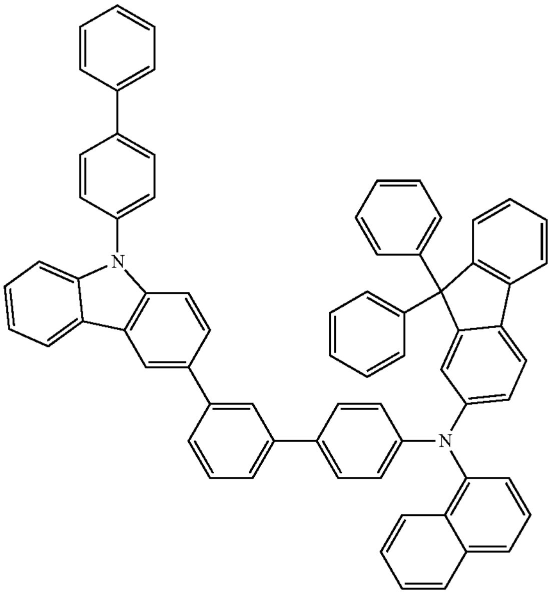
-continued
6-59
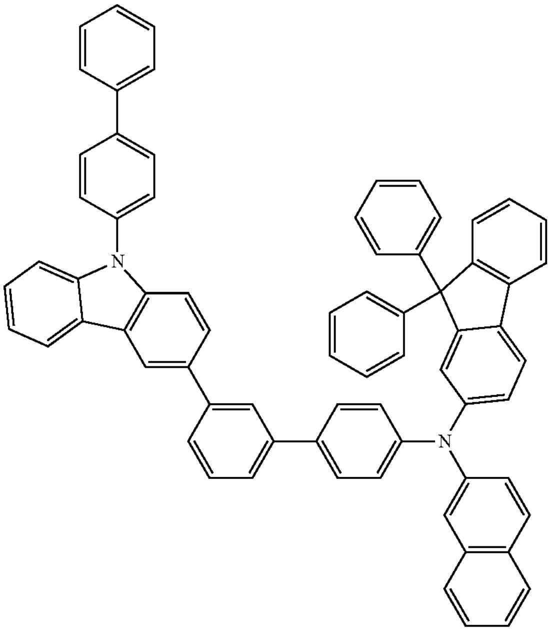
6-60
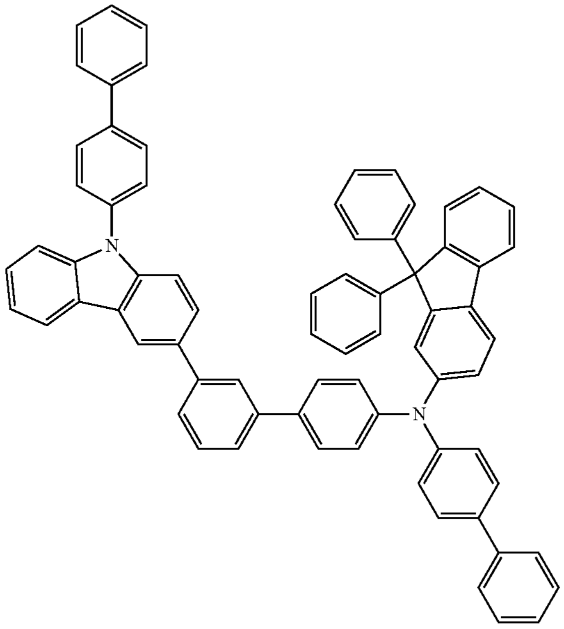

-continued
6-61
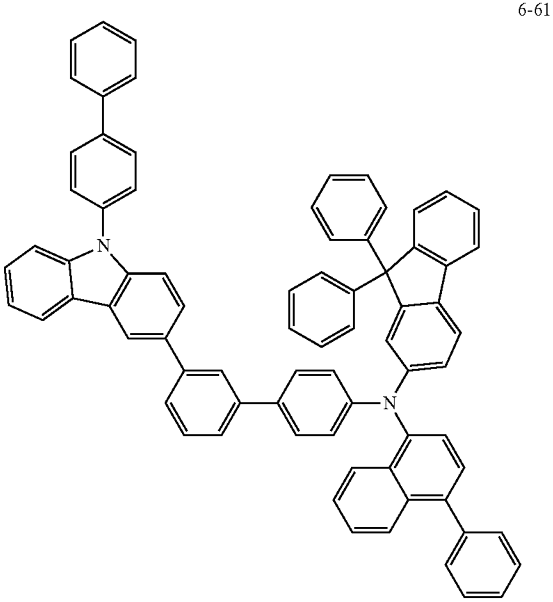
6-62
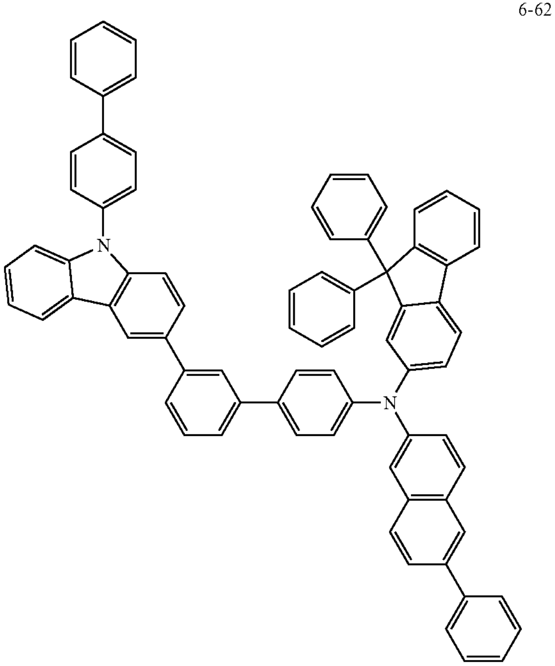
-continued
6-63
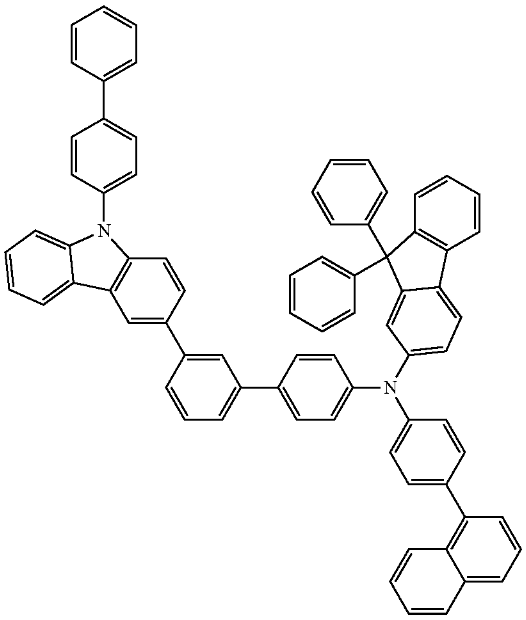
6-64
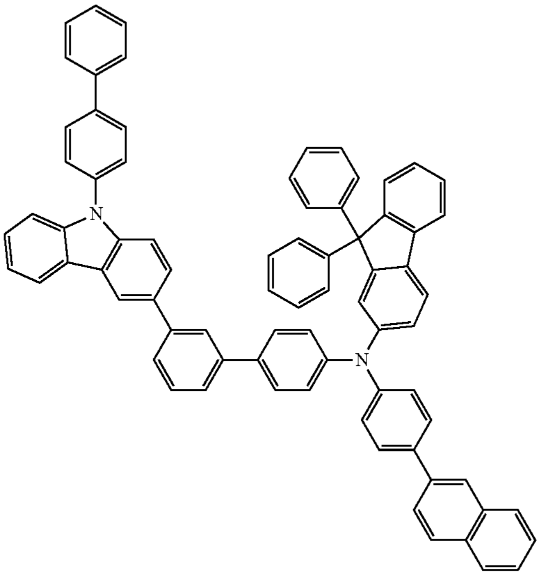

-continued
6-65
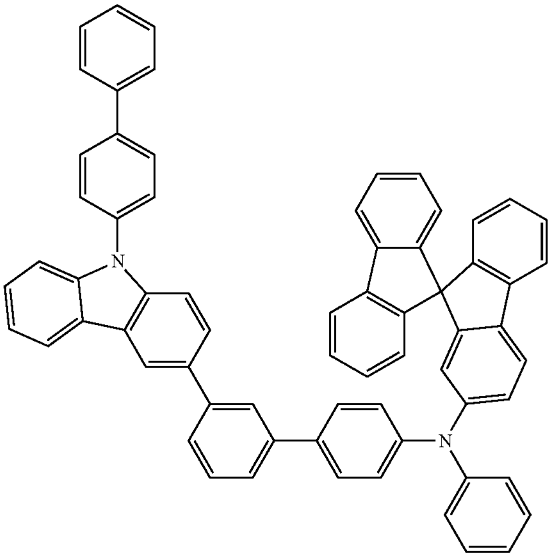
-continued
6-67
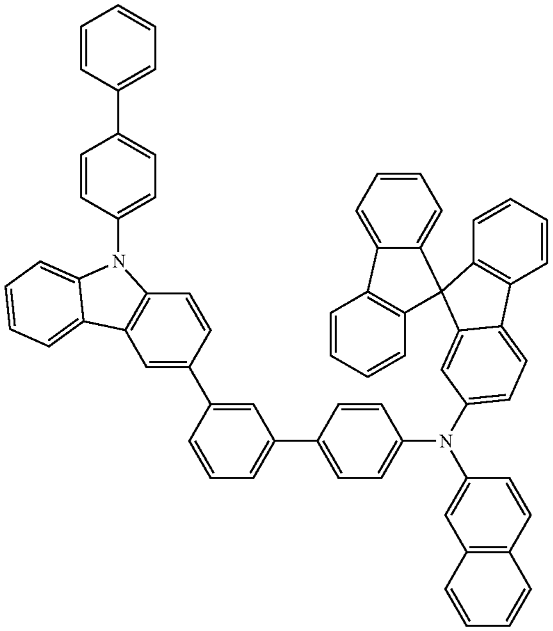
6-66
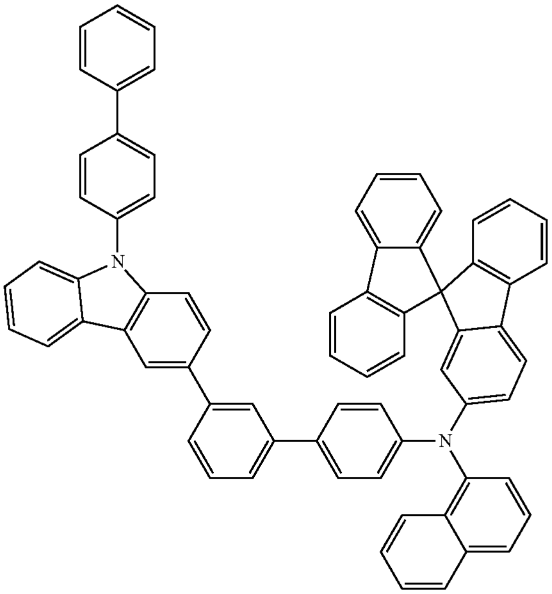
6-68
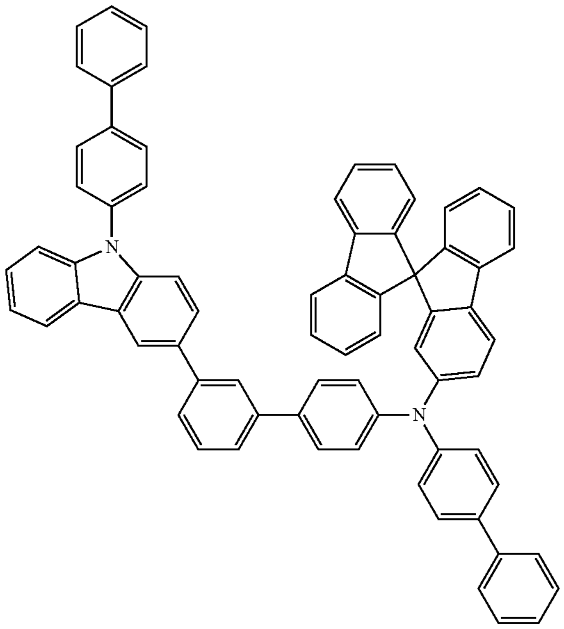

-continued
6-69
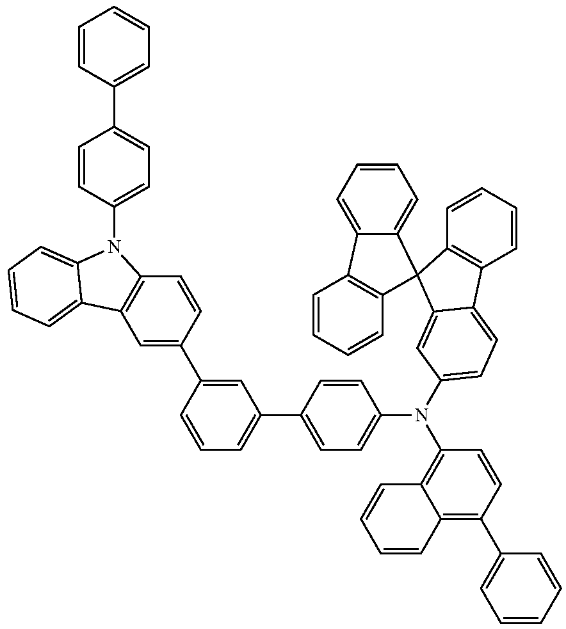
6-70
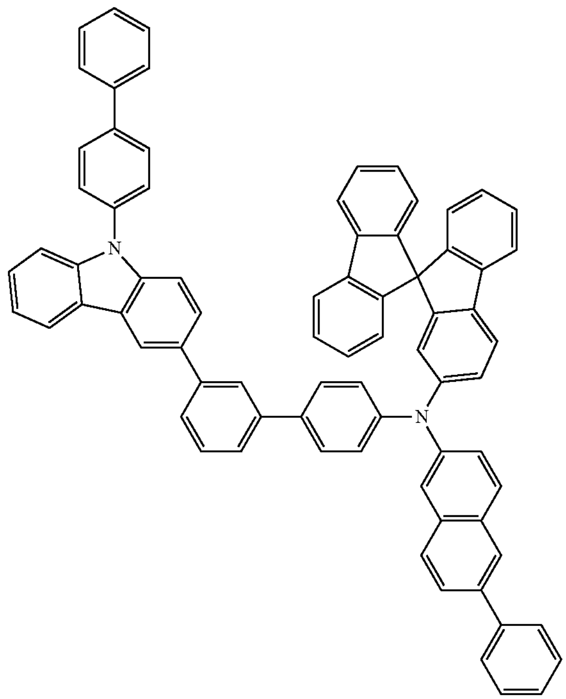
-continued
6-71
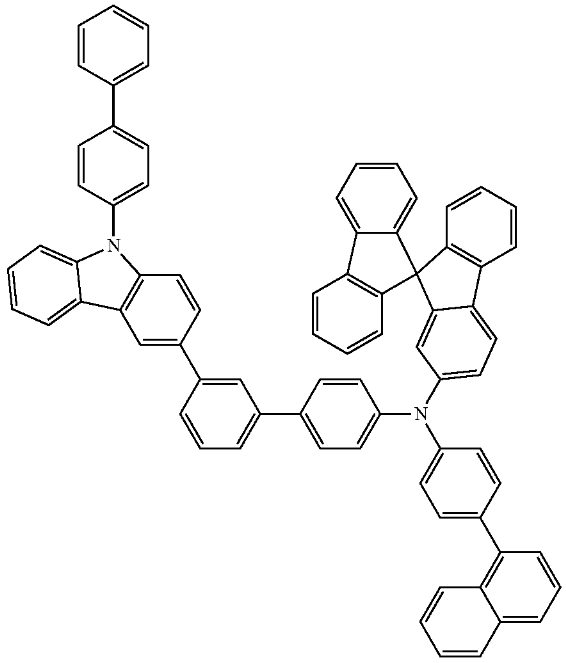
6-72
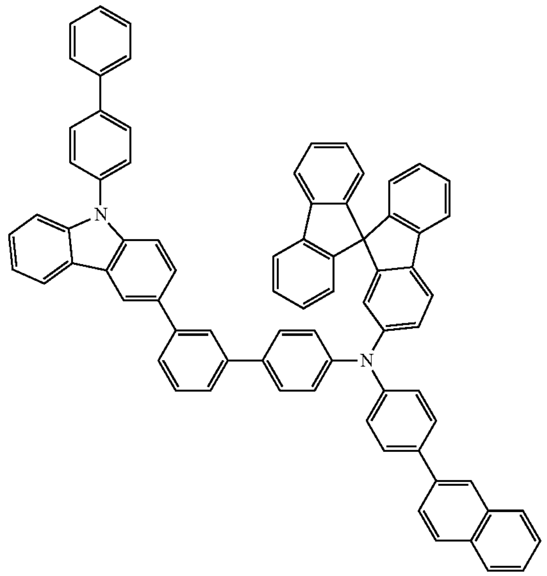

-continued
6-73
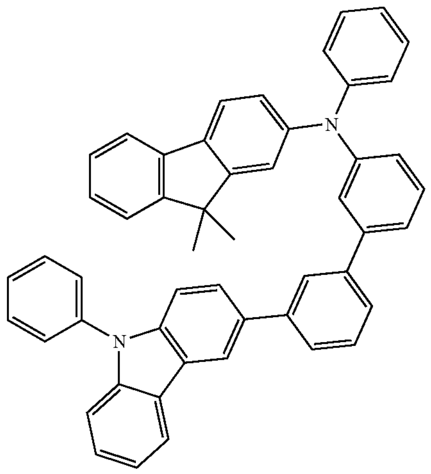
6-74
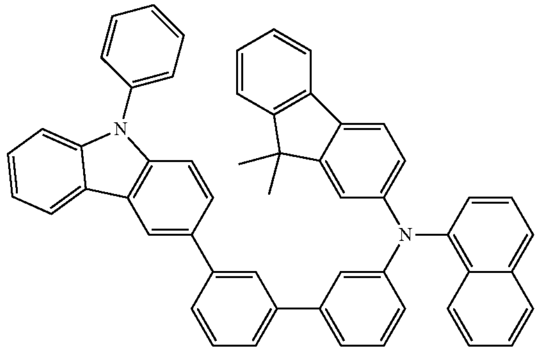
6-75
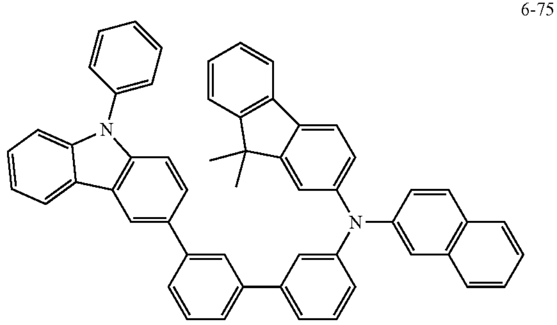
6-76
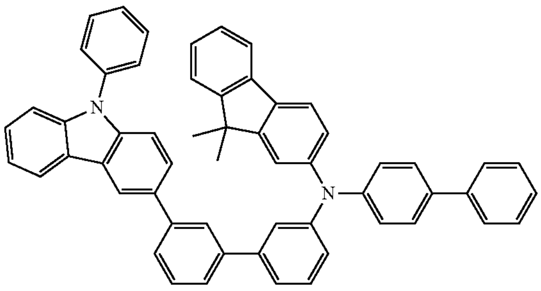
-continued
6-77
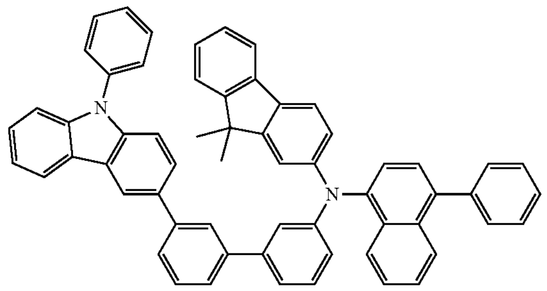
6-78
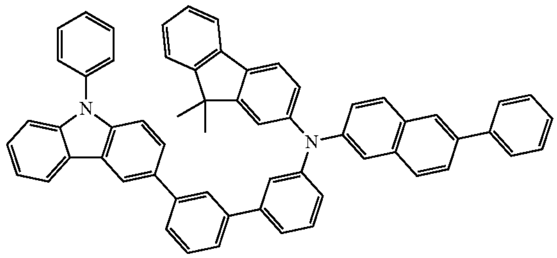
6-79
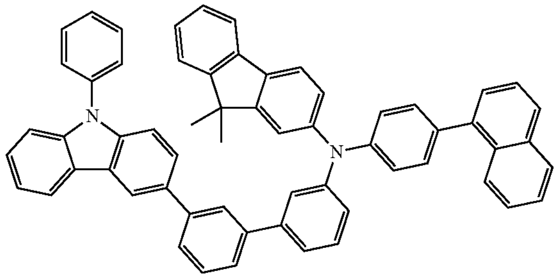
6-80
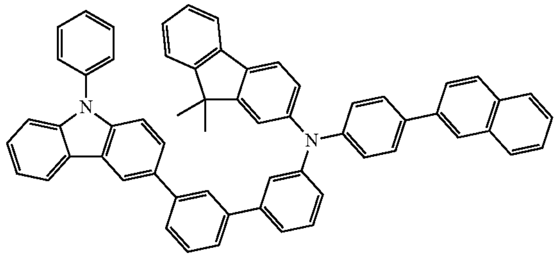
6-81
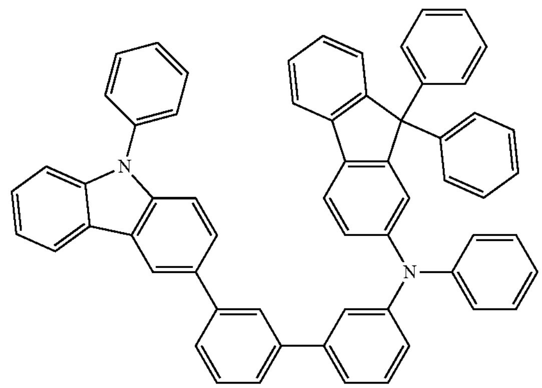

6-82
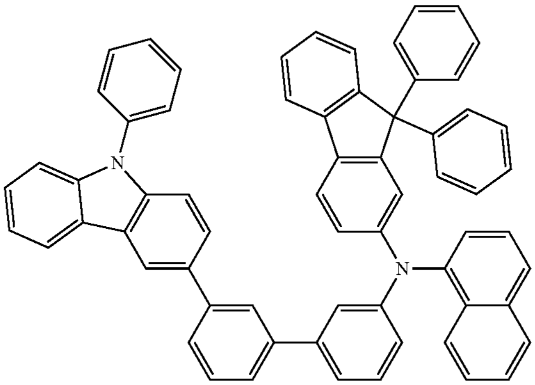
6-83
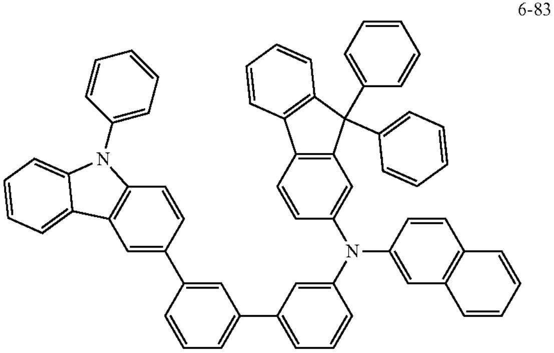
6-84
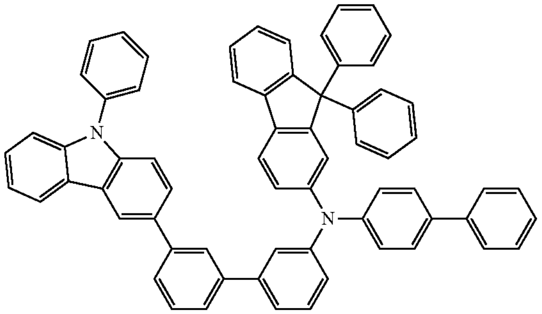
6-85
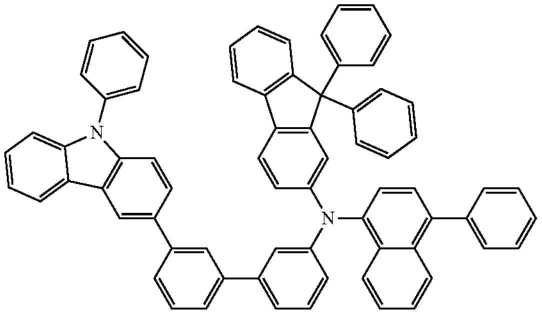
6-86
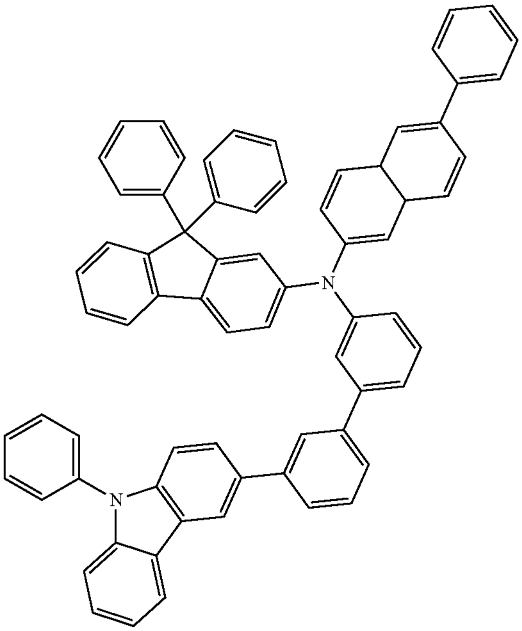
6-87
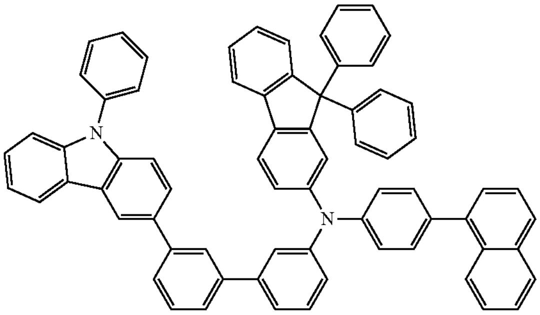
6-88
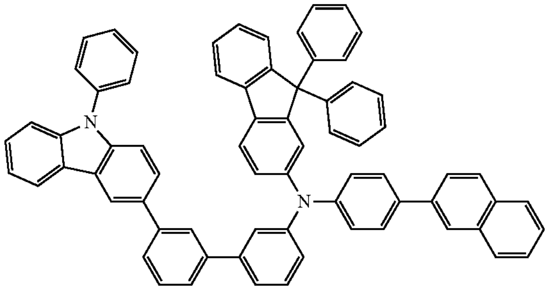

-continued
6-89
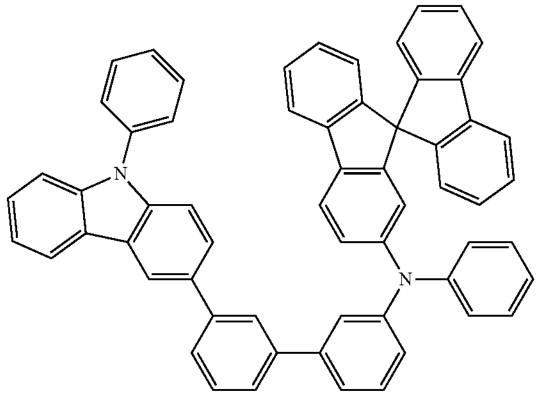
6-90
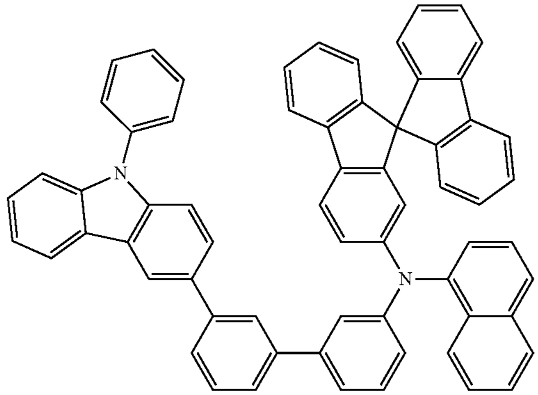
6-91
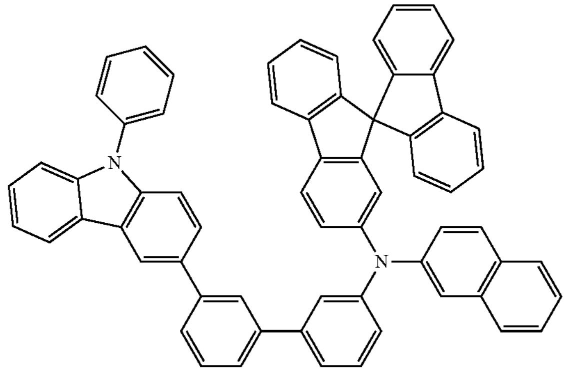
6-92
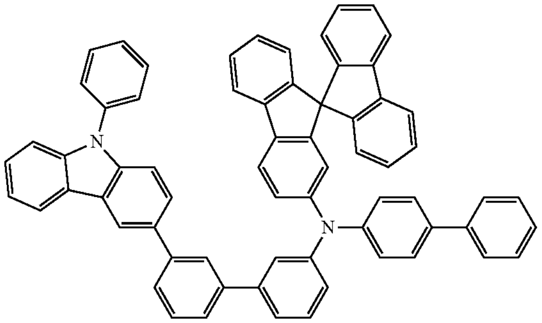
-continued
6-93
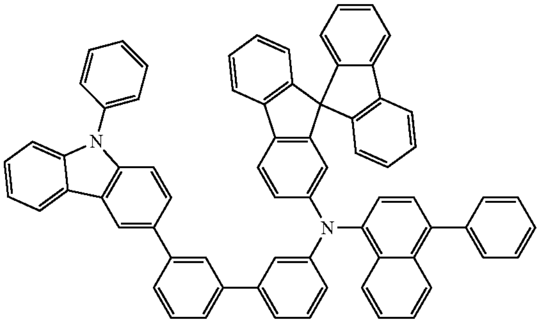
6-94
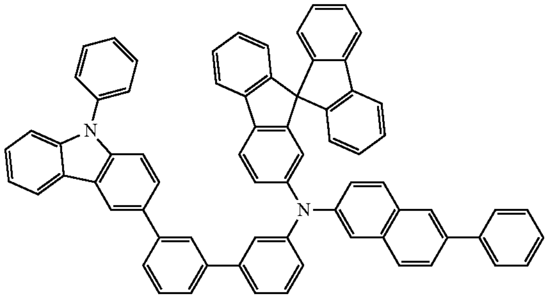
6-95
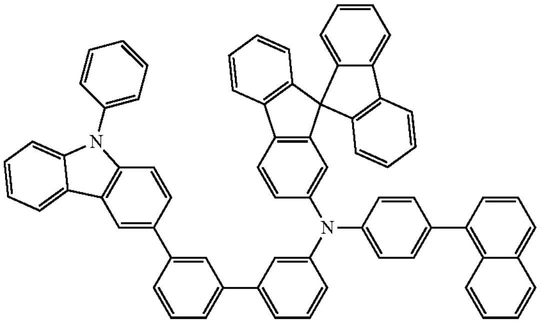
6-96
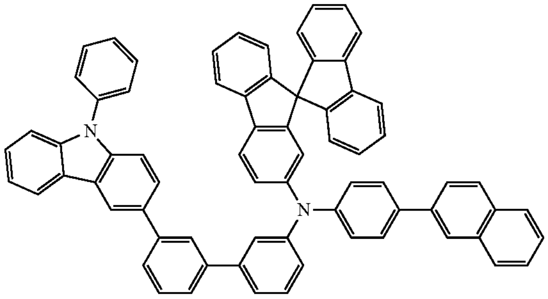

-continued
6-97
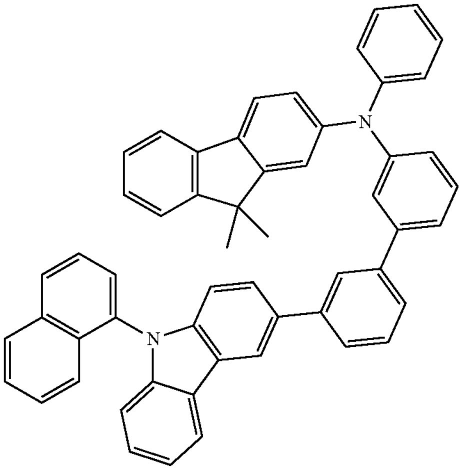
6-98
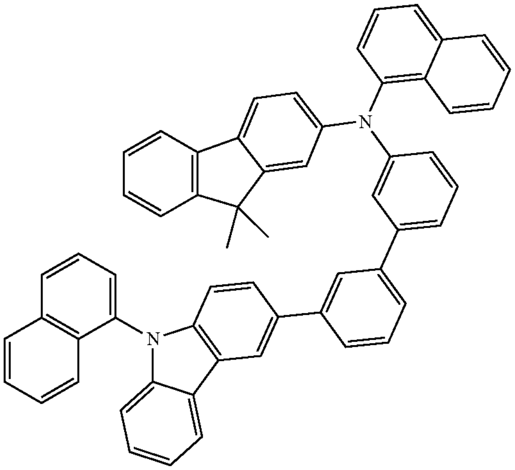
6-99
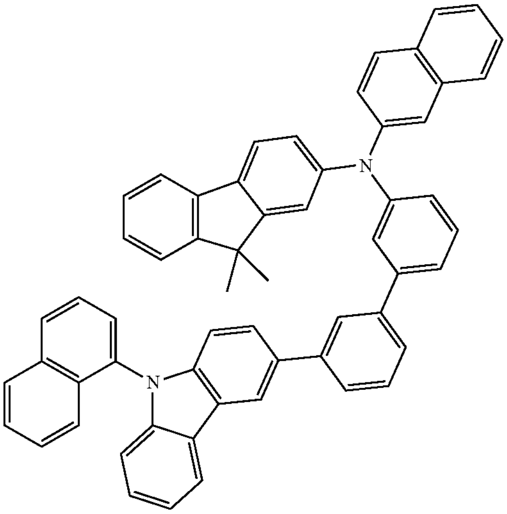
-continued
6-100
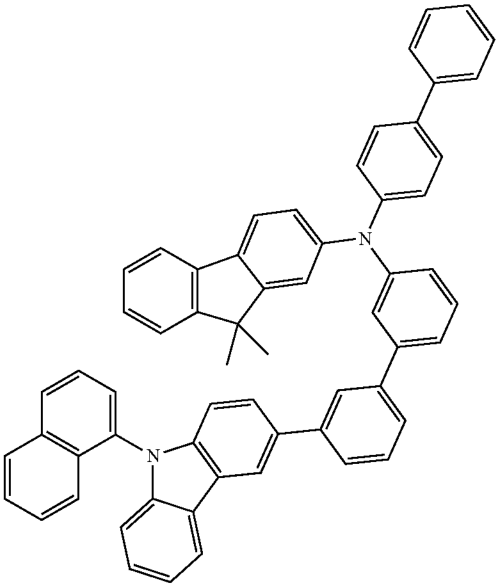
6-101
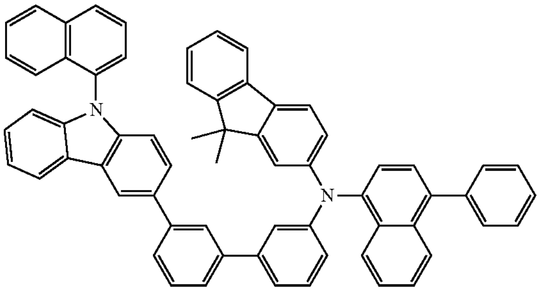
6-102
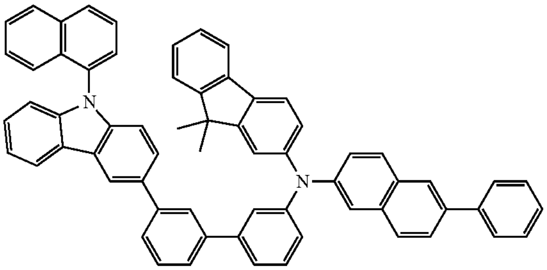
6-103
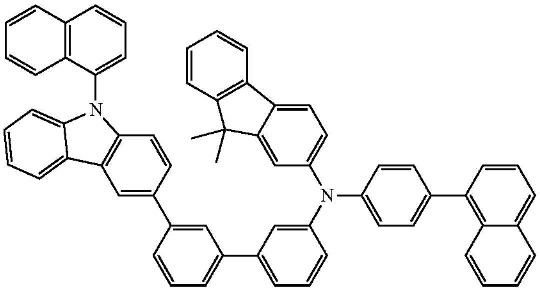

-continued
6-104
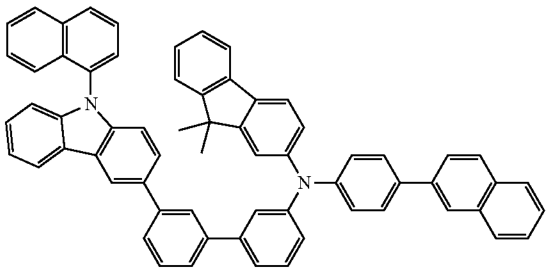
6-105
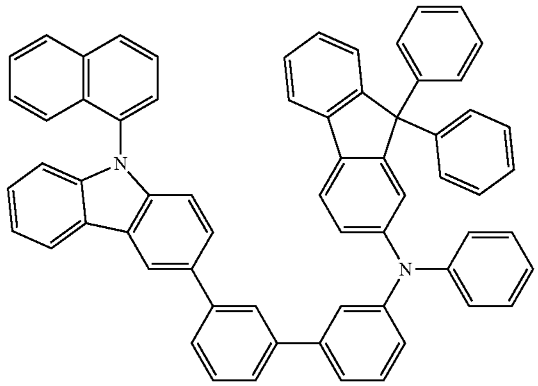
6-106
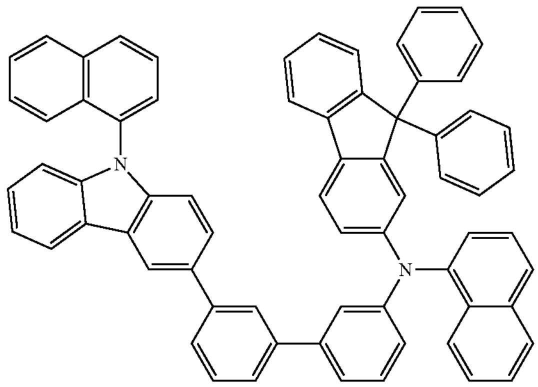
6-107
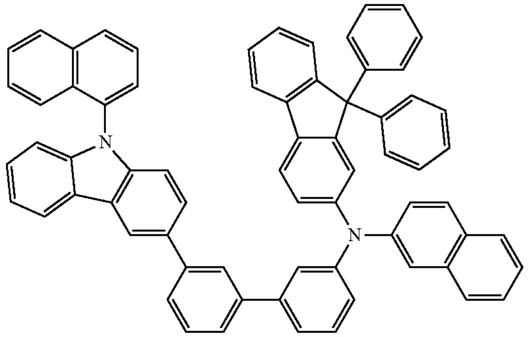
-continued
6-108
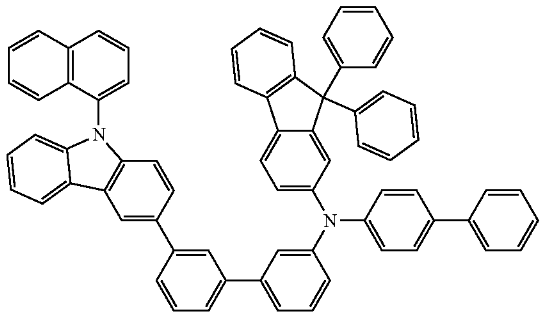
6-109
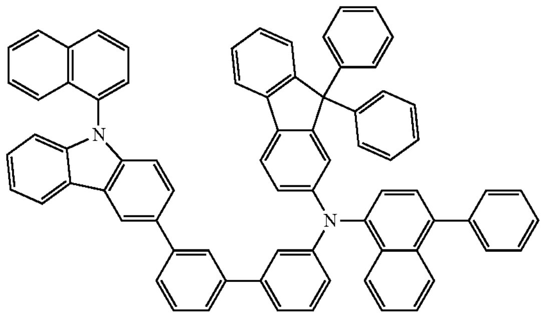
6-110
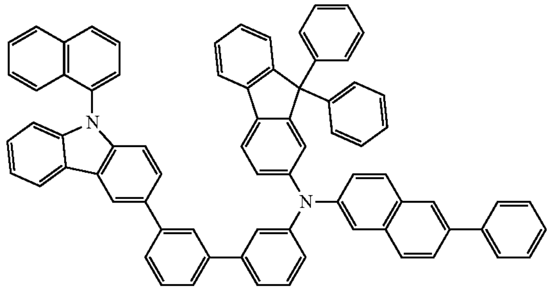
6-111
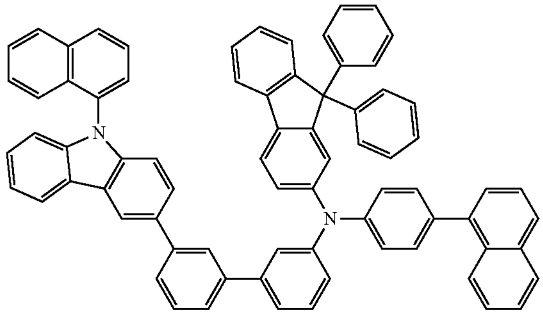
6-112
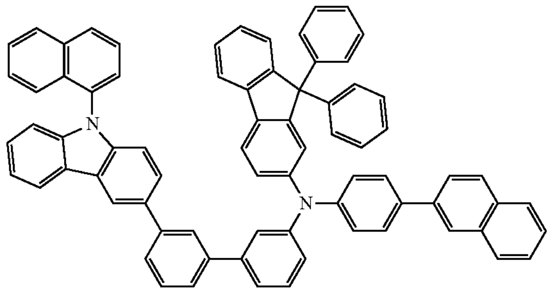

-continued
6-113
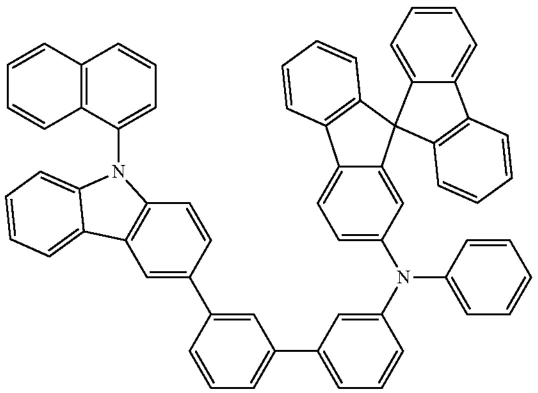
6-114
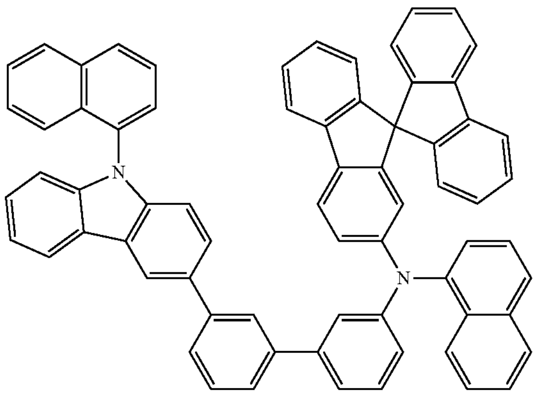
6-115
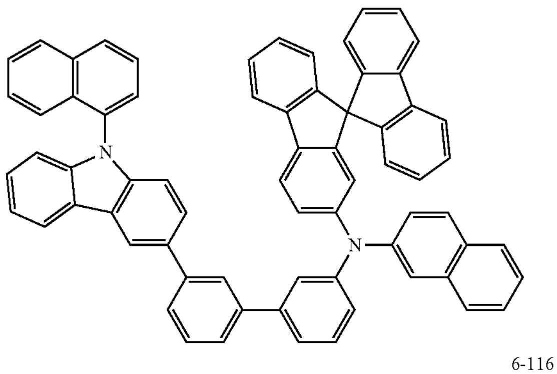
6-116
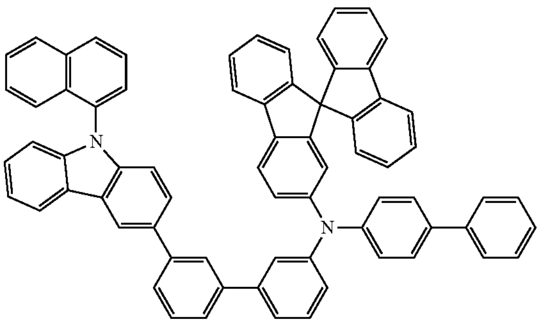
-continued
6-117
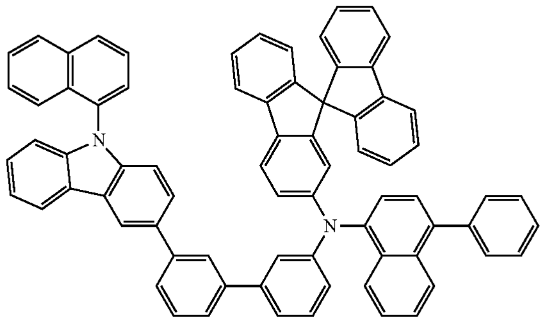
6-118
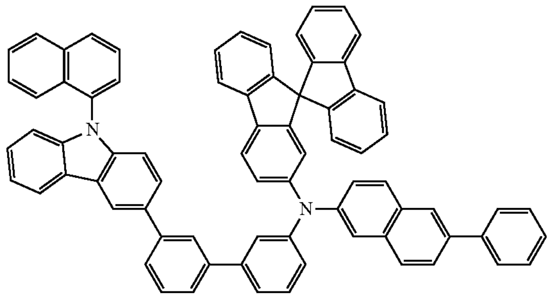
6-119
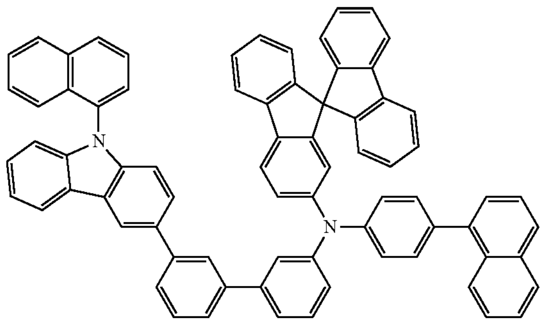
6-120
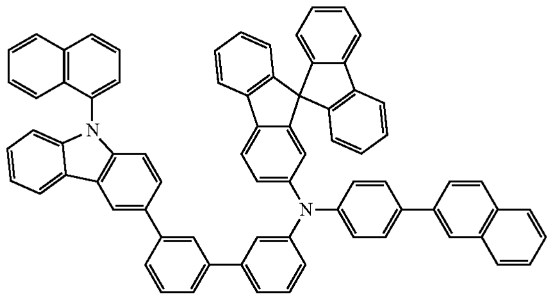

6-121
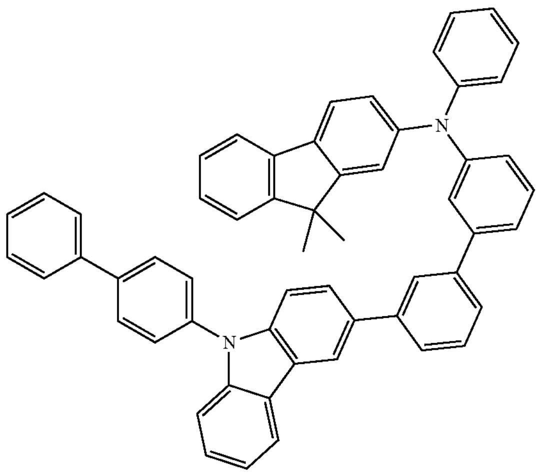
6-122
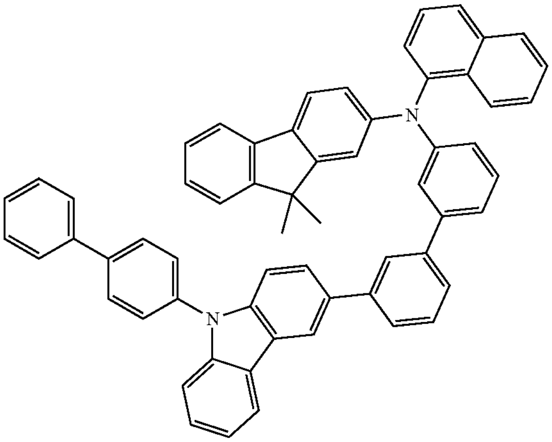
6-123
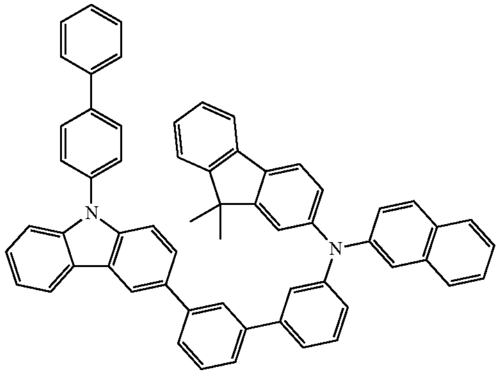
6-124
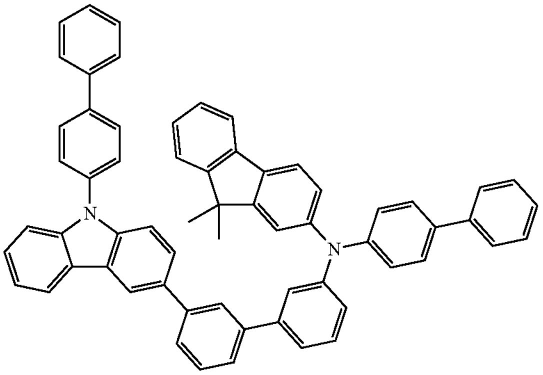
6-125
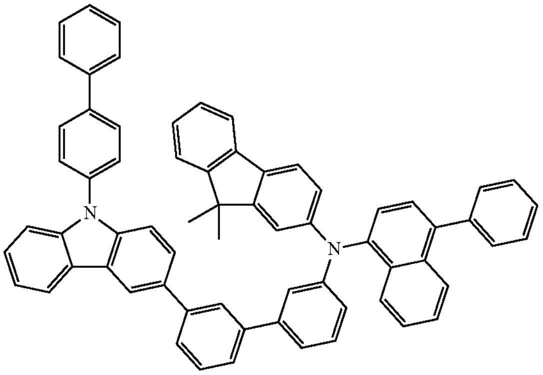
6-126
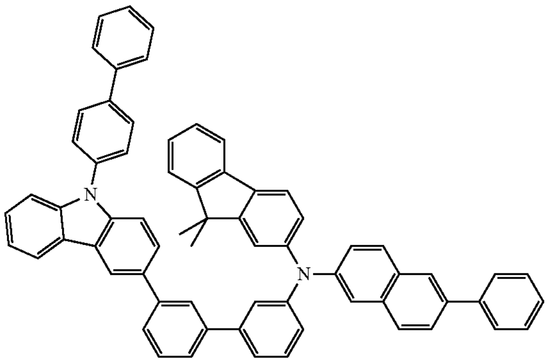
6-127
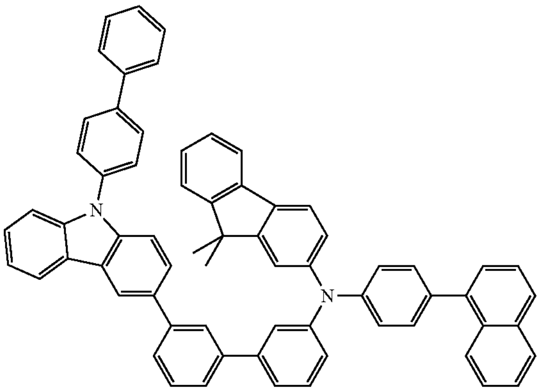

-continued
6-128
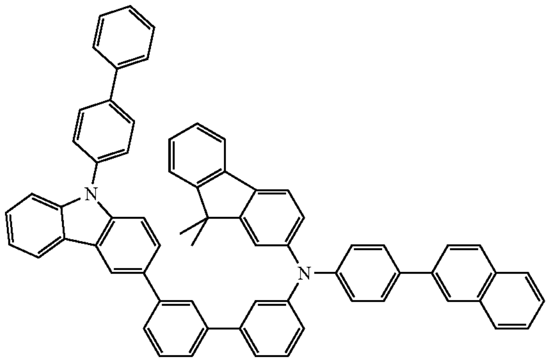
6-129
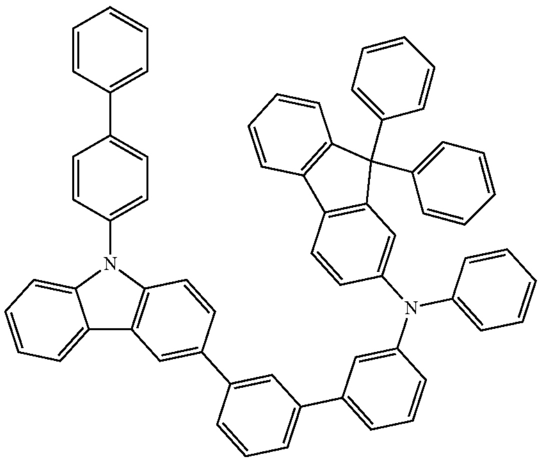
6-130
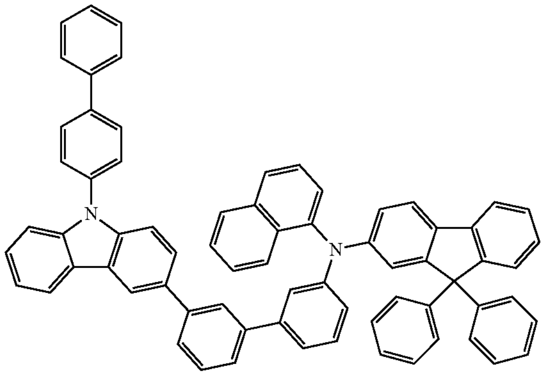
-continued
6-131
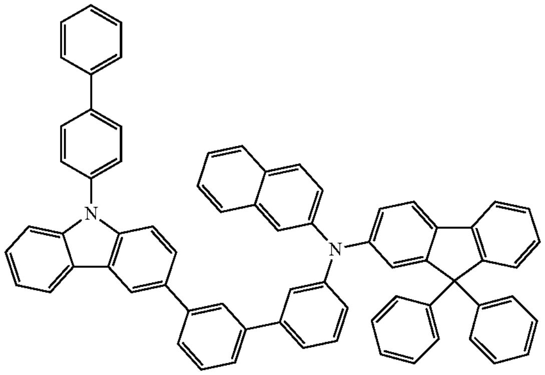
6-132
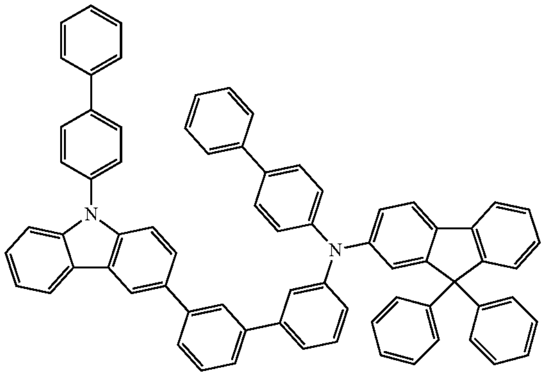
6-133
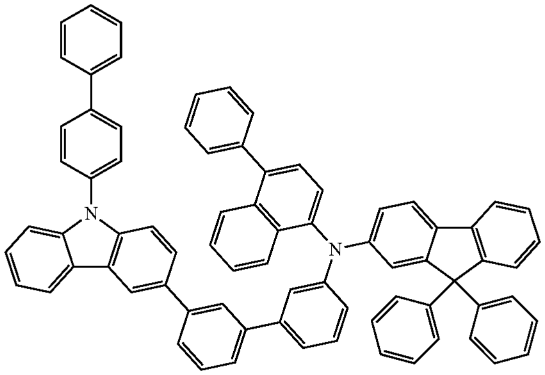

-continued
6-134
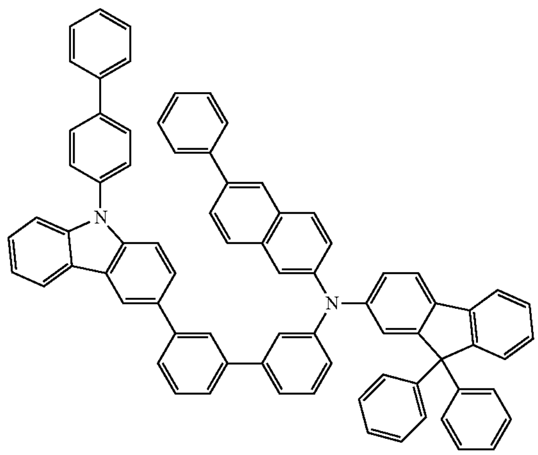
6-135
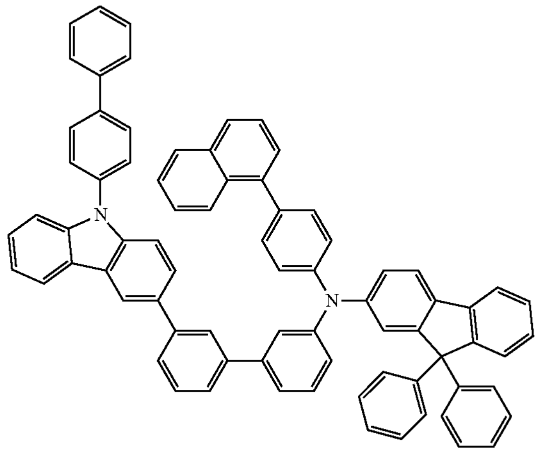
6-136
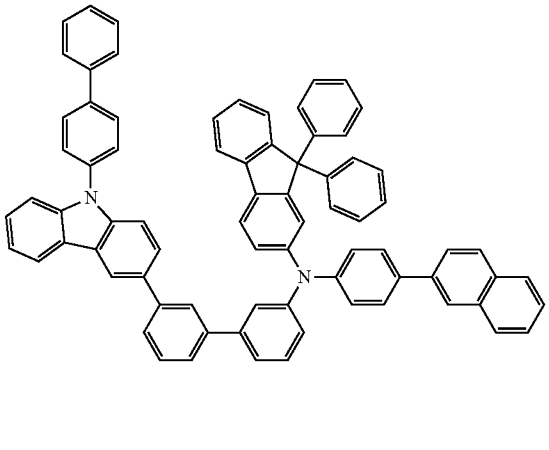
-continued
6-137
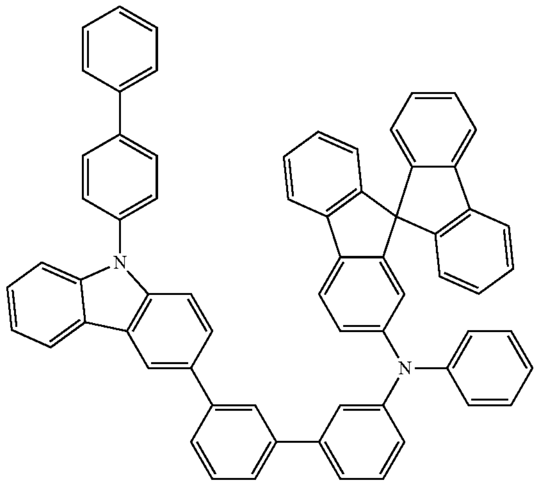
6-138
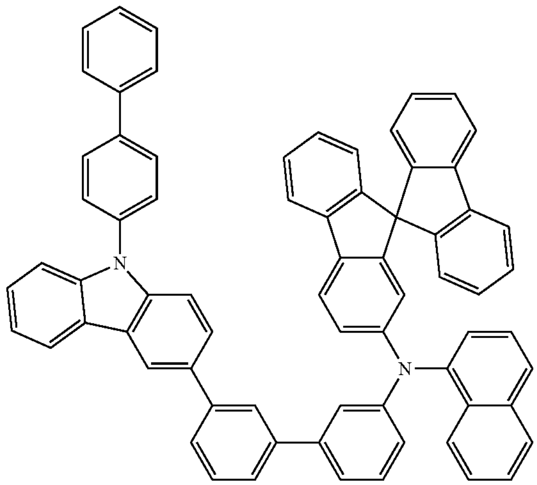
6-139
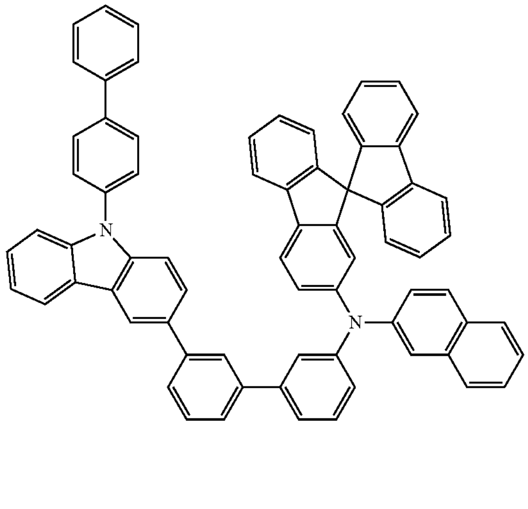

-continued 6-140

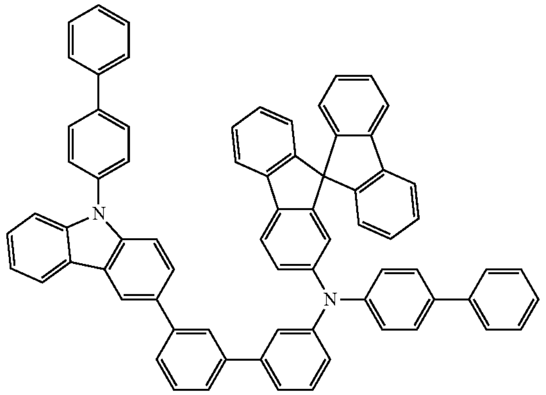

6-141

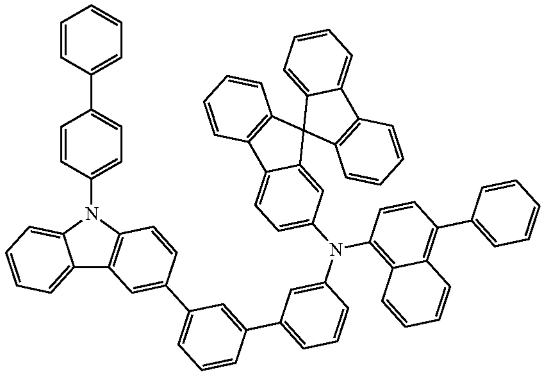

6-142

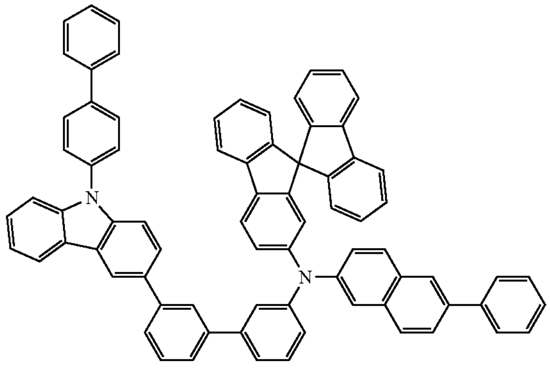

6-143

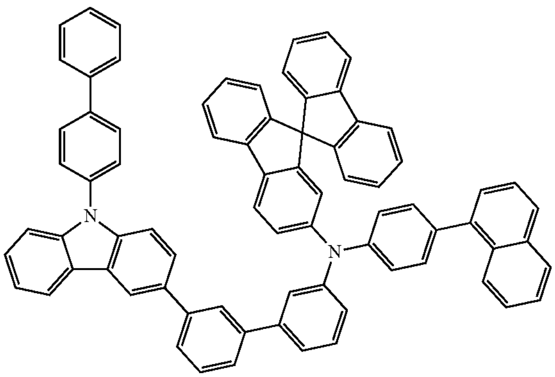

-continued 6-144

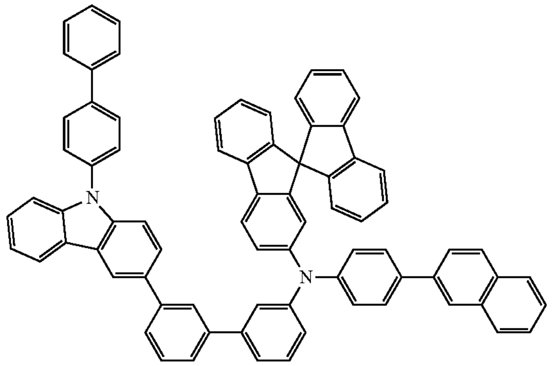

The HTL or buffer layer including a hole-transporting material may further include any suitable hole-transporting material commonly used in OLEDs. Non-limiting examples of the hole-transporting material include a carbazole derivative such as N-phenylcarbazole and polyvinylcarbazole, N,N'-bis(3-methylphenyl)-N,N'-diphenyl-[1,1-biphenyl]-4,4'-diamine (TPD), 4,4',4"-tris(N-carbazole)triphenylamine (TCTA), and N,N'-di(1-naphthyl)-N,N'-diphenylbenzidine (NPB.

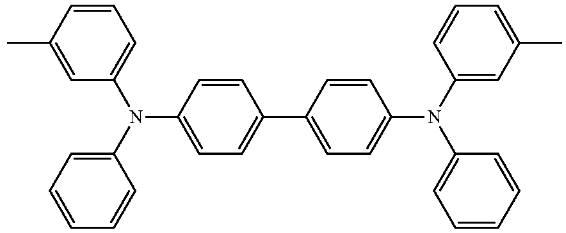

TPD

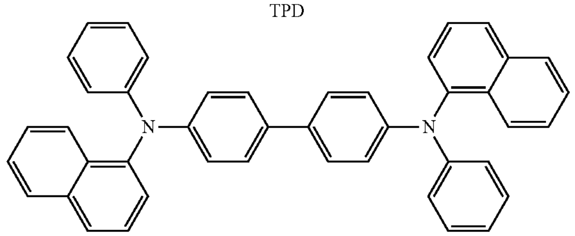

NPB

The thickness of the HTL may be about 50 Å to about 2,000 Å, for example, about 100 Å to about 1,500 Å. When the thickness of the HTL is within either of the foregoing ranges, the HTL may have satisfactory hole transport ability without a substantial increase in a driving voltage.

The H-functional layer having both hole injection and hole transport capabilities may include one or more of the materials described above in connection with the HIL and the HTL. The thickness of the H-functional layer may be about 100 Å to about 10,000 Å, for example, about 100 Å to about 1,000 Å. When the thickness of the H-functional layer is within either of the foregoing ranges, the H-functional layer may have satisfactory hole injection and transport abilities without a substantial increase in a driving voltage.

At least one of the HIL, the HTL, and the H-functional layer may include at least one compound represented by one of Formula 300 and Formula 301.

Formula 300

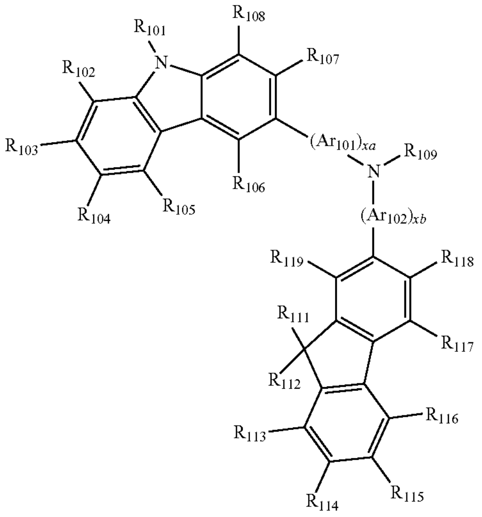

Formula 301

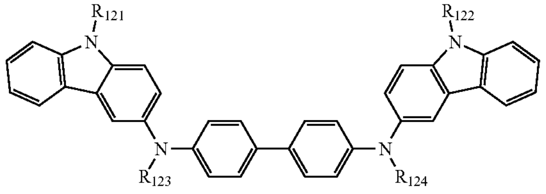

In Formula 300, $Ar_{101}$ and $Ar_{102}$ may each independently be a substituted or unsubstituted $C_6$-$C_{60}$ arylene group. For example, $Ar_{101}$ and $Ar_{102}$ may each independently be: a phenylene group, a pentalenylene group, an indenylene group, a naphthylene group, an azulenylene group, a heptalenylene group, a substituted or unsubstituted acenaphthylene group, a fluorenylene group, a phenalenylene group, a phenanthrenylene group, an anthrylene group, a fluoranthenylene group, a triphenylenylene group, a pyrenylene group, a chrysenylene group, a naphthacenylene group, a picenylene group, a perylenylene group, or a pentacenylene group; or a phenylene group, a pentalenylene group, an indenylene group, a naphthylene group, an azulenylene group, a heptalenylene group, a substituted or unsubstituted acenaphthylene group, a fluorenylene group, a phenalenylene group, a phenanthrenylene group, an anthrylene group, a fluoranthenylene group, a triphenylenylene group, a pyrenylene group, a chrysenylene group, a naphthacenylene group, a picenylene group, a perylenylene group, or a pentacenylene group substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, or a $C_1$-$C_{60}$ heteroaryl group.

In Formula 300, xa and xb may each independently be an integer of 0 to 5, or may be 0, 1, or 2. For example, xa may be 1 and xb may be 0, but xa and xb are not limited thereto.

In Formula 300 and 301, $R_{101}$ to $R_{108}$, $R_{111}$ to $R_{119}$, and $R_{121}$ to $R_{124}$ may each independently be a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_5$-$C_{60}$ aryl group, a substituted or unsubstituted $C_5$-$C_{60}$ aryloxy group, or a substituted or unsubstituted $C_5$-$C_{60}$ arylthio group.

In some embodiments, $R_{51}$ to $R_{58}$, $R_{61}$ to $R_{69}$, $R_{71}$, and $R_{72}$ may each independently be a hydrogen atom; a deuterium atom; a halogen atom; a hydroxyl group; a cyano group; a nitro group; an amino group; an amidino group; a hydrazine group; a hydrazone group; a carboxyl group or a salt thereof; a sulfonic acid group or a salt thereof; a phosphoric acid group or a salt thereof; a $C_1$-$C_{10}$ alkyl group (e.g., a methyl group, an ethyl group, a propyl group, a butyl group, a pentyl group, and a hexyl group); a $C_1$-$C_{10}$ alkoxy group (e.g., a methoxy group, an ethoxy group, a propoxy group, a butoxy group, and a pentoxy); a $C_1$-$C_{10}$ alkyl group or a $C_1$-$C_{10}$ alkoxy group substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof; a phenyl group; a naphthyl group; an anthryl group; a fluorenyl group; a pyrenyl group; a phenyl group, a naphthyl group, an anthryl group, a fluorenyl group, or a pyrenyl group substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{10}$ alkyl group, or a $C_1$-$C_{10}$ alkoxy group. However, $R_{51}$ to $R_{58}$, $R_{61}$ to $R_{69}$, $R_{71}$, and $R_{72}$ are not limited thereto.

In Formula 300, $R_{109}$ may be a phenyl group; a naphthyl group; an anthryl group; a biphenyl group; a pyridinyl group; or a phenyl group, a naphthyl group, an anthryl group, a biphenyl group, or a pyridinyl group substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a substituted or unsubstituted $C_1$-$C_{20}$ alkyl group, or a substituted or unsubstituted $C_1$-$C_{20}$ alkoxy group.

According to another embodiment of the present invention, the compound represented by Formula 300 may be represented by Formula 300A, but Formula 300 is not limited to thereto.

Formula 300A
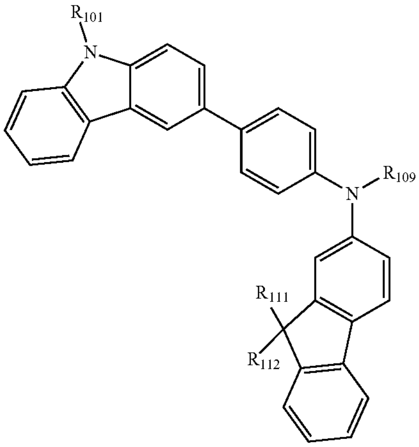
In Formula 300A above, $R_{101}$, $R_{111}$, $R_{112}$, and $R_{109}$ may be defined as described above with respect to Formula 300.
In some embodiments, at least one of the HIL, the HTL, and the H-functional layer may include at least one of Compounds 301 to 320, but these layers are not limited thereto.
301
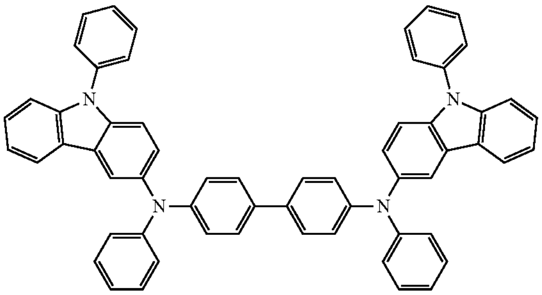
302
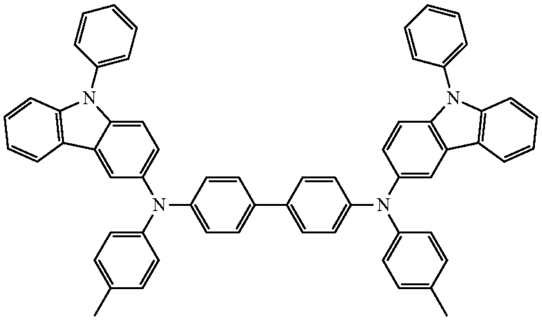
-continued
303
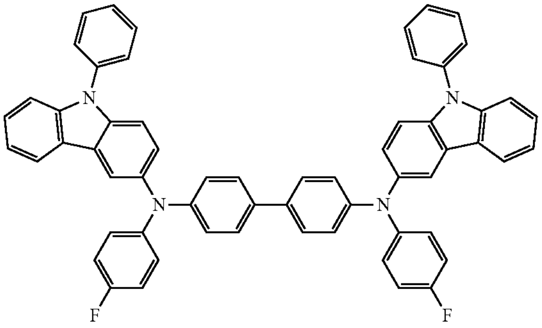
304
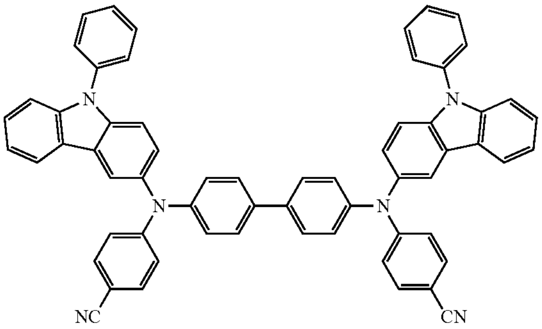
305
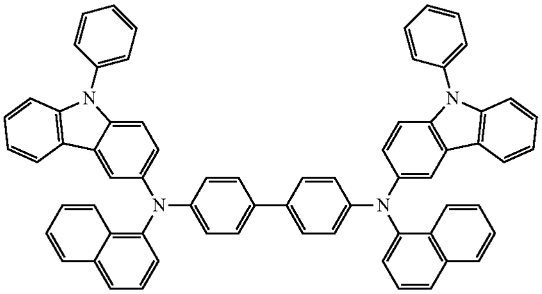
306
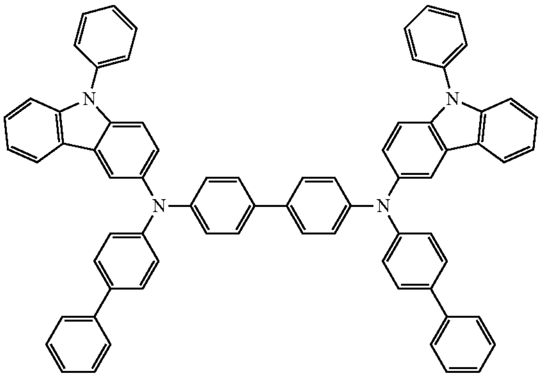

307
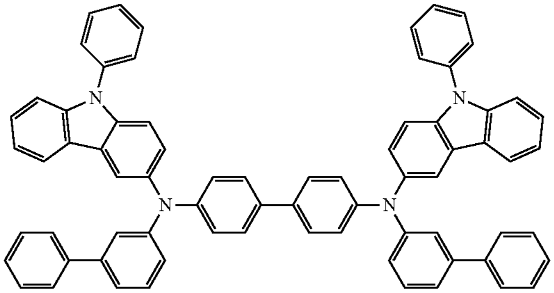
308
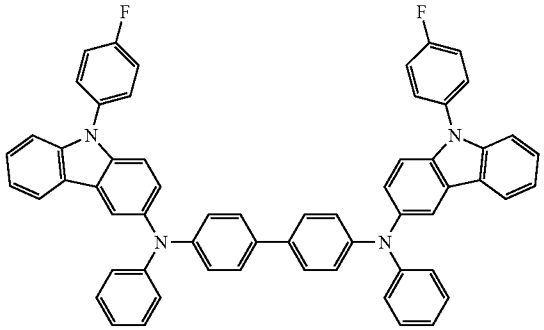
309
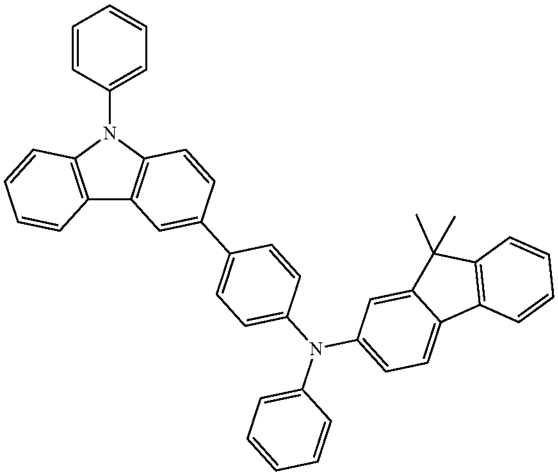
310
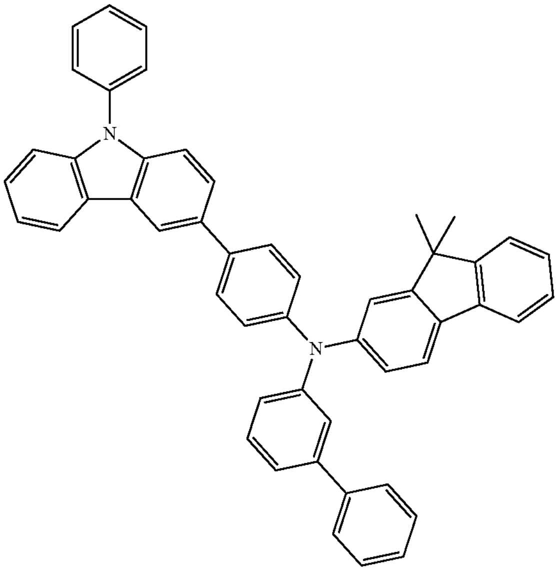
311
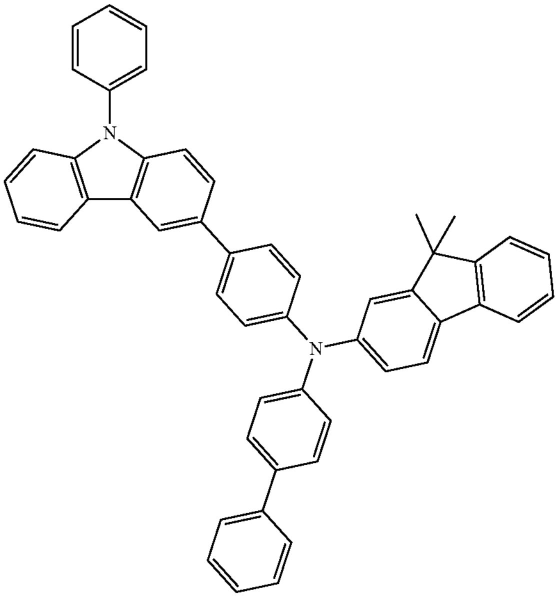

-continued
312
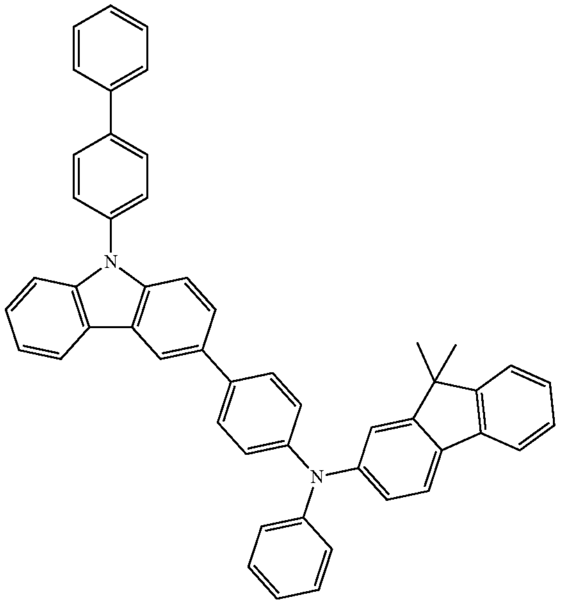
313
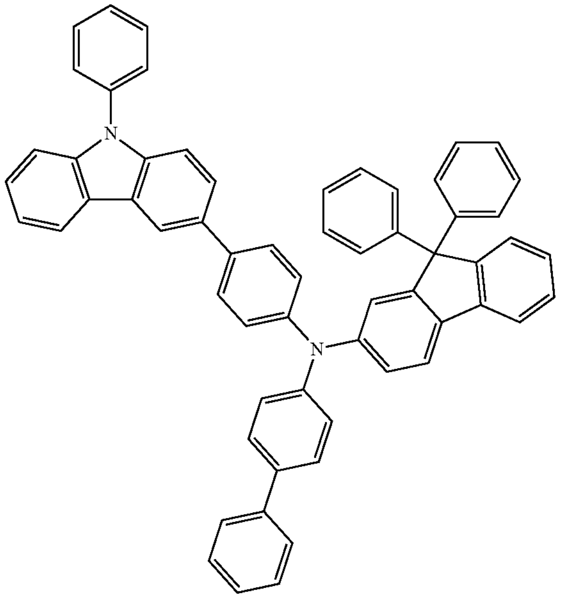
-continued
314
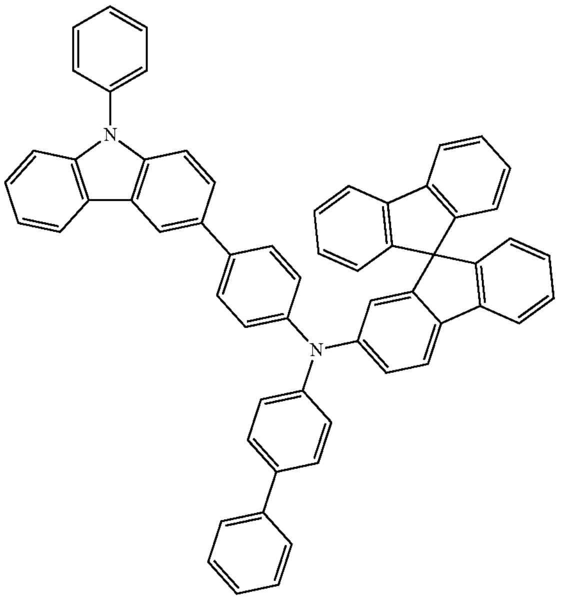
315
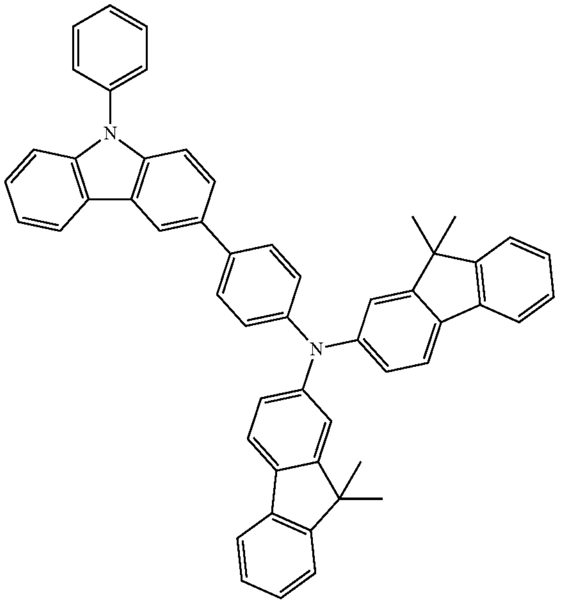

-continued

316

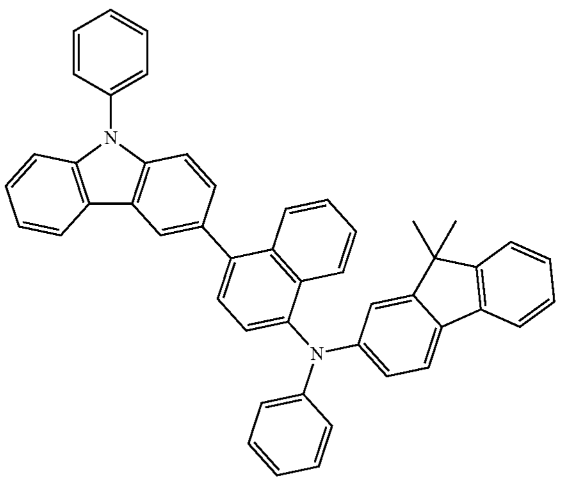

317

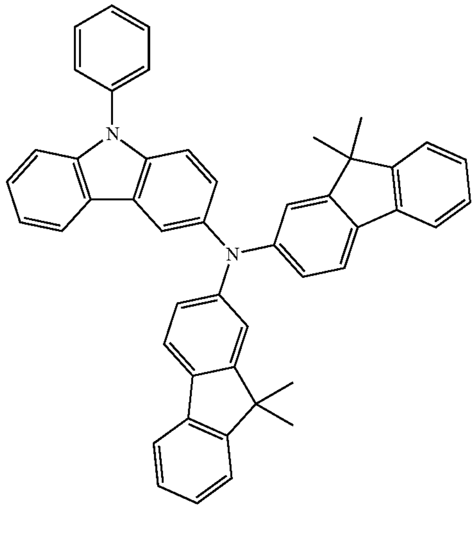

318

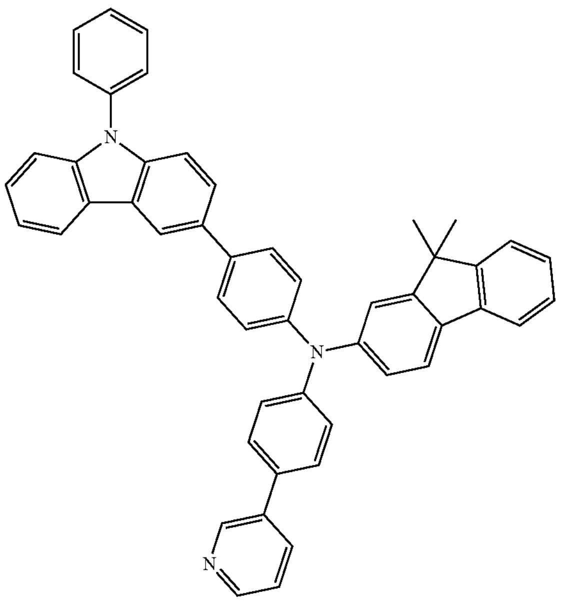

-continued

319

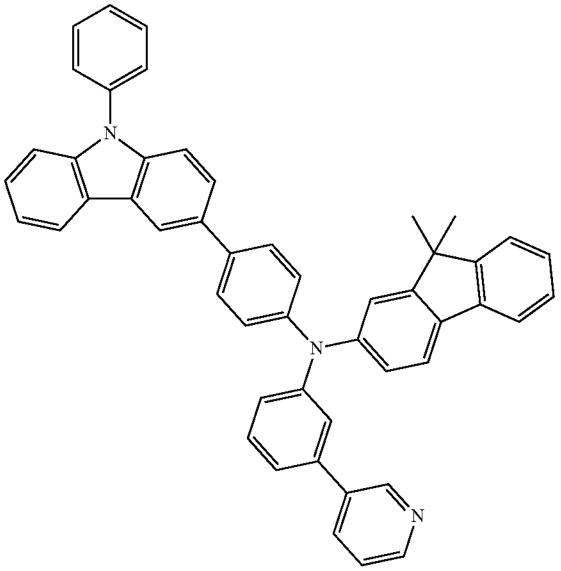

320

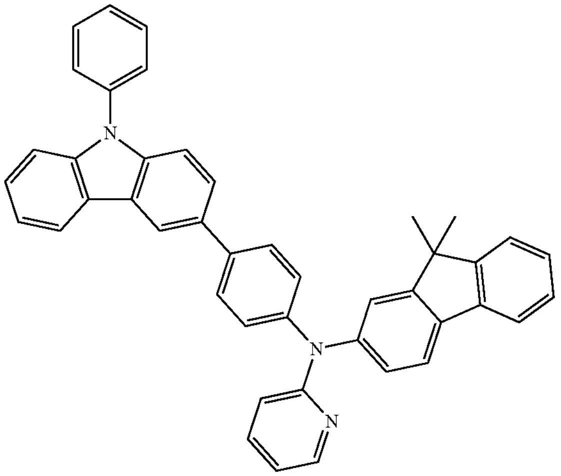

To improve conductivity, at least one of the HIL, the HTL, and the H-functional layer may further include a charge-generating material in addition to the material used to form the HIL, the HTL, and/or the H-functional layer as described above.

The charge-generating material may be, for example, a p-dopant. The p-dopant may be one of a quinone derivative, a metal oxide, or a cyano group-containing compound, but the charge-generating material is not limited thereto. Non-limiting examples of the p-dopant include a quinone derivative such as tetracyanoquinonedimethane (TCNQ) and 2,3,5,6-tetrafluoro-tetracyano-1,4-benzoquinonedimethane (F4-TCNQ); a metal oxide such as a tungsten oxide and a molybdenum oxide; and a cyano group-containing compound such as Compound 200.

Compound 200

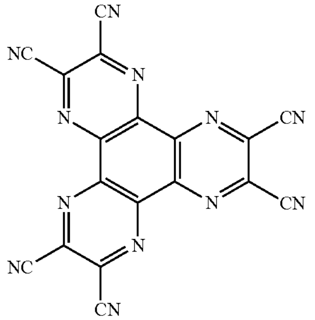

F4-TCNQ

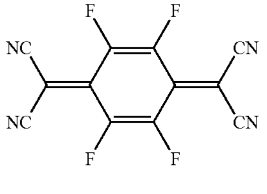

When the HIL, the HTL, or the H-functional layer further includes the charge-generating material, the charge-generating material may be homogeneously dispersed or non-homogeneously distributed in the layer.

A buffer layer may be positioned between the EML and at least one of the HIL, the HTL, and the H-functional layer. In some embodiments, for example, a hole-transporting region includes a buffer layer and a hole transport layer between the emission layer and the first electrode. The buffer layer in the hole-transporting region may be disposed between the hole transport layer and the emission layer. The buffer layer may compensate for an optical resonance distance of light according to a wavelength of the light emitted from the EML, and thus may increase efficiency. The buffer layer may include any suitable material commonly used to form an HIL or an HTL. In some embodiments, for example, the buffer layer in a hole-transporting region that also includes an HTL, may include a hole transporting material. Alternatively, the buffer layer may include the same (or similar) material as at least one of the materials included in the HIL, the HTL, and/or the H-functional layer underneath the buffer layer.

Then, the EML may be formed on the HTL, the H-functional layer, or the buffer layer by various methods, such as vacuum deposition, spin coating, casting, and LB deposition. When the EML is formed by vacuum deposition or spin coating, vacuum deposition conditions or spin coating conditions may be similar to those described above for the formation of the HIL, though the conditions may vary depending on the compound used to form the EML.

The EML may include at least one light-emitting material represented by one of Formulas 1 and 2.

Formula 1

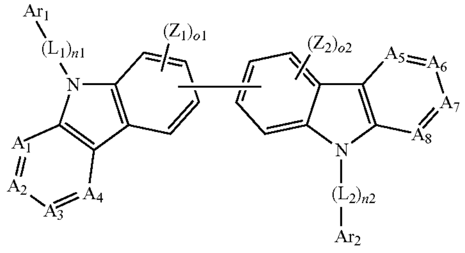

-continued

Formula 2

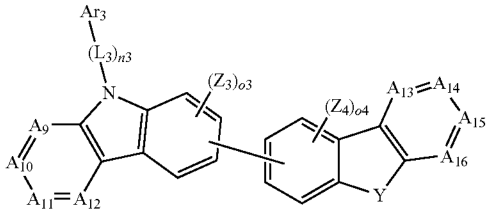

In Formula 1 or Formula 2, $A_1$ may be $CR_1$ or N; $A_2$ may be $CR_2$ or N; $A_3$ may be $CR_3$ or N; $A_4$ may be $CR_4$ or N; $A_5$ may be $CR_5$ or N; $A_6$ may be $CR_6$ or N; $A_7$ may be $CR_7$ or N; $A_8$ may be $CR_8$ or N; $A_9$ may be $CR_9$ or N; $A_{10}$ may be $CR_{10}$ or N; $A_{11}$ may be $CR_{11}$ or N; $A_{12}$ may be $CR_{12}$ or N; $A_{13}$ may be $CR_{13}$ or N; $A_{14}$ may be $CR_{14}$ or N; $A_{15}$ may be $CR_{15}$ or N; and $A_{16}$ may be $CR_{16}$ or N.

For example, in Formula 1 and Formula 2, Y may be O, S, or $C(R_{31})(R_{32})$. In some embodiments, in Formula 1 and Formula 2, $L_1$ and $L_3$ may each independently be a substituted or unsubstituted $C_3$-$C_{10}$ cycloalkylene group, a substituted or unsubstituted $C_3$-$C_{10}$ cycloalkenylene group, a substituted or unsubstituted $C_6$-$C_{60}$ arylene group, a substituted or unsubstituted $C_2$-$C_{10}$ heterocycloalkylene group, a substituted or unsubstituted $C_2$-$C_{10}$ heterocycloalkenylene group, and a substituted or unsubstituted $C_1$-$C_{60}$ heteroarylene group.

In some embodiments, in Formula 1 or Formula 2, $L_1$ to $L_3$ may each independently be: i) a $C_3$-$C_{10}$ cycloalkylene group, a $C_3$-$C_{10}$ cycloalkenylene group, a $C_6$-$C_{60}$ arylene group, a $C_2$-$C_{10}$ heterocycloalkylene group, a $C_2$-$C_{10}$ heterocycloalkenylene group, or a $C_1$-$C_{60}$ heteroarylene group; or ii) a $C_3$-$C_{10}$ cycloalkylene group, a $C_3$-$C_{10}$ cycloalkenylene group, a $C_6$-$C_{60}$ arylene group, a $C_2$-$C_{10}$ heterocycloalkylene group, a $C_2$-$C_{10}$ heterocycloalkenylene group, or a $C_1$-$C_{60}$ heteroarylene group substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, or a $C_1$-$C_{60}$ heteroaryl group; or iii) a $C_3$-$C_{10}$ cycloalkylene group, a $C_3$-$C_{10}$ cycloalkenylene group, a $C_6$-$C_{60}$ arylene group; a $C_2$-$C_{10}$ heterocycloalkylene group, a $C_2$-$C_{10}$ heterocycloalkenylene group, or a $C_1$-$C_{60}$ heteroarylene group substituted with at least one of a $C_6$-$C_{60}$ aryl group and a $C_1$-$C_{60}$ heteroaryl group substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, or a $C_1$-$C_{60}$ heteroaryl group.

In some other embodiments, in Formula 1 or Formula 2, $L_1$ to $L_3$ may each independently be: i) a $C_6$-$C_{60}$ arylene group or a $C_1$-$C_{60}$ heteroarylene group; or ii) a $C_6$-$C_{60}$ arylene group or a $C_1$-$C_{60}$ heteroarylene group substituted with at least one of a $C_6$-$C_{60}$ aryl group or a $C_1$-$C_{60}$ heteroaryl group; or iii) a $C_6$-$C_{60}$ arylene group or a $C_1$-$C_{60}$ heteroarylene group substituted with at least one of a $C_6$-$C_{60}$ aryl group or a $C_1$-$C_{60}$ heteroaryl group substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_1$-$C_{60}$ alkoxy group, a $C_6$-$C_{60}$ aryl group, or a $C_1$-$C_{60}$ heteroaryl group. However, $L_1$ to $L_3$ are not limited thereto.

In some other embodiments, in Formula 1 or Formula 2, $L_1$ to $L_3$ may each independently be: i) a phenylene group, a fluorenylene group, a pyridylene group, a pyrimidylene group, a triazinylene group, or a quinazolinylene group; or ii) a phenylene group, a fluorenylene group, a pyridylene group, a pyrimidylene group, a triazinylene group, or a quinazolinylene group substituted with at least one of a phenyl group, a naphthyl group, or a pyridyl group; or iii) a phenylene group, a fluorenylene group, a pyridylene group, a pyrimidylene group, a triazinylene group, or a quinazolinylene group substituted with at least one of a deuterium atom, a methyl group, an ethyl group, an n-octyl group, a methoxy group, an ethoxy group, a phenyl group, a naphthyl group, a pyridyl group, or a carbazole group. However, $L_1$ to $L_3$ are not limited thereto.

In Formula 1 or Formula 2, n1 indicates the number of $L_1$s, and is an integer from 0 to 3. When n1 is 2 or greater, the $L_1$s may be identical to or different from each other. In Formula 1 or Formula 2, n2 indicates the number of $L_2$s, and is an integer from 0 to 3. When n2 is 2 or greater, the $L_2$s may be identical to or different from each other. In Formula 1 or Formula 2, n3 indicates the number of $L_3$s, and is an integer from 0 to 3. When n3 is 2 or greater, the $L_3$s may be identical to or different from each other.

In Formula 1 or Formula 2, $Ar_1$ to $Ar_3$ may each independently be: i) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_1$-$C_{60}$ heteroaryl group, or —Si($Q_1$)($Q_2$)($Q_3$) (where $Q_1$ to $Q_3$ are each independently a substituted or unsubstituted $C_1$-$C_{10}$ alkyl group or a substituted or unsubstituted $C_6$-$C_{30}$ aryl group); or ii) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, or a $C_1$-$C_{60}$ heteroaryl group substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, or —Si($Q_1$)($Q_2$)($Q_3$) (where $Q_1$ to $Q_3$ are each independently a substituted or unsubstituted $C_1$-$C_{10}$ alkyl group or a substituted or unsubstituted $C_6$-$C_{30}$ aryl group).

In some embodiments, in Formula 1 or Formula 2, $Ar_1$ to $Ar_3$ may each independently be: i) a $C_6$-$C_{60}$ aryl group, a $C_1$-$C_{60}$ heteroaryl group, or —Si($Q_1$)($Q_2$)($Q_3$) (where $Q_1$ to $Q_3$ are each independently a $C_1$-$C_{10}$ alkyl group or a $C_6$-$C_{30}$ aryl group); or ii) a $C_6$-$C_{60}$ aryl group or a $C_1$-$C_{60}$ heteroaryl group substituted with at least one of a deuterium atom, a halogen atom, a $C_1$-$C_{60}$ alkyl group, a $C_6$-$C_{60}$ aryl group, a $C_1$-$C_{60}$ heteroaryl group, or —Si($Q_1$)($Q_2$)($Q_3$) (where $Q_1$ to $Q_3$ are each independently a $C_1$-$C_{10}$ alkyl group or a $C_6$-$C_{30}$ aryl group). However, $Ar_1$ to $Ar_3$ are not limited thereto.

In some other embodiments, in Formula 1 or Formula 2, $Ar_1$ to $Ar_3$ may each independently be: i) a phenyl group, a pyridyl group, a pyrimidyl group, a triazinyl group, or —Si($Q_1$)($Q_2$)($Q_3$) (where $Q_1$ to $Q_3$ are each independently a methyl group, an ethyl group, an n-propyl group, an i-propyl group, or a phenyl group); or ii) a phenyl group, a pyridyl group, a pyrimidyl group, or a triazinyl group substituted with at least one of a deuterium atom, a halogen atom, a phenyl group, a pyridyl group, or —Si($Q_1$)($Q_2$)($Q_3$) (where, $Q_1$ to $Q_3$ are each independently a methyl group, an ethyl group, an n-propyl group, an i-propyl group, or a phenyl group). However, $Ar_1$ to $Ar_3$ are not limited thereto.

In some other embodiments, in Formula 1 or Formula 2, $Ar_1$ to $Ar_3$ may each independently be a moiety represented by one of Formulas H1 to H5, but $Ar_1$ to $Ar_3$ are not limited thereto.

H1

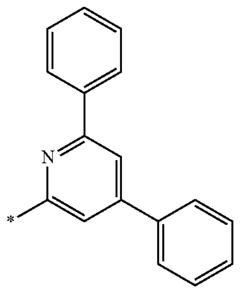

H2

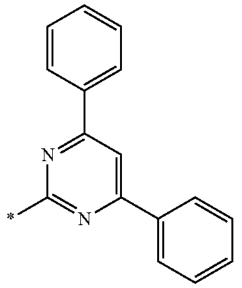

H3

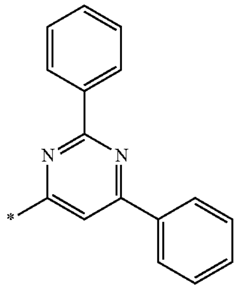

-continued

H4

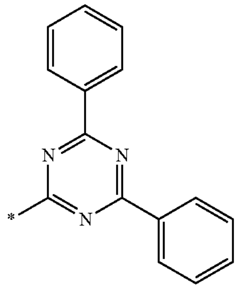

H5

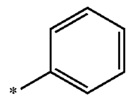

In Formulas H1 to H5 above, * represents a binding site to one of $L_1$ to $L_3$ in Formula 1 or Formula 2, or to N in Formula 1 or Formula 2.

In Formula 1 or Formula 2, $Z_1$, $Z_2$, $R_{31}$, and $R_{32}$ may each independently be: i) a hydrogen atom, a deuterium atom, a $C_1$-$C_{60}$ alkyl group, a $C_2$-$C_{60}$ alkenyl group, a $C_2$-$C_{60}$ alkynyl group, or a $C_1$-$C_{60}$ alkoxy group; or ii) a $C_1$-$C_{60}$ alkyl group, a $C_2$-$C_{60}$ alkenyl group, a $C_2$-$C_{60}$ alkynyl group, or a $C_1$-$C_{60}$ alkoxy group substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid group or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, or a $C_1$-$C_{60}$ heteroaryl group; or iii) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, or a $C_1$-$C_{60}$ heteroaryl group; or iv) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, or a $C_1$-$C_{60}$ heteroaryl group substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, or a $C_1$-$C_{60}$ heteroaryl group.

In some embodiments, in Formula 1 or Formula 2, $Z_1$, $Z_2$, $R_{31}$, and $R_{32}$ may each independently be: i) a $C_1$-$C_{60}$ alkyl group or a $C_1$-$C_{60}$ alkoxy group; or ii) a $C_1$-$C_{60}$ alkyl group or a $C_1$-$C_{60}$ alkoxy group substituted with at least one of a deuterium atom, a halogen atom, a $C_6$-$C_{60}$ aryl group, or a $C_1$-$C_{60}$ heteroaryl group; or iii) a $C_6$-$C_{60}$ aryl group or a $C_1$-$C_{60}$ heteroaryl group; or iv) a $C_6$-$C_{60}$ aryl group or a $C_1$-$C_{60}$ heteroaryl group substituted with at least one of a deuterium atom, a halogen atom, a $C_1$-$C_{60}$ alkyl group, a $C_6$-$C_{60}$ aryl group, or a $C_1$-$C_{60}$ heteroaryl group. However, $Z_1$, $Z_2$, $R_{31}$, and $R_{32}$ are not limited thereto.

In some other embodiments, in Formulas 1 to 3, $Z_1$, $Z_2$, $R_{31}$, and $R_{32}$ may each independently be: i) a methyl group, an ethyl group, an n-propyl group, an iso-propyl group, an n-butyl group, an iso-butyl group, a sec-butyl group, or a tert-butyl group; or ii) a phenyl group, a naphthyl group, or a pyridyl group; or iv) a phenyl group, a naphthyl group, or a pyridyl group substituted with at least one of a methyl group, an ethyl group, an n-propyl group, an iso-propyl group, an n-butyl group, an iso-butyl group, a sec-butyl group, or a tert-butyl group. However, $Z_1$, $Z_2$, $R_{31}$, and $R_{32}$ are not limited thereto.

In Formulas 1 to 3, $R_1$ to $R_{16}$ may each independently be a hydrogen atom, a deuterium atom, a halogen atom, a $C_1$-$C_{60}$ alkyl group, a $C_6$-$C_{60}$ aryl group, a $C_1$-$C_{60}$ heteroaryl group, or —N($Q_1$)($Q_2$)($Q_3$) (where $Q_1$ to $Q_3$ are each independently a $C_1$-$C_{60}$ alkyl group, a $C_6$-$C_{60}$ aryl group, or a $C_1$-$C_{60}$ heteroaryl group). 2 or more of $R_1$ to $R_{16}$ may optionally combine to form a $C_6$-$C_{20}$ saturated ring or a $C_6$-$C_{20}$ unsaturated ring.

In some embodiments, in Formula 1 or Formula 2, $R_1$ to $R_{16}$ may be a hydrogen atom, and 2 or more of $R_1$ to $R_{16}$ may optionally combine to form a $C_6$-$C_{20}$ saturated ring or a $C_6$-$C_{20}$ unsaturated ring, but $R_1$ to $R_{16}$ are not limited thereto.

In Formula 1 or Formula 2, o1 indicates the number of $Z_1$s, and is an integer of 0 to 3. When o1 is 2 or greater, the $Z_1$s may be identical to or different from each other. In Formula 1 or Formula 2, o2 indicates the number of $Z_2$s, and is an integer of 0 to 3. When o2 is 2 or greater, the $Z_2$s may be identical to or different from each other. In Formula 1 or Formula 2, o3 indicates the number of $Z_3$s, and is an integer of 0 to 3. When o3 is 2 or greater, the $Z_3$s may be identical to or different from each other. In Formula 1 or Formula 2, o4 indicates the number of $Z_4$s, and is an integer of 0 to 3. When o4 is 2 or greater, the $Z_4$s may be identical to or different from each other.

According to another embodiment of the present invention, Formulas 1 and 2 may be represented by one of Formulas 1-1 to 1-24, but Formulas 1 and 2 are not limited thereto.

1-1

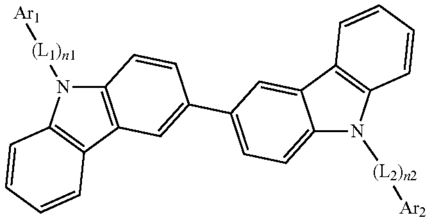

1-2

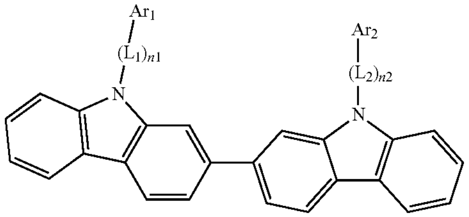

-continued
1-3
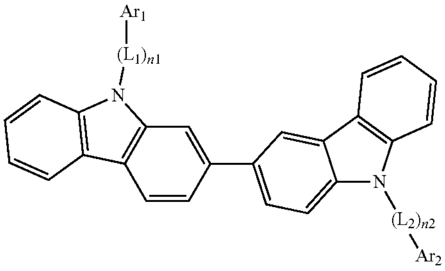
1-4
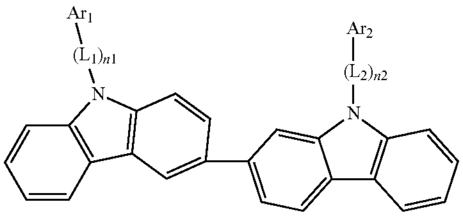
1-5
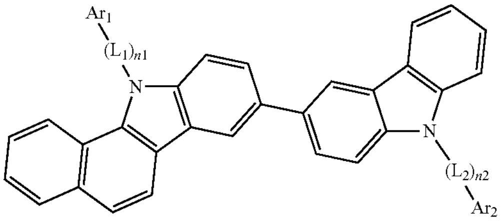
1-6
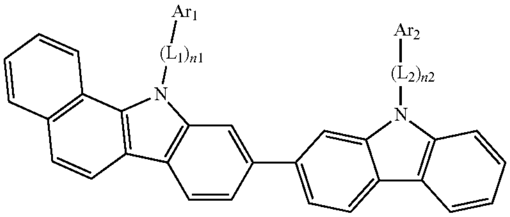
1-7
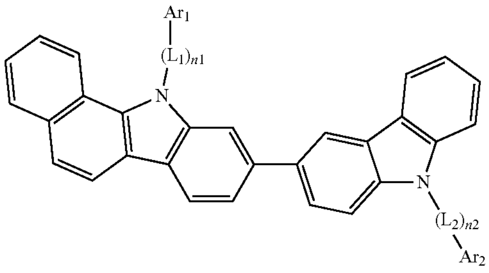
1-8
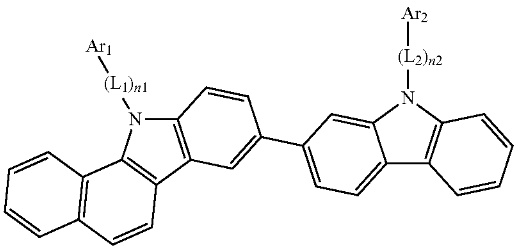
-continued
1-9
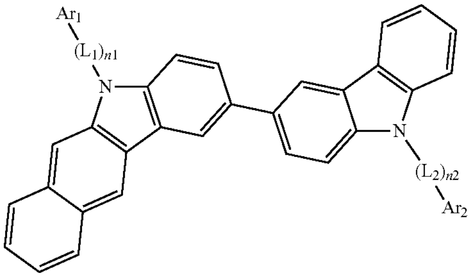
1-10
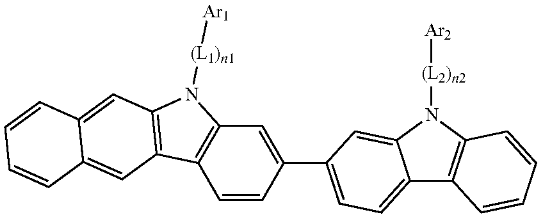
1-11
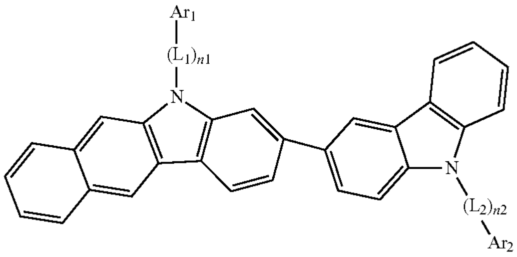
1-12
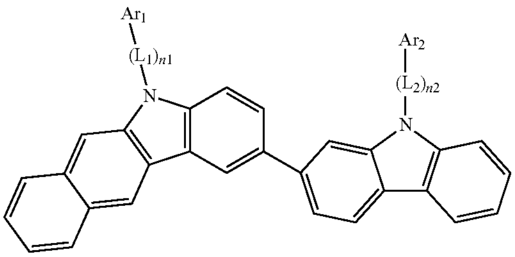
1-13
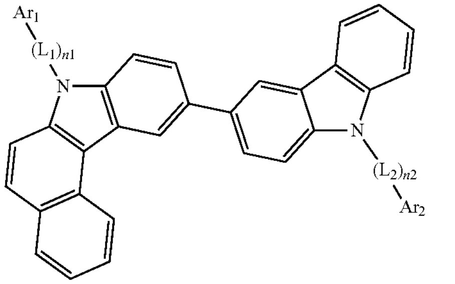

-continued 1-14

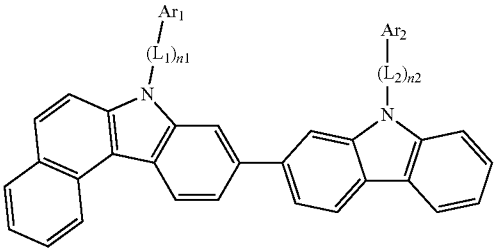

1-15

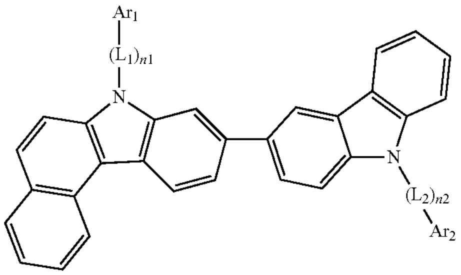

1-16

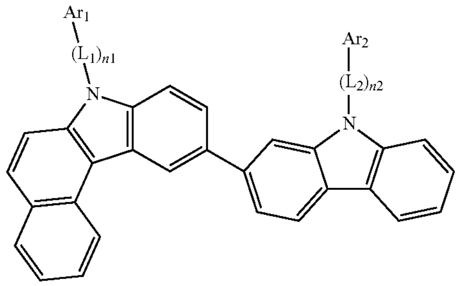

1-17

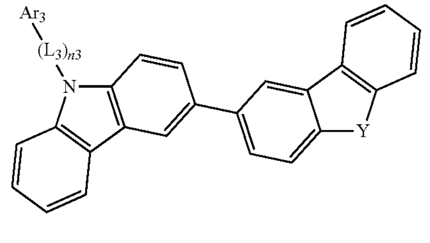

1-18

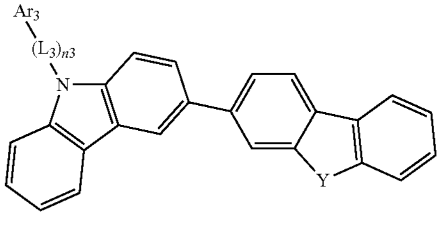

1-19

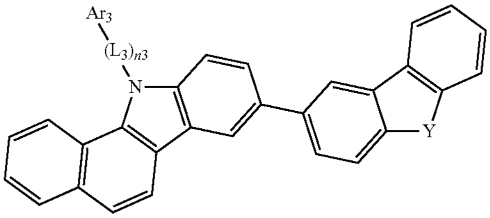

-continued 1-20

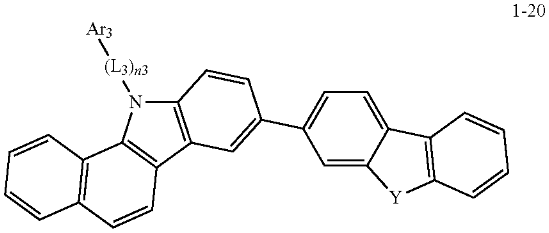

1-21

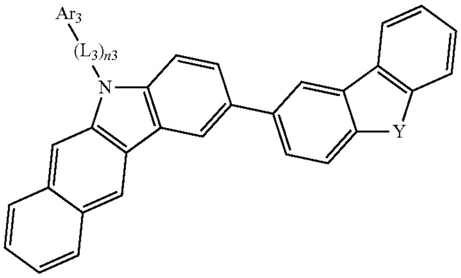

1-22

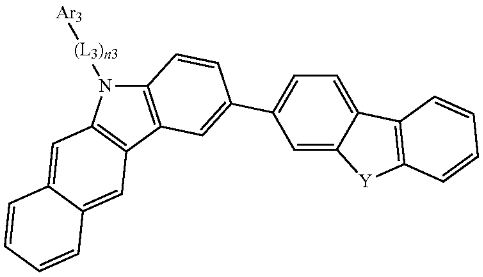

1-23

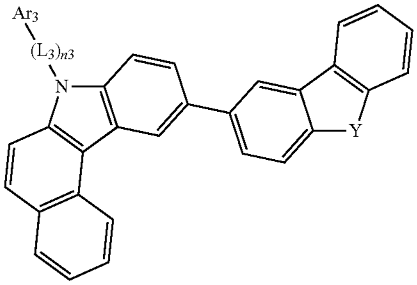

1-24

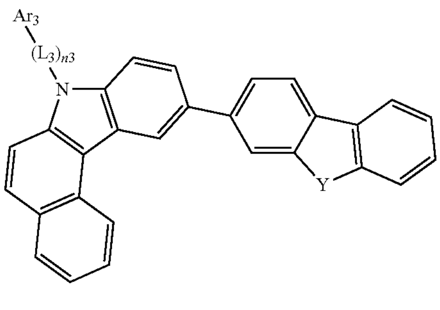

In Formulas 1-1 to 1-24, Y may be O, S, or $C(R_{31})(R_{32})$; n1 to n3 may each independently be an integer of 0 to 3; and $L_1$ to $L_3$ may each independently be a substituted or unsubstituted $C_3$-$C_{10}$ cycloalkylene group, a substituted or unsubstituted $C_3$-$C_{10}$ cycloalkenylene group, a substituted or unsubstituted $C_6$-$C_{60}$ arylene group, a substituted or unsubstituted $C_2$-$C_{10}$ heterocycloalkylene group, a substituted or unsubstituted $C_2$-$C_{10}$ heterocycloalkenylene group, or a substituted or unsubstituted $C_1$-$C_{60}$ heteroarylene group.

In Formulas 1-1 to 1-24, n1 to n3 may each independently be an integer of 0 to 3. $Ar_1$ to $Ar_3$ may each independently be: i) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, or a $C_1$-$C_{60}$ heteroaryl group; or ii) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, or a $C_1$-$C_{60}$ heteroaryl group substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-10 cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, or a $C_1$-$C_{60}$ heteroaryl group.

In Formulas 1-1 to 1-24, $R_{31}$ and $R_{32}$ may each independently be: i) a hydrogen atom, a deuterium atom, a $C_1$-$C_{60}$ alkyl group, a $C_2$-$C_{60}$ alkenyl group, a $C_2$-$C_{60}$ alkynyl group, or a $C_1$-$C_{60}$ alkoxy group; or ii) a $C_1$-$C_{60}$ alkyl group, a $C_2$-$C_{60}$ alkenyl group, a $C_2$-$C_{60}$ alkynyl group, or a $C_1$-$C_{60}$ alkoxy group substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, or a $C_1$-$C_{60}$ heteroaryl group; or iii) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, or a $C_1$-$C_{60}$ heteroaryl group; or iv) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, or a $C_1$-$C_{60}$ heteroaryl group substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, or a $C_1$-$C_{60}$ heteroaryl group.

In some other embodiments, the light-emitting material is at least one of Compounds 1 to 108, but the light-emitting material is not limited thereto.

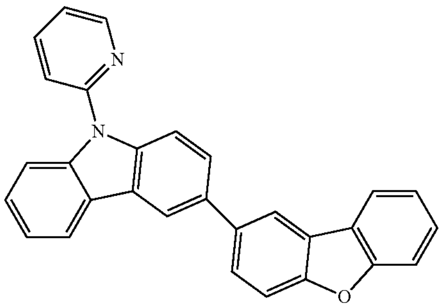

1

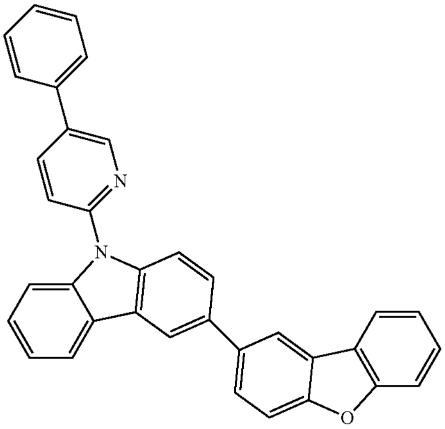

2

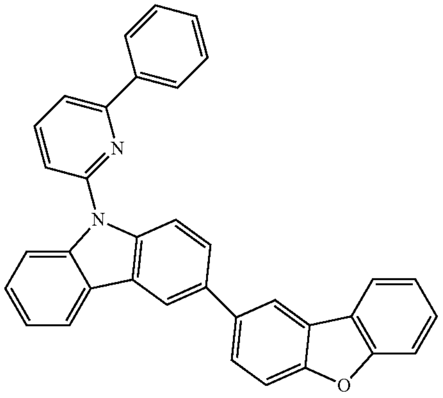

3

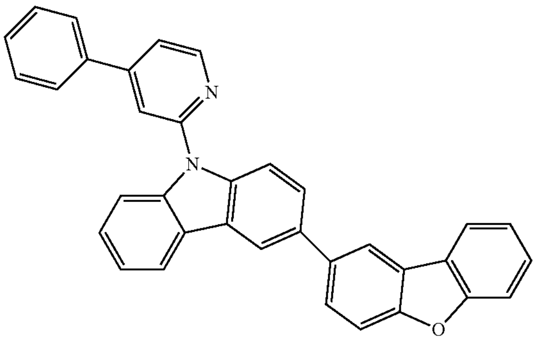

4

-continued
5
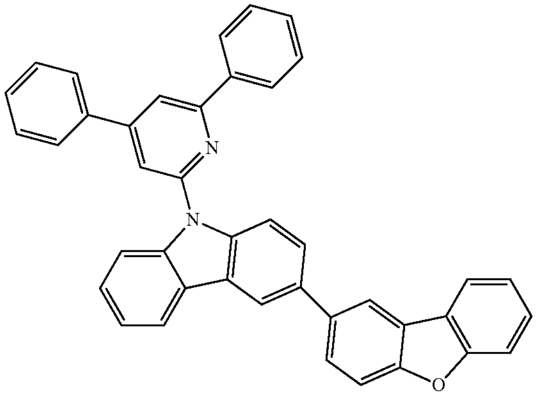
6
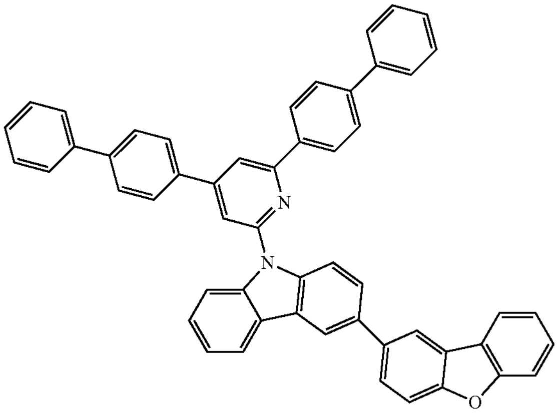
7
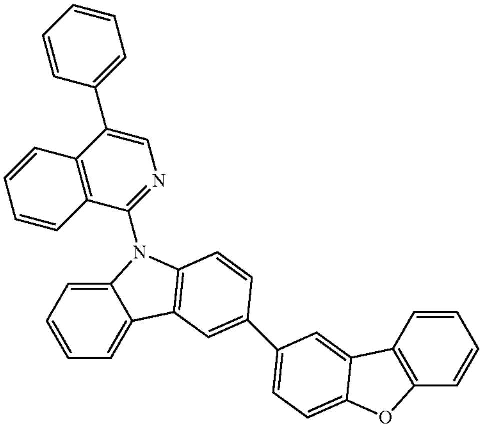
-continued
8
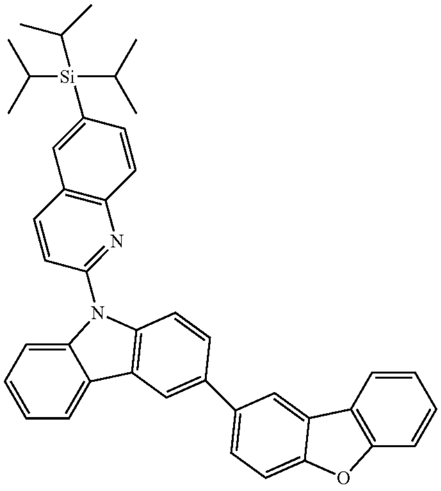
9
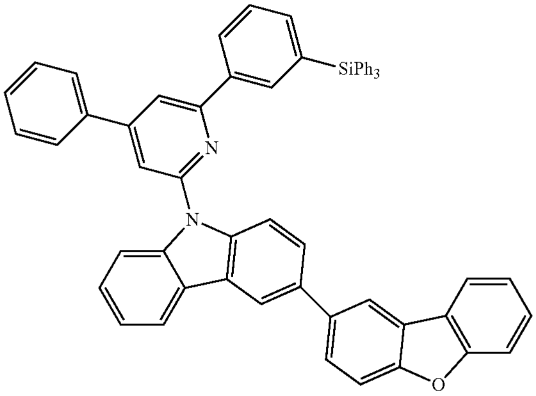
10
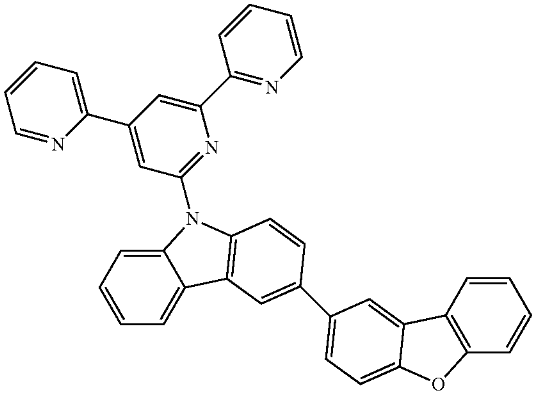

-continued
11
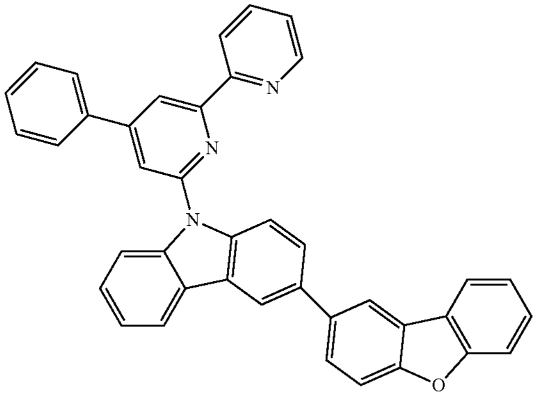
12
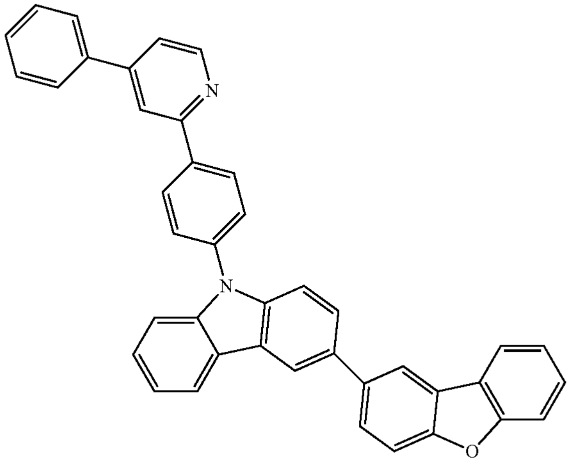
13
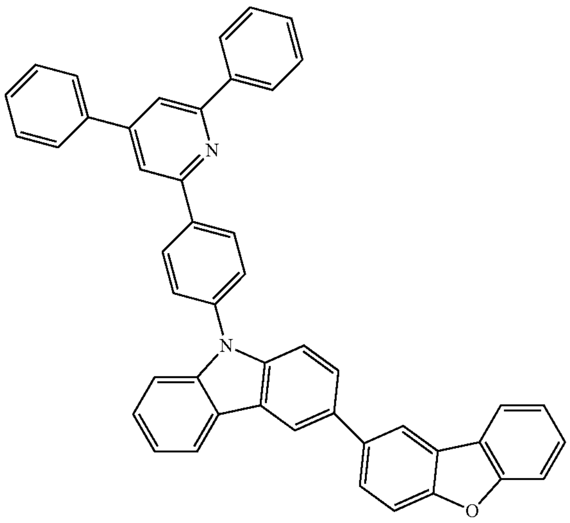
-continued
14
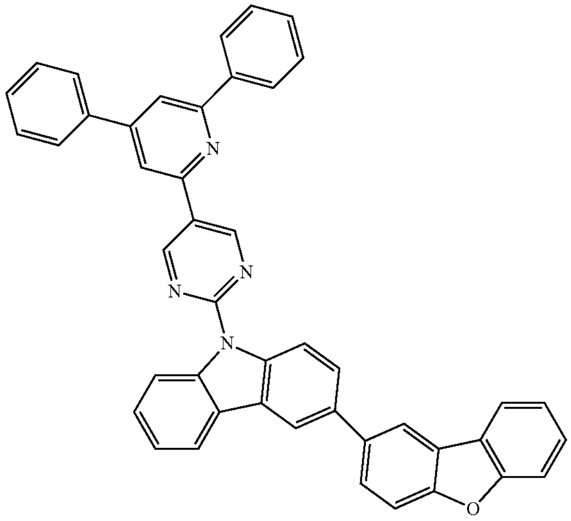
15
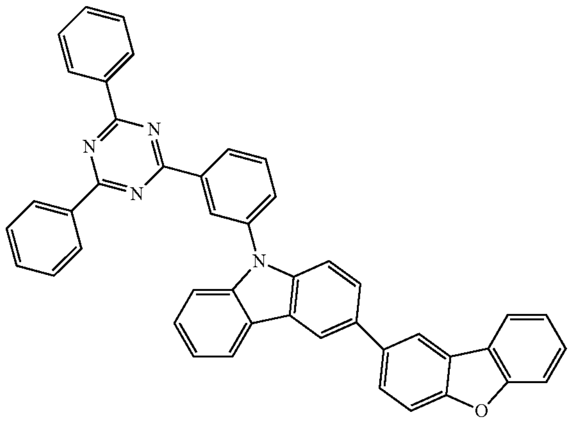
16
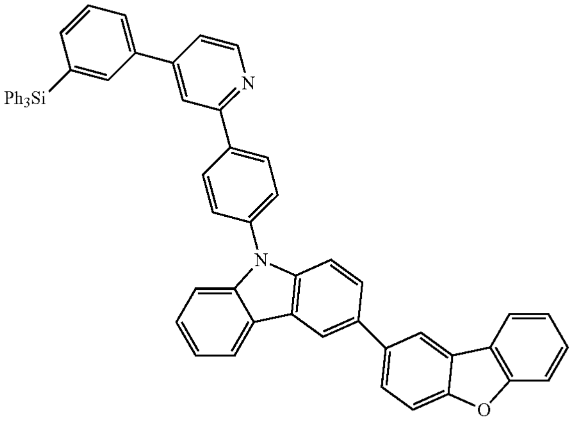

-continued
17
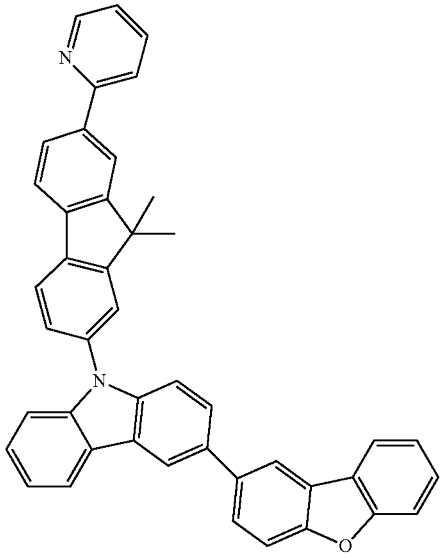
18
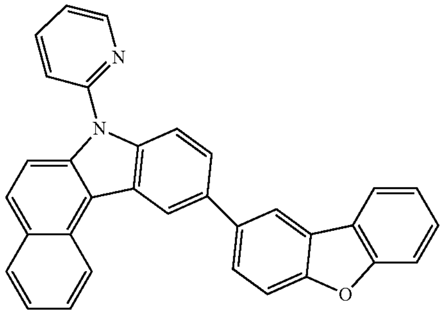
19
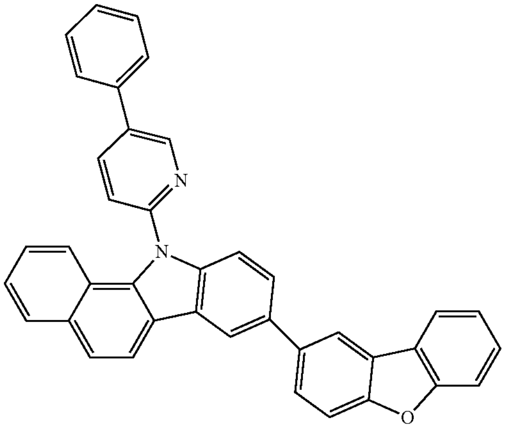
-continued
20
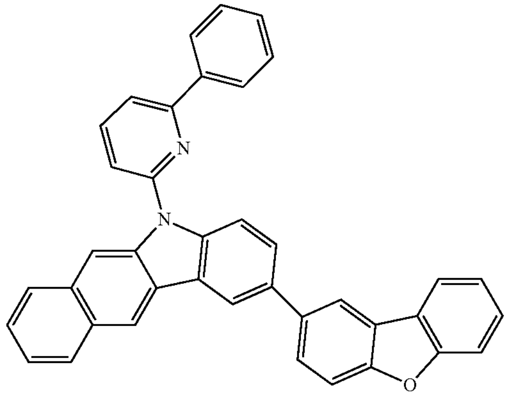
21
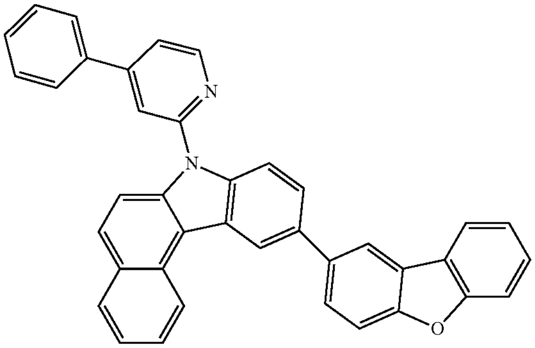
22
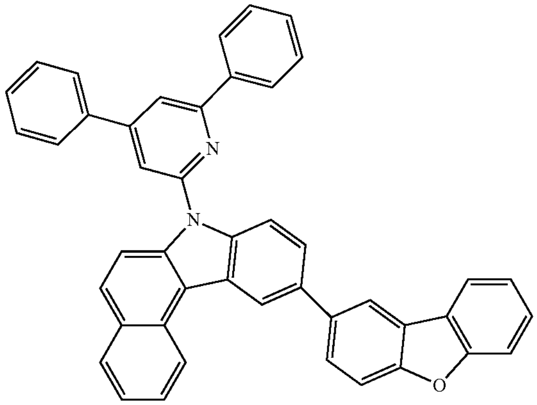
23
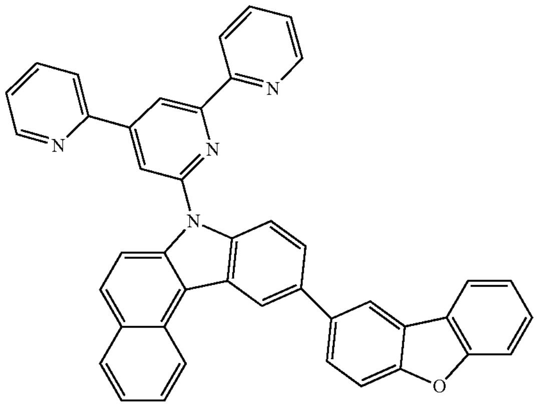

-continued
24
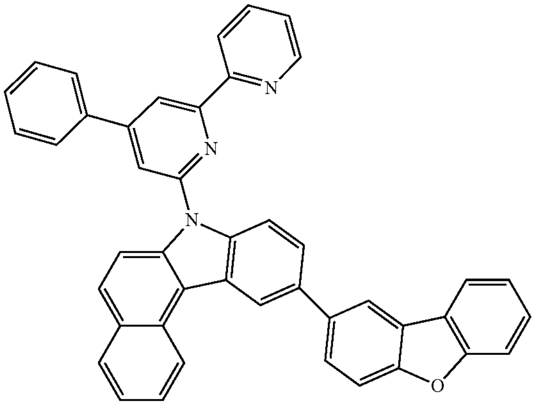
25
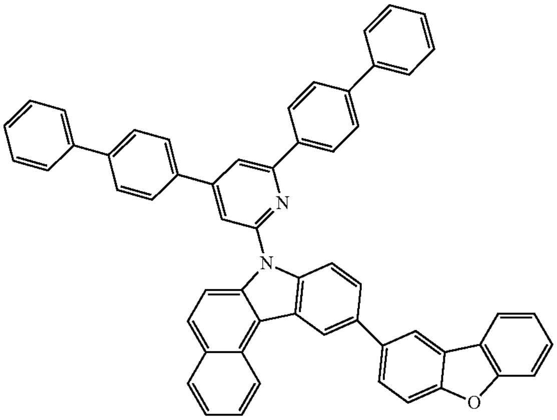
26
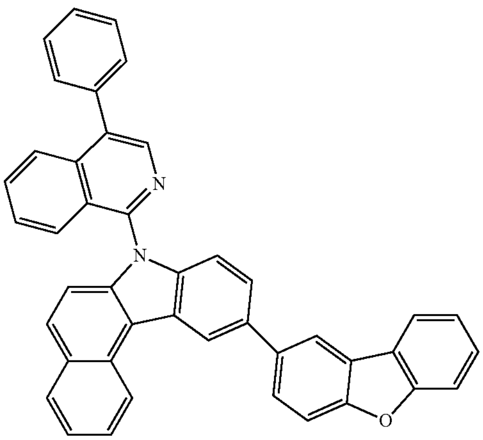
-continued
27
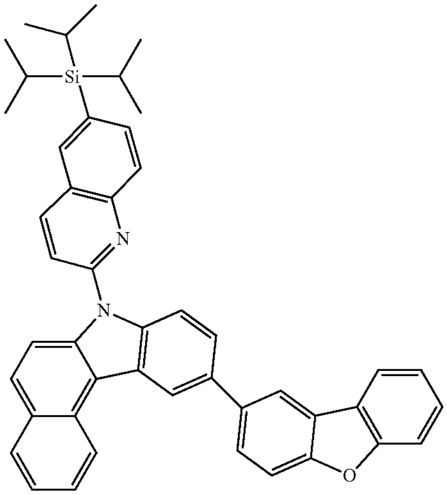
28
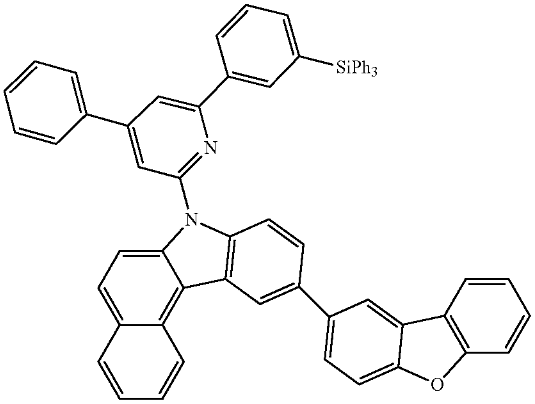
29
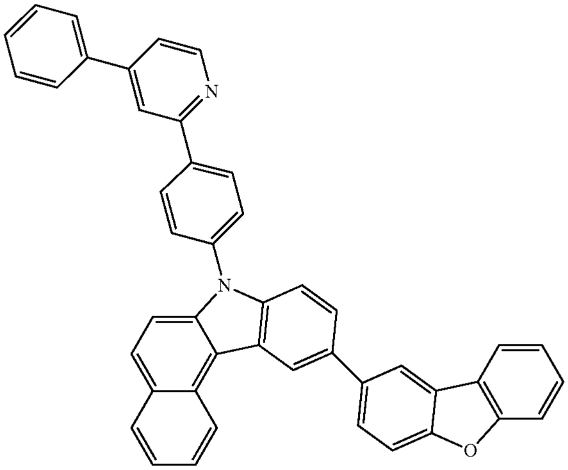

-continued
30
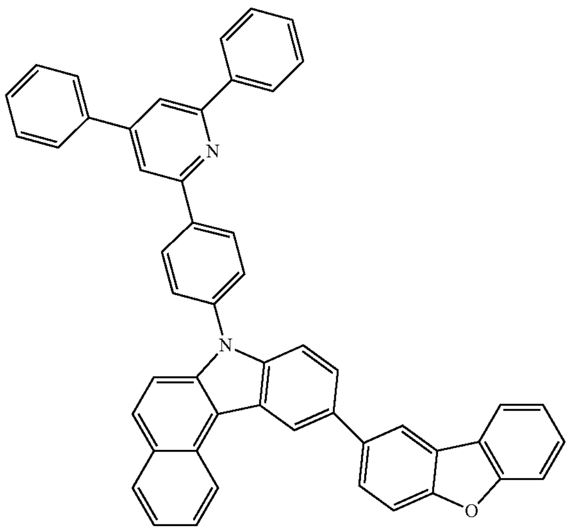
31
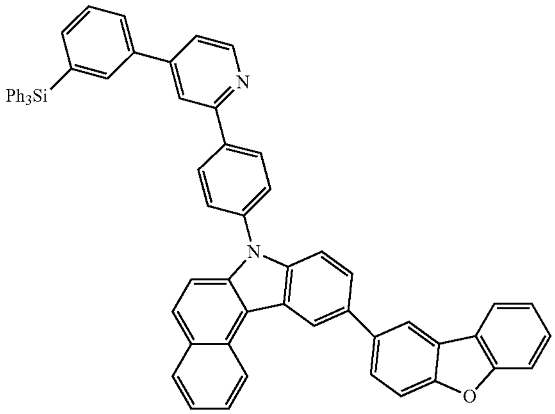
32
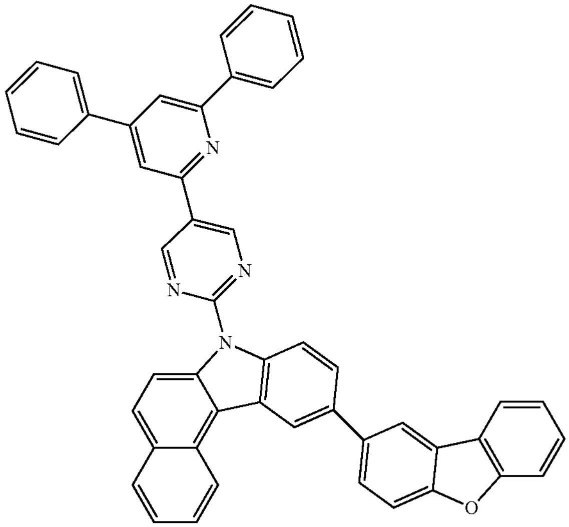
-continued
33
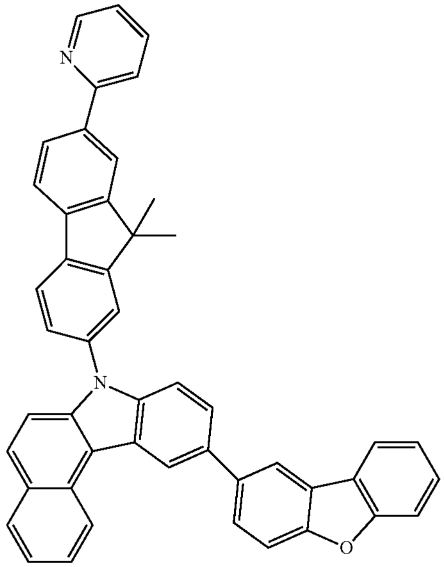
34
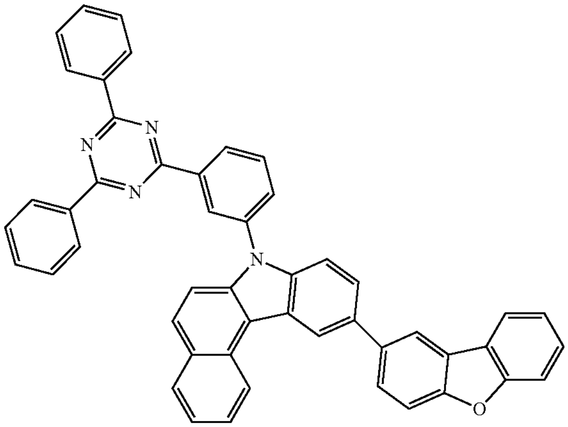
35
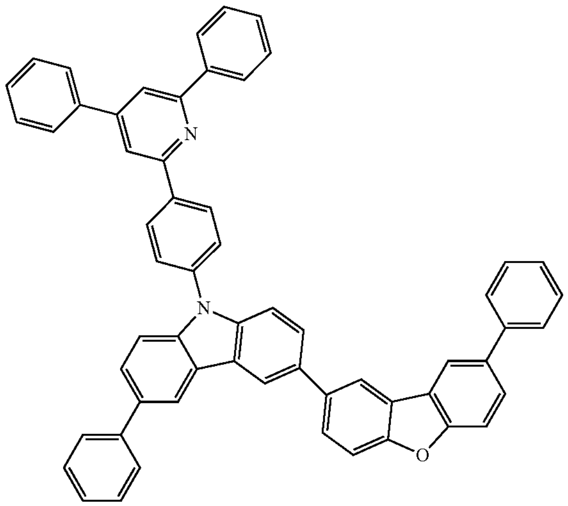

-continued
36
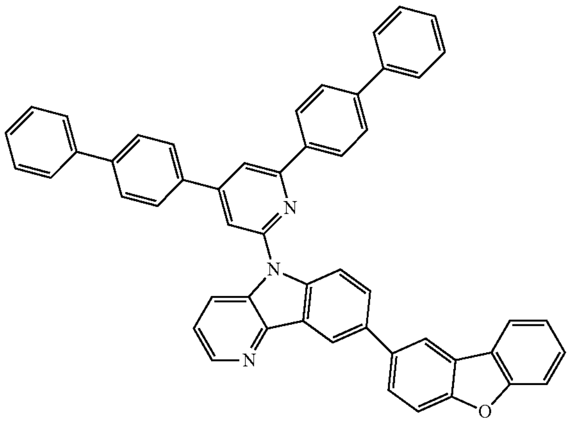
37
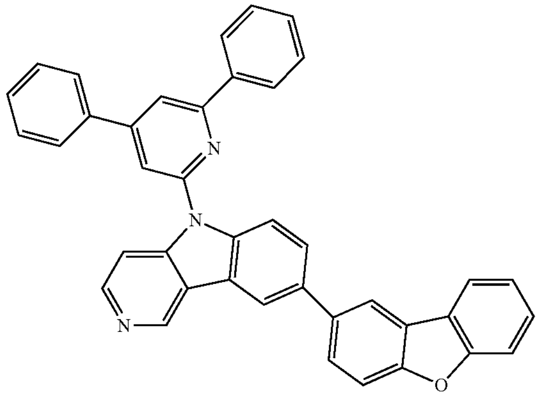
38
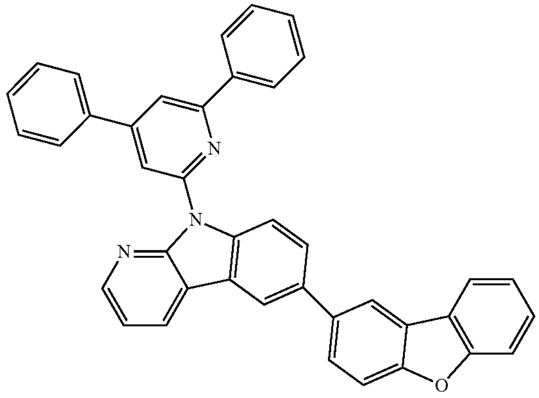
-continued
39
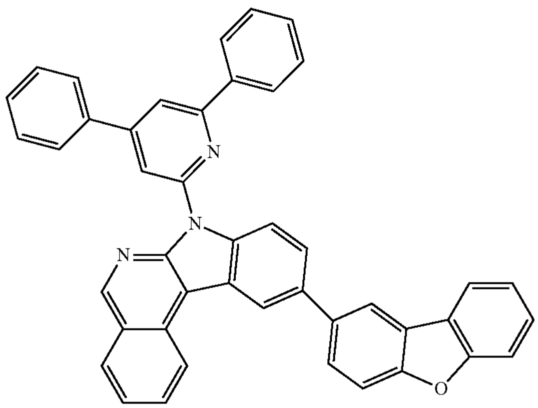
40
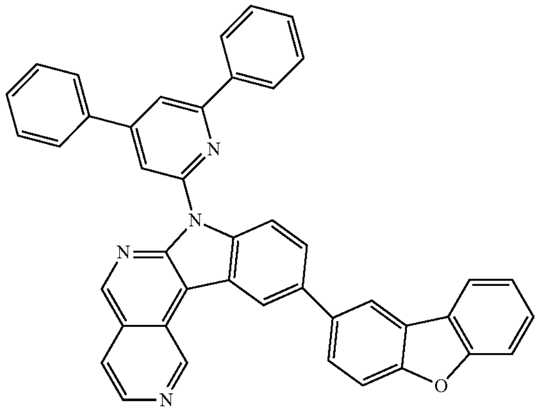
41
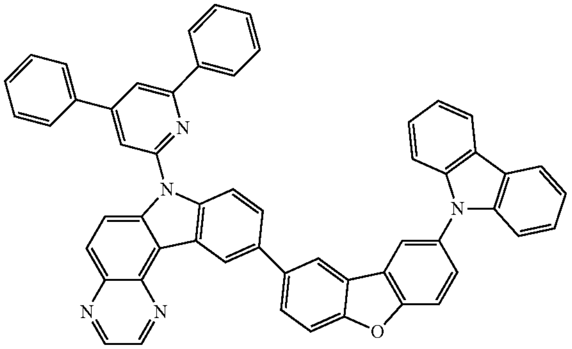
42
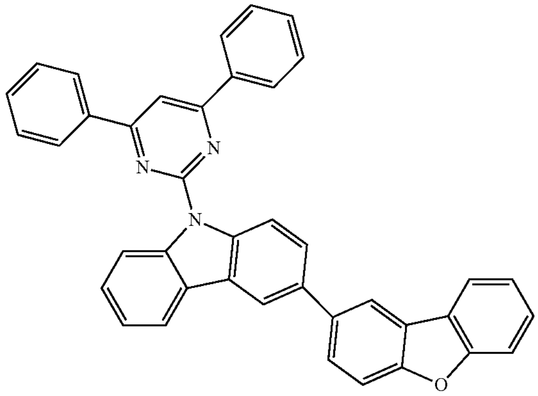

-continued
43
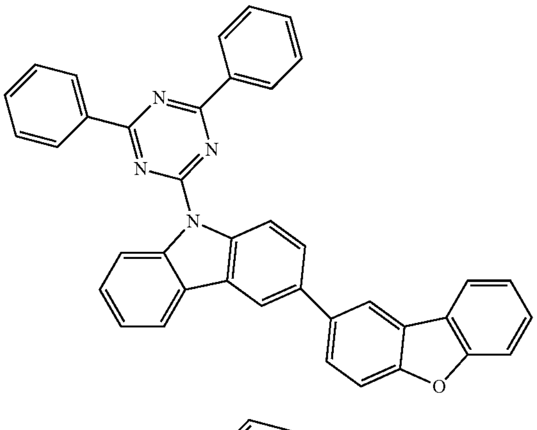
44
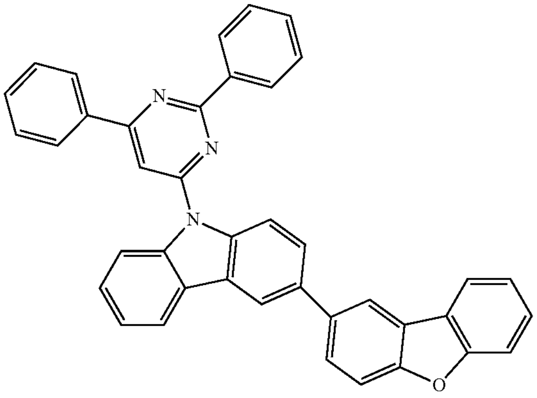
45
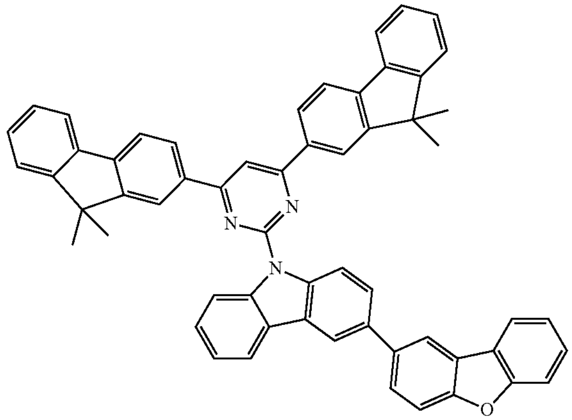
46
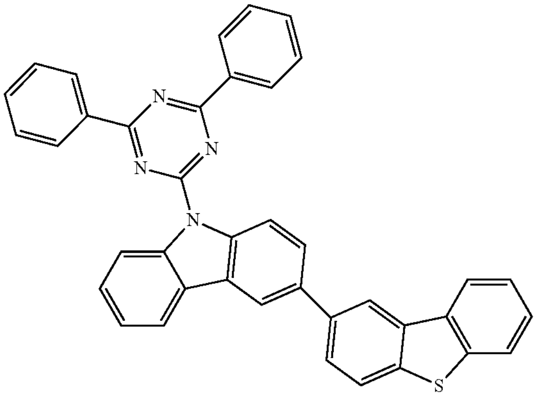
-continued
47
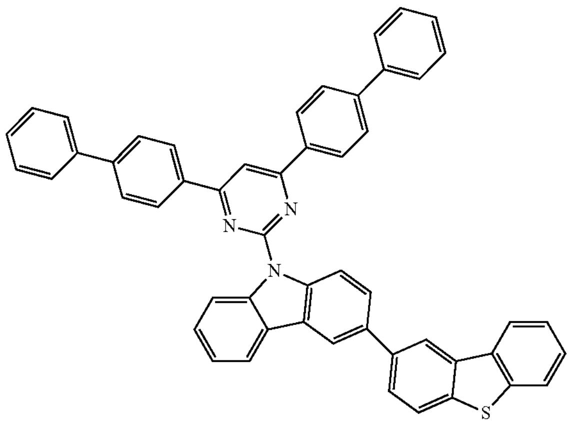
48
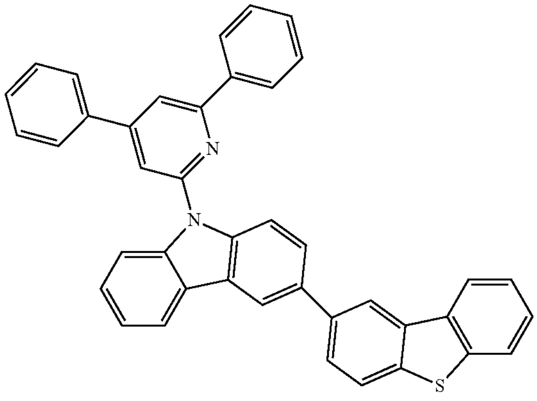
49
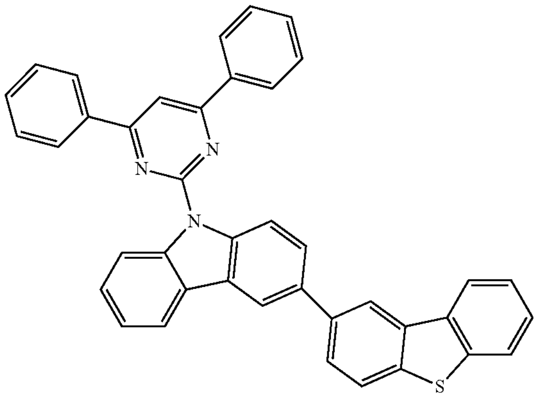

-continued
50
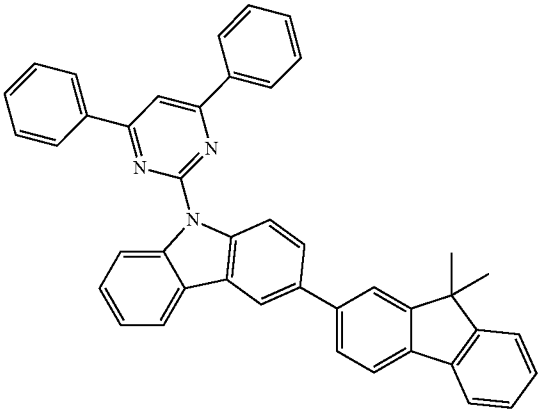
51
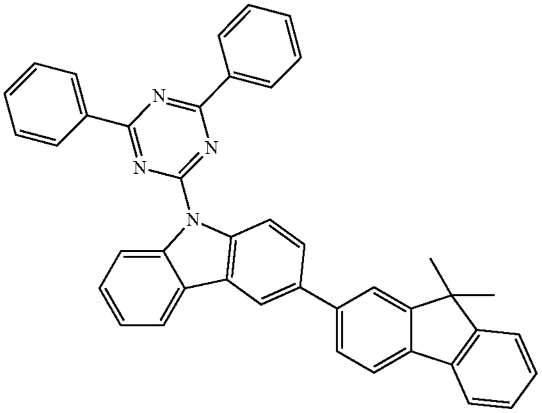
52
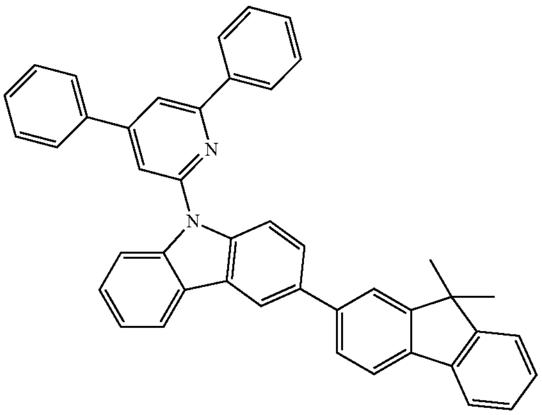
-continued
53
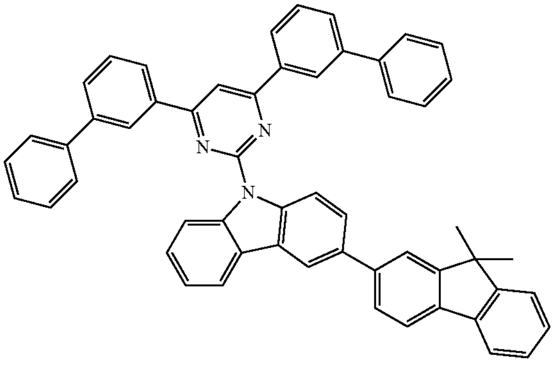
54
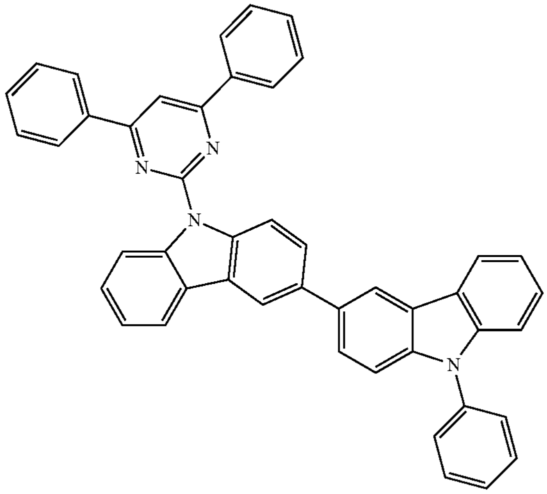
55
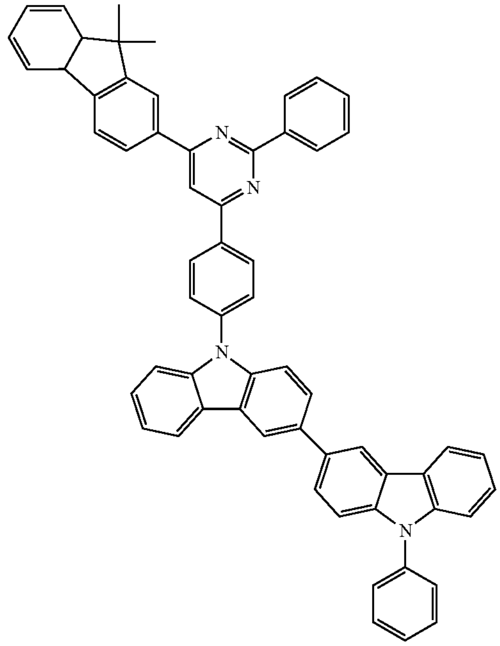

-continued
56
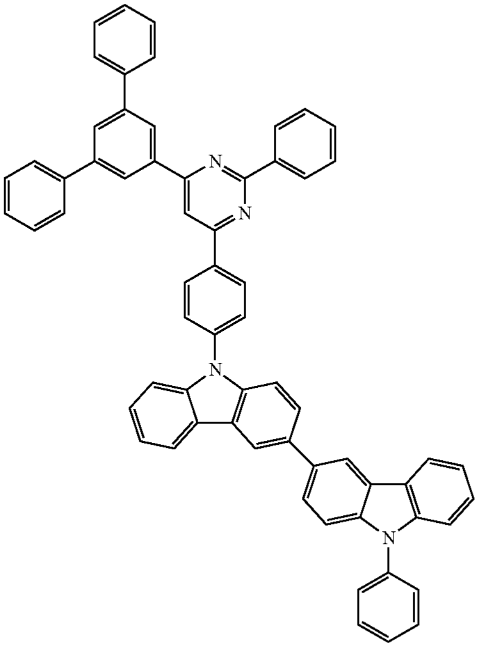
57
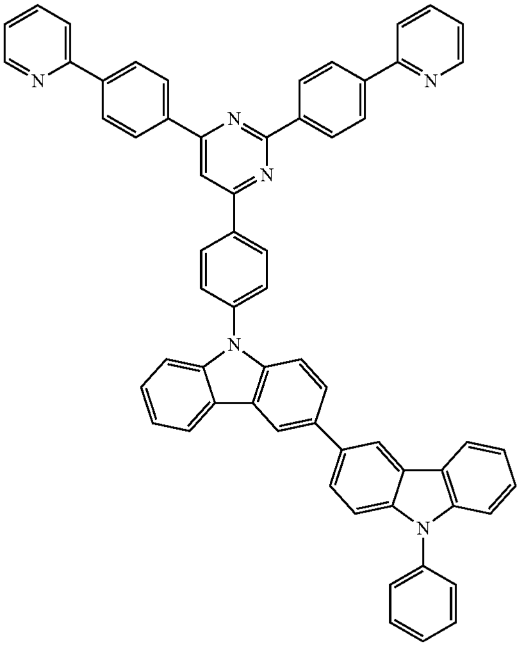
-continued
58
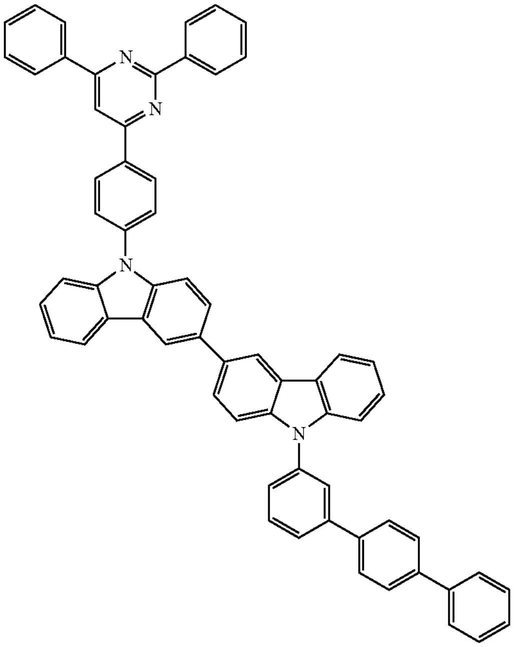
59
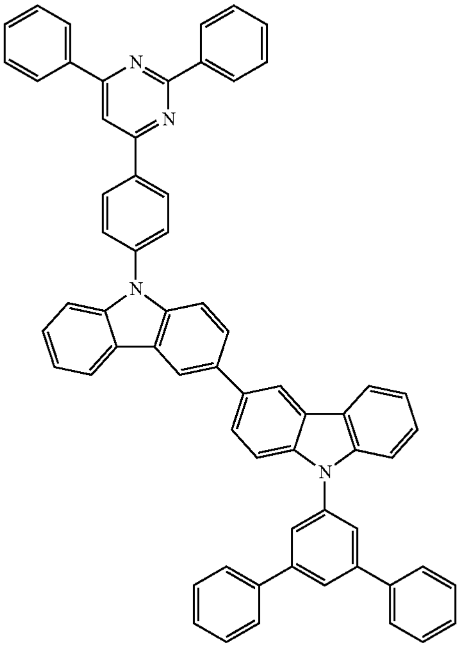

-continued
60
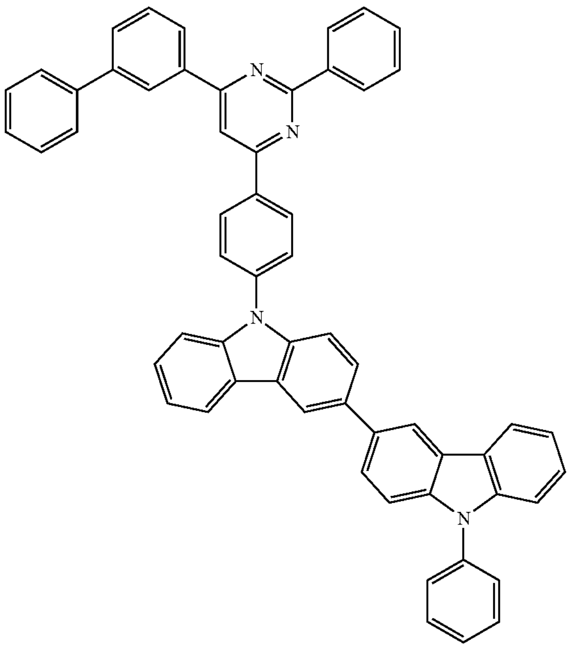
61
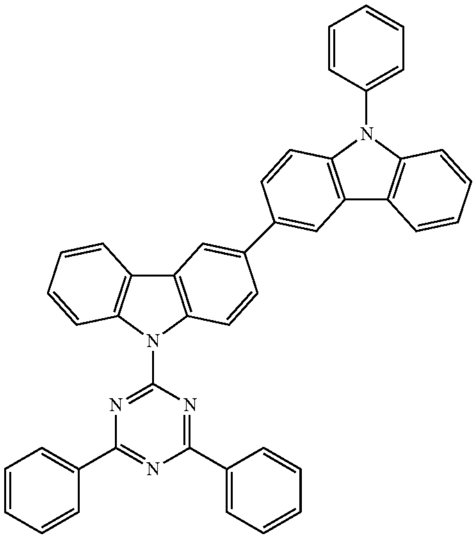
-continued
62
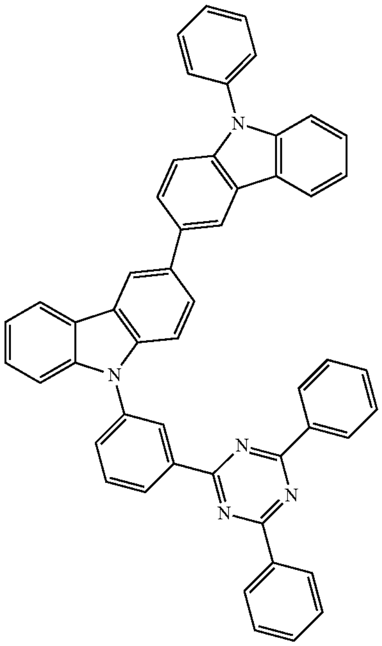
63
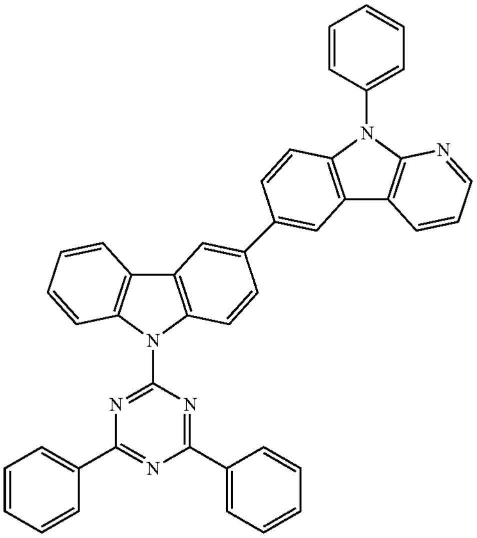

-continued
64
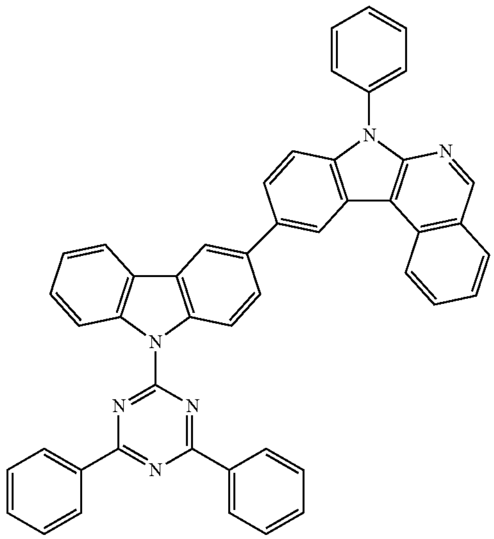
65
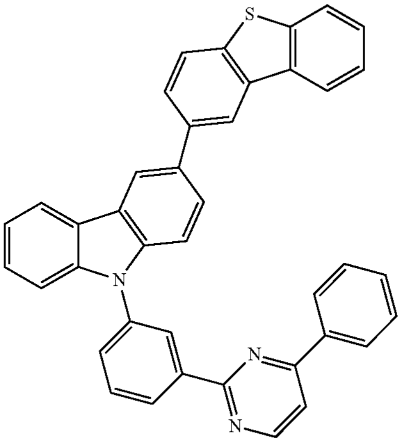
66
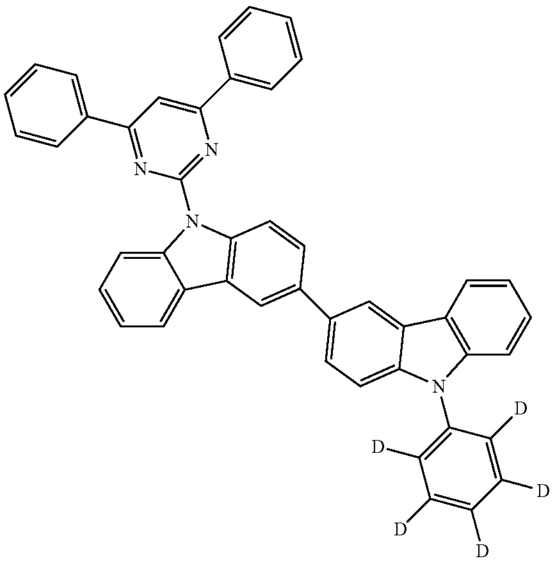
-continued
67
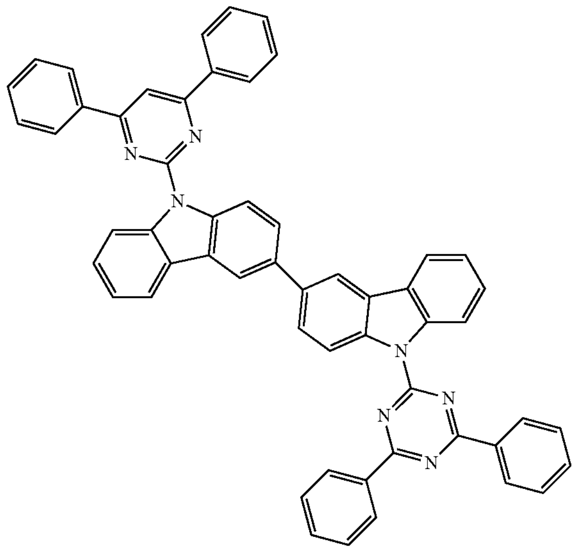
68
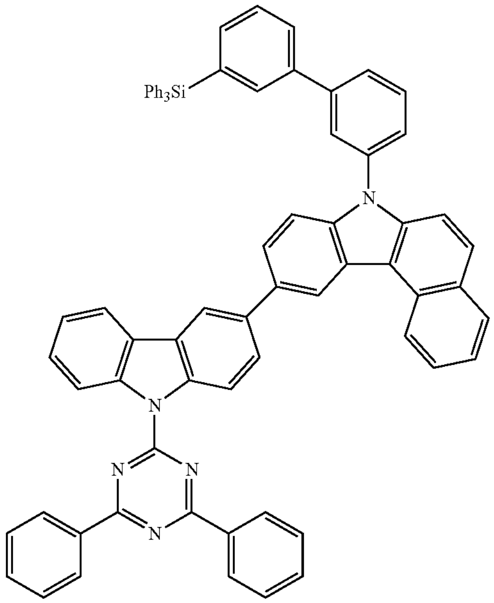

-continued
69
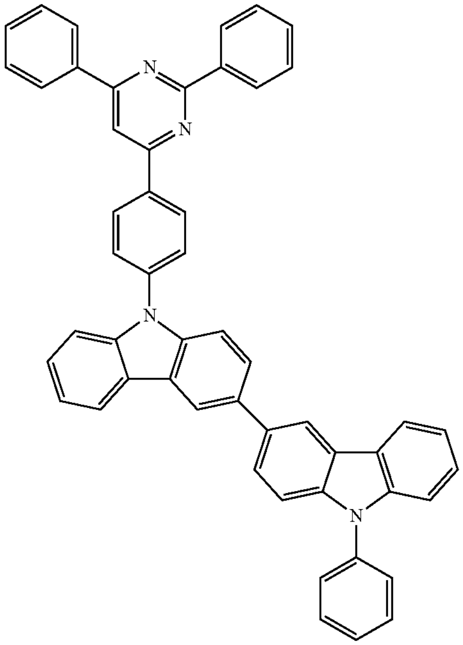
70
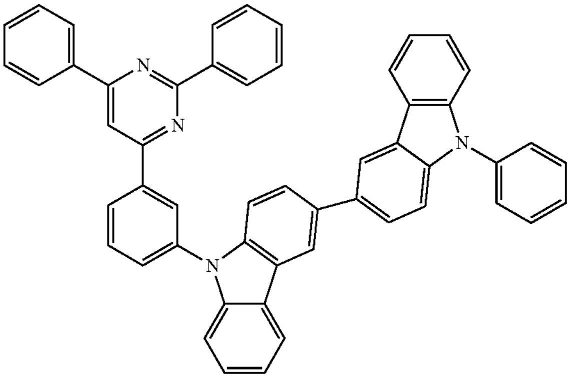
71
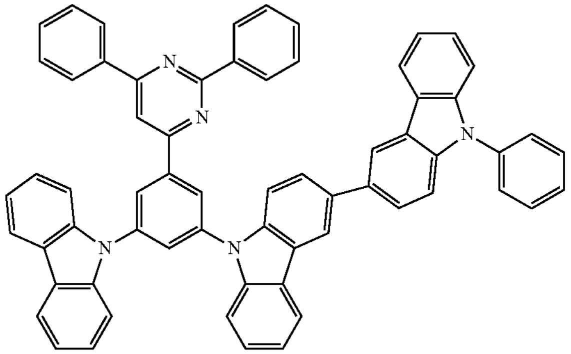
-continued
72
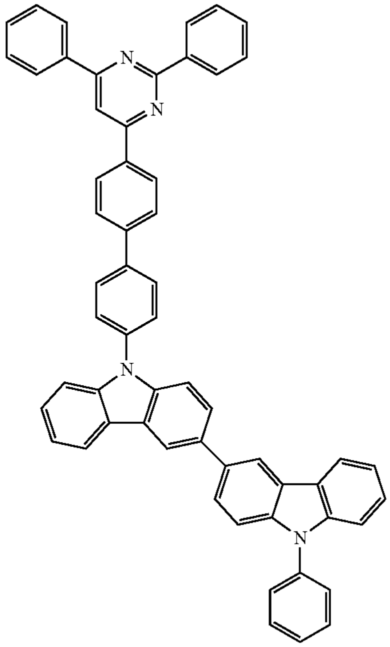
73
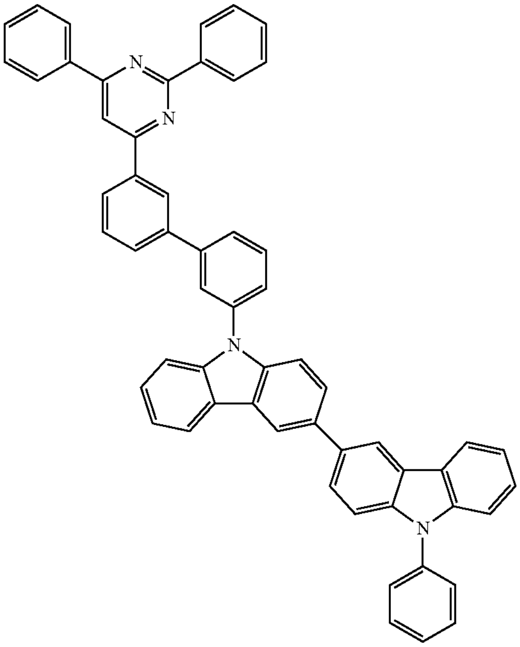

-continued
74
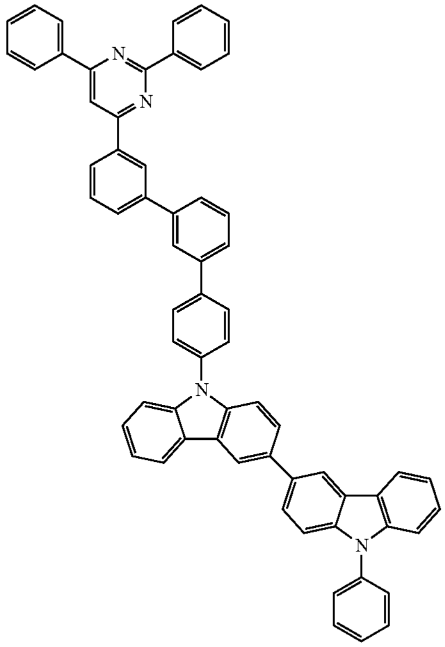
75
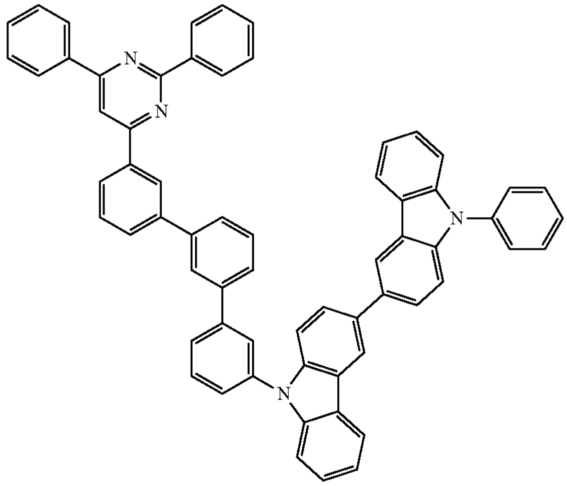
-continued
76
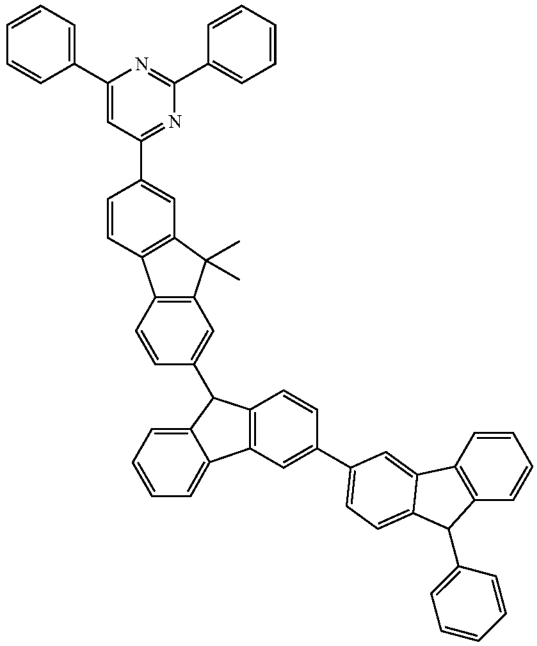
77
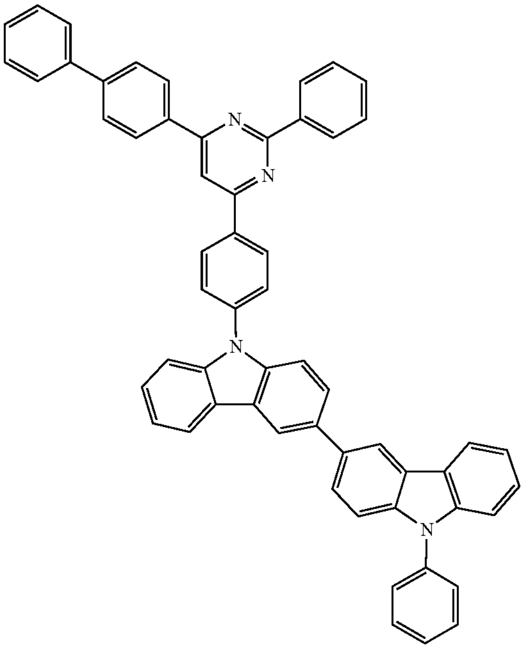

-continued
78
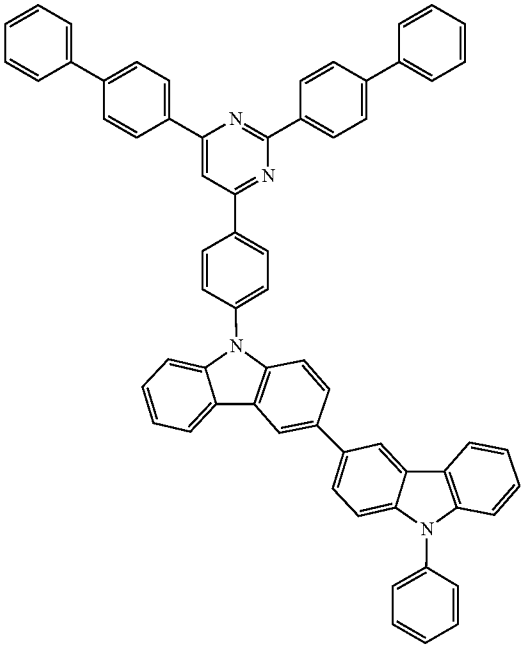
79
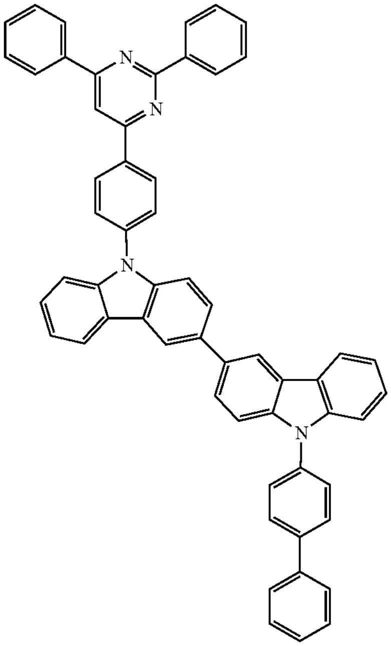
-continued
80
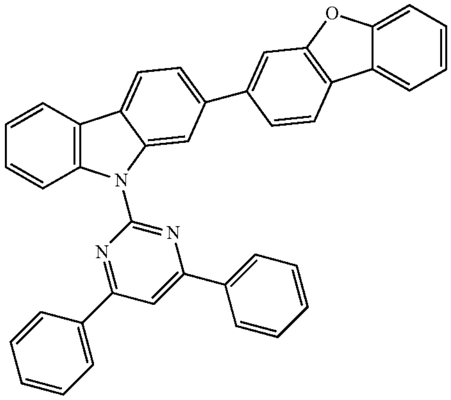
81
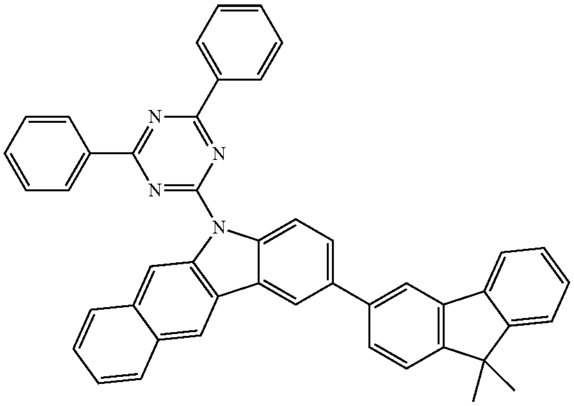
82
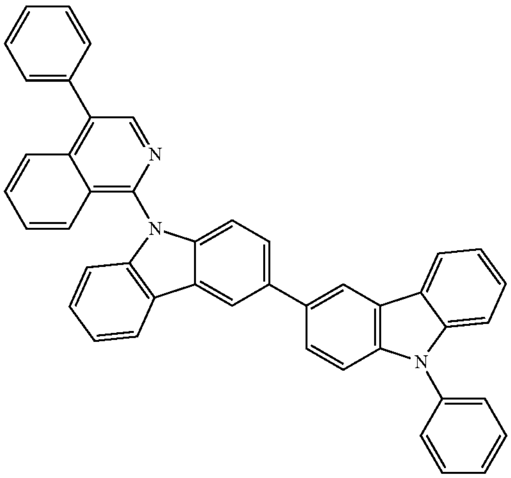

-continued
83
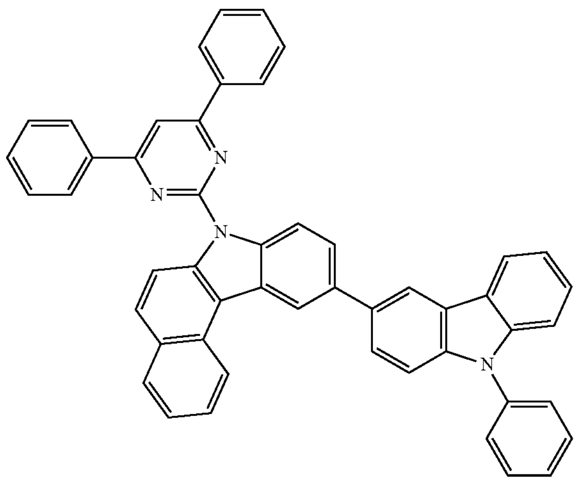
84
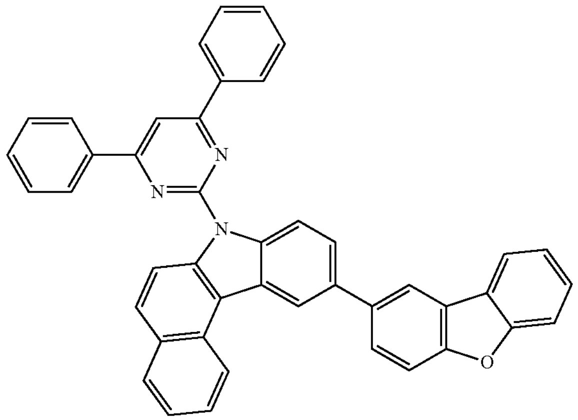
85
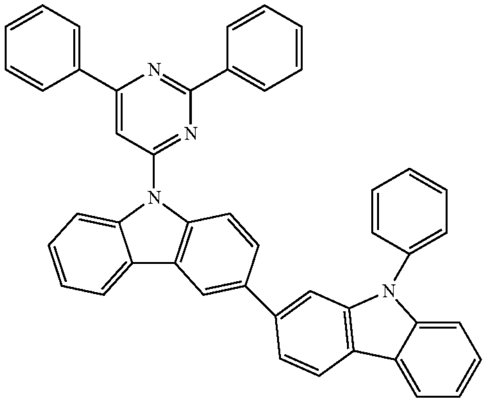
-continued
86
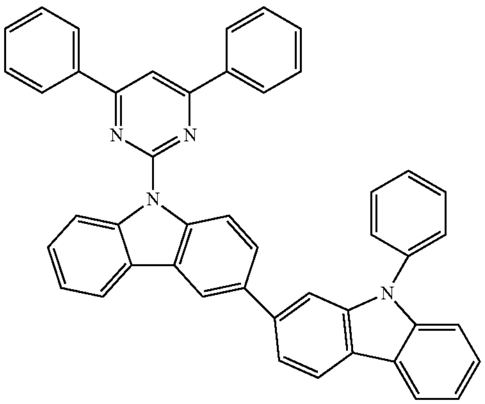
87
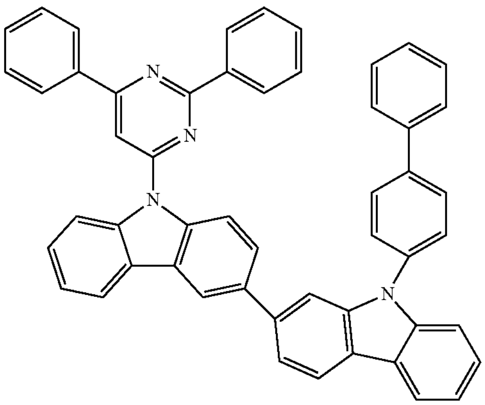
88
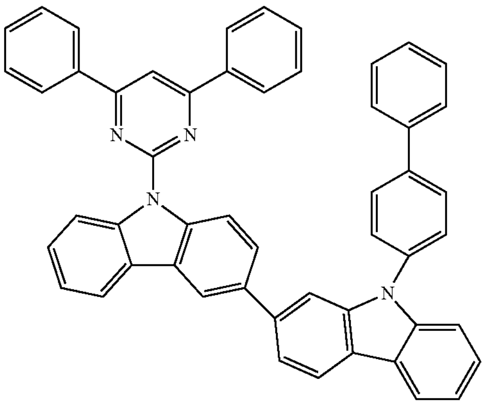

-continued
89
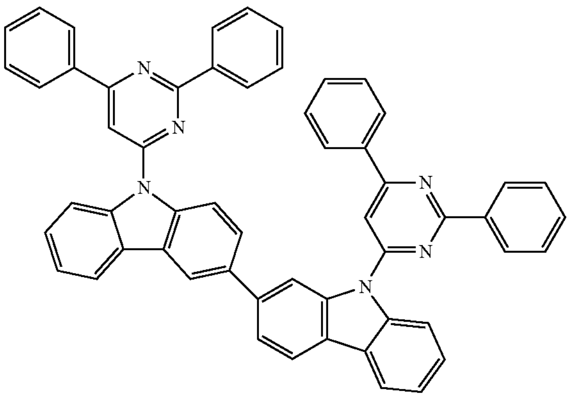
90
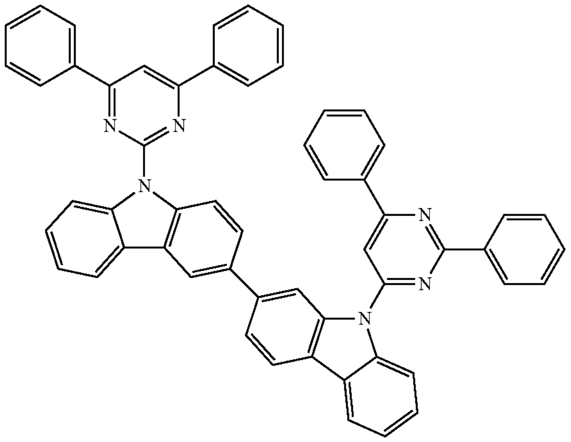
91
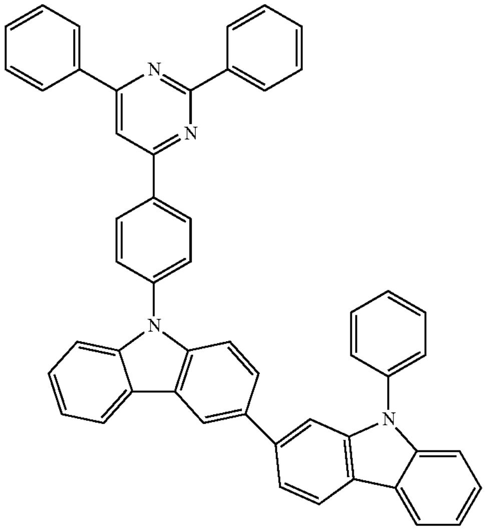
-continued
92
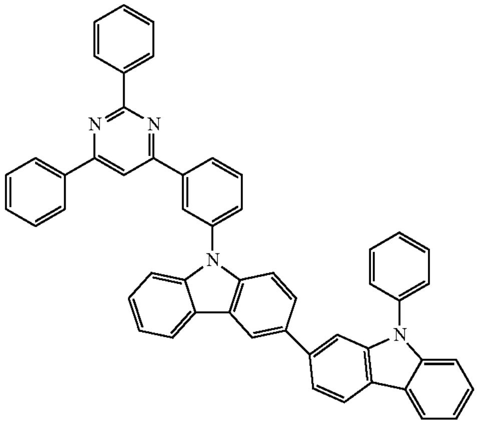
93
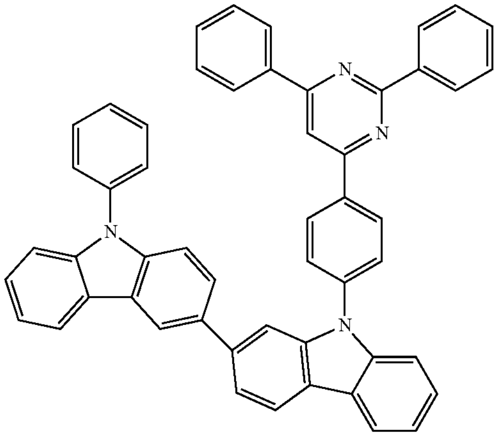
94
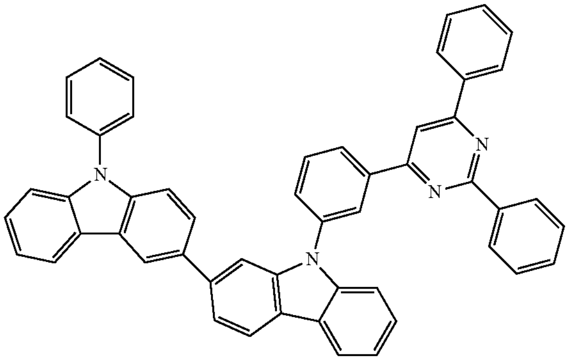

-continued
95
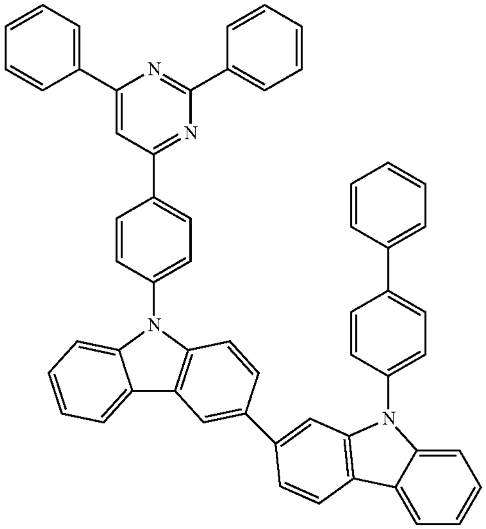
96
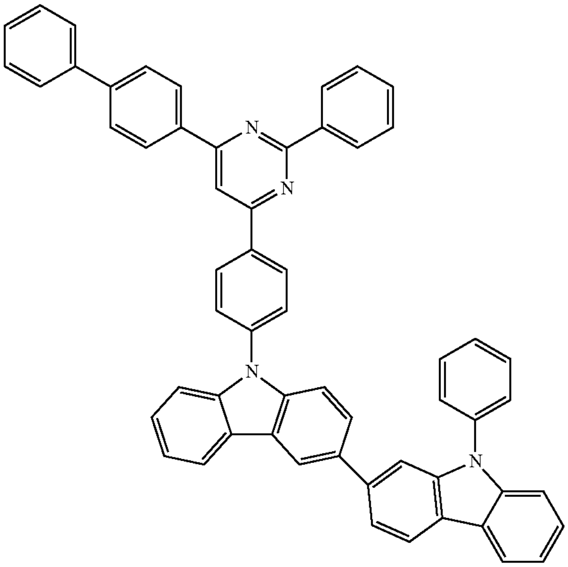
97
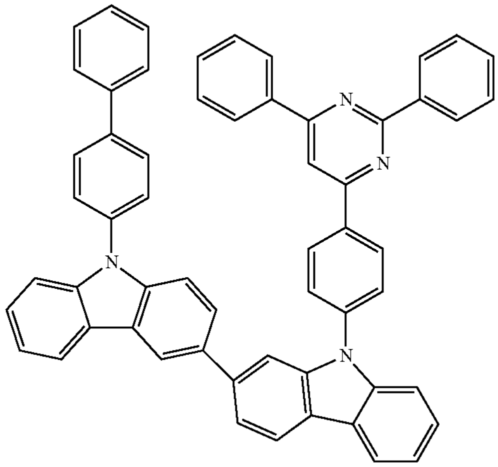
-continued
98
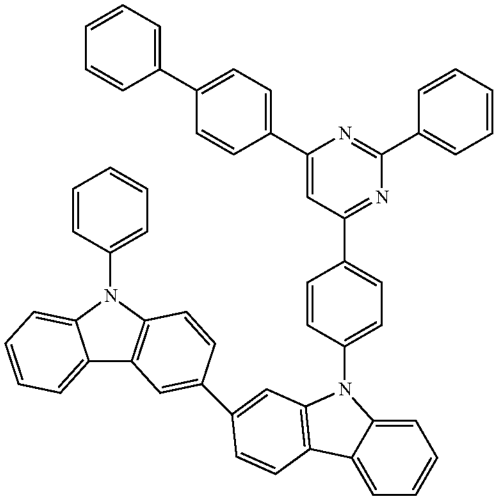
99
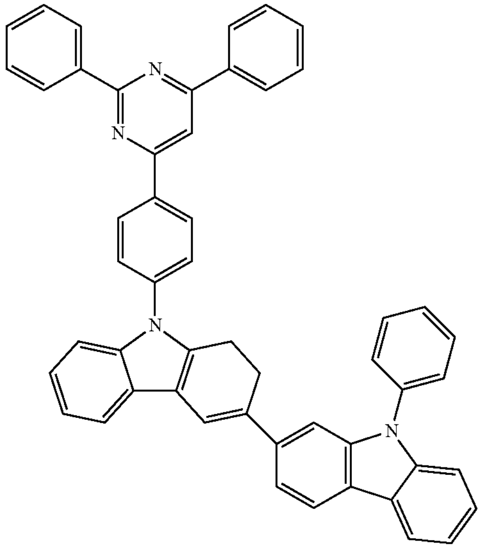
100
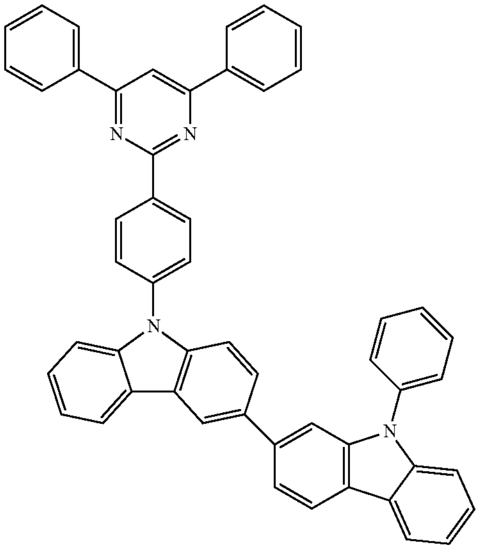

-continued
101
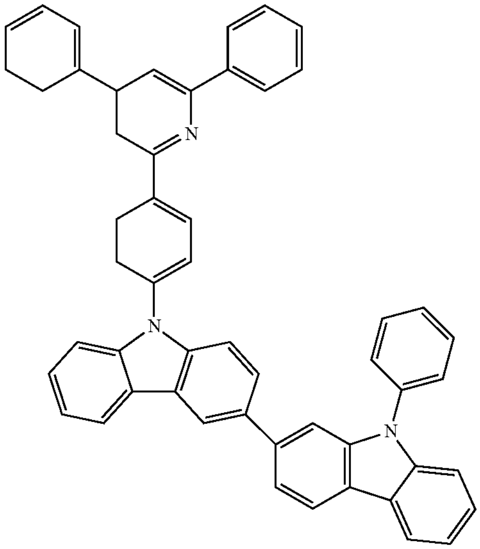
102
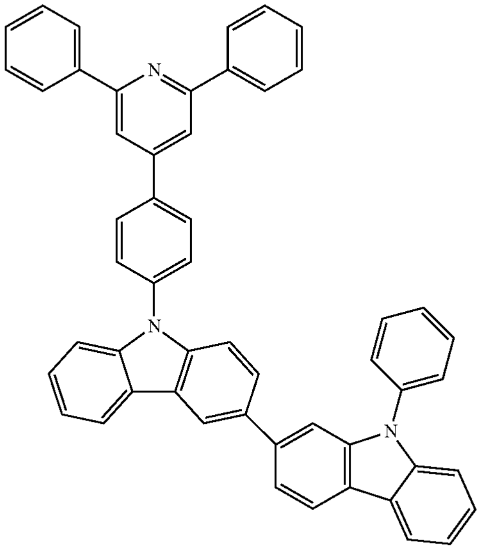
-continued
103
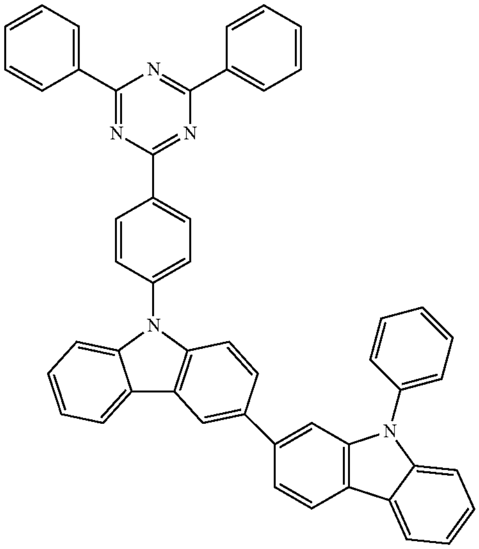
104
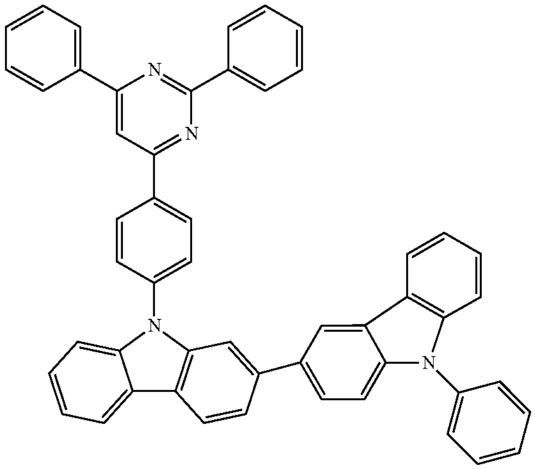
105
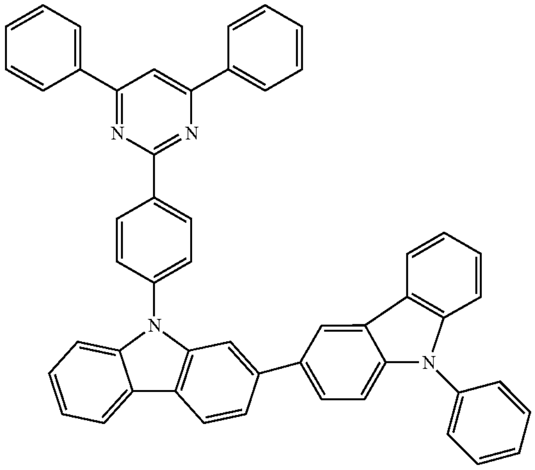

-continued

106

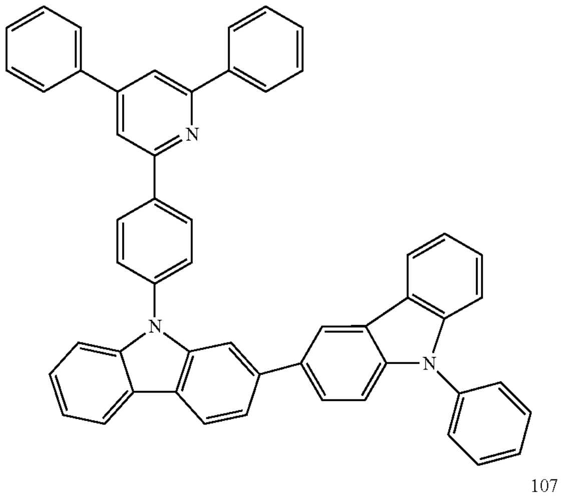

107

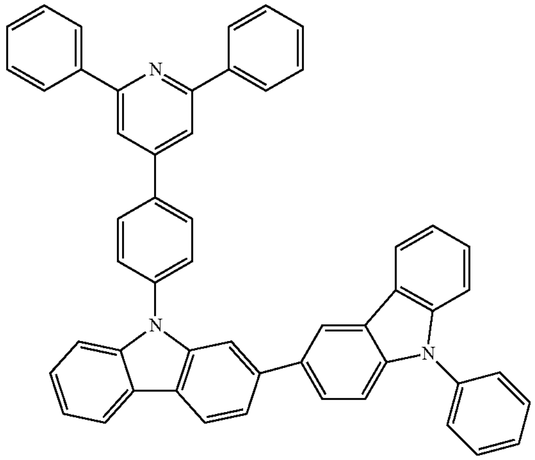

108

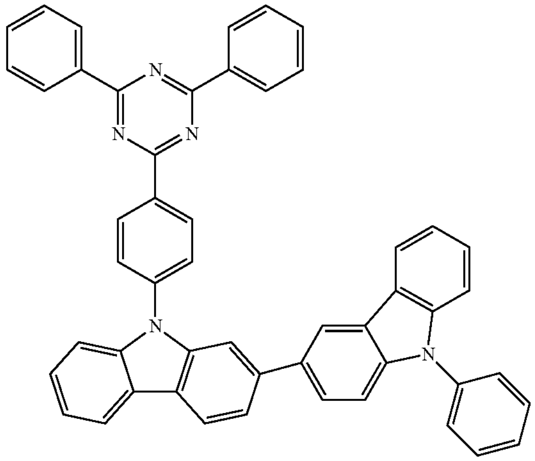

When the OLED is a full color OLED, the EML may be patterned into a red EML, a green EML, and a blue EML. Alternatively, the EML may include at least two of a red EML, green EML, and blue EML, stacked upon one another to emit white light. In some embodiments, the OLED includes a substrate that is partitioned into a first sub-pixel region, a second sub-pixel region, and a third sub-pixel region, and a first electrode is disposed in each of the first, second and third sub-pixel regions of the substrate. The emission layer is disposed between the first electrode and the second electrode. In some embodiments, the emission layer includes a first emission layer disposed in the first sub-pixel region, a second emission layer disposed in the second sub-pixel region, and a third emission layer in the third sub-pixel region. In some embodiments, the first emission layer may emit a first color light, the second emission layer may emit a second color light, and the third emission layer may emit a third color light. In some embodiments, at least one of the first emission layer and/or the second emission layer includes the light emitting material represented by Formula 1 or Formula 2, discussed above. In some embodiments, the first color light may be red, the second color light may be green, and the third color light may be blue.

In some embodiments, the OLED may include a hole-transporting region between the emission layer and the first electrode, and the hole-transporting region may include a first hole-transporting region in the first sub-pixel region, a second hole-transporting region in the second sub-pixel region, and a third hole-transporting region in the third sub-pixel region. In some embodiments, at least one of the first hole-transporting region and/or the second hole-transporting region includes the hole-transporting material of Formula 2(1) or 2(2), as discussed above. In some embodiments, each of the first, second and third hole-transporting regions includes a buffer layer and hole transport layer, and the buffer layer may be disposed between the hole transport layer and the respective emission layer. In some embodiments, the buffer layer includes the hole-transporting material of Formula 2(1) or 2(2), as discussed above. In some embodiments, the buffer layer includes a first buffer layer disposed in the first sub-pixel region, a second buffer layer disposed in the second sub-pixel region and a third buffer layer disposed in the third sub-pixel region. In some embodiments, at least one of the first buffer layer and/or the second buffer layer includes the hole-transporting material of Formula 2(1) or 2(2), as discussed above.

In some embodiments in which the emission layer includes first, second and third emission layers disposed in the first, second and third sub-pixel regions, respectively, and the buffer layer includes first, second and third buffer layers disposed in the first, second and third, sub-pixel regions, respectively, the first emission layer may include the light-emitting material of Formula 1 or Formula 2, and the first buffer layer may include the hole-transporting material of Formula 2(1) or 2(2). In some embodiments, however, the first emission layer may include the light-emitting material of Formula 1 or Formula 2, and the second buffer layer may include the hole-transporting material of Formula 2(1) or 2(2). In some embodiments, the second emission layer may include the light-emitting material of Formula 1 or Formula 2, and the first buffer layer may include the hole-transporting material of Formula 2(1) or 2(2). In some embodiments, the second emission layer may include the light-emitting material of Formula 1 or Formula 2, and the second buffer layer may include the hole-transporting material of Formula 2(1) or 2(2).

The EML may further include an additional light-emitting material commonly used in OLEDs. For example, the EML may further include a host and/or a dopant commonly used in OLEDs. Non-limiting examples of a suitable host include tris(8-quinolinolate)aluminum ($Alq_3$), 4,4'-N,N'-dicarbazol-biphenyl (CBP), poly(n-vinylcarbazole) (PVK), 9,10-di (naphthalen-2-yl)anthracene (ADN), 4,4',4"-tris(carbazole-9-yl)triphenylamine (TCTA), 1,3,5-tris(N-phenylbenzimidazole-2-yl)benzene) (TPBI), 3-tert-butyl-9, 10-di(naphth-2-yl)anthracene (TBADN), 9,9'-(1,3-phenylene)bis-9H-carbazole (mCP), E3, 1,3-bis[2-(4-tert-butylphenyl)-1,3,4-oxadiazole-5-yl](OXD-7), distyrylarylene (DSA), dmCBP (see below), and Compounds 501 to 509, but the host is not limited thereto.
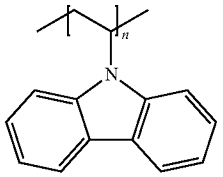
PVK
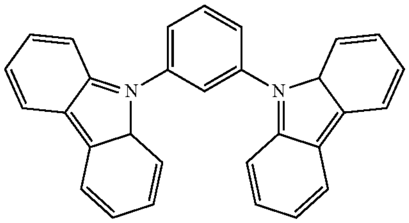
mCP
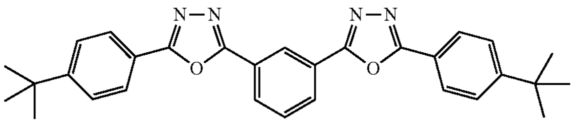
OXD-7
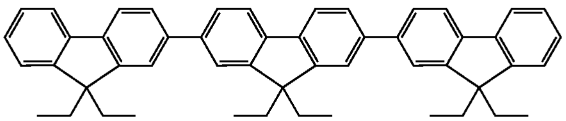
E3
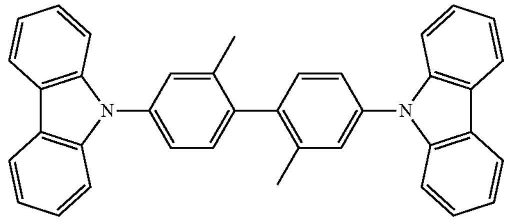
dmCBP
501
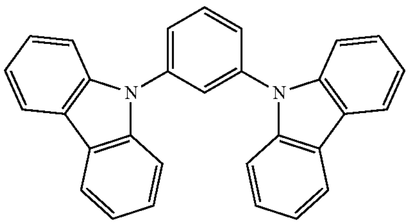
-continued
502
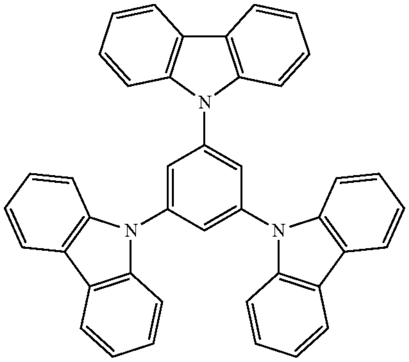
503
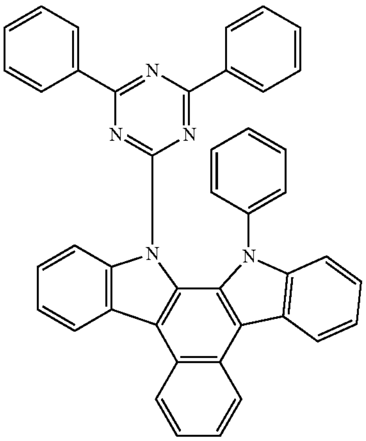
504
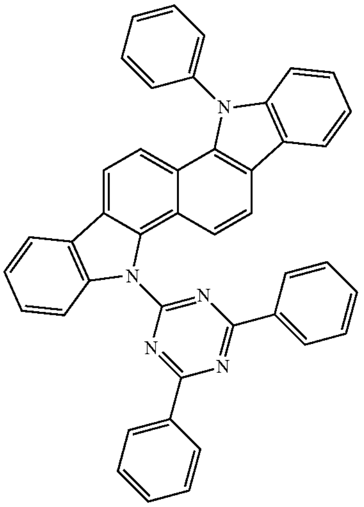

-continued

505

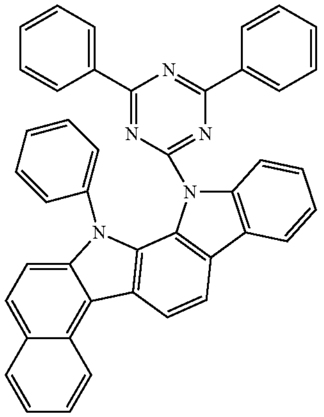

506

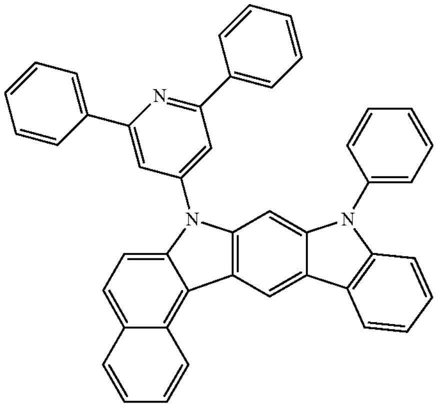

507

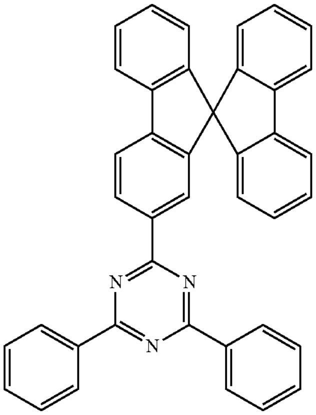

508

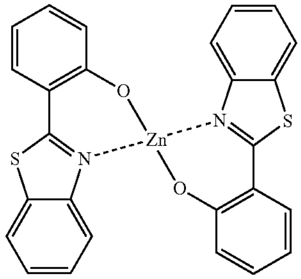

-continued

509

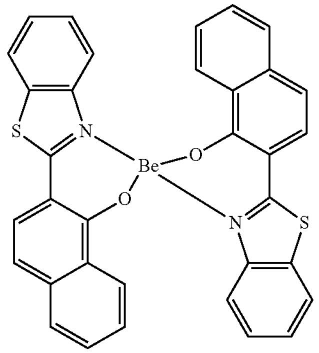

Alternatively, an anthracene-based compound represented by Formula 400 may be used as the host.

Formula 400

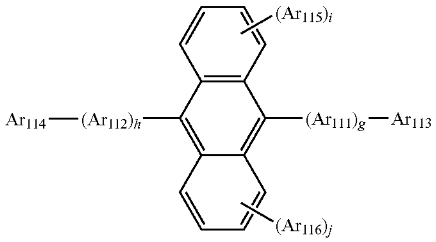

In Formula 400, g, h, i, and j may each independently be an integer of 0 to 4; $Ar_{111}$ and $Ar_{112}$ may each independently be a substituted or unsubstituted $C_5$-$C_{60}$ arylene group; and $Ar_{113}$ to $Ar_{116}$ may each independently be a substituted or unsubstituted $C_1$-$C_{10}$ alkyl group or a substituted or unsubstituted $C_5$-$C_{60}$ aryl group.

For example, in Formula 400 above, $Ar_{111}$ and $Ar_{112}$ may each independently be a phenylene group, a naphthylene group, a phenanthrenylene group, or a pyrenylene group; or a phenylene group, a naphthylene group, a phenanthrenylene group, a fluorenyl group, or a pyrenylene group substituted with at least one of a phenyl group, a naphthyl group, or an anthryl group. However, $Ar_{111}$ and $Ar_{112}$ are not limited thereto.

In Formula 400 above, g, h, i, and j may each independently be 0, 1, or 2; and $Ar_{113}$ to $Ar_{116}$ may each independently be: a $C_1$-$C_{10}$ alkyl group that is substituted with at least one of a phenyl group, a naphthyl group, or an anthryl group; or a phenyl group; a naphthyl group; an anthryl group; a pyrenyl group; a phenanthrenyl group; a fluorenyl group; or a phenyl group, a naphthyl group, an anthryl group, a pyrenyl group, a phenanthrenylene group, or a fluorenyl group substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a pyrenyl group, a phenanthrenyl group, or a fluorenyl group; or

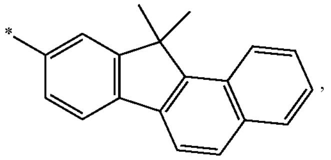 [SMILES: *c1ccc2c(c1)C(C)(C)c1c-2ccc2ccccc12]
where * represents a binding site. However, $Ar_{113}$ to $Ar_{116}$ are not limited thereto.
For example, the anthracene-based compound of Formula 400 may be one of the Compounds below, but Formula 400 is not limited thereto.
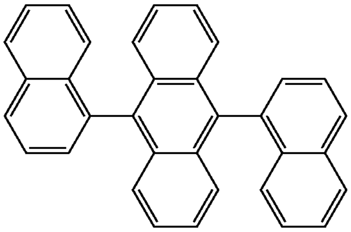
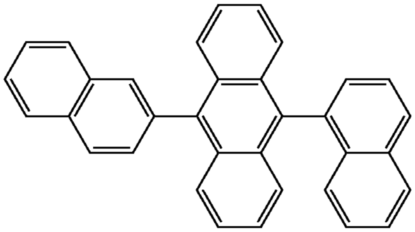
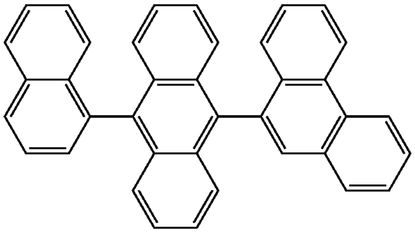
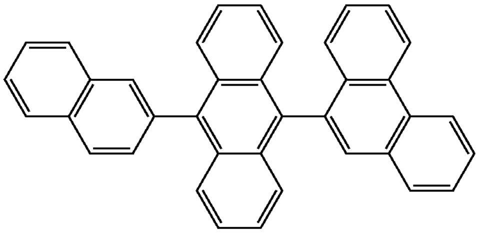
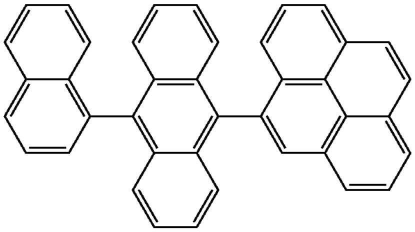
-continued
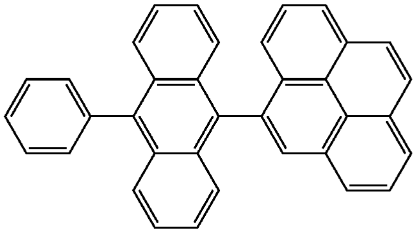
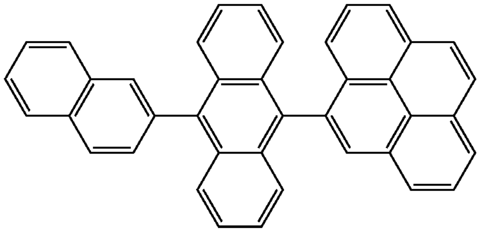
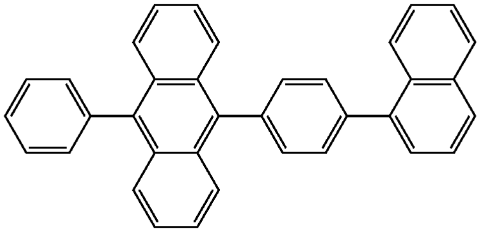
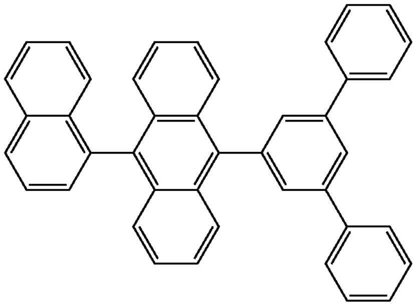
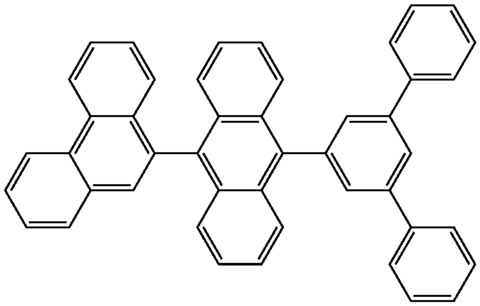
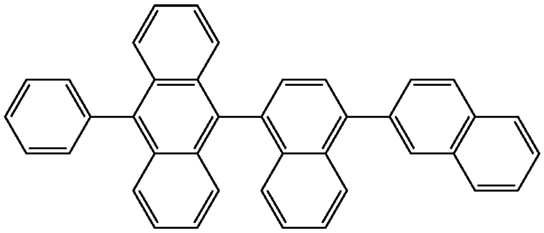

-continued
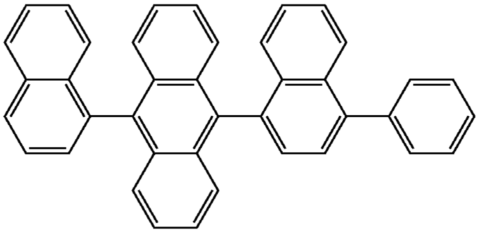
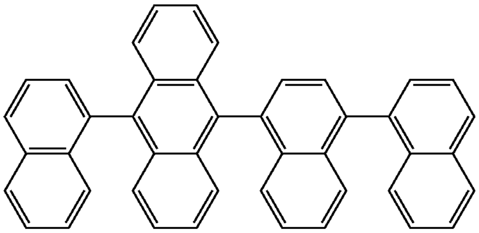
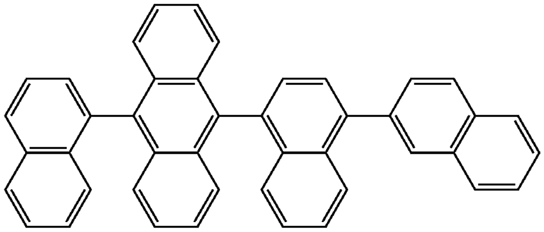
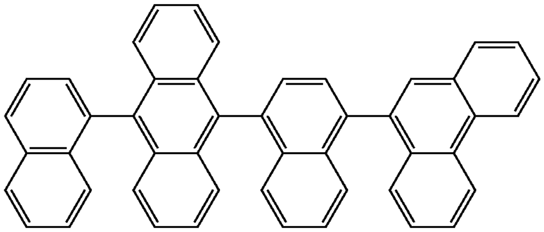
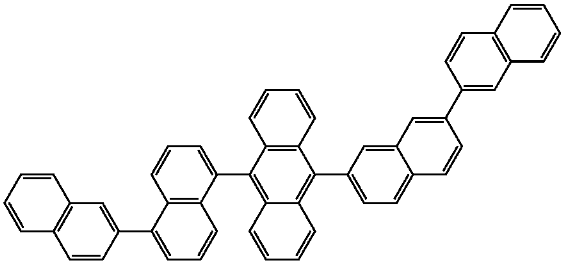
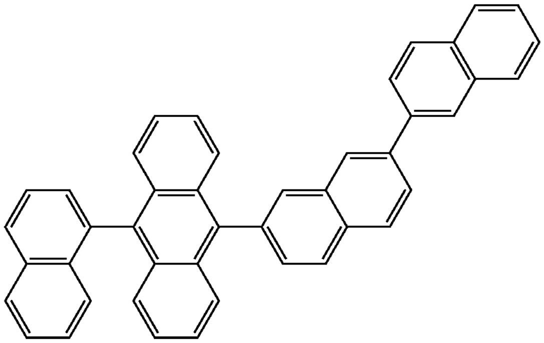
-continued
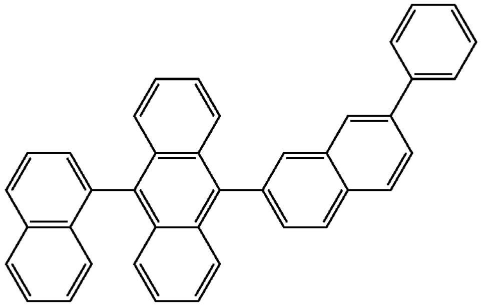
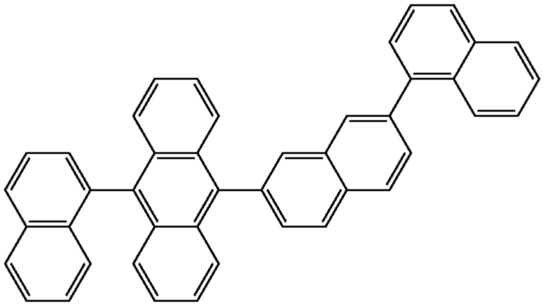
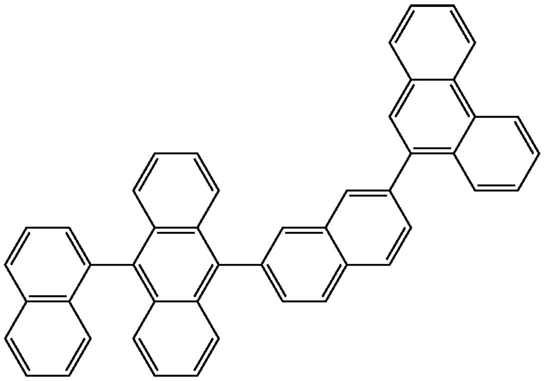
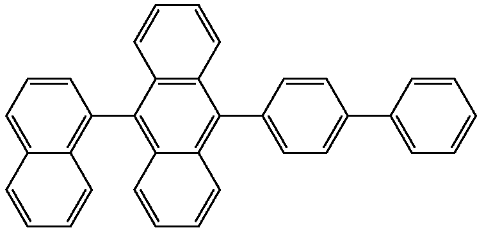
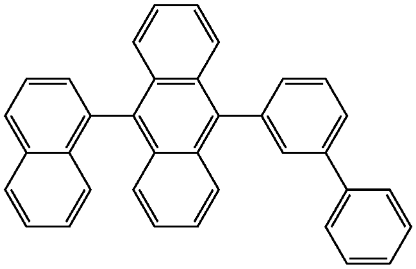
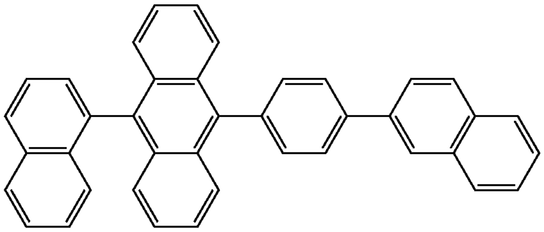

-continued
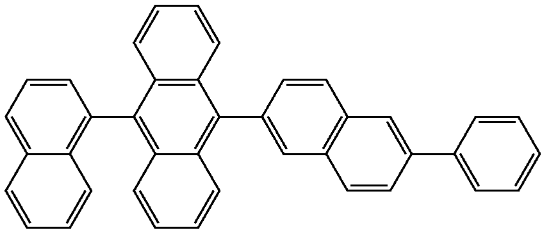
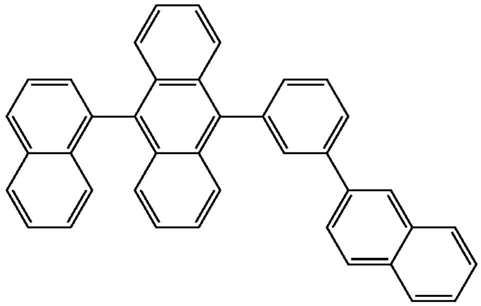
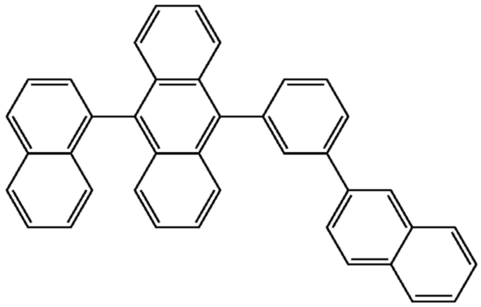
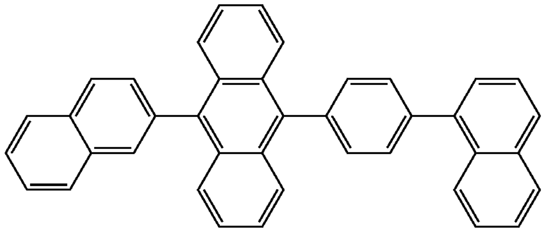
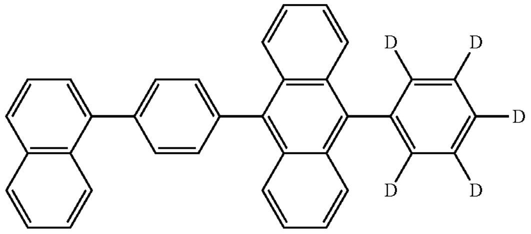
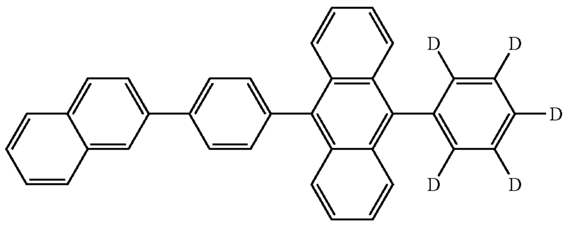
-continued
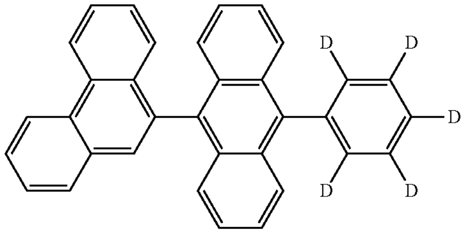
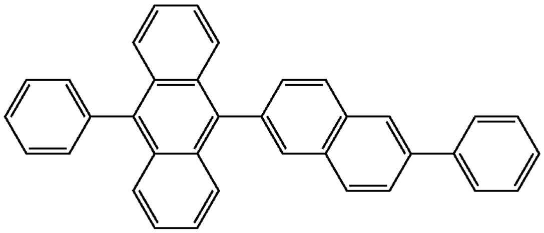
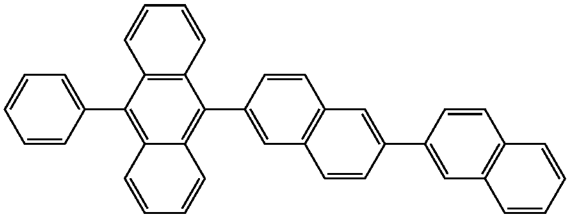
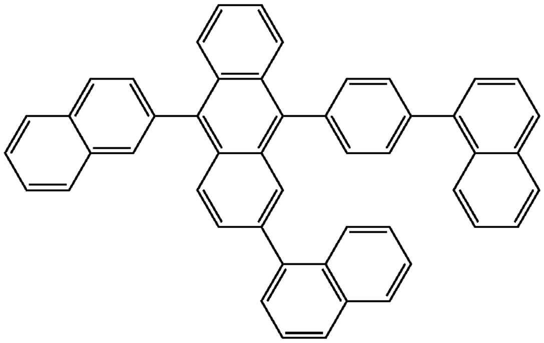
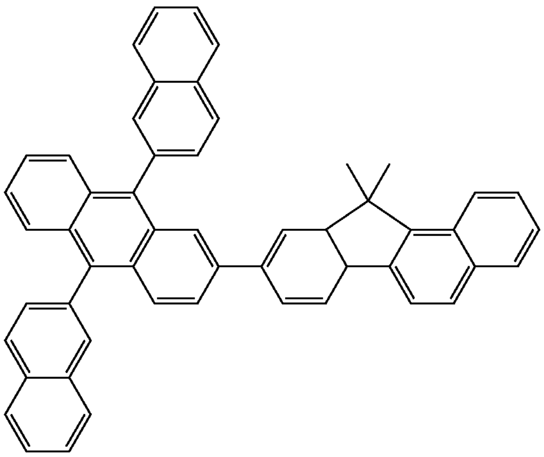

-continued

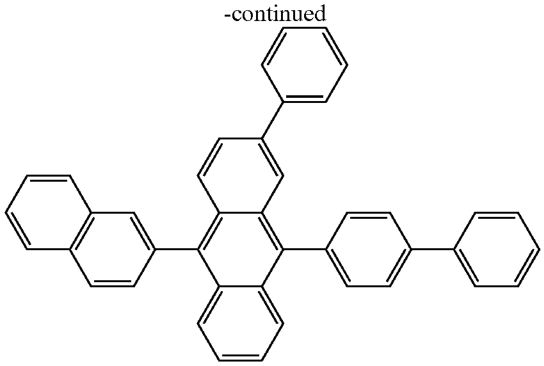

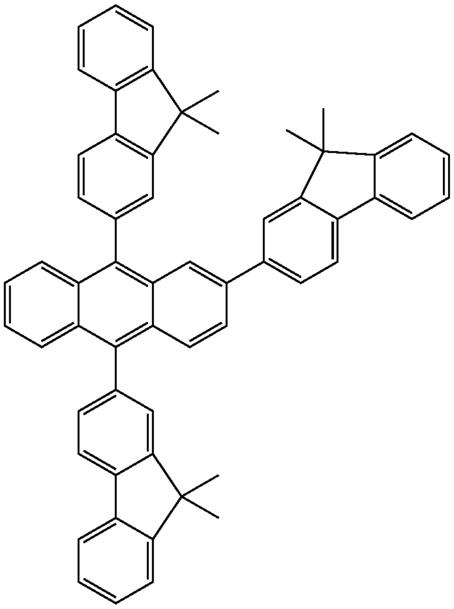

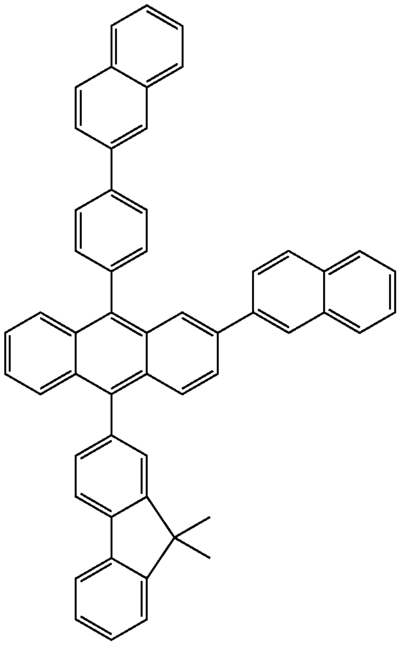

-continued

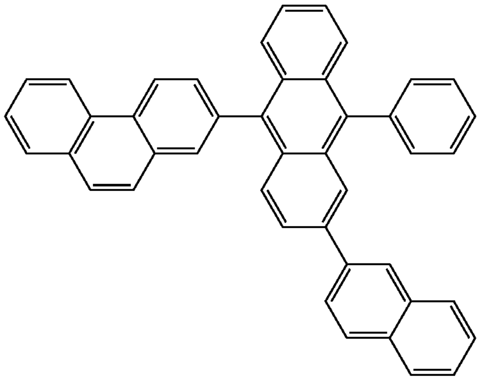 [SMILES: c1ccc(-c2c3ccccc3c(-c3ccc4c(ccc5ccccc54)c3)c3ccc(-c4ccc5ccccc5c4)cc23)cc1]

In some embodiments, an anthracene-based compound represented by Formula 401 may be used as the host.

Formula 401

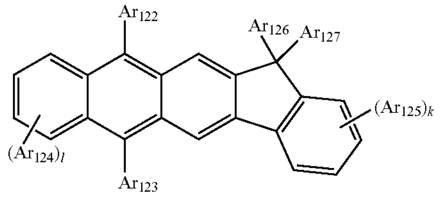

In Formula 401, $Ar_{122}$ to $Ar_{125}$ may be the same as $Ar_{113}$ of Formula 400, and the description of $Ar_{113}$ is fully incorporated here.

In Formula 401, $Ar_{126}$ and $Ar_{127}$ may each independently be a $C_1$-$C_{10}$ alkyl group (e.g., a methyl group, an ethyl group, or a propyl group).

In Formula 401, k and l may each independently be an integer from 0 to 4. For example, k and l may each independently be 0, 1, or 2.

In some embodiments, the anthracene-based compound of Formula 401 may be one of the Compounds below, but Formula 401 is not limited thereto.

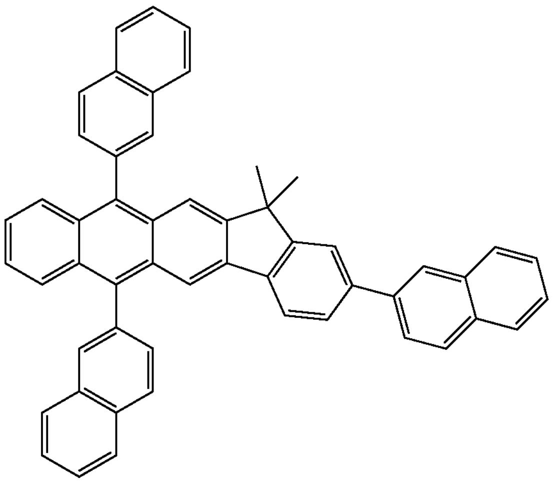

-continued

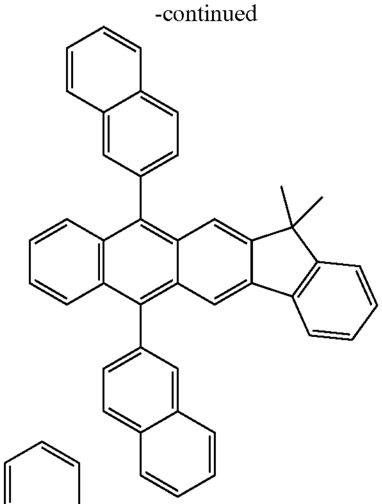

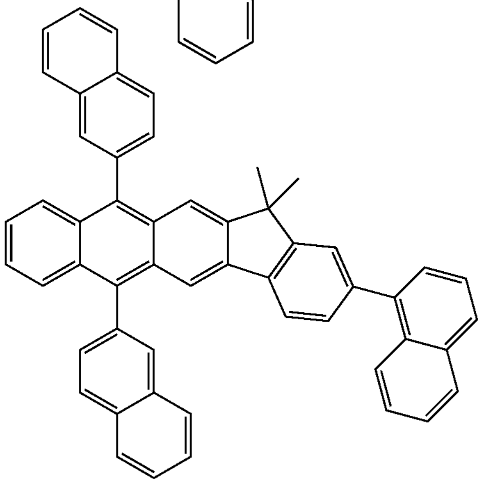

-continued

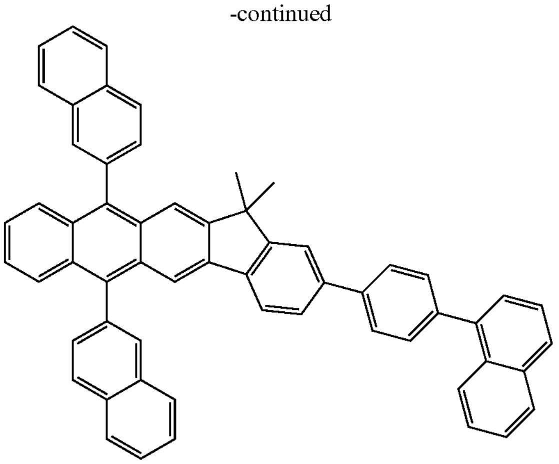

The dopant may be at least one of a fluorescent dopant and a phosphorescent. The phosphorescent dopant may be an organometallic complex including Ir, Pt, Os, Re, Ti, Zr, Hf, or a combination of two or more thereof, but is not limited thereto.

Non-limiting examples of the blue dopant include $F_2$Irpic, $(F_2ppy)_2$Ir(tmd), Ir(dfppz)$_3$, ter-fluorene, 4,4'-bis(4-diphenylaminostyryl)biphenyl (DPAVBi), 2,5,8,11-tetra-tert-butyl perylene (TBPe), and 4,4'-bis(2,2,-diphenylvinyl)-1,1'-biphenyl (DPVBi), but the blue dopant is not limited thereto.

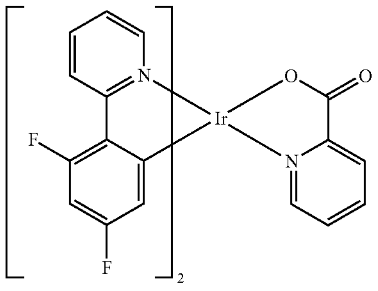

$F_2$Irpic

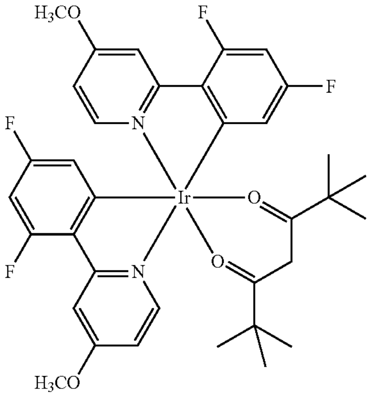

$(F_2ppy)_2$Ir(tmd)

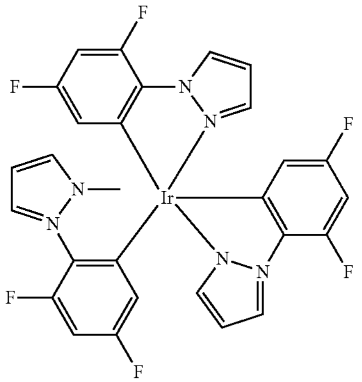

Ir(dfppz)$_3$

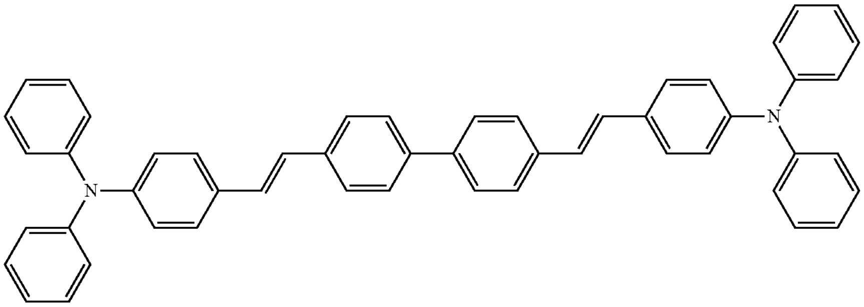

DPAVBi

-continued
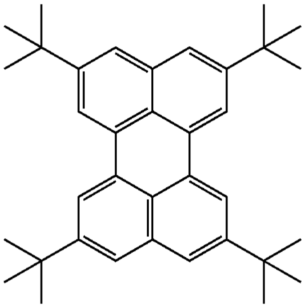
TBPe
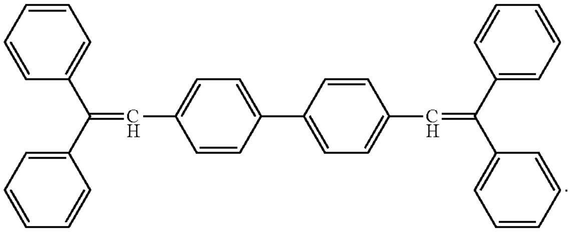
DPVBi
In some embodiments, the compounds below may be used as the red dopant, but the red dopant is not limited thereto. Alternatively, DCM or DCJTB, which are described below, may be used as the red dopant.
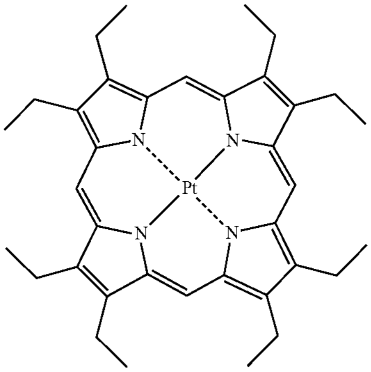
PtOEP
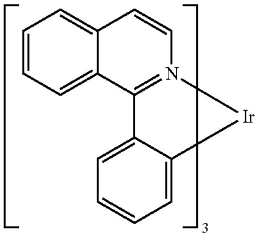
Ir(piq)3
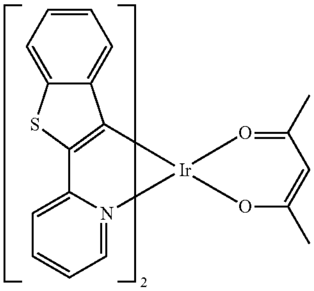
Btp2Ir(acac)
-continued
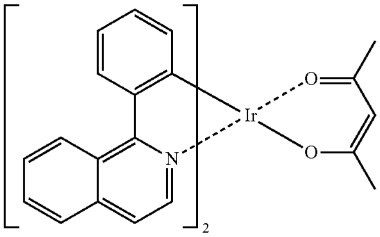
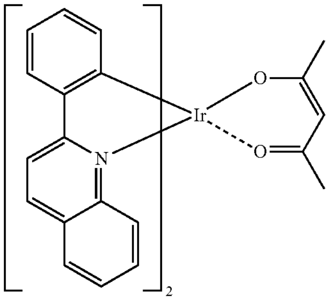
Ir(pq)2(acac)
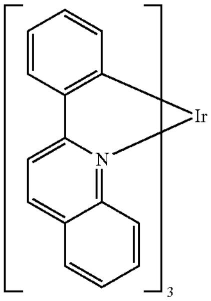
Ir(2-phq)3
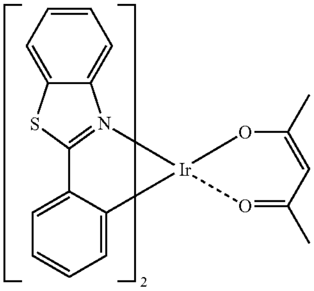
Ir(BT)2(acac)

-continued
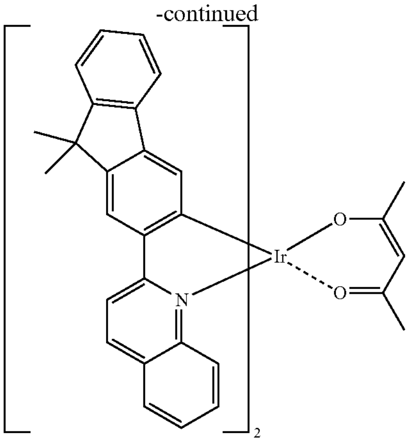
Ir(flq)$_2$(acac)
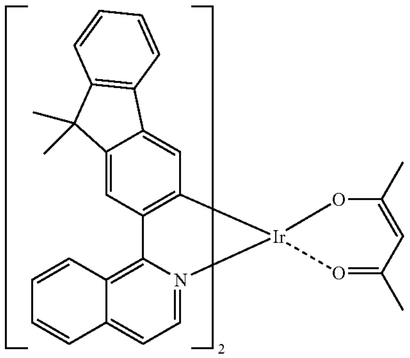
Ir(fliq)$_2$(acac)
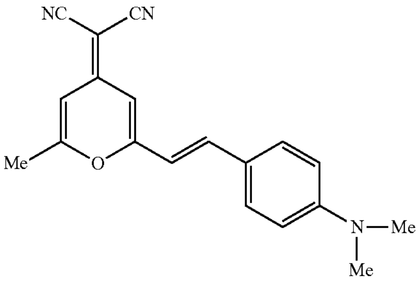
DCM
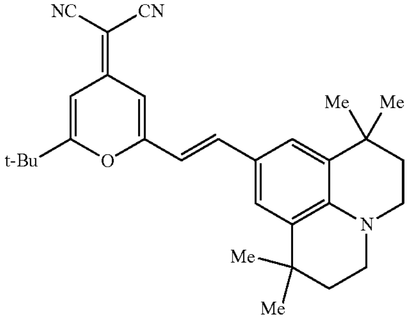
DCJTB
-continued
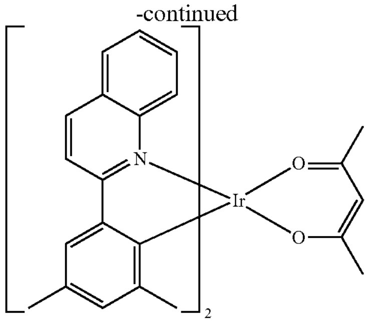
In some embodiments, the compounds below may be used as the green dopant, but the green dopant is not limited thereto. For example, C545T (shown below) may be used as the green dopant.
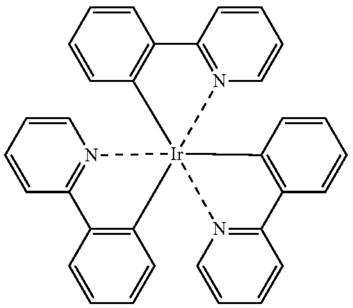
Ir(ppy)$_3$
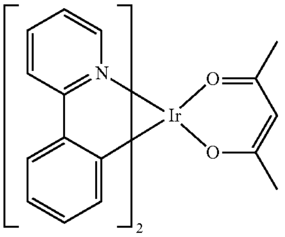
Ir(ppy)$_2$(acac)
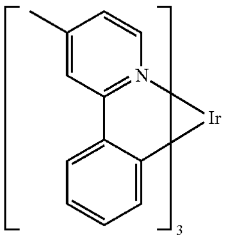
Ir(mpyp)$_3$
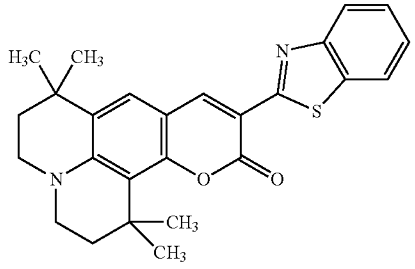
C545T
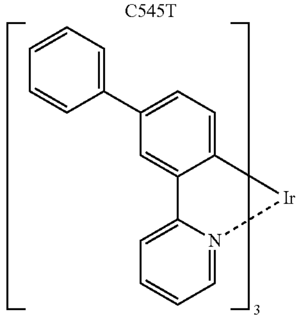

The thickness of the EML may be about 100 Å to about 1,000 Å, for example, about 200 Å to about 600 Å. When the thickness of the EML is within either of the foregoing ranges, the EML may have good light-emitting ability without a substantial increase in driving voltage.

Next, an ETL may be formed on the EML by various methods, such as vacuum deposition, spin coating, and casting. When the ETL is formed by vacuum deposition and spin coating, the vacuum deposition or coating conditions may be similar to those described above for the formation of the HIL, though the deposition and coating conditions may vary depending on the compound used to form the ETL. The ETL may be formed using the above-described material that can stably transport electrons that are injected from an electron-injecting electrode (e.g., a cathode) and an electron-transporting material commonly used in OLEDs may be used. Non-limiting examples of the electron-transporting material include a quinoline derivative, for example, $Alq_3$, TAZ, Balq, beryllium bis(benzoquinolin-10-olate) ($Bebq_2$), ADN, and Compounds 201 and 202, but the electron-transporting material is not limited thereto.

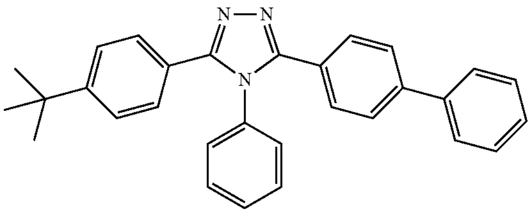

TAZ

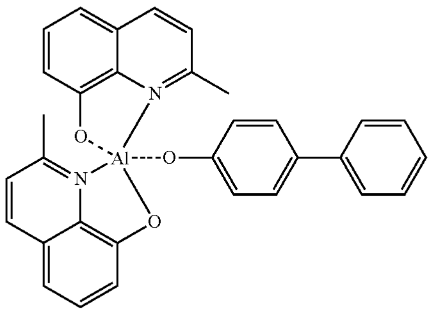

BAlq

Compound 201

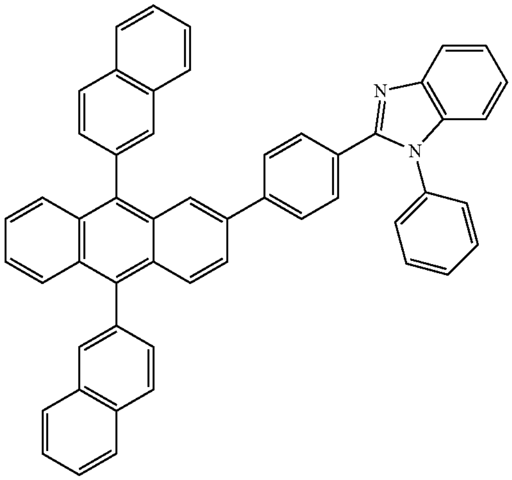

-continued

Compound 202

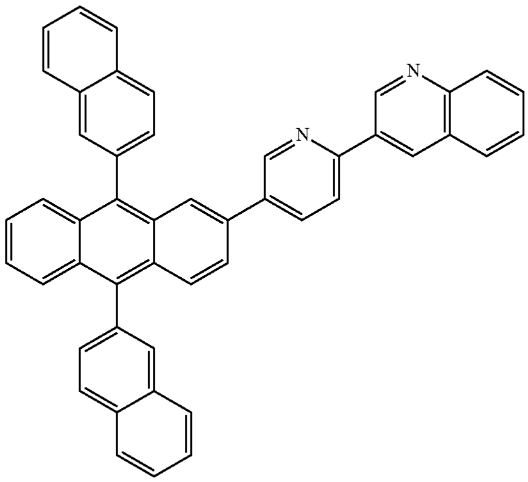

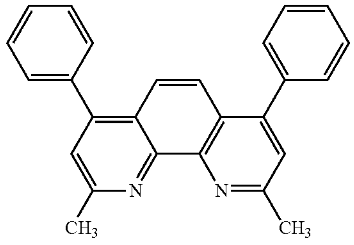

BCP

The thickness of the ETL may be about 100 Å to about 1,000 Å, and for example, about 150 Å to about 500 Å. When the thickness of the ETL is within either of the foregoing ranges, the ETL may have satisfactory electron transporting ability without a substantial increase in driving voltage.

In some embodiments, the ETL may further include a metal-containing material in addition to the above-described electron-transporting material.

The metal-containing material may include a lithium (Li) complex. Non-limiting examples of the Li complex include lithium quinolate (LiQ) and Compound 203.

Compound 203

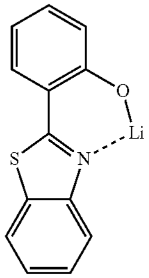

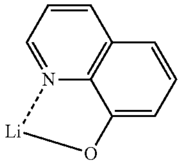

LiQ

In addition, an EIL, which facilitates injection of electrons from the cathode, may be formed on the ETL. Any suitable electron injecting material may be used to form the EIL.

Any suitable electron-injecting material commonly used in OLEDs, such as LiF, NaCl, CsF, $Li_2O$, and BaO, may be used as the EIL-forming material. The deposition conditions may be similar to those described above for the formation of the HIL, though the conditions may vary depending on the compound used to form the EIL.

The thickness of the EIL may be about 1 Å to about 100 Å, and for example, about 3 Å to about 90 Å. When the thickness of the ETL is within either of the foregoing ranges, the ETL may have satisfactory electron injection ability without a substantial increase in driving voltage.

A second electrode 17 is on the organic layer 15. The second electrode 17 may be a cathode, which is an electron injecting electrode. Here, a material for the formation of the second electrode 17 may be a metal, an alloy, an electro-conductive compound, each of which have a low work function, or a mixture thereof. In this regard, the second electrode 17 may be formed of lithium (Li), magnesium (Mg), aluminum (Al), aluminum-lithium (Al—Li), calcium (Ca), magnesium-indium (Mg—In), and magnesium-silver (Mg—Ag), and may be formed as a thin film type transmission electrode. In some embodiments, to manufacture a top-emission light-emitting device, the transmission electrode may be formed of indium tin oxide (ITO) or indium zinc oxide (IZO).

Although the organic light-emitting device has been described with reference to FIG. 1, the present invention is not limited thereto.

In addition, when a phosphorescent dopant is used in the EML, an HBL is formed between the HTL and the EML, or between the H-functional layer and the EML, to prevent (or reduce) the diffusion of triplet excitons or holes into the ETL. The HBL may be formed by various methods, such as vacuum deposition, casting and LB deposition. When the HBL is formed by vacuum deposition or spin coating, the vacuum deposition conditions or spin coating conditions may be similar to those described above for the formation of the HIL, though the conditions may vary depending on the compound used to form the HBL. Any suitable hole-blocking material commonly used in OLEDs may be used, and non-limiting examples thereof include an oxadiazole derivative, a triazole derivative, and a phenanthroline derivative. For example, BCP may be used as the HBL-forming material.

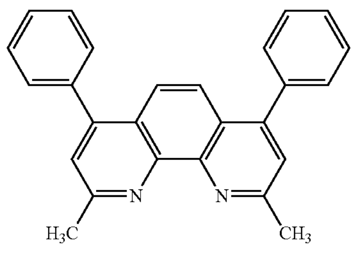

BCP

The thickness of the HBL may be about 20 Å to about 1,000 Å, and for example, about 30 Å to about 300 Å. When the thickness of the HBL is within either of the foregoing ranges, the HBL may have good hole blocking ability without a substantial increase in driving voltage.

The light-emitting material represented by one of Formulas 1 and 2 may have a wide energy gap, and its triplet energy may be suitable for phosphorescent light emission. In addition, an OLED including the above-described light-emitting material exhibits high efficiency.

The hole-transporting material represented by one of Formulas 2(1) and 2(2) has a structure in which a carbazole-based ring is bonded to a first carbon of a first benzene and a second benzene is bonded to a meta position of the first benzene relative to the carbazole-based ring. The first benzene ring, the second benzene ring, first carbon and meta position are shown in Formulas 2(1)' and 2(2)'. Thus, compared to a compound having a structure in which the second benzene is bonded to the para position of the first benzene relative to the carbazole-based ring, the hole-transporting material according to embodiments of the present invention may have a low (HOMO) energy level (based on the measured value) and slow hole mobility. Hole mobility is generally faster than electron mobility, and thus, an OLED including a compound represented by one of Formulas 2(1) and 2(2) in a hole-transporting region between an anode and an EML may achieve a balance between hole mobility and electron mobility to the EML. In addition, the hole-transporting material may block leakage of electrons from the EML to the HTL (e.g., electrons injected from the second electrode or cathode). Therefore, an OLED including a compound represented by one of Formulas 2(1) and 2(2) in the hole-transporting region may exhibit high efficiency and long lifespan.

Formula 2(1)'

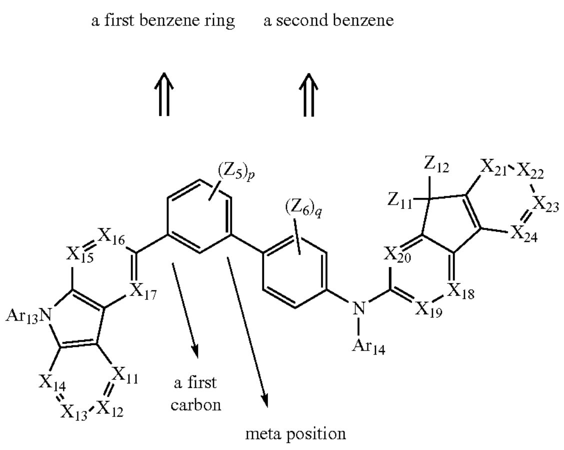

-continued

Formula 2(2)'

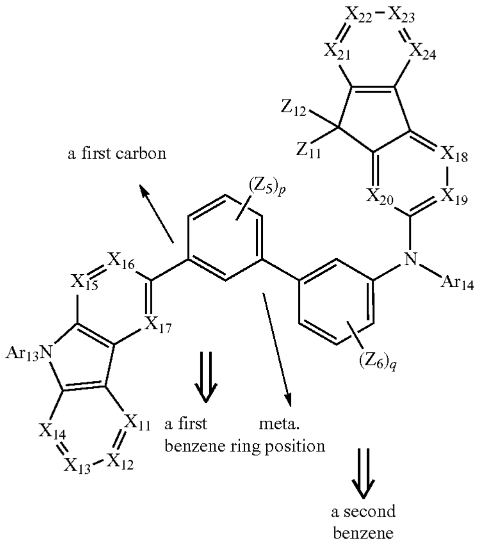

The OLED including the light-emitting material of one of Formulas 1 and 2 and the hole-transporting material of one of Formulas 2(1) and 2(2) may include a suitable material as a host in the EML for phosphorescent emission, and may form excitons in the EML to exhibit high efficiency. Also the leakage of electrons from the EML to the HTL may be minimized (or reduced), and thus, most (or a substantial portion) of the excitons formed in the EML may contribute to light emission. Therefore, when the driving voltage of the OLED increases, a decrease in efficiency is relatively small (e.g., the OLED exhibits low roll-off) The relationship between OLED luminance and efficiency is shown in the graphs in FIGS. 2 and 3.

Accordingly, an OLED including the light-emitting material of one of Formulas 1 and 2 and the hole-transporting material of one of Formulas 2(1) and 2(2) may exhibit low driving voltage, high efficiency, and high color purity.

In particular, the EML including the light-emitting material of one of Formulas 1 and 2 and the HTL including the hole-transporting material of one of Formulas 2(1) and 2(2) may be in contact with each other, but the present invention is not limited thereto.

As used herein, the $C_1$-$C_{60}$ alkyl group may be an unsubstituted $C_1$-$C_{60}$ alkyl group or a substituted $C_1$-$C_{60}$ alkyl group. Non-limiting examples of the unsubstituted $C_1$-$C_{60}$ alkyl group include a linear or a branched $C_1$-$C_{60}$ alkyl group, such as a methyl group, an ethyl group, a propyl group, an iso-butyl group, a sec-butyl group, a pentyl group, an iso-amyl group, and a hexyl group. The substituted $C_1$-$C_{60}$ alkyl group refers to the substitution of at least one hydrogen atom of the unsubstituted $C_1$-$C_{60}$ alkyl group with a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_1$-$C_{60}$ fluoroalkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-060 aryl group, a $C_6$-$C_{60}$ aryloxy group, a $C_6$-$C_{60}$ arylthio group, a $C_1$-$C_{60}$ heteroaryl group, —$N(Q_{11})(Q_{12})$, or —$Si(Q_{13})(Q_{14})(Q_{15})$ (where $Q_{11}$ to $Q_{15}$ are each independently selected from the group consisting of a hydrogen atom, a $C_1$-$C_{60}$ alkyl group, a $C_2$-$C_{60}$ alkenyl group, a $C_2$-$C_{60}$ alkynyl group, a $C_6$-$C_{60}$ aryl group, and a $C_1$-$C_{60}$ heteroaryl group).

As used herein, the $C_1$-$C_{60}$ alkoxy group may be an unsubstituted $C_1$-$C_{60}$ alkoxy group or a substituted $C_1$-$C_{60}$ alkoxy group. The unsubstituted $C_1$-$C_{60}$ alkoxy group may have a formula of —OA (where, A is an unsubstituted $C_1$-$C_{60}$ alkyl group as described above). Non-limiting examples of the unsubstituted $C_1$-$C_{60}$ alkoxy group include a methoxy group, an ethoxy group, and an isopropyloxy group. Here, the substituted $C_1$-$C_{60}$ alkoxy group refers to the substitution of at least one hydrogen atom of the unsubstituted $C_1$-$C_{60}$ alkoxy group with the same substituents as described above in connection with the substituted $C_1$-$C_{60}$ alkyl group.

As used herein, the $C_2$-$C_{60}$ alkenyl group may be an unsubstituted $C_2$-$C_{60}$ alkenyl group or a substituted $C_2$-$C_{60}$ alkenyl group. The unsubstituted $C_2$-$C_{60}$ alkenyl group refers to an unsubstituted $C_2$-$C_{60}$ alkyl group having one or more carbon-carbon double bonds inserted at the body (e.g., the center) or at a terminal end of the alkyl group. Non-limiting examples of the unsubstituted $C_2$-$C_{60}$ alkenyl group include an ethenyl group, a propenyl group, and a butenyl group. The substituted $C_2$-$C_{60}$ alkenyl group refers to the substitution of at least one hydrogen atom of the unsubstituted $C_2$-$C_{60}$ alkenyl group with the same substituents as described above in connection with the substituted $C_1$-$C_{60}$ alkyl group.

As used herein, the $C_2$-$C_{60}$ alkynyl group may be an unsubstituted $C_2$-$C_{60}$ alkynyl group or a substituted $C_2$-$C_{60}$ alkynyl group. The unsubstituted $C_2$-$C_{60}$ alkynyl group refers to an unsubstituted $C_2$-$C_{60}$ alkyl group having one or more carbon-carbon triple bonds inserted at the body (e.g., the center) or at a terminal end of the alkyl group. Non-limiting examples of the unsubstituted $C_2$-$C_{60}$ alkynyl group include an ethynyl group and a propenyl group. The substituted $C_2$-$C_{60}$ alkenyl group refers to the substitution of at least one hydrogen atom of the unsubstituted $C_2$-$C_{60}$ alkynyl group with the same substituents as described above in connection with the substituted $C_1$-$C_{60}$ alkyl group.

As used herein, the $C_6$-$C_{60}$ aryl group may be an unsubstituted $C_6$-$C_{60}$ aryl group or a substituted $C_6$-$C_{60}$ aryl group. The unsubstituted $C_6$-$C_{60}$ aryl group refers to a monovalent group having a carbocyclic aromatic system having 6 to 60 carbon atoms including at least one aromatic ring. The unsubstituted $C_6$-$C_{60}$ arylene group refers to a divalent group having a carbocyclic aromatic system having 6 to 60 carbon atoms including at least one aromatic ring. When the aryl group and the arylene group include two or more rings, the rings may be fused to each other by a single bond. The substituted $C_6$-$C_{60}$ aryl group refers to the substitution of at least one hydrogen atom of the aryl group with the same substituents as described above in connection with the substituted $C_1$-$C_{60}$ alkyl group. The substituted $C_6$-$C_{60}$ arylene group refers to the substitution of at least one hydrogen atom of the arylene group with the same substituents as described above in connection with the substituted $C_1$-$C_{60}$ alkyl group.

Non-limiting examples of the substituted or unsubstituted $C_6$-$C_{60}$ aryl group include a phenyl group, a $C_1$-$C_{10}$ alkylphenyl group (i.e., an ethylphenyl group), a $C_1$-$C_{10}$ alkylbiphenyl group (i.e., an ethylbiphenyl group), a halophenyl group (i.e., an o-, m-, and p-fluorophenyl group, a dichlorophenyl group), a dicyanophenyl group, a trifluoromethoxyphenyl group, o-, m-, and p-tolyl group, o-, m-, and p-cumenyl groups, a mosityl group, a phenoxyphenyl group, an (α,α-dimethylbenzene)phenyl group, an (N,N'-dimethyl)aminophenyl group, an (N,N'-diphenyl)aminophenyl group, a pentalenyl group, an indenyl group, a naphthyl group, a halonaphthyl group (i.e., a fluoronaphthyl group), a $C_1$-$C_{10}$ alkylnaphthyl group (i.e., a methylnaphthyl group), a $C_1$-$C_{10}$ alkoxynaphthyl group (i.e., a methoxynaphthyl group), an anthracenyl group, an azulenyl group, a heptalenyl group, an acenaphthylenyl group, a phenalenyl group, a fluorenyl group, an anthraquinolinyl group, a methylanthryl group, a phenanthryl group, a triphenylenyl group, a pyrenyl group, a chrysenyl group, an ethyl-chrysenyl group, a picenyl group, a perylenyl group, a chloroperylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, an obarenyl group, and a spiro-fluorenyl group. Additional non-limiting examples of the substituted $C_6$-$C_{60}$ aryl group may be inferred from the foregoing non-limiting examples of the unsubstituted $C_6$-$C_{60}$ aryl group and the substituents described above in connection with the substituted $C_1$-$C_{60}$ alkyl group. Non-limiting examples of the substituted or unsubstituted $C_6$-$C_{60}$ arylene group may be inferred from the foregoing non-limiting examples of the substituted or unsubstituted $C_6$-$C_{60}$ aryl group.

As used herein, the $C_1$-$C_{60}$ heteroaryl group may be an unsubstituted $C_1$-$C_{60}$ heteroaryl group or a substituted $C_1$-$C_{60}$ heteroaryl group. The unsubstituted $C_1$-$C_{60}$ heteroaryl group refers to a monovalent group having a system composed of one or more aromatic rings having at least one heteroatom, e.g., N, O, P, and S, as a ring-forming atom, and carbon atoms as the remaining ring atoms. The unsubstituted $C_1$-$C_{60}$ heteroarylene group refers to a divalent group having a system composed of one or more aromatic rings having at least one heteroatom, e.g., N, O, P, and S, and carbon atoms as the remaining ring atoms. For example, when the heteroaryl group and the heteroarylene group each include two or more rings, the rings may be fused to each other or connected to each other via a single bond. The substituted $C_1$-$C_{60}$ heteroaryl group refers to the substitution of at least one hydrogen atom of the heteroaryl group with the same substituents described above in connection with the $C_1$-$C_{60}$ alkyl group. The substituted $C_1$-$C_{60}$ heteroarylene group refers to the substitution of at least one hydrogen atom of the heteroarylene group with the same substituents described above in connection with the $C_1$-$C_{60}$ alkyl group.

Non-limiting examples of the unsubstituted $C_1$-$C_{60}$ heteroaryl group include a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazolyl group, an indolyl group, a quinolinyl group, an isoquinolinyl group, a benzimidazolyl group, an imidazopyridinyl group, an imidazopyrimidinyl group, a furanyl group, a thiophenyl group, a benzofuranyl group, a benzothiophenyl group, a dibenzofuranyl group, and a dibenzothiophenyl group. Non-limiting examples of the substituted $C_1$-$C_{60}$ heteroaryl group may be inferred from the foregoing non-limiting examples of the unsubstituted $C_1$-$C_{60}$ heteroaryl group and the substituents described above in connection with the substituted $C_1$-$C_{60}$ alkyl group. Non-limiting examples of the substituted or unsubstituted $C_1$-$C_{60}$ heteroarylene group may be inferred from the foregoing non-limiting examples of the substituted or unsubstituted $C_1$-$C_{60}$ heteroaryl groups.

The substituted or unsubstituted $C_6$-$C_{60}$ aryloxy group refers to a group represented by —$OA_2$ (where $A_2$ is a substituted or unsubstituted $C_6$-$C_{60}$ aryl group as described above). The substituted or unsubstituted $C_6$-$C_{60}$ arylthio group refers to a group represented by —$SA_3$ (where $A_3$ is a substituted or unsubstituted $C_6$-$C_{60}$ aryl group as described above).

Hereinafter, embodiments of the present invention will be described by reference to the following examples. However, these examples are presented for illustrative purposes only, and are not intended to limit the scope of the present invention

EXAMPLE

Example 1

As an anode, ITO/Ag/ITO layers having a thickness of 7 nm/100 nm/7 nm, respectively, were deposited on a glass substrate which was cut to a size of 50 mm×50 mm×0.7 mm, and then sonicated (ultrasonically washed) in isopropyl alcohol for 30 minutes and sonicated in pure water for 30 minutes, and then cleaned by irradiation of ultraviolet rays for 10 minutes and exposure to ozone. The glass substrate was then loaded into a vacuum deposition device.

Compound B (shown below) was vacuum-deposited on the ITO layer, which is the anode, to form an HIL having a thickness of 1,200 Å, and Compound 6-12 was deposited on the HIL to a thickness of 350 Å to form an HTL.

Compound 49 (as a host) and Compound D(1) (as a dopant; shown below) were co-deposited at a weight ratio of 10:1 on the HTL to form an EML having a thickness of 400 Å.

Then, Compound 201 and LiQ were co-deposited at a weight ratio of 1:1 on the EML to form an ETL having a thickness of 300 Å. LiQ was deposited on the ETL to form an EIL having a thickness of 5 Å, followed by depositing Mg—Ag at a weight ratio of 10:1 on the EIL to form a second electrode (cathode) having a thickness of 130 Å, thereby completing the manufacture of an OLED.

Compound D(1)

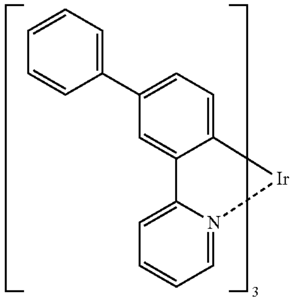

-continued

Compound B

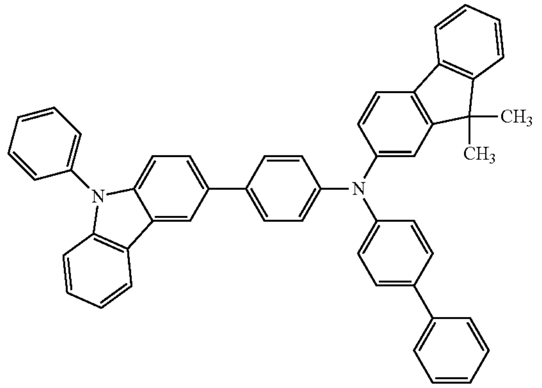

Example 2

An OLED was manufactured as in Example 1, except that Compound 6-132 was used instead of Compound 6-12 to form the HTL, and Compound 61 was used instead of Compound 49 to form the EML.

Example 3

An OLED was manufactured as in Example 1, except that Compound 6-84 was used instead of Compound 6-12 to form the HTL, and Compound 80 was used instead of Compound 49 to form the EML.

Example 4

An OLED was manufactured as in Example 1, except that Compound 6-36 was used instead of Compound 6-12 to form the HTL, and Compound 99 was used instead of Compound 49 to form the EML.

Example 5

An OLED was manufactured as in Example 1, except that Compound 6-4 was used instead of Compound 6-12 to form the HTL, and Compound 104 was used instead of Compound 49 to form the EML.

Example 6

An OLED was manufactured as in Example 1, except that Compound 6-10 was used instead of Compound 6-12 to form the HTL, and Compound 50 was used instead of Compound 49 to form the EML.

Example 7

An OLED was manufactured as in Example 1, except that Compound 34 and Compound D(2) (shown below) were used instead of Compound 49 and Compound D(1) (shown above), respectively, to form the EML.

Compound D(2)

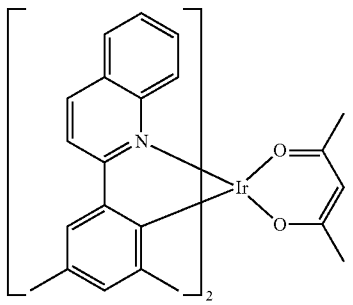

Example 8

An OLED was manufactured as in Example 7, except that Compound 6-132 was used instead of Compound 6-12 to form the HTL, and Compound 32 was used instead of Compound 34 to form the EML.

Example 9

An OLED was manufactured as in Example 7, except that Compound 6-84 was used instead of Compound 6-12 to form the HTL, and Compound 81 was used instead of Compound 34 to form the EML.

Example 10

An OLED was manufactured as in Example 7, except that Compound 6-36 was used instead of Compound 6-12 to form the HTL, and Compound 82 was used instead of Compound 34 to form the EML.

Example 11

An OLED was manufactured as in Example 7, except that Compound 6-4 was used instead of Compound 6-12 to form the HTL, and Compound 83 was used instead of Compound 34 to form the EML.

Example 12

An OLED was manufactured as in Example 7, except that Compound 6-10 was used instead of Compound 6-12 to form the HTL, and Compound 84 was used instead of Compound 34 to form the EML.

Comparative Example 1

An OLED was manufactured as in Example 1, except that Compound A (shown below) was used instead of Compound 6-12 to form the HTL, and Compound 61 was used instead of Compound 49 to form the EML.

Compound A

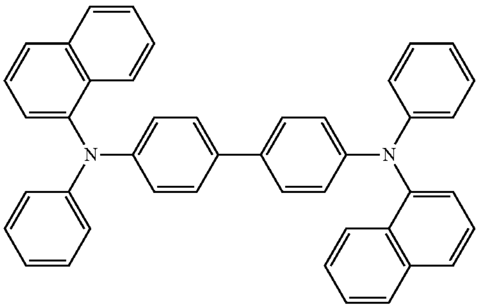

Comparative Example 2

An OLED was manufactured as in Example 1, except that Compound B (shown below) was used instead of Compound 6-12 to form the HTL, and Compound 61 was used instead of Compound 49 to form the EML.

<Compound B>

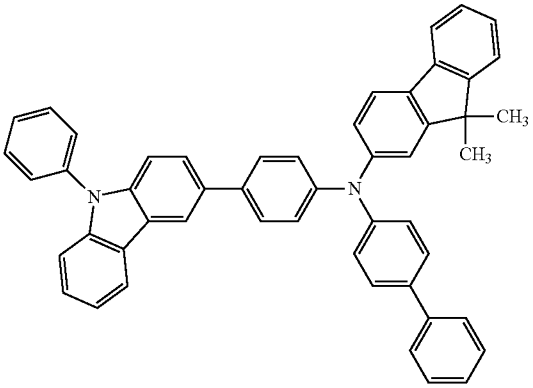

Comparative Example 3

An OLED was manufactured as in Example 7, except that Compound A (shown above) was used instead of Compound 6-12 to form the HTL, and Compound 83 was used instead of Compound 34 to form the EML.

Comparative Example 4

An OLED was manufactured as in Example 7, except that Compound B (shown above) was used instead of Compound 6-12 to form the HTL, and Compound 83 was used instead of Compound 34 to form the EML.

Evaluation Example

The driving voltages, current densities, efficiencies, and color purities of the OLEDs of Examples 1 to 12 and Comparative Examples 1 to 4 were evaluated by supplying power from a voltage and current meter (a Source Measurement Unit 236 obtained from Keithley Instruments Inc.) and by a luminance meter (a PR650 Spectrascan Colorimeter obtained from Photo Research, Inc.). The OLEDs of Example 1 to 6 and Comparative Examples 1 and 2 were evaluated at a luminance of 9,000 cd/m$^2$, and the OLEDs of Example 7 to 12 and Comparative Examples 3 and 4 were measured at a luminance of 3,000 cd/m$^2$. The results are shown in Table 1.

TABLE 1

| | Driving voltage | Current density | Luminance | Power | Color coordinates | |
|---|---|---|---|---|---|---|
| | (V) | (mA/cm$^2$) | (cd/A) | (lm/W) | CIE_*x* | CIE_*y* |
| Example 1 | 4.8 | 8.6 | 104.4 | 69.0 | 0.227 | 0.732 |
| Example 2 | 4.4 | 8.7 | 103.1 | 73.2 | 0.212 | 0.742 |
| Example 3 | 4.5 | 8.7 | 103.8 | 73.2 | 0.308 | 0.672 |
| Example 4 | 4.9 | 8.9 | 101.6 | 65.0 | 0.229 | 0.734 |
| Example 5 | 4.6 | 8.9 | 101.5 | 69.1 | 0.287 | 0.690 |
| Example 6 | 4.5 | 8.9 | 101.3 | 71.4 | 0.220 | 0.737 |
| Example 7 | 4.5 | 7.3 | 41.0 | 28.7 | 0.657 | 0.341 |
| Example 8 | 4.7 | 7.1 | 42.4 | 28.2 | 0.651 | 0.347 |
| Example 9 | 4.6 | 7.6 | 39.4 | 26.8 | 0.661 | 0.337 |
| Example 10 | 5.0 | 7.4 | 40.7 | 25.7 | 0.669 | 0.329 |
| Example 11 | 4.8 | 7.3 | 41.1 | 26.9 | 0.659 | 0.339 |
| Example 12 | 4.9 | 7.3 | 41.1 | 26.5 | 0.652 | 0.348 |
| Comparative Example 1 | 4.6 | 12.4 | 72.4 | 49.5 | 0.293 | 0.685 |
| Comparative Example 2 | 4.6 | 12.3 | 73.5 | 49.7 | 0.279 | 0.695 |
| Comparative Example 3 | 4.7 | 9.8 | 30.6 | 20.3 | 0.671 | 0.327 |
| Comparative Example 4 | 4.6 | 9.5 | 31.4 | 21.7 | 0.658 | 0.340 |

Referring to Table 1 above, it can be seen that the OLEDs of Examples 1 to 12 exhibit lower driving voltages, higher efficiencies, and better color purities than the OLEDs of Comparative Example 1 to 4.

As described above, according to aspects of one or more embodiments of the present invention, an organic light-emitting device may exhibit a low driving voltage, high efficiency, and high color purities.

While certain exemplary embodiments of the present invention have been illustrated and described, it will be understood by those of ordinary skill in the art that various changes may be made to the disclosed embodiments without departing from the spirit and scope of the present invention as defined by the following claims.

What is claimed is:

1. An organic light-emitting device comprising:

a substrate comprising a first sub-pixel region, a second sub-pixel region, and a third sub-pixel region;

a first electrode disposed in each of the first, the second, and the third sub-pixel regions of the substrate;

a second electrode disposed opposite to the first electrode in each of the first, the second, and the third sub-pixel regions;

an emission layer disposed between the first electrode and the second electrode; and a hole transporting-region disposed between the emission layer and the first electrode, wherein the hole transporting-region comprises a hole transport layer and a buffer layer; and the buffer layer is disposed between the hole transport layer and the emission layer;

the hole transport layer comprises:

a first hole transport layer disposed in the first sub-pixel region, a second hole transport layer disposed in the second sub-pixel region, and a third hole transport layer disposed in the third sub-pixel region;

the emission layer comprises:

a first emission layer that is disposed in the first sub-pixel region and emits red light, a second emission layer that is disposed in the second sub-pixel region and emits green light, and a third emission layer that is disposed in the third sub-pixel region and emits blue light;

the buffer layer consists of:

a first buffer layer disposed in the first sub-pixel region, and a second buffer layer disposed in the second sub-pixel region; and at least one compound represented by Formula 2(2) being disposed only in the first hole transport region or the second hole transport region, with the proviso that only one of conditions i) or ii) is met:

i) the first emission layer comprises at least one light-emitting material selected from the group consisting of compounds represented by any one of Formulas 1 and 2, and the first buffer layer consists of the at least one compound represented by Formula 2(2), or ii) the second emission layer comprises at least one light-emitting material selected from the group consisting of compounds represented by any one of Formulas 1 and 2, and the second buffer layer consists of the at least one compound represented by Formula 2(2):

<Formula 1>

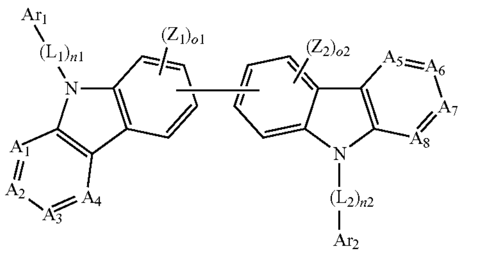

<Formula 2>

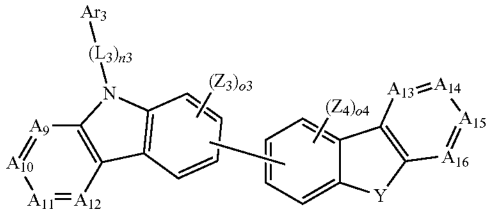

wherein, in the Formulae 1 and 2, $A_1$ is $CR_1$ or N; $A_2$ is $CR_2$ or N; $A_3$ is $CR_3$ or N; $A_4$ is $CR_4$ or N; As is $CR_5$ or N; $A_6$ is $CR_6$ or N; $A_7$ is $CR_7$ or N; $A_8$ is $CR_8$ or N; $A_9$ is $CR_9$ or N; $A_{10}$ is $CR_{10}$ or N; $A_{11}$ is $CR_{11}$ or N; $A_{12}$ is $CR_{12}$ or N; $A_{13}$ is $CR_{13}$ or N; $A_{14}$ is $CR_{14}$ or N; $A_{15}$ is $CR_{15}$ or N; and $A_{16}$ is $CR_{16}$ or N; and $R_1$ to $R_{16}$ are each independently selected from the group consisting of a hydrogen atom, a deuterium atom, a halogen atom, a $C_1$-$C_{60}$ alkyl group, a $C_6$-$C_{60}$ aryl group, a $C_1$-$C_{60}$ heteroaryl group, and —$N(Q_1)(Q_2)(Q_3)$, wherein $Q_1$ to $Q_3$ are each independently a $C_1$-$C_{60}$ alkyl group, a $C_6$-$C_{60}$ aryl group, or a $C_1$-$C_{60}$ heteroaryl group; or two or more of $R_1$ to $R_{16}$ are optionally connected to each other to form a $C_6$-$C_{20}$ saturated ring or a $C_6$-$C_{20}$ unsaturated ring;

Y is 0, S, or $C(R_{31})(R_{32})$;

$L_1$ to $L_3$ are each independently selected from the group consisting of a substituted or unsubstituted $C_3$-$C_{10}$ cycloalkylene group, a substituted or unsubstituted $C_3$-$C_{10}$ cycloalkenylene group, a substituted or unsubstituted $C_6$-$C_{60}$ arylene group, a substituted or unsubstituted $C_3$-$C_{10}$ heterocycloalkylene group, a substituted or unsubstituted $C_3$-$C_{10}$ heterocycloalkenylene group, and a substituted or unsubstituted $C_1$-$C_{60}$ heteroarylene group;

n1 to n3 are each independently an integer of 0 to 3;

$Ar_1$ to $Ar_3$ are each independently selected from the group consisting of:

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-Coo aryl group, a $C_1$-$C_{60}$ heteroaryl group, and —$Si(Q_1)(Q_2)(Q_3)$ (wherein $Q_1$ to $Q_3$ are each independently selected from the group consisting of a substituted or unsubstituted $C_1$-$C_{10}$ alkyl group and a substituted or unsubstituted $C_6$-$C_{30}$ aryl group); wherein the $C_3$-$C_{10}$ cycloalkyl group, the $C_3$-$C_{10}$ heterocycloalkyl group, the $C_3$-$C_{10}$ cycloalkenyl group, the $C_3$-$C_{10}$ heterocycloalkenyl group, the $C_6$-$C_{60}$ aryl group, and the $C_1$-$C_{60}$ heteroaryl group are each optionally substituted with at least one substituent selected from the group consisting of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, and —$Si(Q_1)(Q_2)(Q_3)$ (wherein $Q_1$ to $Q_3$ are each independently a substituted or unsubstituted $C_1$-$C_{10}$ alkyl group or a substituted or unsubstituted $C_6$-$C_{30}$ aryl group);

$Z_1$ to $Z_4$, $R_{31}$, and $R_{32}$ are each independently selected from the group consisting of:

a hydrogen atom, a deuterium atom, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_1$-$C_{60}$ heteroaryl group:

wherein:

the $C_1$-$C_{60}$ alkyl group, the $C_2$-$C_{60}$ alkenyl group, the $C_2$-$C_{60}$ alkynyl group, the $C_1$-$C_{60}$ alkoxy group are each optionally substituted with at least one substituent selected from the group consisting of a deuterium atom, a halogen atom, a hydroxyl group, a cyano group, a nitro group, an amino group, an amidino group, a hydrazine, a hydrazone, a carboxyl group or a salt thereof, a sulfonic acid or a salt thereof, a phosphoric acid or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_1$-$C_{60}$ heteroaryl group;

and the $C_3$-$C_{10}$ cycloalkyl group, the $C_3$-$C_{10}$ heterocycloalkyl group, the $C_3$-$C_{10}$ cycloalkenyl group, the $C_3$-$C_{10}$ heterocycloalkenyl group, the $C_6$-$C_{60}$ aryl group, and the $C_1$-$C_{60}$ heteroaryl group, are each optionally substituted with at least one substituent selected from the group consisting of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_5$-$C_{60}$ arylthio group, and a $C_1$-$C_{60}$ heteroaryl group;

o1 to o4 are each independently an integer of 0 to 3;

<Formula 2(2)>

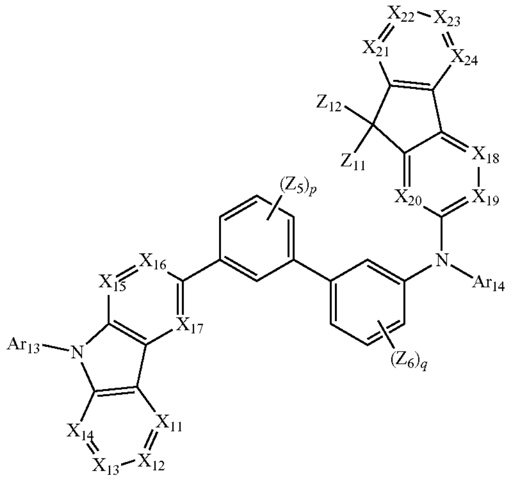

wherein, in Formula 2(2), $X_{11}$ is $CR_{11}$ or N $X_{12}$ is $CR_{12}$ or N; $X_{13}$ is $CR_{13}$ or N; $X_{14}$ is $CR_{14}$ or N; $X_{15}$ is $CR_{15}$ or N; $X_{16}$ is $CR_{16}$ or N; $X_{17}$ is $CR_{17}$ or N; $X_{18}$ is $CR_{18}$ or N; $X_{19}$ is $CR_{19}$ or N; $X_{20}$ is $CR_{20}$ or N; $X_{21}$ is $CR_{21}$ or N; $X_{22}$ is $CR_{22}$ or N; $X_{23}$ is $CR_{23}$ or N; and $X_{24}$ is $CR_{24}$ or N;

$Z_5$, $Z_6$, and $R_{11}$ to $R_{24}$ are each independently selected from the group consisting of:

a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl grout), a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_1$-$C_{60}$ heteroaryl group, —$N(Q_{11})(Q_{12})$, —$Si(Q_{13})(Q_{14})(Q_{15})$, and —$B(Q_{16})(Q_{17})$ wherein $Q_{11}$ to $Q_{17}$ are each independently selected from the group consisting of a $C_1$-$C_{60}$ alkyl group, a $C_1$-$C_{60}$ alkoxy group, a $C_6$-$C_{60}$ aryl group, and a $C_2$-$C_{60}$ heteroaryl group);

wherein:

the $C_1$-$C_{60}$ alkyl group, the $C_2$-$C_{60}$ alkenyl group, the $C_2$-$C_{60}$ alkynyl group, and the $C_1$-$C_{60}$ alkoxy group are each optionally substituted with at least one substituent selected from the group consisting of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_1$-$C_{60}$ heteroaryl group;

and the $C_3$-$C_{10}$ cycloalkyl group, the $C_3$-$C_{10}$ heterocycloalkyl group, the $C_3$-$C_{10}$ cycloalkenyl group, the $C_3$-$C_{10}$ heterocycloalkenyl group, the $C_6$-$C_{60}$ aryl group, and the $C_1$-$C_{60}$ heteroaryl group are each optionally substituted with at least one substituent selected from the group consisting of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_3$-$C_{10}$ aryloxy group, a $C_6$-$C_{60}$ arylthio group, and a $C_1$-$C_{60}$ heteroaryl group;

$Ar_{13}$ and $Ar_{14}$ are each independently selected from the group consisting of:

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_3$-$C_{10}$ heteroaryl group;

wherein:

the $C_3$-$C_{10}$ cycloalkyl group, the $C_3$-$C_{10}$ heterocycloalkyl group, the $C_3$-$C_{10}$ cycloalkenyl group, the $C_3$-$C_{10}$ heterocycloalkenyl group, the $C_6$-$C_{60}$ aryl group, and the $C_1$-$C_{60}$ heteroaryl group are each optionally substituted with at least one substituent selected from the group consisting of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_1$-$C_{60}$ heteroaryl group;

$Z_{11}$ and $Z_{12}$ are connected to each other to form a fluorene moiety; and p and q are each independently an integer from 1 to 4.

2. The organic light-emitting device of claim 1, wherein the at least one light-emitting material of any one of Formulas 1 and 2 is selected from the group consisting of compounds represented by anyone of Formulas 1-1 to 1-24:

1-1

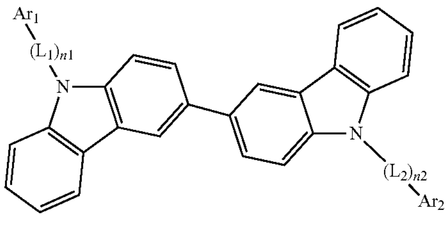

-continued
1-2
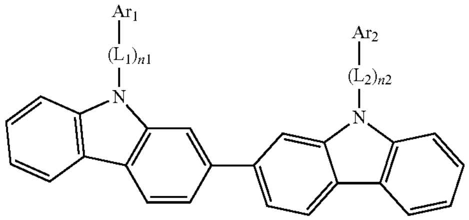
1-3
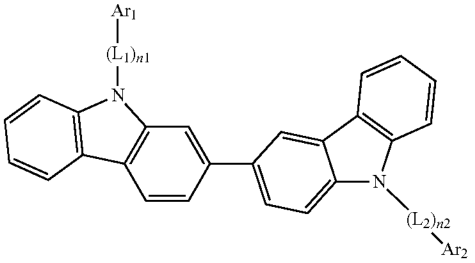
1-4
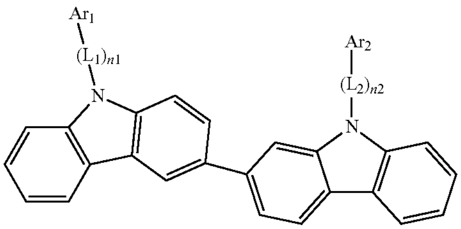
1-5
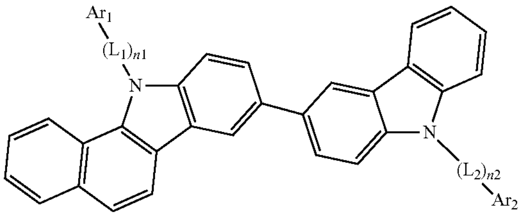
1-6
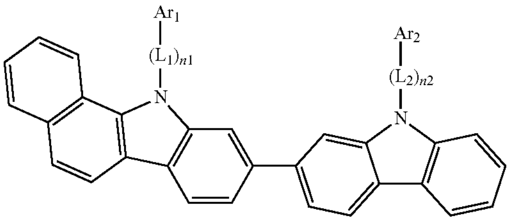
1-7
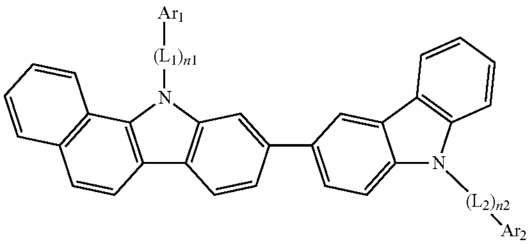
-continued
1-8
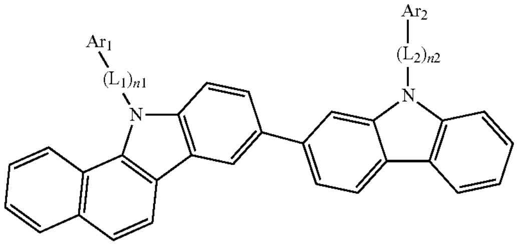
1-9
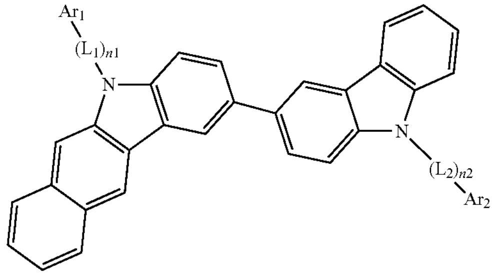
1-10
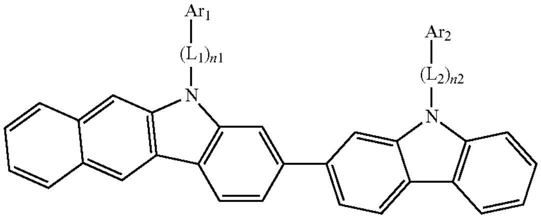
1-11
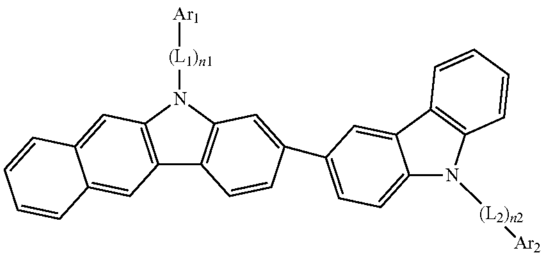
1-12
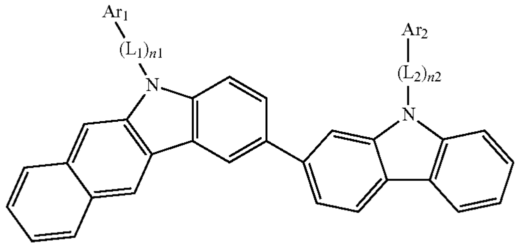
1-13
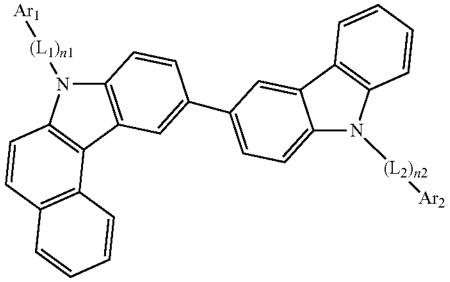

-continued
1-14
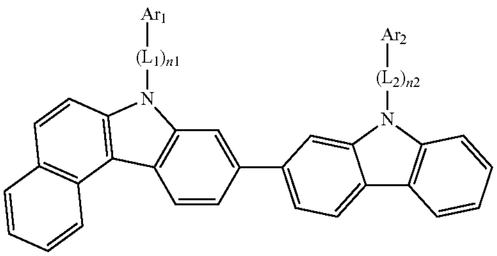
1-15
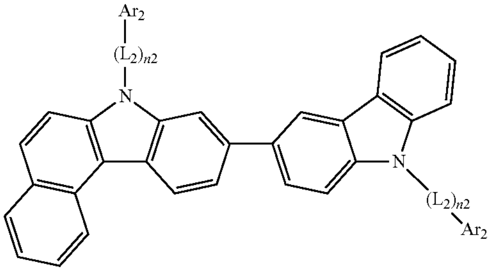
1-16
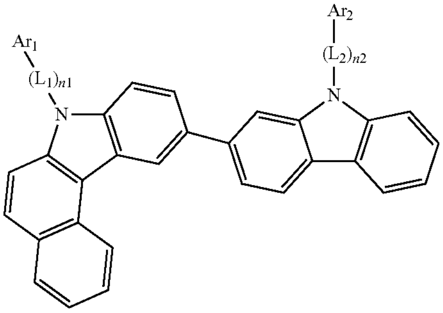
1-17
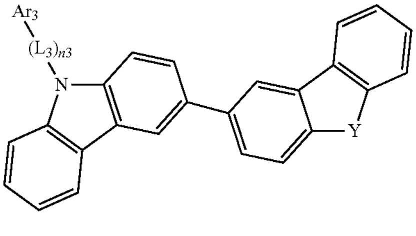
1-18
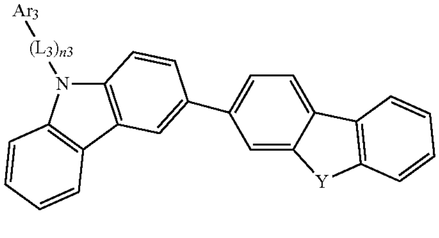
1-19
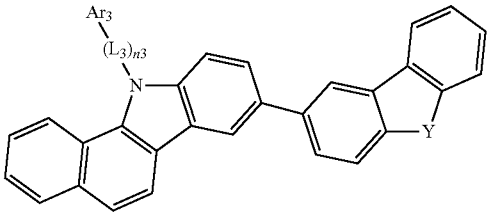
-continued
1-20
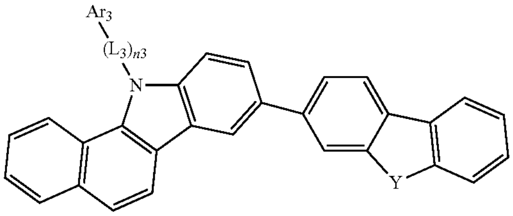
1-21
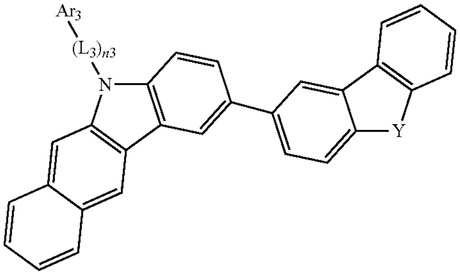
1-22
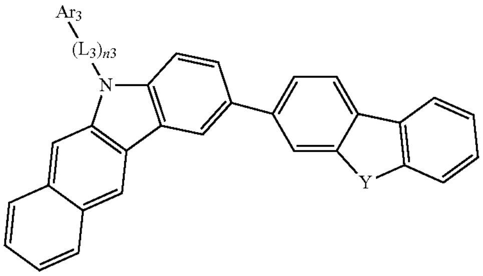
1-23
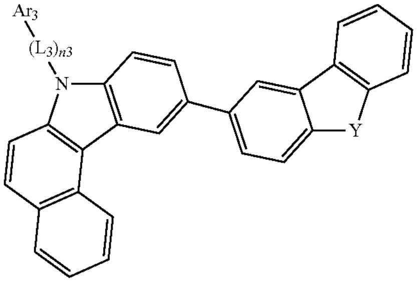
1-24
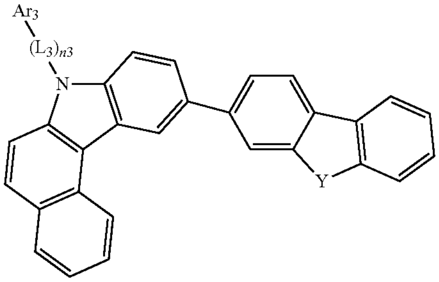
wherein, in Formulas 1-1 to 1-24,
Y is O, S, or $C(R_{31})(R_{32})$;
$L_1$ to $L_3$ are each independently selected from the group consisting of a substituted or unsubstituted $C_3$-$C_{10}$ cycloalkylene group, a substituted or unsubstituted $C_3$-$C_{10}$ cycloalkenylene group, a substituted or unsubstituted $C_6$-$C_{60}$ arylene group, a substituted or unsubstituted $C_3$-$C_{10}$ heterocycloalkylene group, a substituted or unsubstituted $C_3$-$C_{10}$ heterocycloalkenylene group, and a substituted or unsubstituted $C_1$-$C_{60}$ heteroarylene group;

n1 to n3 are each independently an integer of 0 to 3;

$Ar_1$ to $Ar_3$ are each independently selected from the group consisting of:

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_1$-$C_{60}$ heteroaryl group; wherein the $C_3$-$C_{10}$ cycloalkyl group, the $C_3$-$C_{10}$ heterocycloalkyl group, the $C_3$-$C_{10}$ cycloalkenyl group, the $C_3$-$C_{10}$ heterocycloalkenyl group, the $C_6$-$C_{60}$ aryl group, and the $C_1$-$C_{60}$ heteroaryl group are each optionally substituted with at least one substituent selected from the group consisting of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_5$-$C_{50}$ aryloxy group, a $C_6$-$C_{60}$ arylthio group, and a $C_1$-$C_{60}$ heteroaryl group;

$R_{31}$ and $R_{32}$ are each independently selected from the group consisting of:

a hydrogen atom, a deuterium atom, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_1$-$C_{60}$ heteroaryl group:

wherein:

the $C_1$-$C_{60}$ alkyl group, the $C_2$-$C_{60}$ alkenyl group, the $C_2$-$C_{60}$ alkynyl group, and the $C_1$-$C_{60}$ alkoxy group are each optionally substituted with at least one substituent selected from the group consisting of a deuterium atom, a halogen atom, a hydroxyl group, a cyano group, a nitro group, an amino group, an amidino group, a hydrazine, a hydrazone, a carboxyl group or a salt thereof, a sulfonic acid or a salt thereof, a phosphoric acid or a salt thereof, a $C_3$-$C_{10}$ cycloalkyl group, a $C_3$-$C_{10}$ heterocycloalkyl group, a $C_3$-$C_{10}$ cycloalkenyl group, a $C_5$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_1$-$C_{60}$ heteroaryl group;

and the $C_3$-$C_{10}$ cycloalkyl group, the $C_3$-$C_{10}$ heterocycloalkyl group, the $C_3$-$C_{10}$ cycloalkenyl group, the $C_3$-$C_{10}$ heterocycloalkenyl group, the $C_6$-$C_{60}$ aryl group, and the $C_1$-$C_{60}$ heteroaryl group are each optionally substituted with at least one substituent selected from the group consisting of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_1$-$C_{60}$ heteroaryl group.

3. The organic light-emitting device of claim 1, wherein:

$Ar_1$ to $Ar_3$ are each independently selected from the group consisting of:

i) a $C_6$-$C_{60}$ aryl group, a $C_1$-$C_{60}$ heteroaryl group, and $Si(Q_1)(Q_2)(Q_3)$ (here, $Q_1$ to $Q_3$ are each independently a $C_1$-$C_{10}$ alkyl group or a $C_6$-$C_{30}$ aryl group); and ii) a $C_6$-$C_{60}$ aryl group and a $C_1$-$C_{60}$ heteroaryl group, each substituted with at least one substituent selected from the group consisting of a deuterium atom, a halogen atom, a $C_1$-$C_{60}$ alkyl group, a $C_6$-$C_{60}$ aryl group, a $C_1$-$C_{60}$ heteroaryl group, and —$Si(Q_1)(Q_2)(Q_3)$ (wherein $Q_1$ to $Q_3$ are each independently a $C_1$-$C_{10}$ alkyl group or a $C_6$-$C_{30}$ aryl group).

4. The organic light-emitting device of claim 1, wherein:

$X_{11}$ is $C(R_{11})$, $X_{12}$ is $C(R_{12})$, $X_{13}$ is $C(R_{13})$, $X_{14}$ is $C(R_{14})$, $X_{15}$ is $C(R_{15})$, $X_{16}$ is $C(R_{16})$, $X_{17}$ is $C(R_{17})$, $X_{18}$ is $C(R_{18})$, $X_{19}$ iS $C(R_{19})$, $X_{20}$ is $C(R_{20})$, $X_{21}$ is $C(R_{21})$, $X_{22}$ is $C(R_{22})$, $X_{23}$ is $C(R_{23})$, and $X_{24}$ is $C(R_{24})$.

5. The organic light-emitting device of claim 1, wherein:

$Ar_{13}$ and $Ar_{14}$ are each independently selected from the group consisting of:

i) a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group; and ii) a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group, each substituted with at least one substituent selected from the group consisting of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a alkoxy group, a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group.

6. An organic light-emitting device comprising:

a substrate comprising a first sub-pixel region, a second sub-pixel region, and a third sub-pixel region;

a first electrode disposed in each of the first, second, and third sub-pixel regions of the substrate;

a second electrode disposed opposite to the first electrode in each of the first, the second, and the third sub-pixel regions;

an emission layer disposed between the first electrode and the second electrode; and a hole transporting-region disposed between the emission layer and the first electrode, wherein the hole transporting-region comprises a hole transport layer and a buffer layer; and the buffer layer is disposed between the hole transport layer and the emission layer;

the emission layer comprises:

a first emission layer that is disposed in the first sub-pixel region and emits red light, a second emission layer that is disposed in the second sub-pixel region and emits green light, and a third emission layer that is disposed in the third sub-pixel region and emits blue light;

the hole transport layer comprises:

a first hole transport layer disposed in the first sub-pixel region, a second hole transport layer disposed in the second sub-pixel region, and a third hole transport layer disposed in the third sub-pixel region;

the buffer layer consists of:

a first buffer layer disposed in the first sub-pixel region, and a second buffer layer disposed in the second sub-pixel region;

with the proviso that only one of conditions i) or ii) is met:

i) the first emission layer comprises at least one light-emitting material selected from the group consisting of compounds represented by any one of Formulas 1 and 2, and the first buffer layer consists of at least one of Compounds 6-89 through 6-96, 6-113 through 6-120, and 6-137 through 6-144, or ii) the second emission layer comprises at least one light-emitting material selected from the group consisting of compounds represented by any one of Formulas 1 and 2, and the second buffer layer consists of the at least one of Compounds 6-89 through 6-96, 6-113 through 6-120, and 6-137 through 6-144, <Formula 1>

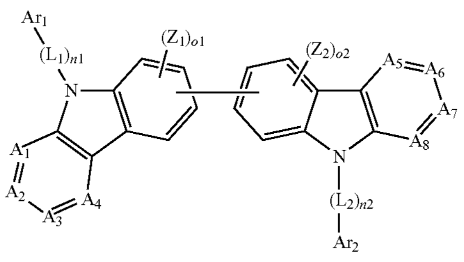

<Formula 2>

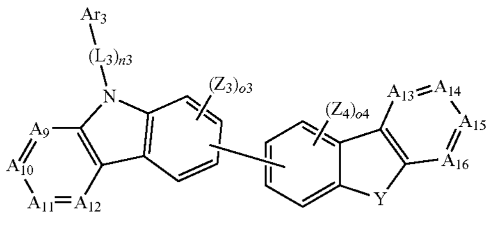

wherein, in Formulae 1 and 2, $A_1$ is $CR_1$ or N; $A_2$ is $CR_2$ or N; $A_3$ is $CR_3$ or N; $A_4$ is $CR_4$ or N; $A_5$ is $CR_5$ or N; $A_6$ is $CR_6$ or N; $A_7$ is $CR_7$ or N; $A_8$ is $CR_8$ or N; $A_9$ is $CR_9$ or N; $A_{10}$ is $CR_{10}$ or N; $A_{11}$ is $CR_{11}$ or N; $A_{12}$ is $CR_{12}$ or N; $A_{13}$ is $CR_{13}$ or N; $A_{14}$ is $CR_{14}$ or N; $A_{15}$ is $CR_{15}$ or N; and $A_{16}$ is $CR_{16}$ or N; and $R_1$ to $R_{16}$ are each independently selected from the group consisting of a hydrogen atom, a deuterium atom, a halogen atom, a $C_1$-$C_{60}$ alkyl group, a $C_6$-$C_{60}$ aryl group, a $C_1$-$C_{60}$ heteroaryl group, and —$N(Q_1)(Q_2)(Q_3)$, wherein $Q_1$ to $Q_3$ are each independently a $C_1$-$C_{60}$ alkyl group, a $C_6$-$C_{60}$ aryl group, or a $C_1$-$C_{60}$ heteroaryl group; or two or more of $R_1$ to $R_{16}$ are optionally connected to each other to form a $C_6$-$C_{20}$ saturated ring or a $C_6$-$C_{20}$ unsaturated ring;

Y is 0, S, or $C(R_{31})(R_{32})$;

$L_1$ to $L_3$ are each independently selected from the group consisting of a substituted or unsubstituted $C_3$-$C_{10}$ cycloalkylene group, a substituted or unsubstituted $C_3$-$C_{10}$ cycloalkenylene group, a substituted or unsubstituted $C_6$-$C_{60}$ arylene group, a substituted or unsubstituted $C_3$-$C_{10}$ heterocycloalkylene group, a substituted or unsubstituted $C_3$-$C_{10}$ heterocycloalkenylene group, and a substituted or unsubstituted $C_1$-$C_{60}$ heteroarylene group;

n1 to n3 are each independently an integer of 0 to 3;

$Ar_1$ to $Ar_3$ are each independently selected from the group consisting of:

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_1$-$C_{60}$ heteroaryl group, and —$Si(Q_1)(Q_2)(Q_3)$ (wherein $Q_1$ to $Q_3$ are each independently selected from the group consisting of a substituted or unsubstituted $C_1$-$C_{10}$ alkyl group and a substituted or unsubstituted $C_6$-$C_{30}$ aryl group); wherein the $C_3$-$C_{10}$ cycloalkyl group, the $C_3$-$C_{10}$ heterocycloalkyl group, the $C_3$-$C_{10}$ cycloalkenyl group, the $C_3$-$C_{10}$ heterocycloalkenyl group, the $C_6$-$C_{60}$ aryl group, and the $C_1$-$C_{60}$ heteroaryl group are each optionally substituted with at least one substituent selected from the group consisting of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, and —$Si(Q_1)(Q_2)(Q_3)$ (wherein $Q_1$ to $Q_3$ are each independently a substituted or unsubstituted $C_1$-$C_{10}$ alkyl group or a substituted or unsubstituted $C_6$-$C_{30}$ aryl group);

$Z_1$ to $Z_4$, $R_{31}$ and $R_{32}$ are each independently selected from the group consisting of:

a hydrogen atom, a deuterium atom, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_1$-$C_{60}$ heteroaryl group; wherein:

the $C_1$-$C_{60}$ alkyl group, the $C_2$-$C_{60}$ alkenyl group, the $C_2$-$C_{60}$ alkynyl group, and the $C_1$-$C_{60}$ alkoxy group are each optionally substituted with at least one substituent selected from the group consisting of a deuterium atom, a halogen atom, a hydroxyl group, a cyano group, a nitro group, an amino group, an amidino group, a hydrazine, a hydrazone, a carboxyl group or a salt thereof, a sulfonic acid or a salt thereof, a phosphoric acid or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_1$-$C_{60}$ heteroaryl group; and the $C_3$-$C_{10}$ cycloalkyl group, the $C_3$-$C_{10}$ heterocycloalkyl group, the $C_3$-$C_{10}$ cycloalkenyl group, the $C_3$-$C_{10}$ heterocycloalkenyl group, the $C_6$-$C_{60}$ aryl group, and the $C_1$-$C_{60}$ heteroaryl group are each optionally substituted with at least one substituent selected from the group consisting of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_1$-$C_{60}$ heteroaryl group;

o1 to o4 are each independently an integer of 0 to 3;

6-89

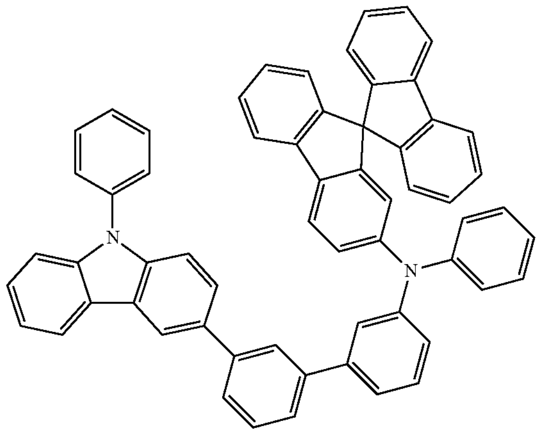

6-90

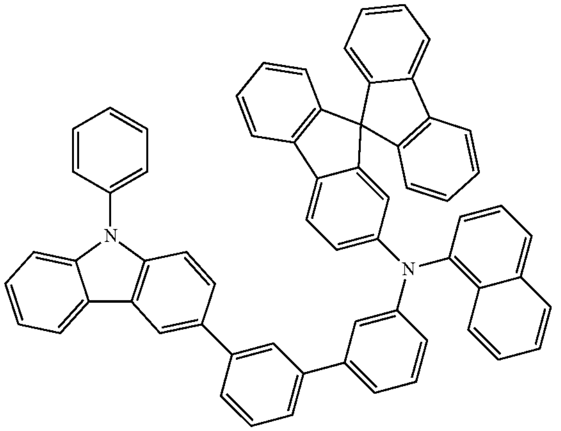

-continued 6-91

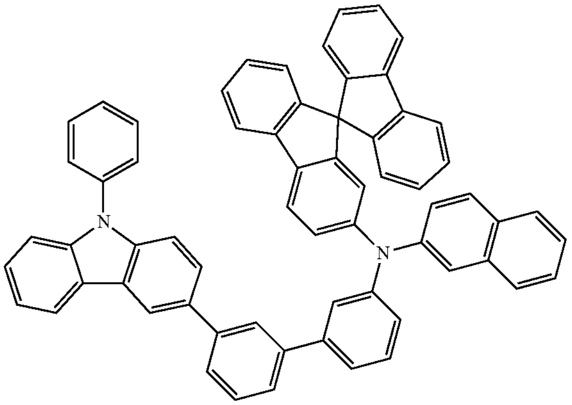

6-92

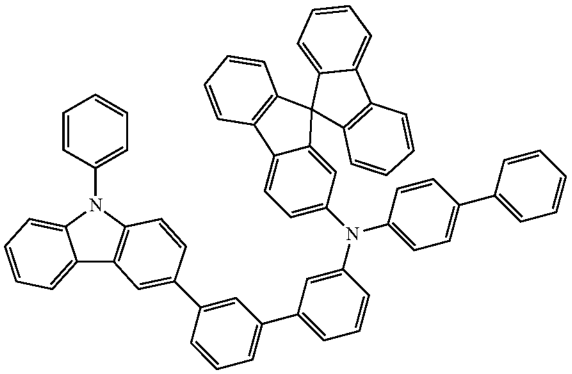

6-93

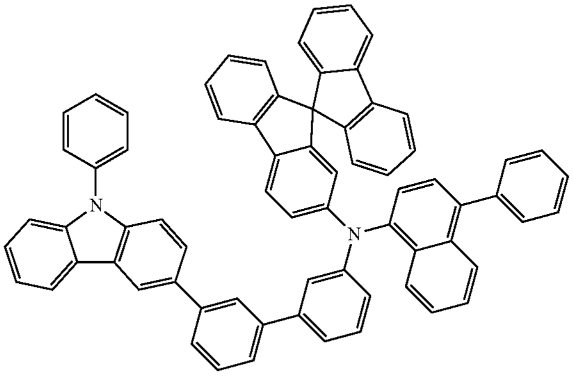

6-94

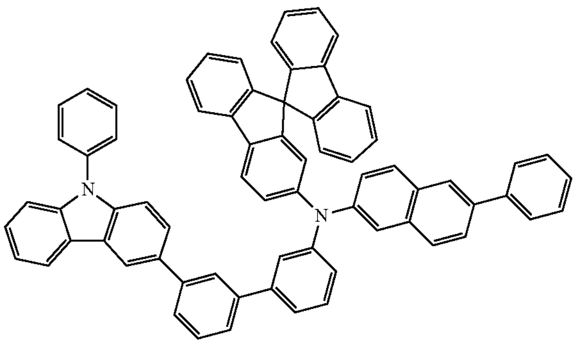

-continued
6-95
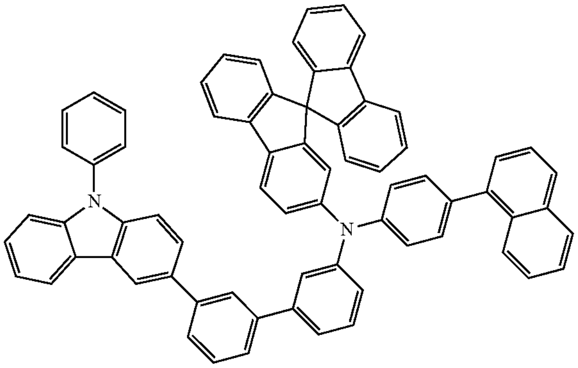
6-96
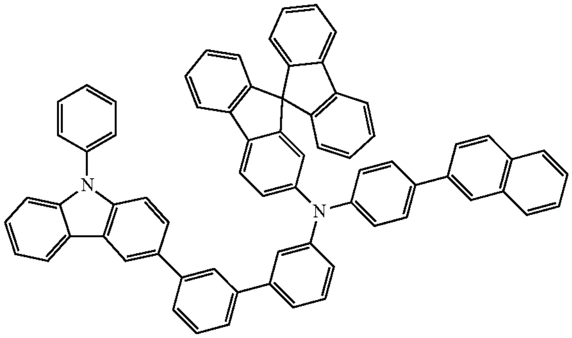
6-113
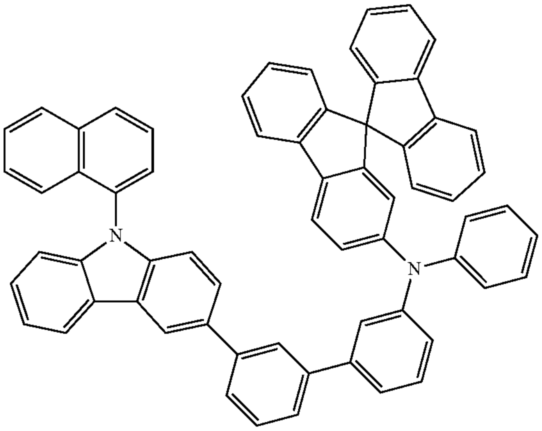
6-114
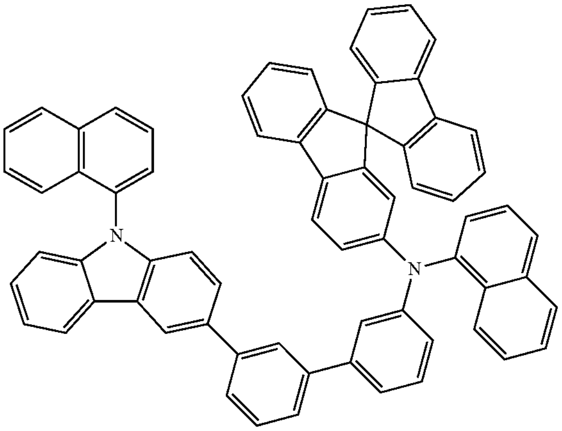
-continued
6-115
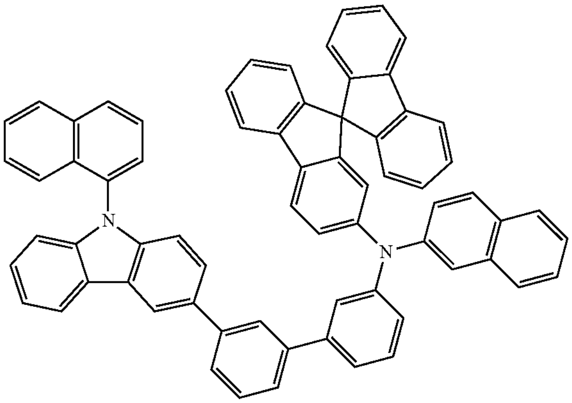
6-116
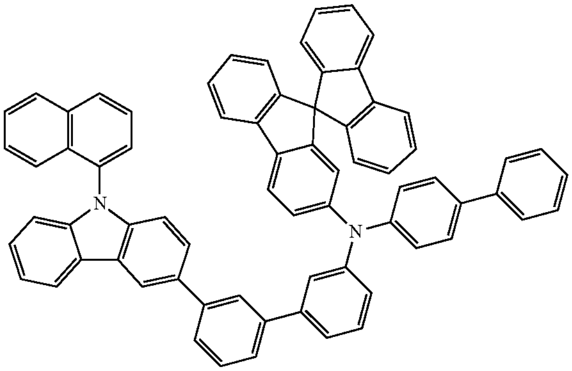
6-117
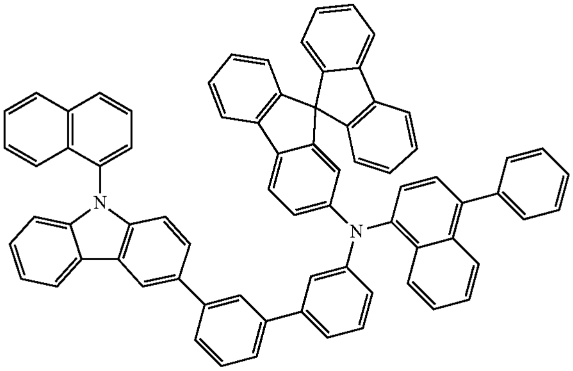
6-118
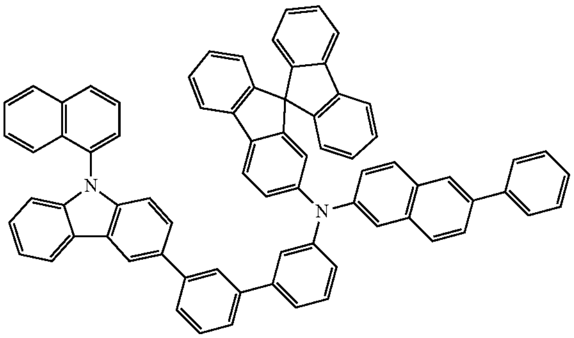

-continued
6-119
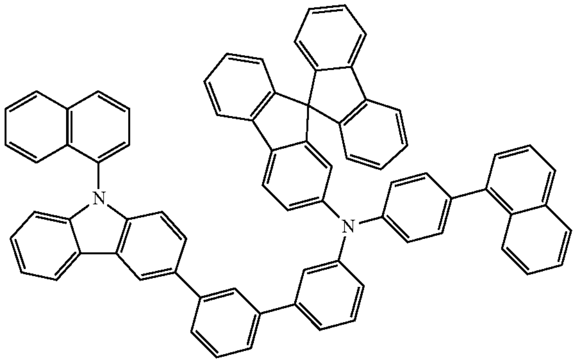
6-120
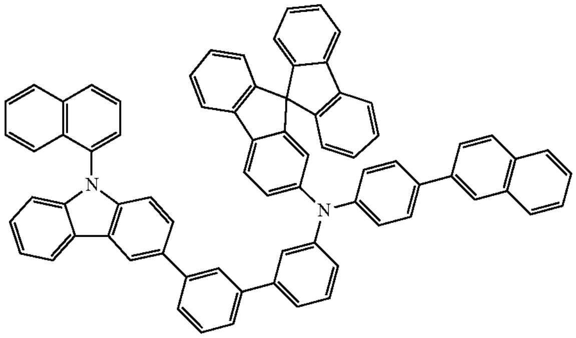
6-137
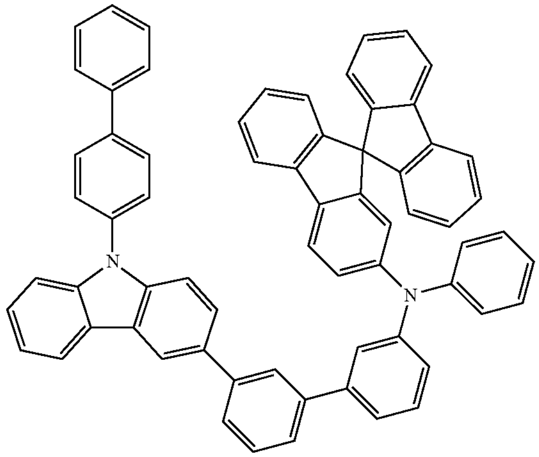
-continued
6-138
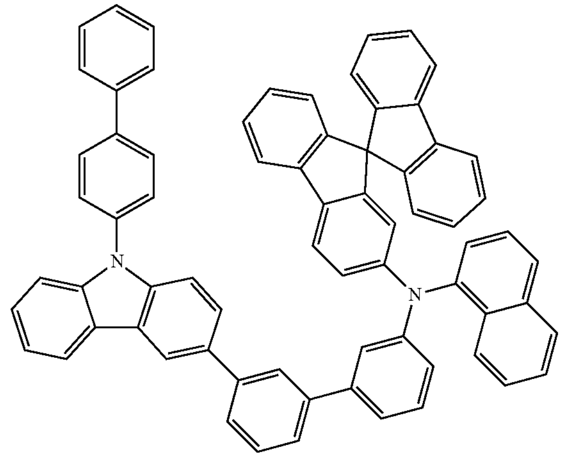
6-139
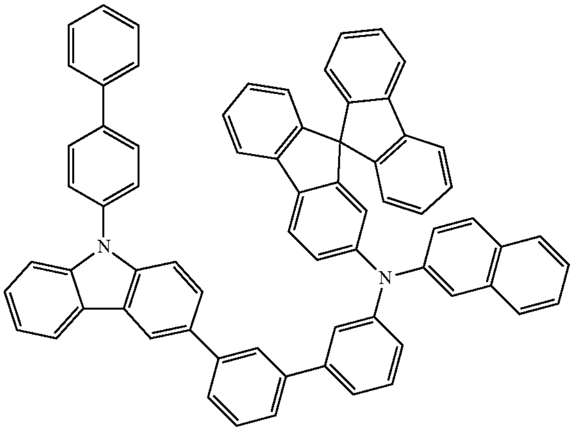
6-140
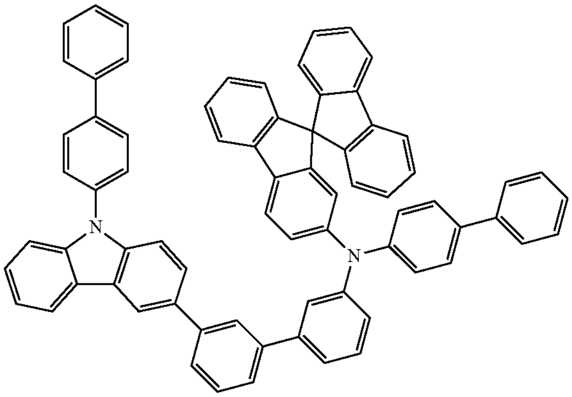

-continued
6-141
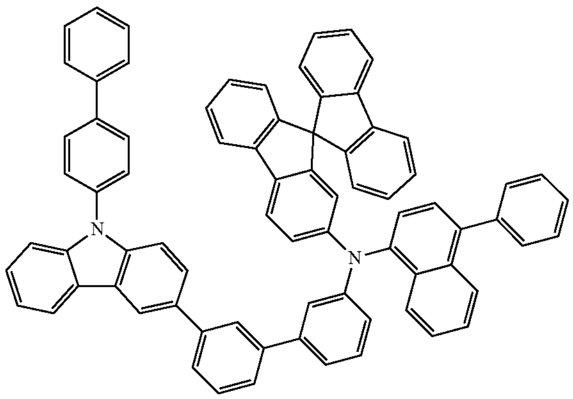
6-142
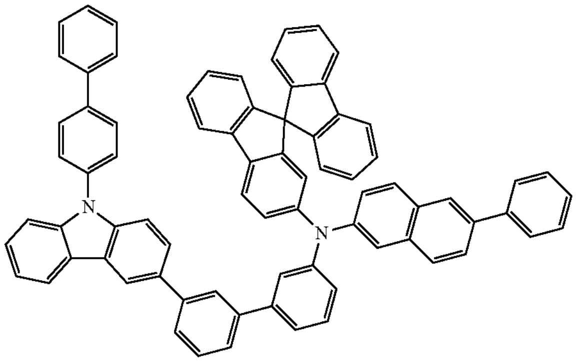
-continued
6-143
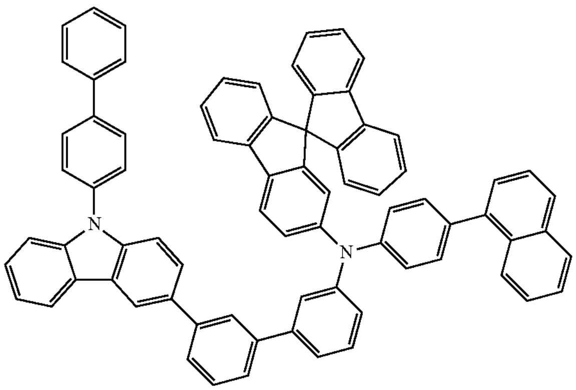
6-144
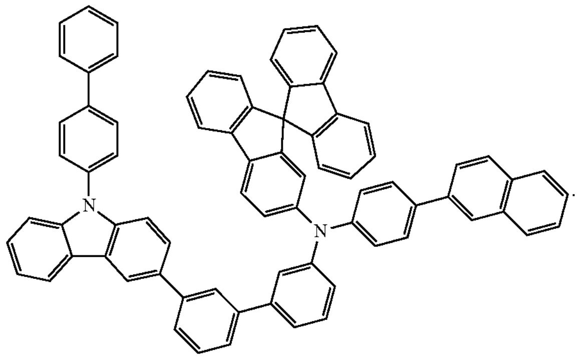
* * * * *

UNITED STATES PATENT AND TRADEMARK OFFICE

CERTIFICATE OF CORRECTION

PATENT NO. : 10,840,454 B2
APPLICATION NO. : 14/691521
DATED : November 17, 2020
INVENTOR(S) : Hwan-Hee Cho et al.

It is certified that error appears in the above-identified patent and that said Letters Patent is hereby corrected as shown below:

In the Claims

In Column 165, Line 54, Claim 1 delete "As" and insert -- $A_5$ --

In Column 166, Line 1, Claim 1 delete "0," and insert -- O, --

In Column 166, Line 16, Claim 1 delete "$C_6$-Coo" and insert -- $C_6$-$C_{60}$ --

In Column 166, Line 46, Claim 1 delete "group:" and insert -- group; --

In Column 166, Line 49, Claim 1 after "group," insert -- and --

In Column 166, Line 64, Claim 1 delete "group," and insert -- group --

In Column 167, Line 8 (approx.), Claim 1 delete "$C_5$-$C_{60}$" and insert -- $C_6$-$C_{60}$ --

In Column 167, Line 35 (approx.), Claim 1 delete "N" and insert -- N; --

In Column 167, Line 50, Claim 1 delete "grout)," and insert -- group, --

In Column 167, Line 56, Claim 1 delete "group);" and insert -- group; --

In Column 168, Line 19 (approx.), Claim 1 delete "$C_3$-$C_{10}$" and insert -- $C_6$-$C_{60}$ --

In Column 168, Line 54 (approx.), Claim 2 delete "anyone" and insert -- any one --

Signed and Sealed this
Eighteenth Day of January, 2022

Drew Hirshfeld
*Performing the Functions and Duties of the*
*Under Secretary of Commerce for Intellectual Property and*
*Director of the United States Patent and Trademark Office*

In Column 171, Lines 15-25 (approx.), Claim 2 delete

“ 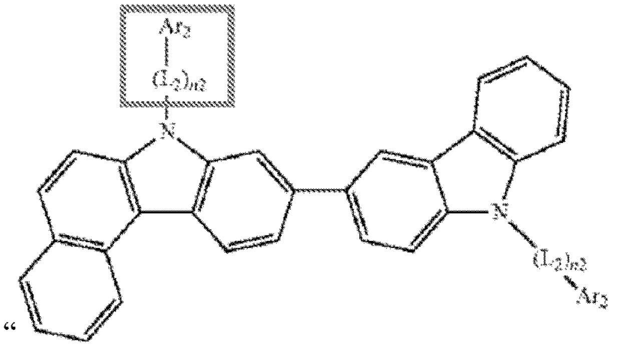 1-15 ”

and insert -- 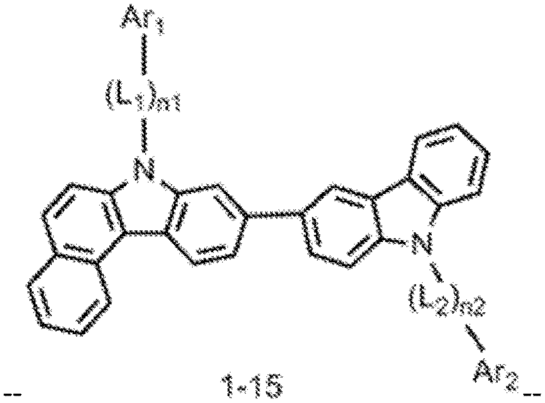 1-15 --

In Column 173, Line 26, Claim 2 delete “$C_5$-$C_{50}$” and insert -- $C_6$-$C_{60}$ --

In Column 173, Line 37, Claim 2 delete “group:” and insert -- group; --

In Column 173, Line 48, Claim 2 delete “$C_5$-$C_{10}$” and insert -- $C_3$-$C_{10}$ --

In Column 174, Line 5, Claim 3 delete “$Si(Q_1)(Q_2)(Q_3)$” and insert -- $—Si(Q_1)(Q_2)(Q_3)$ --

In Column 174, Line 18, Claim 4 delete “iS” and insert -- is --

In Column 174, Line 49, Claim 5 after “a” insert -- $C_1$-$C_{20}$ --

In Column 175, Line 32, Claim 6 delete “2,” and insert -- 2 shown below, --

In Column 175, Line 34, Claim 6 delete “6-144,” and insert -- 6-144 shown below, --

In Column 175, Line 38, Claim 6 delete “2,” and insert -- 2 shown below, --

In Column 175, Line 40, Claim 6 delete “6-144,” and insert -- 6-144 shown below, --

In Column 175, Line 65, Claim 6 after “in” insert -- the --

In Column 176, Line 14, Claim 6 delete “0,” and insert -- O, --